US010943917B2

(12) United States Patent
Iwai et al.

(10) Patent No.: US 10,943,917 B2
(45) Date of Patent: Mar. 9, 2021

(54) THREE-DIMENSIONAL MEMORY DEVICE WITH DRAIN-SELECT-LEVEL ISOLATION STRUCTURES AND METHOD OF MAKING THE SAME

(71) Applicant: SANDISK TECHNOLOGIES LLC, Addison, TX (US)

(72) Inventors: Takaaki Iwai, Yokkaichi (JP); Makoto Koto, Yokkaichi (JP); Sayako Nagamine, Yokkaichi (JP); Ching-Huang Lu, Fremont, CA (US); Wei Zhao, San Jose, CA (US); Yanli Zhang, San Jose, CA (US); James Kai, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/388,054

(22) Filed: Apr. 18, 2019

(65) Prior Publication Data

US 2020/0251488 A1 Aug. 6, 2020

Related U.S. Application Data

(63) Continuation-in-part of application No. 16/267,592, filed on Feb. 5, 2019, now Pat. No. 10,685,978.

(51) Int. Cl.
*H01L 27/11582* (2017.01)
*H01L 27/11519* (2017.01)
(Continued)

(52) U.S. Cl.
CPC ...... *H01L 27/11582* (2013.01); *H01L 21/762* (2013.01); *H01L 27/11519* (2013.01); *H01L 27/11556* (2013.01); *H01L 27/11565* (2013.01)

(58) Field of Classification Search
CPC ......... H01L 27/11582; H01L 27/11519; H01L 27/11556; H01L 27/11565;
(Continued)

(56) References Cited

U.S. PATENT DOCUMENTS 5,915,167 A 6/1999 Leedy
9,524,981 B2 12/2016 Pachamuthu et al.
(Continued)

OTHER PUBLICATIONS

Notification of Transmittal of the International Search Report and Written Opinion of the International Search Authority for International Patent Application No. PCT/US2019/063461, dated Mar. 26, 2020, 12 pages.

(Continued)

*Primary Examiner* — Cuong Q Nguyen
(74) *Attorney, Agent, or Firm* — The Marbury Law Group, PLLC

(57) ABSTRACT

A three-dimensional memory device includes an alternating stack of insulating layers and electrically conductive layers located over a substrate, and memory pillar structures extending through the alternating stack. Each of the memory pillar structures includes a respective memory film and a respective vertical semiconductor channel. Dielectric cores contact an inner sidewall of a respective one of the vertical semiconductor channels. A drain-select-level isolation structure laterally extends along a first horizontal direction and contacts straight sidewalls of the dielectric cores at a respective two-dimensional flat interface. The memory pillar structures may be formed on-pitch as a two-dimensional periodic array, and themay drain-select-level isolation structure may cut through upper portions of the memory pillar structures to minimize areas occupied by the drain-select-level isolation structure.

13 Claims, 92 Drawing Sheets

(51) Int. Cl.
*H01L 21/762* (2006.01)
*H01L 27/11565* (2017.01)
*H01L 27/11556* (2017.01)

(58) Field of Classification Search
CPC ......... H01L 27/11573; H01L 27/11526; H01L 27/11568
See application file for complete search history.

(56) References Cited

U.S. PATENT DOCUMENTS

| | | | |
|---|---|---|---|
| 9,576,967 | B1 | 2/2017 | Kimura et al. |
| 9,613,977 | B2 | 4/2017 | Sharangpani et al. |
| 9,922,987 | B1 | 3/2018 | Mizutani et al. |
| 9,972,640 | B1 | 5/2018 | Kai et al. |
| 9,972,641 | B1 | 5/2018 | Zhang et al. |
| 10,192,878 | B1 | 1/2019 | Tsutsumi et al. |
| 2012/0098049 | A1 | 4/2012 | Moon et al. |
| 2016/0379989 | A1 | 12/2016 | Sharangpani et al. |
| 2017/0179026 | A1 | 6/2017 | Toyama et al. |
| 2017/0278571 | A1 | 9/2017 | Chowdhury et al. |
| 2018/0097009 | A1 | 4/2018 | Zhang et al. |
| 2018/0138194 | A1 | 5/2018 | Shigemura et al. |
| 2018/0197876 | A1 | 7/2018 | Ge et al. |
| 2018/0233513 | A1 | 8/2018 | Zhang et al. |
| 2018/0331118 | A1* | 11/2018 | Amano ............ H01L 27/11573 |
| 2018/0342455 | A1 | 11/2018 | Nosho et al. |
| 2018/0366482 | A1 | 12/2018 | Zhou et al. |
| 2018/0374865 | A1* | 12/2018 | Shimabukuro ... H01L 27/11573 |
| 2019/0027488 | A1 | 1/2019 | Kai et al. |
| 2019/0027489 | A1 | 1/2019 | Orimoto et al. |
| 2019/0035803 | A1 | 1/2019 | Zhang et al. |
| 2019/0067025 | A1 | 2/2019 | Yada et al. |
| 2019/0319100 | A1 | 10/2019 | Chen et al. |

OTHER PUBLICATIONS

Endoh et al., "Novel Ultra High Density Memory with a Stacked-Surrounding Gate Transistor (S-SGT) Structured Cell," IEDM Proc. (2001) 33-36.

U.S. Appl. No. 15/850,073, filed Dec. 21, 2017, SanDisk Technologies LLC.

U.S. Appl. No. 15/865,892, filed Jan. 9, 2018, SanDisk Technologies LLC.

U.S. Appl. No. 15/888,714, filed Feb. 5, 2018, SanDisk Technologies LLC.

U.S. Appl. No. 15/906,109, filed Feb. 27, 2018, SanDisk Technologies LLC.

U.S. Appl. No. 16/019,821, filed Jun. 27, 2018, SanDisk Technologies LLC.

U.S. Appl. No. 16/019,856, filed Jun. 27, 2018, SanDisk Technologies LLC.

U.S. Appl. No. 16/023,289, filed Jun. 29, 2018, SanDisk Technologies LLC.

U.S. Appl. No. 16/023,866, filed Jun. 29, 2018, SanDisk Technologies LLC.

U.S. Appl. No. 16/024,048, filed Jun. 29, 2018, SanDisk Technologies LLC.

U.S. Appl. No. 16/138,001, filed Sep. 21, 2018, SanDisk Technologies LLC.

U.S. Appl. No. 16/142,875, filed Sep. 26, 2018, SanDisk Technologies LLC.

U.S. Appl. No. 16/202,713, filed Nov. 28, 2018, SanDisk Technologies LLC.

U.S. Appl. No. 16/215,912, filed Dec. 11, 2018, SanDisk Technologies LLC.

U.S. Appl. No. 16/224,367, filed Dec. 18, 2018, SanDisk Technologies LLC.

U.S. Appl. No. 16/267,592, filed Feb. 5, 2019, SanDisk Technologies LLC.

U.S. Appl. No. 16/267,625, filed Feb. 5, 2019, SanDisk Technologies LLC.

Office Communication, Notice of Allowance and Fee(s) Due, from the USPTO for U.S. Appl. No. 16/267,592, dated Feb. 10, 2020, 17 pages.

Office Communication, Notice of Allowance and Fee(s) Due, from the USPTO for U.S. Appl. No. 16/267,625, dated Feb. 10, 2020, 13 pages.

* cited by examiner

THREE-DIMENSIONAL MEMORY DEVICE WITH DRAIN-SELECT-LEVEL ISOLATION STRUCTURES AND METHOD OF MAKING THE SAME

RELATED APPLICATIONS

The instant application is a continuation-in-part application of U.S. application Ser. No. 16/267,592 filed on Feb. 5, 2019, the entire contents of which are incorporated herein by reference.

FIELD

The present disclosure relates generally to the field of semiconductor devices, and particular to a three-dimensional memory device including drain-select-level isolation structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: an alternating stack of insulating layers and electrically conductive layers located over a substrate; first memory pillar structures extending through the alternating stack, wherein each of the first memory pillar structures includes a respective first memory film and a respective first vertical semiconductor channel; dielectric cores contacting an inner sidewall of a respective one of the first vertical semiconductor channels; and a drain-select-level isolation structure that laterally extends along a first horizontal direction and contacts straight sidewalls of the dielectric cores at a respective two-dimensional flat interface.

According to another embodiment of the present disclosure, a method of forming a three-dimensional memory device is provided, which comprises: forming an alternating stack of insulating layers and sacrificial material layers over a substrate; forming memory pillar structures extending through the alternating stack, wherein each of the memory pillar structures includes a respective memory film and a respective vertical semiconductor channel, wherein the memory pillar structures comprise first memory pillar structures arranged in two rows that extend along a first horizontal direction; forming a drain-select-level trench by etching through an upper portion of the alternating stack and a first area of each of the first memory pillar structures, wherein the drain-select-level trench includes a pair of straight lengthwise sidewalls that extend along the first horizontal direction; replacing the sacrificial material layers with electrically conductive layers; and forming a drain-select-level isolation structure in a volume of the drain-select-level trench after formation of the electrically conductive layers.

According to an embodiment of the present disclosure, a three-dimensional memory device is provided, which comprises: an alternating stack of insulating layers and electrically conductive layers located over a substrate; first memory stack structures extending through the alternating stack, wherein each of the first memory stack structures includes a respective first memory film and a respective first vertical semiconductor channel; and a drain-select-level isolation structure having a pair of straight lengthwise sidewalls that extend along a first horizontal direction and contact straight sidewalls of the first memory stack structures, wherein each first vertical semiconductor channel comprises a tubular section that underlie a horizontal plane including a bottom surface of the drain-select-level isolation structure and a semi-tubular section overlying the tubular section and contacting the drain-select-level isolation structure.

According to another embodiment of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layers; forming memory stack structures extending through the alternating stack, wherein each of the memory stack structures includes a respective memory film and a respective vertical semiconductor channel including dopants of a first conductivity type, wherein the memory stack structures comprises first memory stack structures arranged in two rows that extend along a first horizontal direction; forming a drain-select-level trench by etching through an upper portion of the alternating stack and a first area of each of the first memory stack structures, wherein the drain-select-level trench includes a pair of straight lengthwise sidewalls that extend along the first horizontal direction; and forming a drain-select-level isolation structure in the drain-select-level trench, wherein each vertical semiconductor channel within the first memory stack structures comprises a tubular section that underlie a horizontal plane including a bottom surface of the drain-select-level isolation structure and a semi-tubular section overlying the tubular section and contacting the drain-select-level isolation structure.

According to yet another embodiment of the present disclosure, a three-dimensional memory device is provided, which comprises: an alternating stack of insulating layers and electrically conductive layers located over a substrate; and first memory stack structures extending through the alternating stack, wherein each of the first memory stack structures includes a respective first memory film and a respective first vertical semiconductor channel, wherein each first vertical semiconductor channel comprises a tubular section including dopants of a first conductivity type at a first atomic concentration, a first semi-tubular section overlying the tubular section and including dopants of the first conductivity type at the first atomic concentration, and a second semi-tubular section overlying the tubular section and laterally adjoined to the first semi-tubular section and including dopants of the first conductivity type at a second atomic concentration that is greater than the first atomic concentration.

According to still another embodiment of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layers; forming memory stack structures extending through the alternating stack, wherein each of the memory stack structures includes a respective memory film and a respective vertical semiconductor channel including dopants of a first conductivity type at a first atomic concentration, wherein the memory stack structures comprises first memory stack structures arranged in two rows that extend along a first horizontal direction; partially physically exposing upper portions of sidewalls of the two rows of the first memory stack structures by forming a drain-select-level trench that extend through an upper portion of the alternating stack and laterally extending between the two rows of the first memory stack structures; and implanting dopants of the first conductivity type into segments of vertical semiconductor channels within the first memory stack structures that are proximal to the drain-select-level trench, wherein each vertical semiconductor channel within the first memory stack structures comprises a tubular section including dopants of the first conductivity type at the first atomic concentration, a first semi-tubular section overlying the tubular section and including dopants of the first conductivity type at the first atomic concentration, and a second semi-tubular section overlying the tubular section and laterally adjoined to the first semi-tubular section and including dopants of the first conductivity type at a second atomic concentration that is greater than the first atomic concentration.

DETAILED DESCRIPTION

Figure 1:
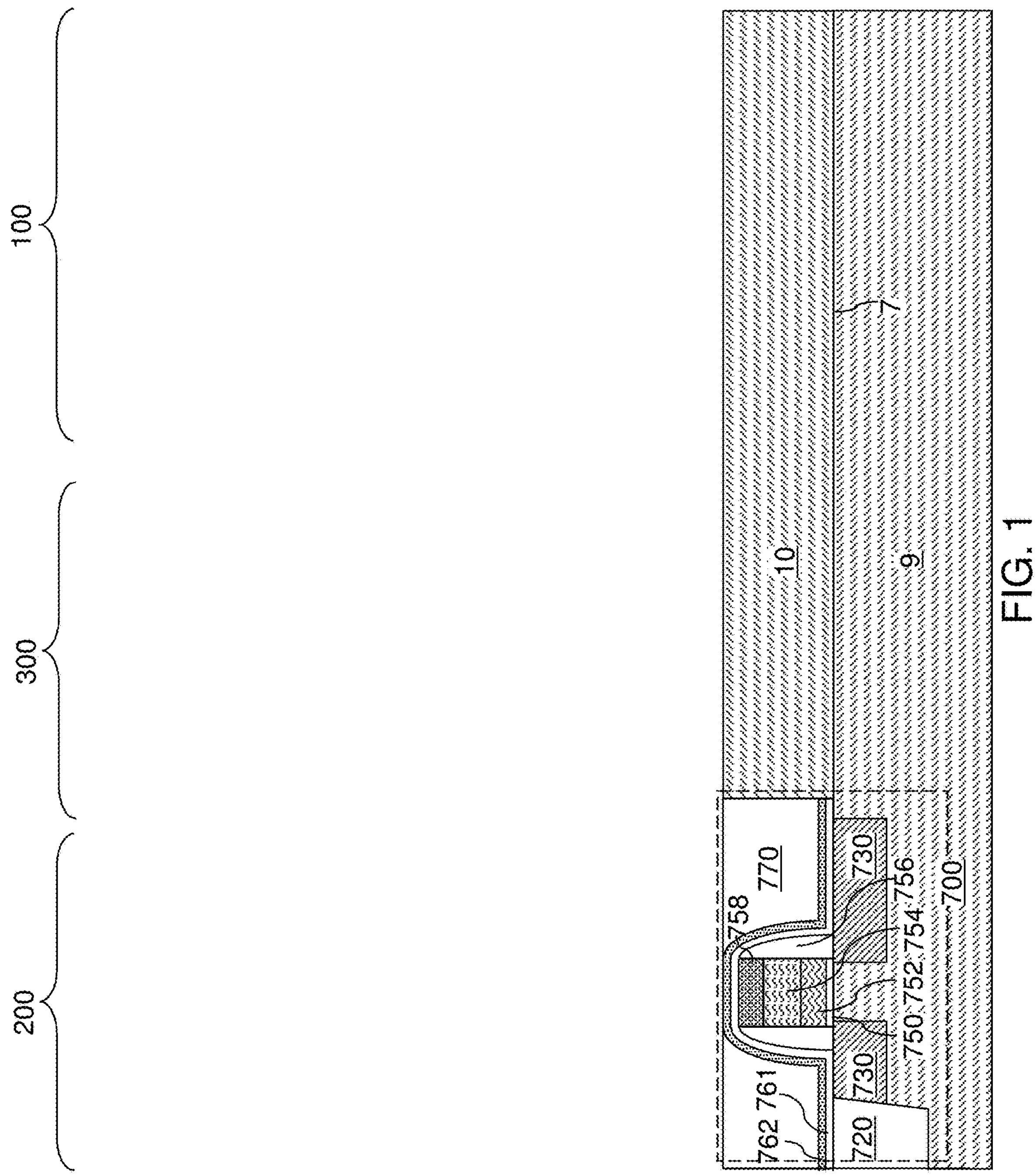
FIG. 1 is a schematic vertical cross-sectional view of a first exemplary structure after formation of at least one peripheral device, and a semiconductor material layer according to a first embodiment of the present disclosure.

As discussed above, the present disclosure is directed to three-dimensional memory devices including a vertical stack of multilevel memory arrays and methods of making thereof, the various embodiments of which are described below. The embodiments of the disclosure may be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a zig-zag vertical plane or a substantially zig-zag vertical plane that includes the first surface and the second surface. A substantially zig-zag vertical plane is a plane that extends straight along a direction that deviates from a vertical direction by an angle less than 5 degrees. A zig-zag vertical plane or a substantially zig-zag vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to the first embodiment of the present disclosure is illustrated, which may be used, for example, to fabricate a device structure containing vertical NAND memory devices. The first exemplary structure includes a substrate (9, 10), which may be a semiconductor substrate. The substrate may include a substrate semiconductor layer 9 and an optional semiconductor material layer 10. The substrate semiconductor layer 9 may be a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^5$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry may be optionally formed on a portion of the substrate semiconductor layer 9. The at least one semiconductor device 700 may include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants using the at least one gate structure (750, 752, 754, 758) as masking structures. Additional masks may be used as needed. The active region 730 may include source regions and drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry may contain a driver circuit for memory devices to be subsequently formed, which may include at least one NAND device.

A dielectric material such as silicon oxide may be deposited over the at least one semiconductor device 700, and may be subsequently planarized to form a planarization dielectric layer 770. In one embodiment, the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be used for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 may have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers may be provided between the memory array region 100 and the peripheral device region 200.

Figure 2:
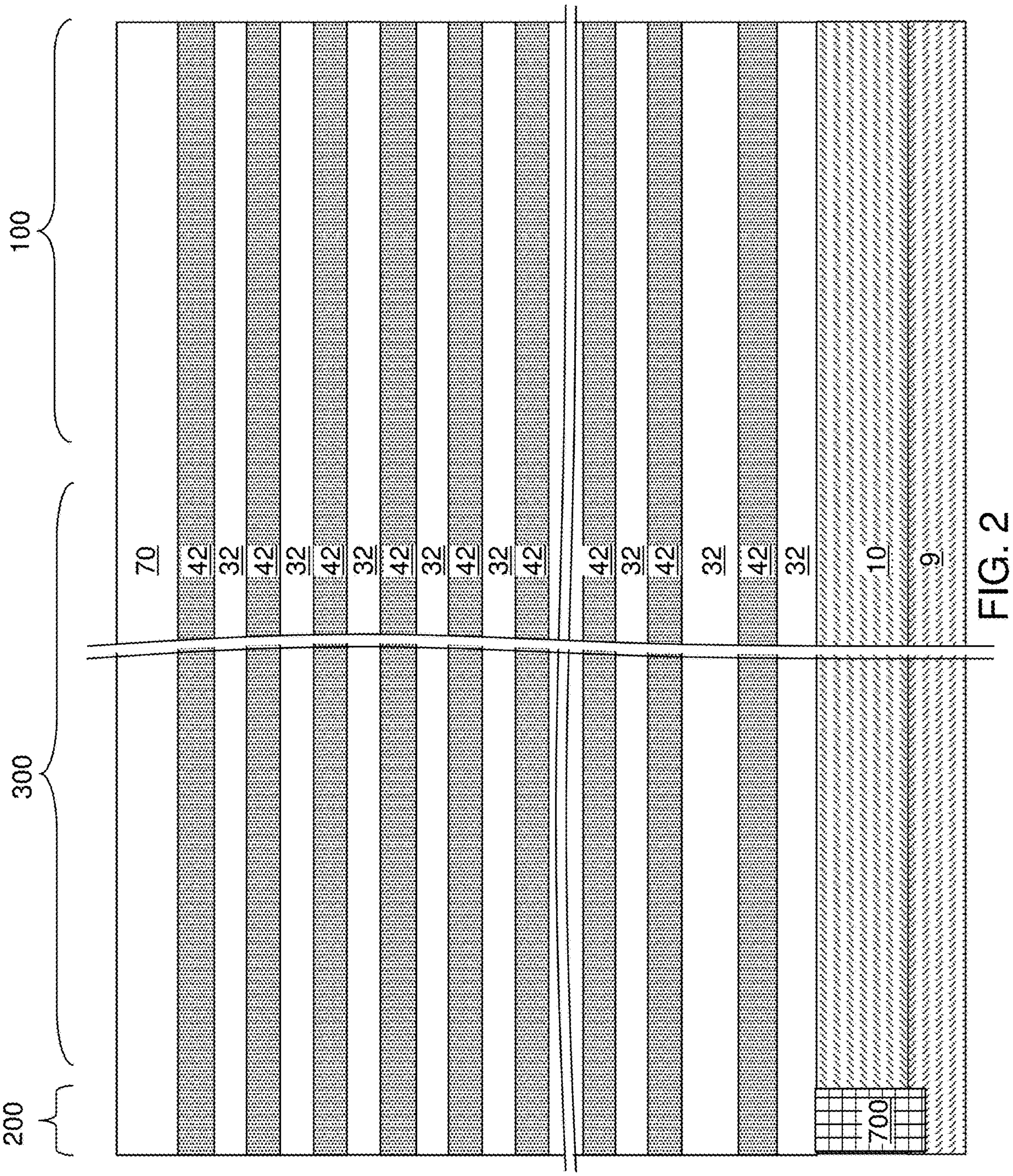
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which may be insulating layers 32) and second material layers (which may be sacrificial material layer 42) may be formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is used for the insulating layers 32, tetraethyl orthosilicate (TEOS) may be used as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be used. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the present disclosure describe embodiments in which the spacer material layers are sacrificial material layers 42 that are subsequently replaced with electrically conductive layers, in other embodiments the sacrificial material layers may be formed as electrically conductive layers. In such embodiments, steps for replacing the spacer material layers with electrically conductive layers may be omitted.

Optionally, an insulating cap layer 70 may be formed over the alternating stack (32, 42). The insulating cap layer 70 may include a dielectric material that is different from the material of the sacrificial material layers 42. In one embodiment, the insulating cap layer 70 may include a dielectric material that may be used for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Figure 3:
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces may be formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region may be formed in the staircase region 300, which is located between the memory array region 100 and the peripheral device region 200 containing the at least one semiconductor device 700 for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) may laterally extend farther than any overlying sacrificial material layer 42 within the alternating stack (32, 42) in the terrace region. The terrace region may include stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer. In one embodiment, each vertical step may have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets from the physically exposed surfaces of the sacrificial material layers 42 may also be used. Each sacrificial material layer 42 may have a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Figure 4A:
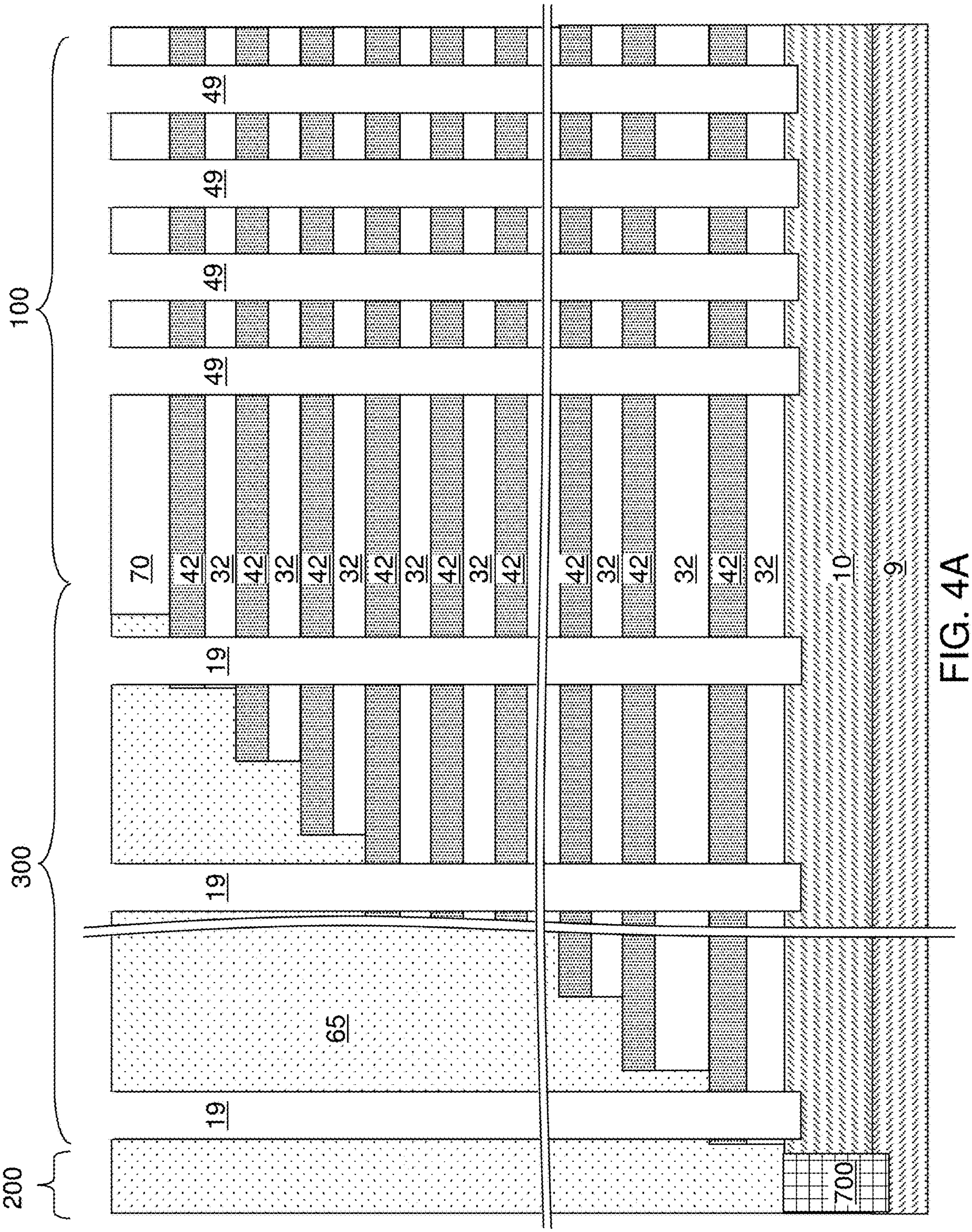
FIG. 4A is a schematic vertical cross-sectional view of the first exemplary structure after formation of memory openings and support openings according to the first embodiment of the present disclosure.
Figure 4B:
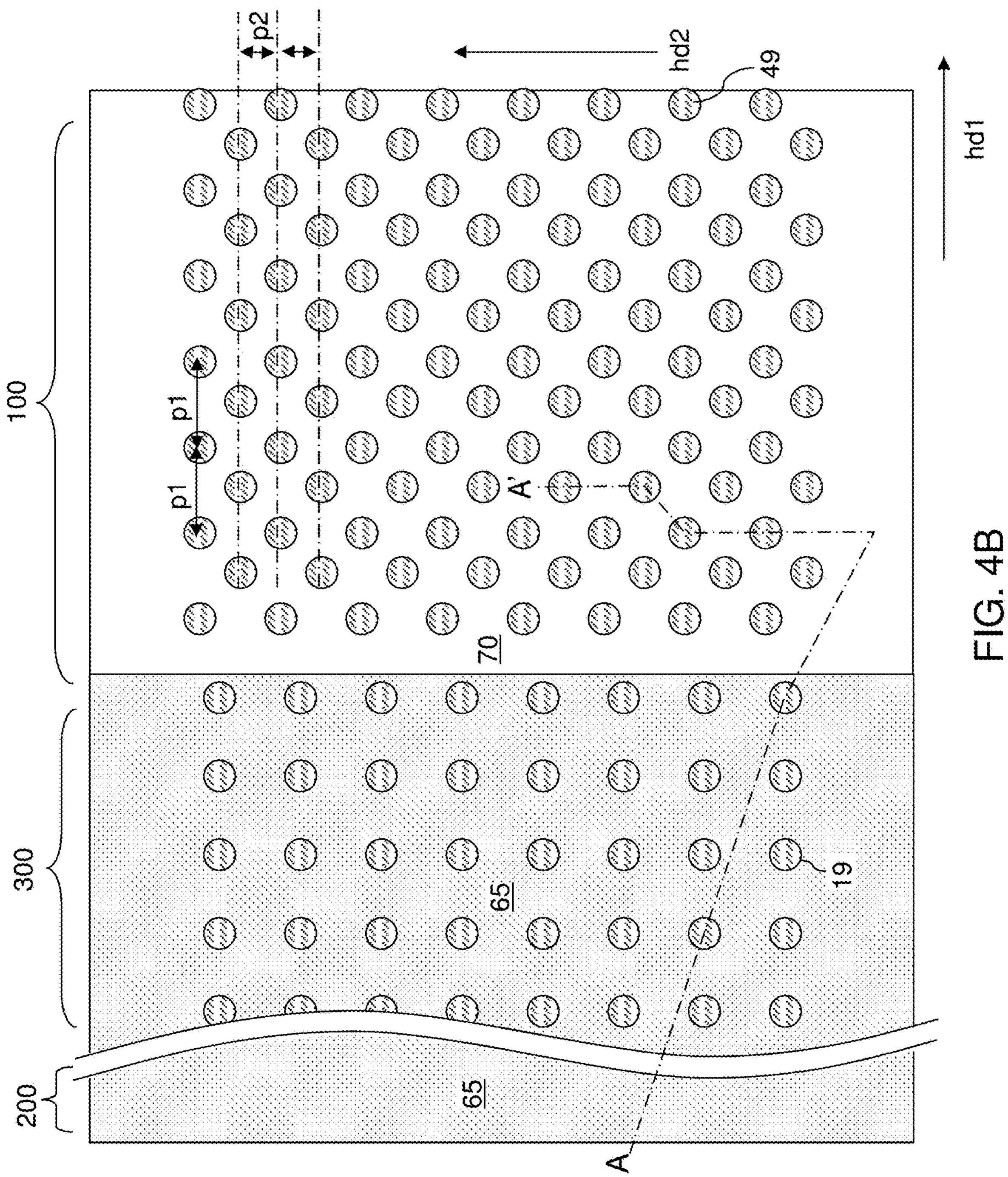
FIG. 4B is a top-down view of the first exemplary structure of FIG. 4A. The zig-zag vertical plane A-A' is the plane of the cross-section for FIG. 4A.

Referring to FIGS. 4A and 4B, a lithographic material stack (not shown) including at least a photoresist layer may be formed over the insulating cap layer 70 and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the insulating cap layer 70 or the retro-stepped dielectric material portion 65, and through the alternating stack (32, 42) by at least one anisotropic etch that uses the patterned lithographic material stack as an etch mask layer. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 may be formed through the insulating cap layer 70 and the entirety of the alternating stack (32, 42) in the memory array region 100. The support openings 19 may be formed through the retro-stepped dielectric material portion 65 and the portion of the alternating stack (32, 42) that underlie the stepped surfaces in the staircase region 300.

The memory openings 49 may extend through the entirety of the alternating stack (32, 42). The support openings 19 may extend through a subset of layers within the alternating stack (32, 42). The chemistry of the anisotropic etch process used to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

The memory openings 49 may be arranged in rows that extend along a first horizontal direction hd1 and laterally spaced apart along a second horizontal direction hd2 that is perpendicular to the first horizontal direction hd1. Memory openings 49 in each row may have a uniform intra-row pitch p1, which is the center-to-center distance between a neighboring pair of memory openings 49 within a row of memory openings 49. Further, the rows of memory openings 49 may be arranged along the second horizontal direction hd2 with a uniform inter-row pitch p2, or a row-to-row pitch, which is the distance between a first vertical plane passing through geometrical centers of a first row of memory openings 49 and a second vertical plane passing through geometrical centers of a second row of memory openings 49 that neighbors the first row of memory openings 49. In one embodiment, the memory openings 49 may be arranged as two-dimensional periodic arrays that are laterally spaced apart along the second horizontal direction hd2. Each two-dimensional periodic array of memory openings 49 may include multiple rows of memory openings 49 such that each neighboring pair of rows of memory openings 49 has a uniform inter-row pitch p2. The number of rows of memory openings 49 within each two-dimensional periodic array of memory openings 49 may be in a range from 4 to 32, such as from 8 to 16, although lesser and greater number of rows may be used for each two-dimensional periodic array of memory openings 49.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each of the support openings 19.

Figure 5B:
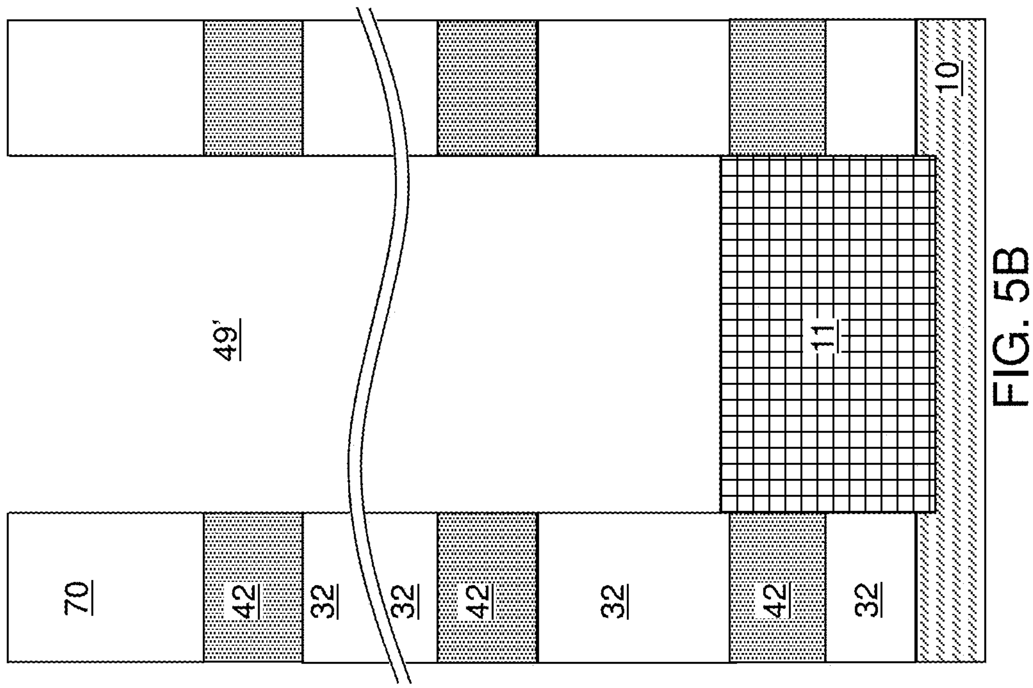
FIGS. 5A-5H are sequential schematic vertical cross-sectional views of a memory opening within the first exemplary structure during formation of a memory stack structure, an optional dielectric core, and a drain region therein according to the first embodiment of the present disclosure.
Figure 5A:
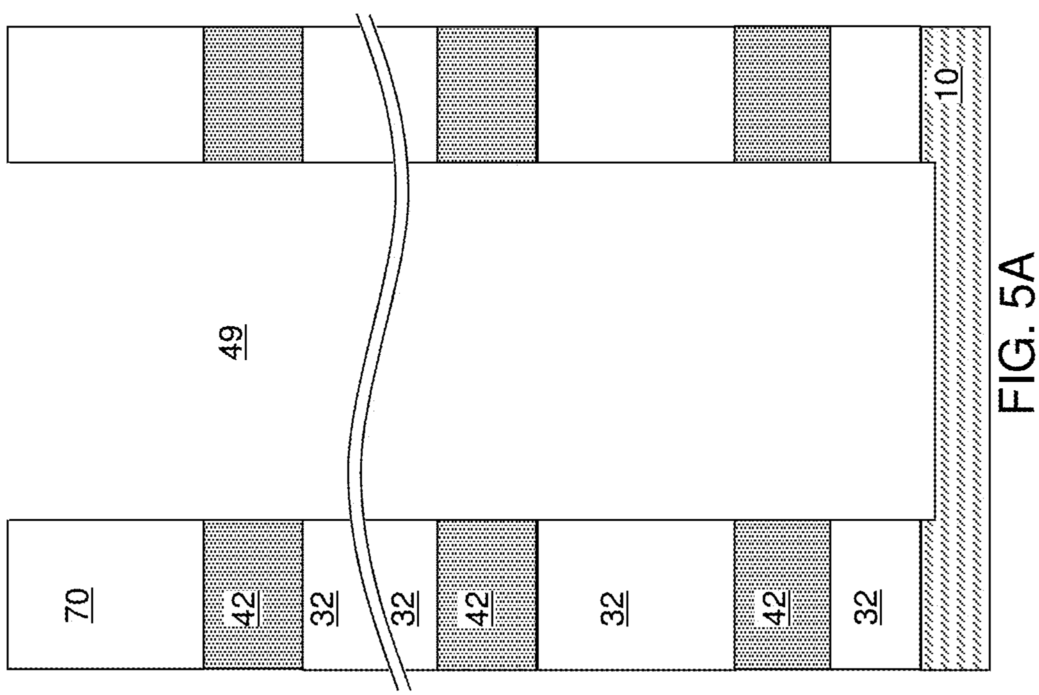

Referring to FIG. 5A, a memory opening 49 in the exemplary device structure of FIGS. 4A and 4B is illustrated. The memory opening 49 may extend through the insulating cap layer 70, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Optionally, the sacrificial material layers 42 may be laterally recessed partially to form lateral recesses (not shown), for example, by an isotropic etch.

Referring to FIG. 5B, an optional pedestal channel portion (e.g., an epitaxial pedestal) 11 may be formed at the bottom portion of each memory opening 49 and each support openings 19, for example, by selective epitaxy. Each pedestal channel portion 11 may comprise a single crystalline semiconductor material in epitaxial alignment with the single crystalline semiconductor material of the semiconductor material layer 10. In one embodiment, the top surface of each pedestal channel portion 11 may be formed above a horizontal plane including the top surface of a bottommost sacrificial material layer 42. In this case, a source select gate electrode may be subsequently formed by replacing the bottommost sacrificial material layer 42 with a conductive material layer. The pedestal channel portion 11 may be a portion of a transistor channel that extends between a source region to be subsequently formed in the substrate (9, 10) and a drain region to be subsequently formed in an upper portion of the memory opening 49. A memory cavity 49' may be present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the substrate semiconductor layer 9, which may have a doping of the first conductivity type.

Figure 5D:
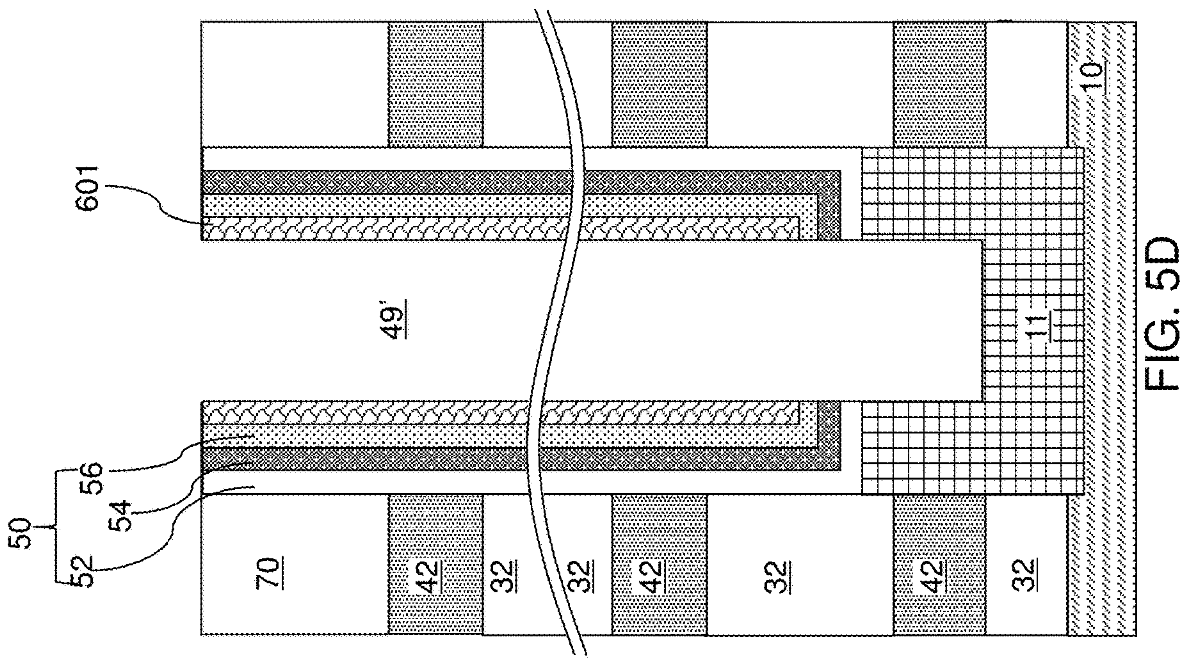
Figure 5C:
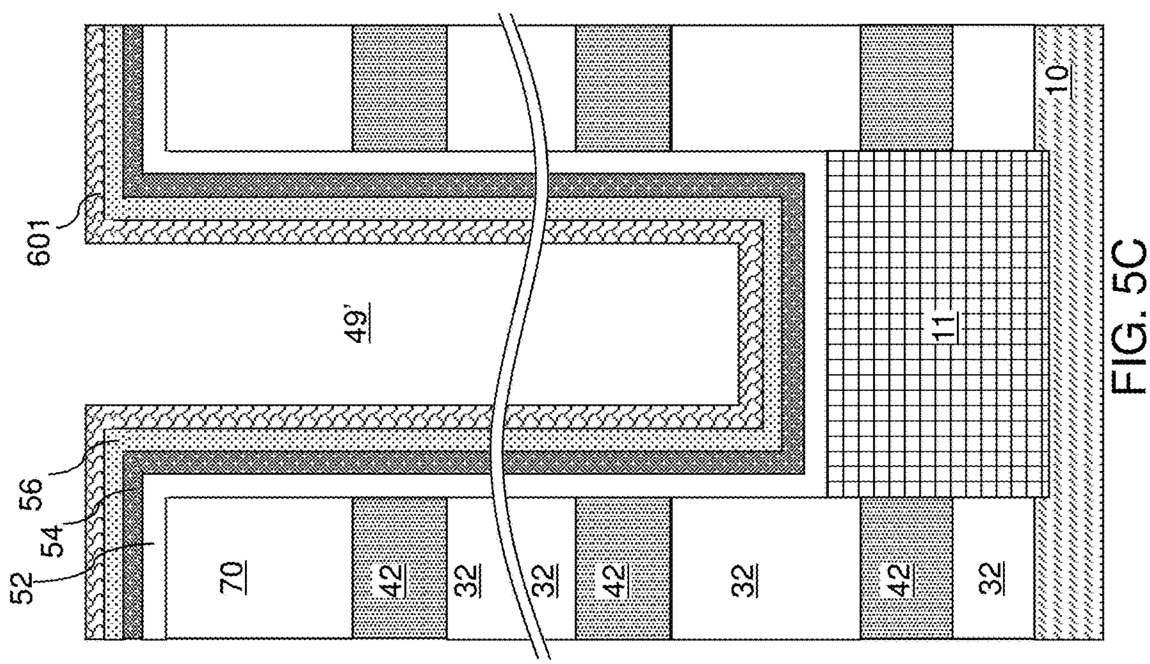

Referring to FIG. 5C, a stack of layers including a blocking dielectric layer 52, a charge storage layer 54, a tunneling dielectric layer 56, and an optional first semiconductor channel layer 601 may be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively, or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer.

In another embodiment, the sacrificial material layers 42 may be laterally recessed with respect to the sidewalls of the insulating layers 32, and a combination of a deposition process and an anisotropic etch process may be used to form the charge storage layer 54 as a plurality of memory material portions that are vertically spaced apart. While the present disclosure describes some embodiments in which the charge storage layer 54 is a single continuous layer, in other embodiments the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively, or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The optional first semiconductor channel layer 601 may include a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 may include amorphous silicon or polysilicon. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be used. A memory cavity 49' may be formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, and the blocking dielectric layer 52 may be sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 may be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' may be removed to form openings in remaining portions thereof. Each of the first semiconductor channel layer 601, the tunneling dielectric layer 56, the charge storage layer 54, and the blocking dielectric layer 52 may be etched by a respective anisotropic etch process using a respective etch chemistry, which may, or may not, be the same for the various material layers.

Each remaining portion of the first semiconductor channel layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) may be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' may be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 may be located over the charge storage layer 54. A set of a blocking dielectric layer 52, a charge storage layer 54, and a tunneling dielectric layer 56 in a memory opening 49 may constitute a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 may have vertically coincident sidewalls.

Figure 5F:
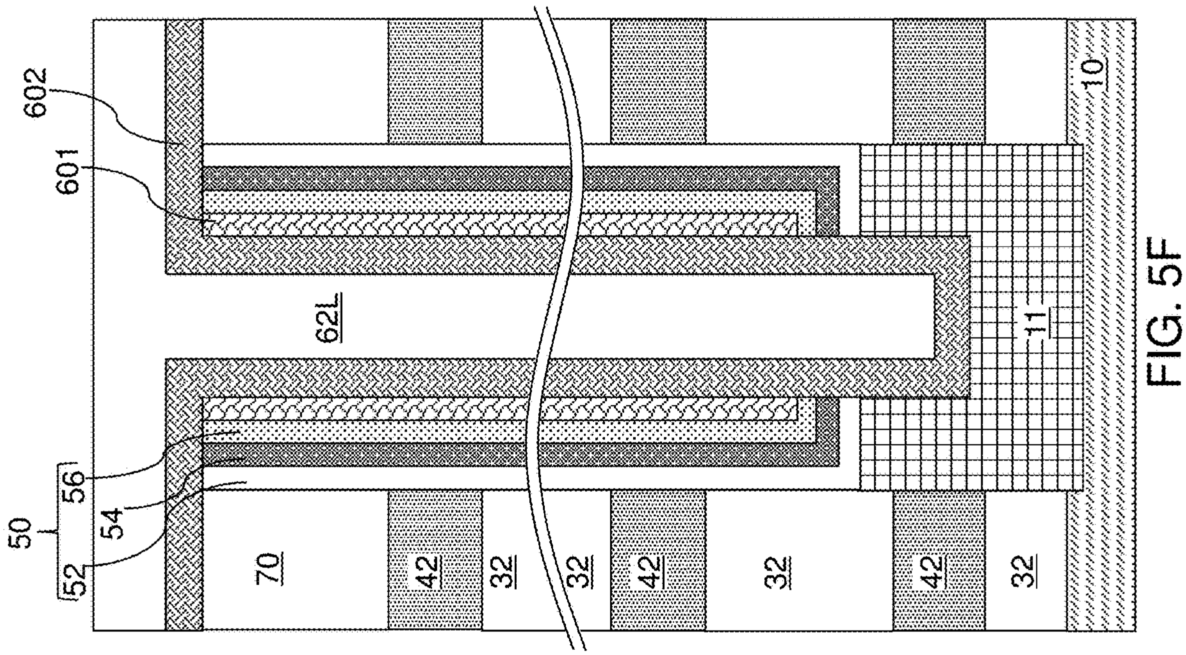
Figure 5E:
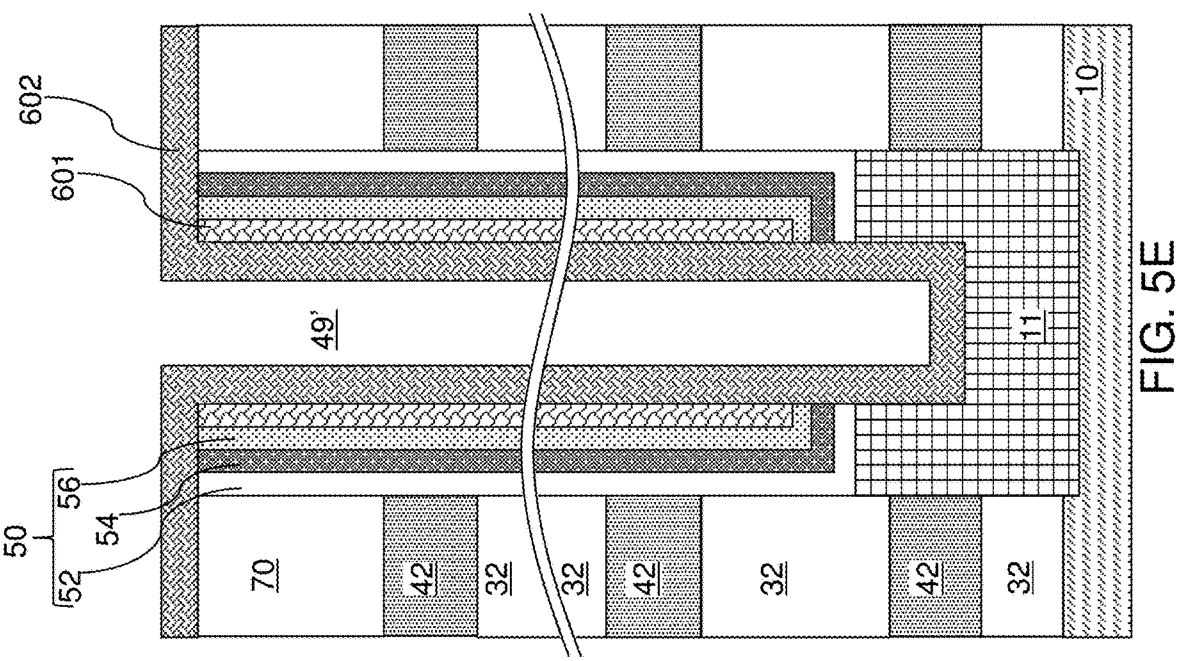

Referring to FIG. 5E, a second semiconductor channel layer 602 may be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 may include a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 may include amorphous silicon or polysilicon. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in embodiments in which the memory cavity 49' in each memory opening is not completely filled by the second semiconductor channel layer 602, a dielectric core layer 62L may be deposited in the memory cavity 49' to fill any remaining portion of the memory cavity 49' within each memory opening. The dielectric core layer 62L may include a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Figure 5H:
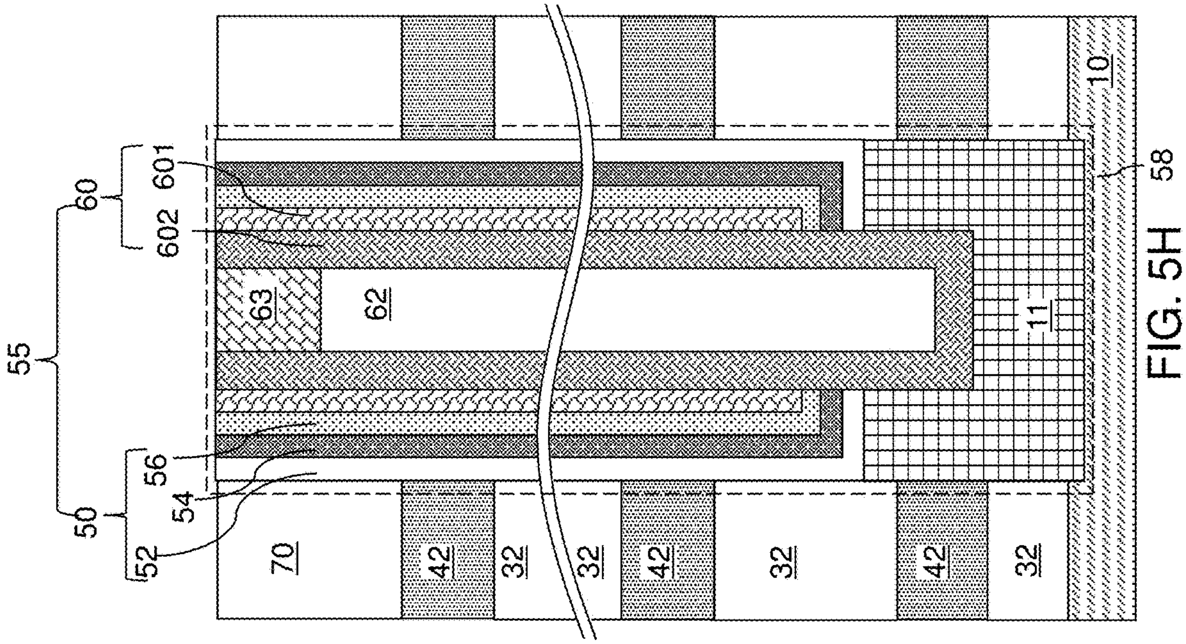
Figure 5G:
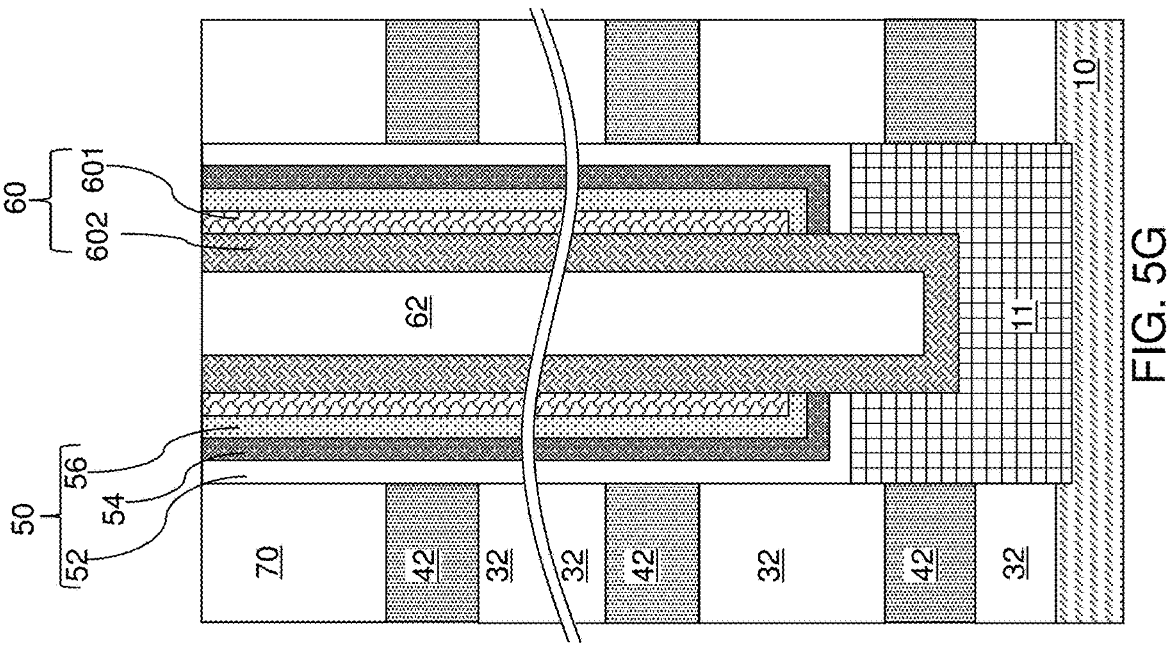

Referring to FIG. 5G, the horizontal portion of the dielectric core layer 62L may be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 may be removed by a planarization process, which may use a recess etch or chemical mechanical planarization (CMP). Each remaining portion of the second semiconductor channel layer 602 may be located entirety within a memory opening 49 or entirely within a support opening 19.

Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. A tunneling dielectric layer 56 may be surrounded by a charge storage layer 54, and laterally surrounds a portion of the vertical semiconductor channel 60. Each adjoining set of a blocking dielectric layer 52, a charge storage layer 54, and a tunneling dielectric layer 56 may collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 may be further recessed within each memory opening, for example, by a recess etch to a depth that is located between the top surface of the insulating cap layer 70 and the bottom surface of the insulating cap layer 70. Drain regions 63 may be formed by depositing a doped semiconductor material within each recessed region above the dielectric cores 62. The drain regions 63 may have a doping of a second conductivity type that is the opposite of the first conductivity type. For example, if the first conductivity type is p-type, the second conductivity type is n-type, and vice versa. The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon. Excess portions of the deposited semiconductor material may be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 may fill the respective support openings 19, and constitutes a support pillar structure.

Figure 6:
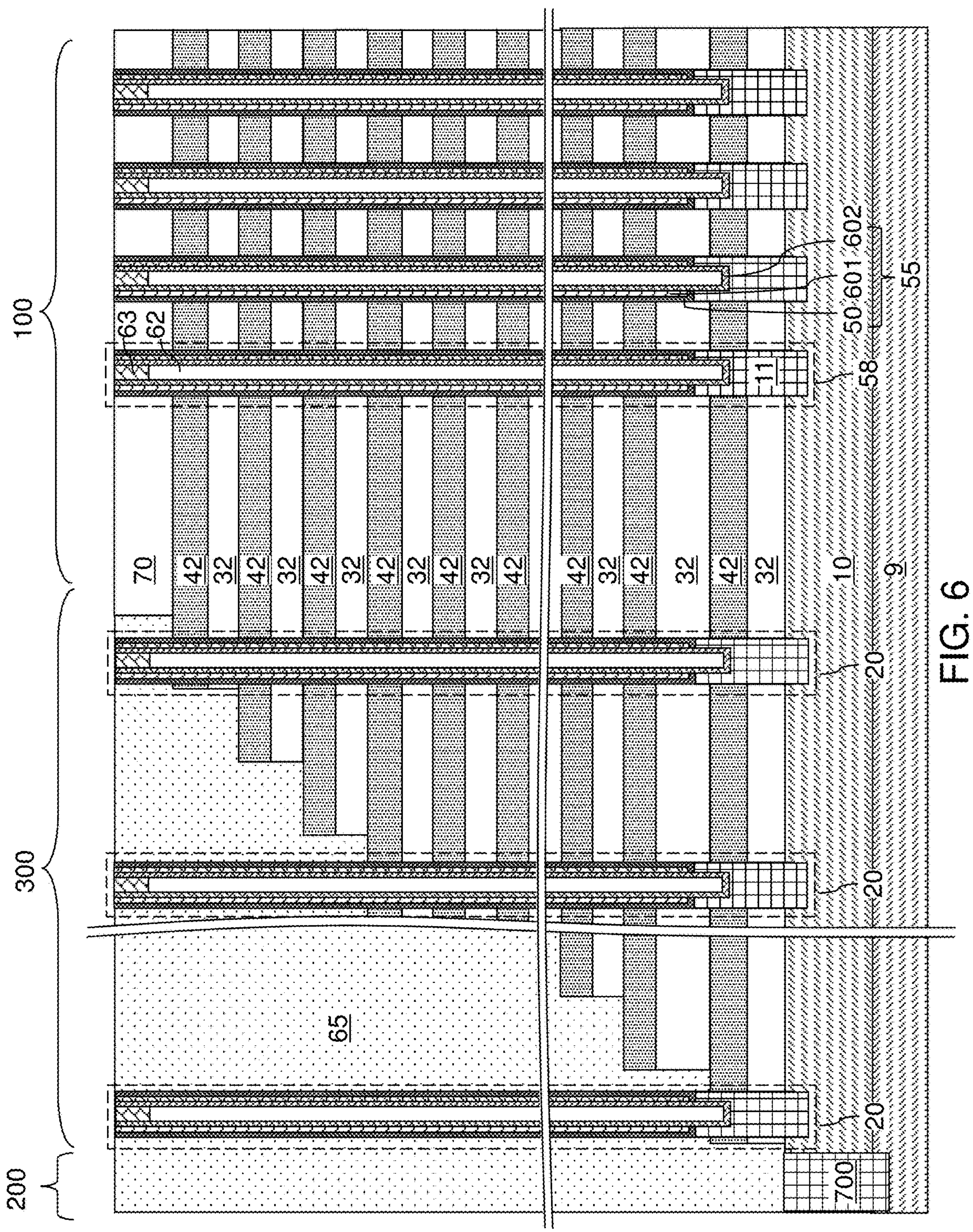
FIG. 6 is a schematic vertical cross-sectional view of the first exemplary structure after formation of memory stack structures and support pillar structures according to the first embodiment of the present disclosure.

Referring to FIG. 6, the first exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 4A and 4B. An instance of the support pillar structure 20 may be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52. While the present disclosure is described using the illustrated configuration for the memory stack structure, the methods of the present disclosure may be applied to alternative memory stack structures including different layer stacks or structures for the memory film 50 and/or for the vertical semiconductor channel 60.

Each memory stack structure 55 may be formed in a respective one of the memory openings 49. As such, the memory stack structures 55 may be arranged in two rows that extend along the first horizontal direction hd1. Memory stack structures 55 within each row have a uniform intra-row pitch p1. In one embodiment, the memory stack structures 55 may be arranged as a two-dimensional periodic array in which each neighboring pair of rows of memory stack structures 55 has a uniform inter-row pitch p2.

Figure 7A:
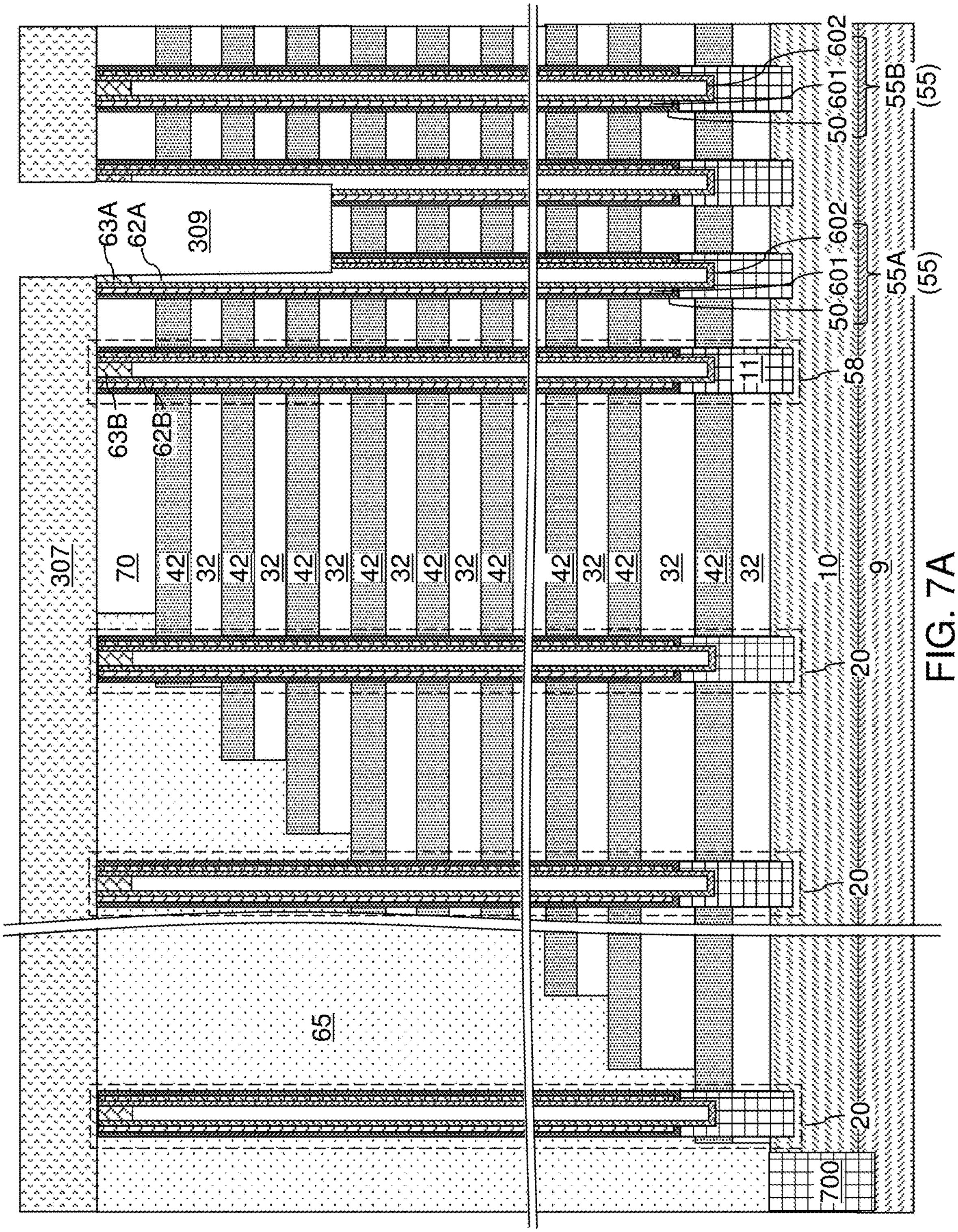
FIG. 7A is a schematic vertical cross-sectional view of the first exemplary structure after formation of drain-select-level trenches according to the first embodiment of the present disclosure.
Figure 7B:
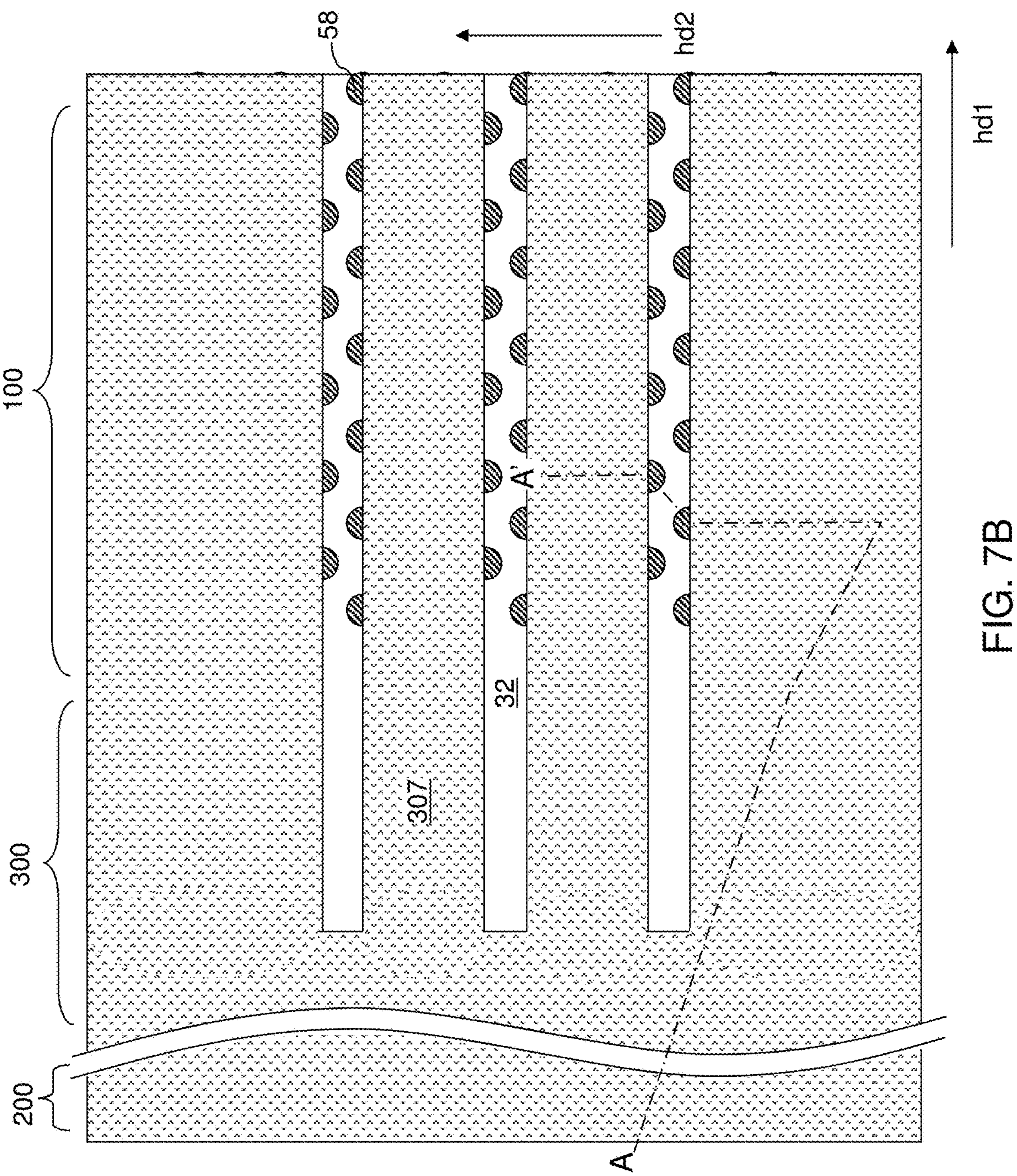
FIG. 7B is a partial see-through top-down view of the first exemplary structure of FIG. 7A. The zig-zag vertical plane A-A' is the plane of the schematic vertical cross-sectional view of FIG. 7A.

Referring to FIGS. 7A and 7B, a patterned etch mask layer 307 including elongated openings may be formed over the alternating stack (32, 42) and the memory stack structures 55. In one embodiment, the patterned etch mask layer 307 may be a patterned photoresist layer formed by application and lithographic patterning of a photoresist material over the alternating stack (32, 42) and the memory stack structures 55. Each opening in the patterned etch mask layer 307 may overlie a segment of each memory stack structure 55 within a neighboring pair of rows of memory stack structures 55. Each memory stack structure 55 of which a segment is located within an area of one of the openings in the patterned etch mask layer 307 is herein referred to as a first memory stack structure 55A. Memory stack structures 55 that are entirely covered with the patterned etch mask layer 307, for example, by being located between neighboring pairs of first memory stack structures 55A and second memory stack structure 55B. Second memory stack structures 55B may, or may not, be present in the first exemplary structure depending on the layout of the elongated openings in the patterned etch mask layer 307. Each first memory stack structure 55A may be only partly covered with the patterned etch mask layer 307. As such, a first area of each of the first memory stack structures 55A may be located within an area of an elongated opening in the patterned etch mask layer 307, and a second area of each of the first memory stack structures 55B may be covered by the patterned etch mask layer 307. The first area may be in a range from 15% to 70%, such as from 25% to 50%, of the entire area of each first memory stack structure 55A.

Drain regions 63 at an upper end of the first memory stack structures 55A are herein referred to as first drain regions 63A, and drain regions 63 at an upper end of the second memory stack structures 55B are herein referred to as second drain regions 63B. Dielectric cores 62 formed within the first memory stack structures 55A are herein referred to as first dielectric cores 62A, and dielectric cores 62 formed within the second memory stack structures 55B are herein referred to as second dielectric cores 62B.

An anisotropic etch process may be performed to etch an upper portion of the alternating stack (32, 42) and unmasked segments of the first memory stack structures 55A. The unmasked segments of the first memory stack structures 55A include portions of vertical semiconductor channels 60 and the memory films 50 of the first memory stack structures 55A that are not masked by the patterned etch mask layer 307. A drain-select-level trench 309 may be formed underneath each elongated opening within the patterned etch mask layer 307 by etching through an upper portion of the alternating stack (32, 42) and a first area of each of the first memory stack structures 55A. Each drain-select-level trench 309 may include a pair of straight lengthwise sidewalls that extend along the first horizontal direction hd1. The depth of the drain-select-level trenches 309 may be selected such that the drain-select-level trenches 309 vertically extend through each sacrificial material layer located at drain select levels, i.e., levels in which drain-select-level electrically conductive layers that function as drain select gate electrodes are to be subsequently formed.

The anisotropic etch process may etch portions of memory films 50 and vertical semiconductor channels 60 of the first memory stack structure 55A that underlie the elongated opening in the patterned etch mask layer 307. A portion of each first drain region 63A may be removed during formation of the drain-select-level trenches 309. The pair of straight lengthwise sidewalls of each drain-select-level trench 309 may comprise straight sidewall segments of remaining portions of the first drain regions 63A and straight sidewall segments of the dielectric cores 62. The memory stack structures 55 may comprise second memory stack structures 55B that are masked with a patterned etch mask layer 307 during formation of the drain-select-level trenches 309. Sidewalls of the second memory stack structures 55B are not etched during formation of the drain-select-level trenches 309. Thus, each vertical semiconductor channel 60 of the second memory stack structures 55B has a tubular configuration. The patterned etch mask layer 307 may be removed, for example, by ashing after formation of the drain-select-level trenches 309.

Figure 8A:
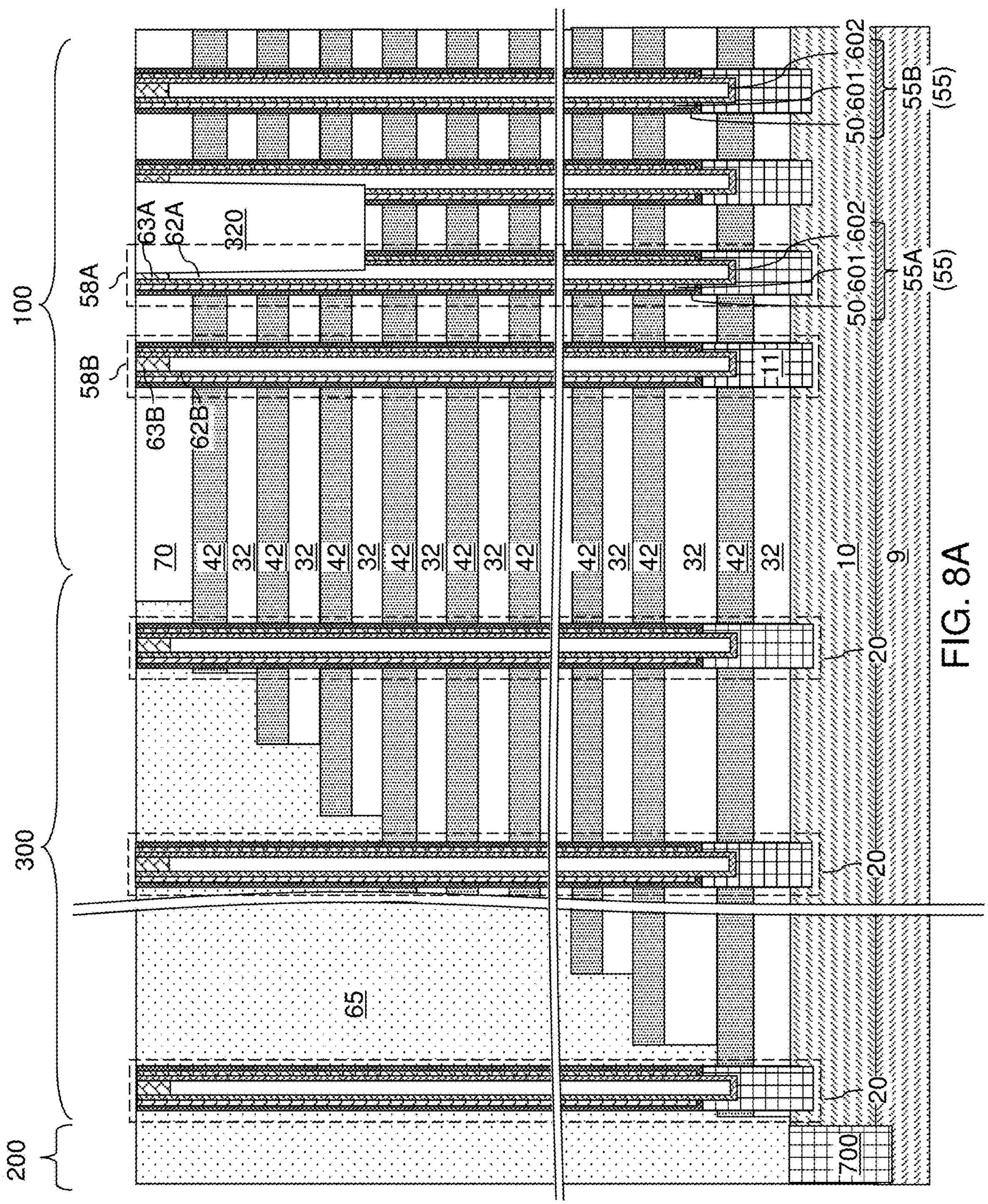
FIG. 8A is a schematic vertical cross-sectional view of the first exemplary structure after formation of drain-select-level isolation structures according to the first embodiment of the present disclosure.
Figure 8B:
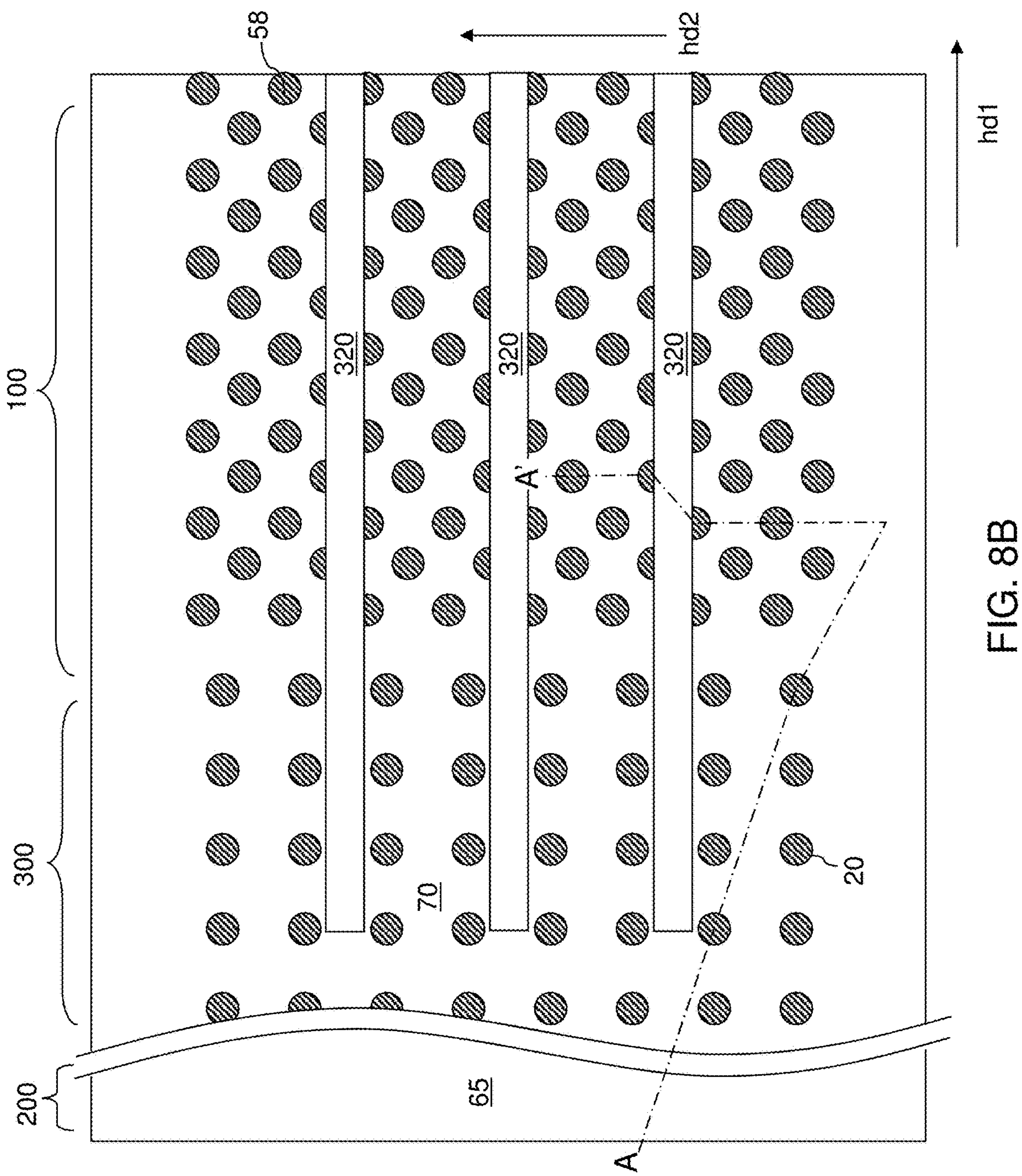
FIG. 8B is a partial see-through top-down view of the first exemplary structure of FIG. 7A. The zig-zag vertical plane A-A' is the plane of the schematic vertical cross-sectional view of FIG. 7A.

Referring to FIGS. 8A and 8B, a drain-select-level isolation structure 320 may be formed in each drain-select-level trench 309, for example, by depositing a dielectric material such as silicon oxide in the drain-select-level trenches 309. Excess portions of the dielectric material may be removed from above the horizontal plane including the top surface of the insulating cap layer 70 by a planarization process, which may use a recess etch and/or chemical mechanical planarization. Each drain-select-level isolation structure 320 may include a pair of straight sidewalls that laterally extend along the first horizontal direction hd1. Each drain-select-level isolation structure 320 may vertically extend through a plurality of sacrificial material layers 42 including a topmost one of the sacrificial material layers 42 within the alternating stack (32, 42). Each vertical semiconductor channel 60 within the first memory stack structures 55A may comprise a tubular section that underlie a horizontal plane including a bottom surface of a drain-select-level isolation structure 320 and a semi-tubular section overlying the tubular section and contacting the drain-select-level isolation structure 320. As used herein, a "tubular" element refers to an element that has a shape of a tube. As used herein, a "semi-tubular" element refers to an element having a shape obtained by cutting off a segment of a tubular element to provide two vertically-extending sidewalls in a remaining portion of the tubular element.

Figure 9A:
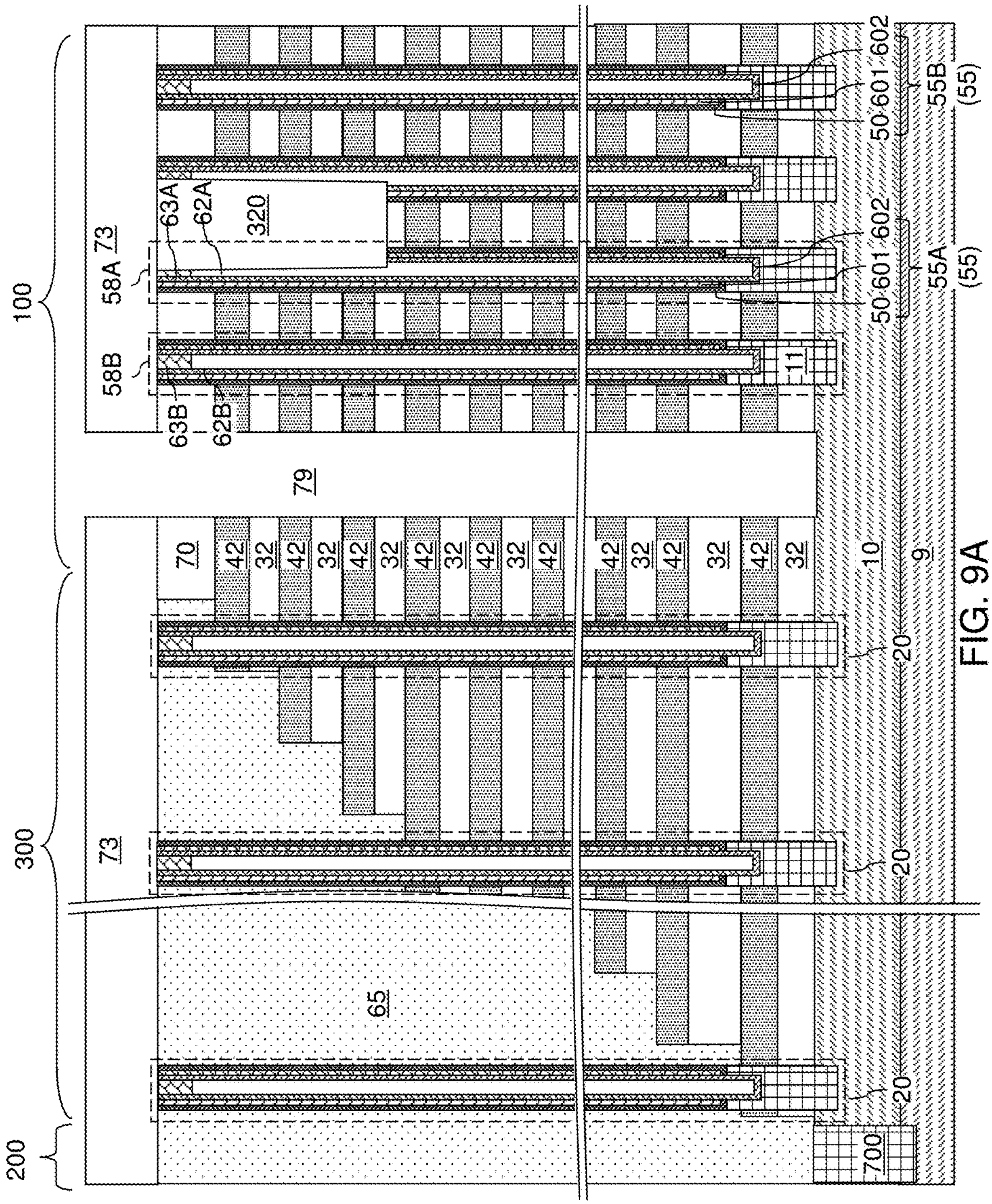
FIG. 9A is a schematic vertical cross-sectional view of the first exemplary structure after formation of backside trenches according to the first embodiment of the present disclosure.
Figure 9B:
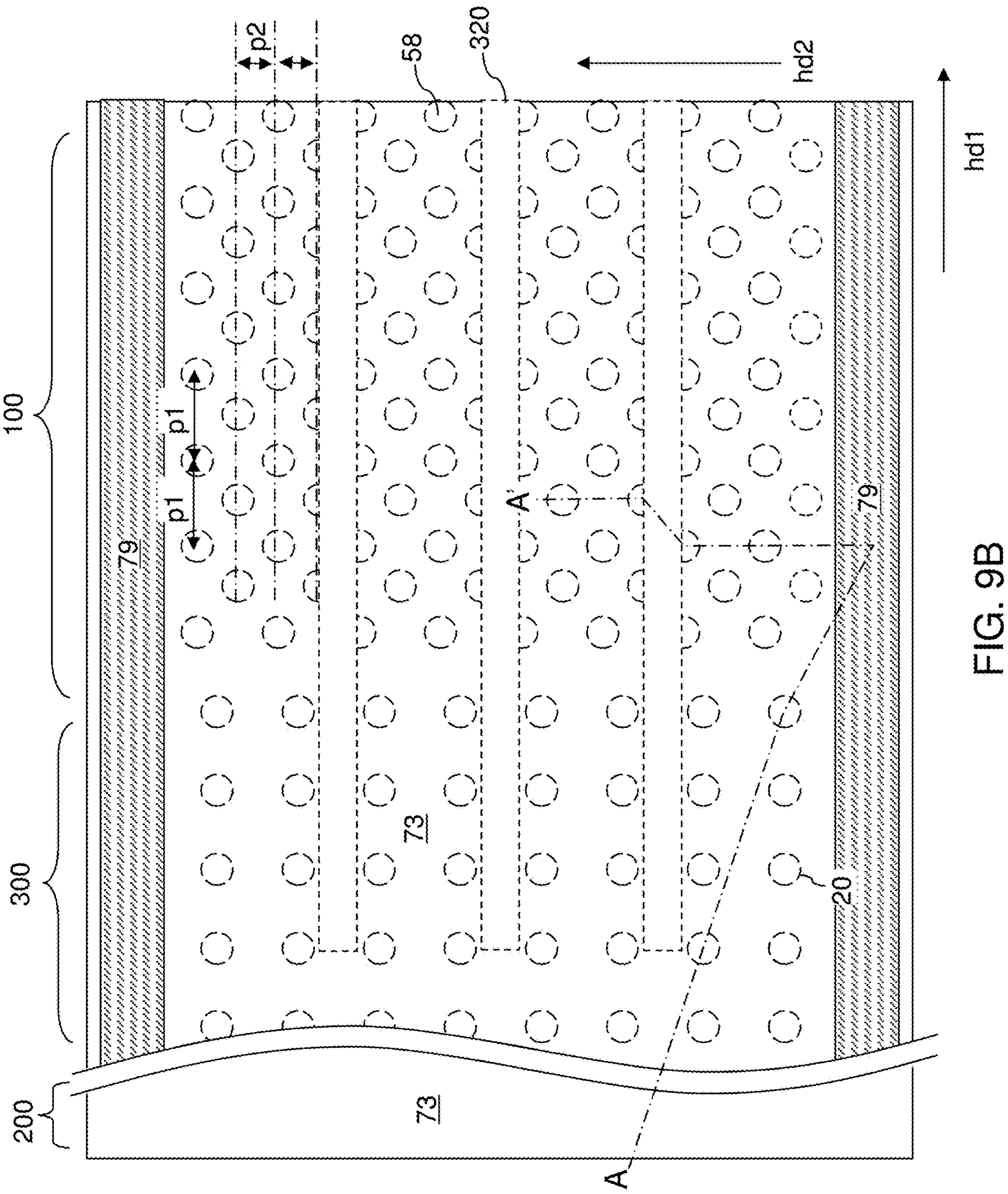
FIG. 9B is a partial see-through top-down view of the first exemplary structure of FIG. 7A. The zig-zag vertical plane A-A' is the plane of the schematic vertical cross-sectional view of FIG. 7A.

Referring to FIGS. 9A and 9B, a contact level dielectric layer 73 may be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be used.

A photoresist layer (not shown) may be applied over the contact level dielectric layer 73, and may be lithographically patterned to form openings in areas between clusters of memory stack structures 55. The pattern in the photoresist layer may be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 may laterally extend along a first horizontal direction hd1 and may be laterally spaced apart from one another along a second horizontal direction hd2 that is perpendicular to the first horizontal direction hd1. The memory stack structures 55 may be arranged in rows that extend along the first horizontal direction hd1.

The drain-select-level isolation structures 320 may laterally extend along the first horizontal direction hd1. Each backside trench 79 may have a uniform width that is invariant along the lengthwise direction (i.e., along the first horizontal direction hd1). Each drain-select-level isolation structure 320 may have a uniform vertical cross-sectional profile along vertical planes that are perpendicular to the first horizontal direction hd1 that is invariant with translation along the first horizontal direction hd1. Each drain-select-level isolation structure 320 contacts two rows of first memory stack structures 55A. In one embodiment, the backside trenches 79 may include a source contact opening in which a source contact via structure may be subsequently formed. The photoresist layer may be removed, for example, by ashing.

Figure 10:
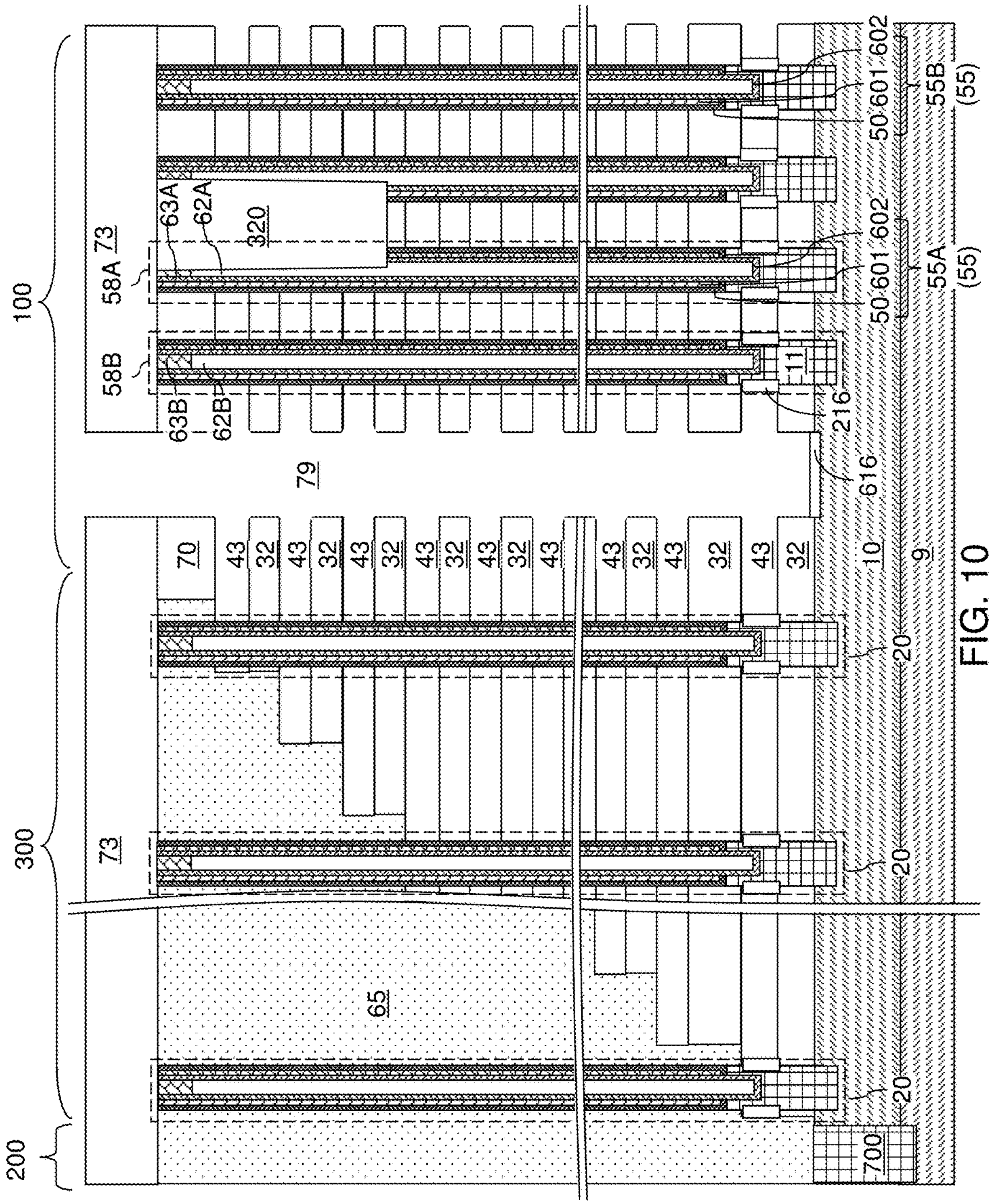
FIG. 10 is a schematic vertical cross-sectional view of the first exemplary structure after formation of backside recesses according to the first embodiment of the present disclosure.
Figure 11B:
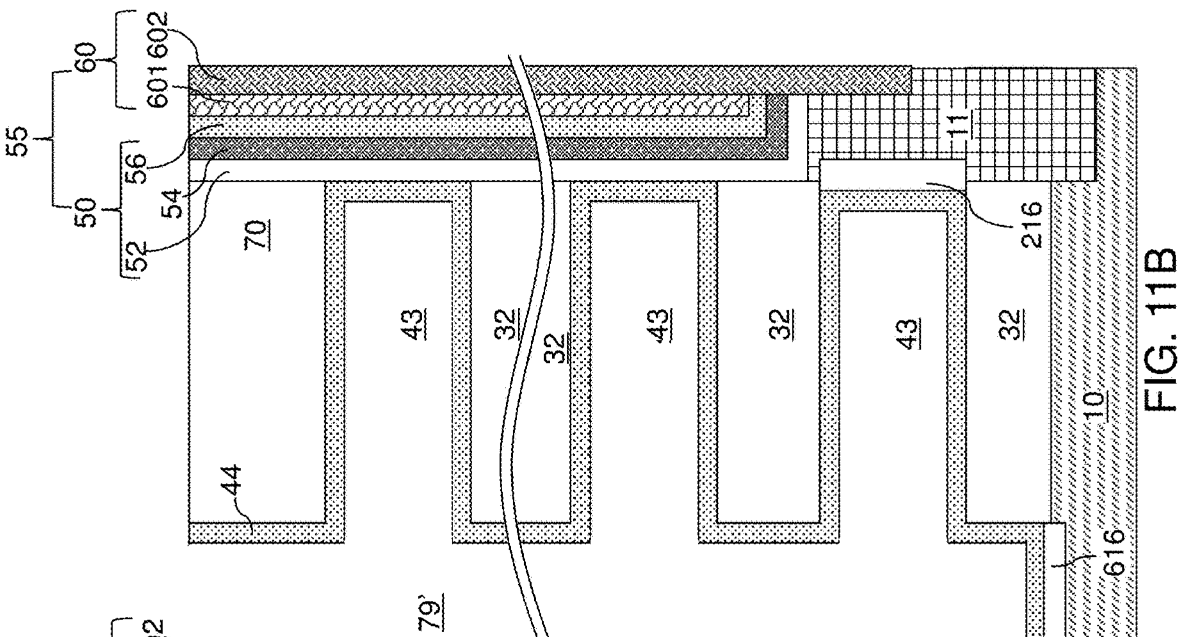
FIGS. 11A-11D are sequential vertical cross-sectional views of a region of the first exemplary structure during formation of electrically conductive layers according to the first embodiment of the present disclosure.
Figure 11A:
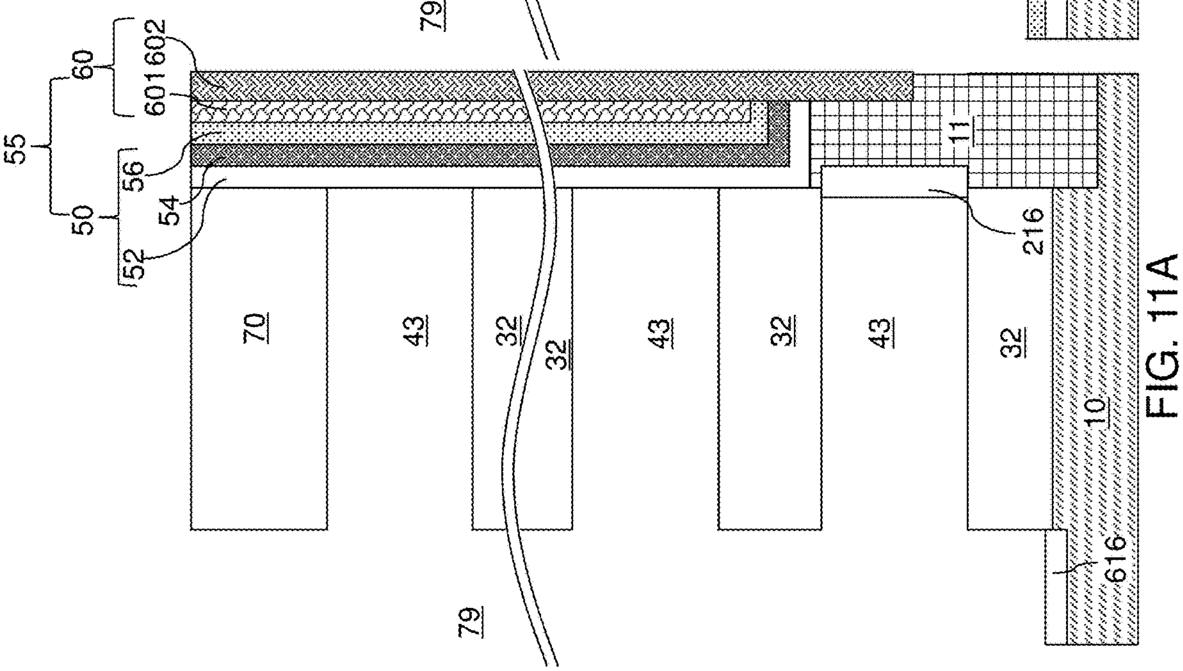

Referring to FIGS. 10 and 11A, an etchant that selectively etches the second material of the sacrificial material layers 42 with respect to the first material of the insulating layers 32 may be introduced into the backside trenches 79, for example, using an etch process. FIG. 9A illustrates a region of the first exemplary structure of FIG. 8. Backside recesses 43 may be formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 may be selected from silicon oxide and dielectric metal oxides.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers 42 include silicon nitride, the etch process may be a wet etch process in which the first exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 may provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 216, and to convert each physically exposed surface portion of the semiconductor material layer 10 into a planar dielectric portion 616. In one embodiment, each tubular dielectric spacer 216 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 216 may include a dielectric material that includes the same semiconductor element as the pedestal channel portions 11 and additionally includes at least one non-metallic element such as oxygen and/or nitrogen such that the material of the tubular dielectric spacers 216 is a dielectric material. In one embodiment, the tubular dielectric spacers 216 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 11B, a backside blocking dielectric layer 44 may be optionally formed. The backside blocking dielectric layer 44, if present, comprises a dielectric material that functions as a control gate dielectric for the control gates to be subsequently formed in the backside recesses 43. In embodiments in which the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 may be formed in the backside recesses 43 and on a sidewall of the backside trench 79. The backside blocking dielectric layer 44 may be formed directly on horizontal surfaces of the insulating layers 32 and sidewalls of the memory stack structures 55 within the backside recesses 43. If the backside blocking dielectric layer 44 is formed, formation of the tubular dielectric spacers 216 and the planar dielectric portion 616 prior to formation of the backside blocking dielectric layer 44 is optional. In one embodiment, the backside blocking dielectric layer 44 may be formed by a conformal deposition process such as atomic layer deposition (ALD). The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively, or additionally, the backside blocking dielectric layer 44 may include a silicon oxide layer. The backside blocking dielectric layer 44 may be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figures 11C, 11D:
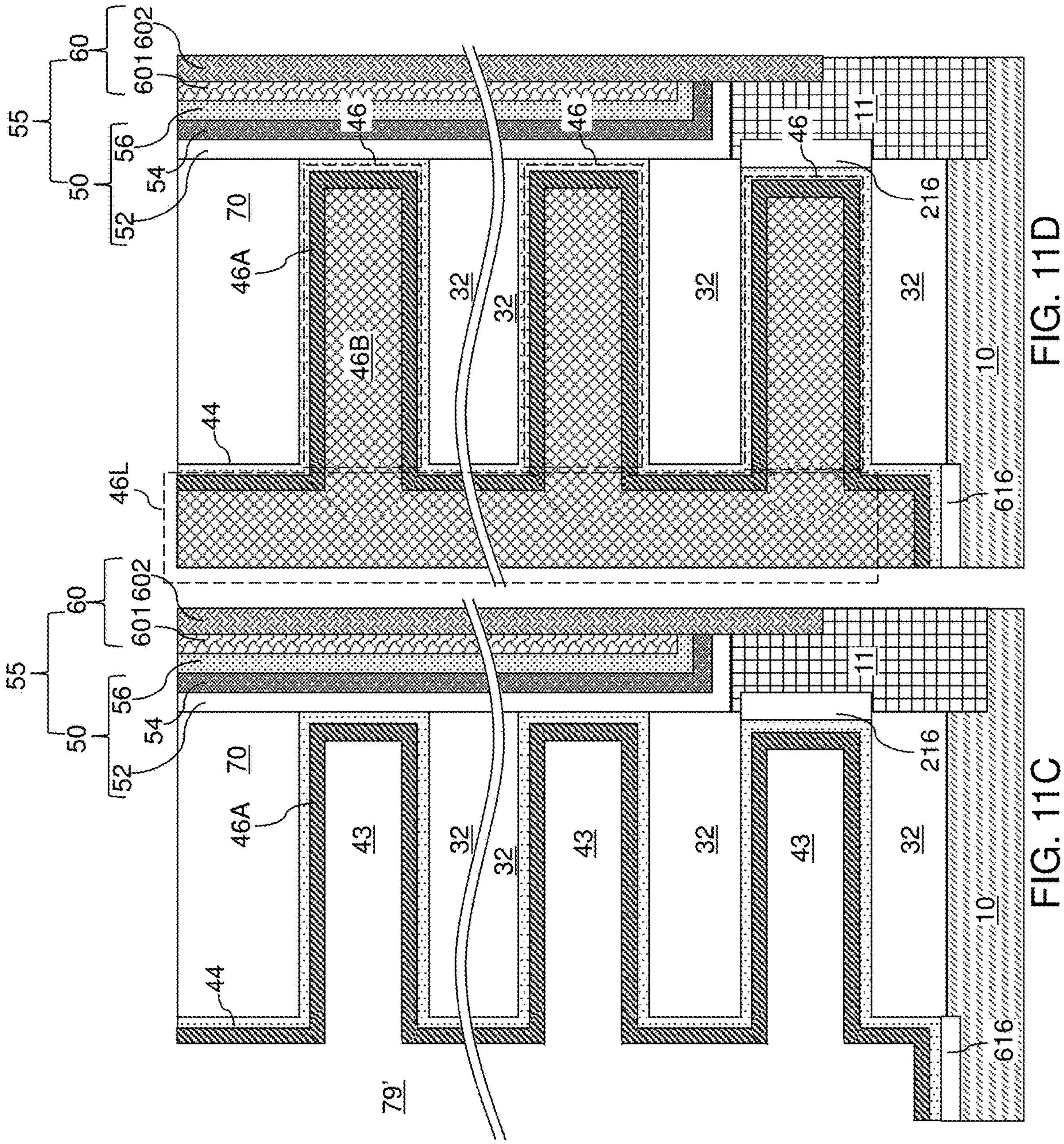

Referring to FIG. 11C, a metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be used. In one embodiment, the metallic barrier layer 46A may consist essentially of a conductive metal nitride such as TiN.

Figure 12:
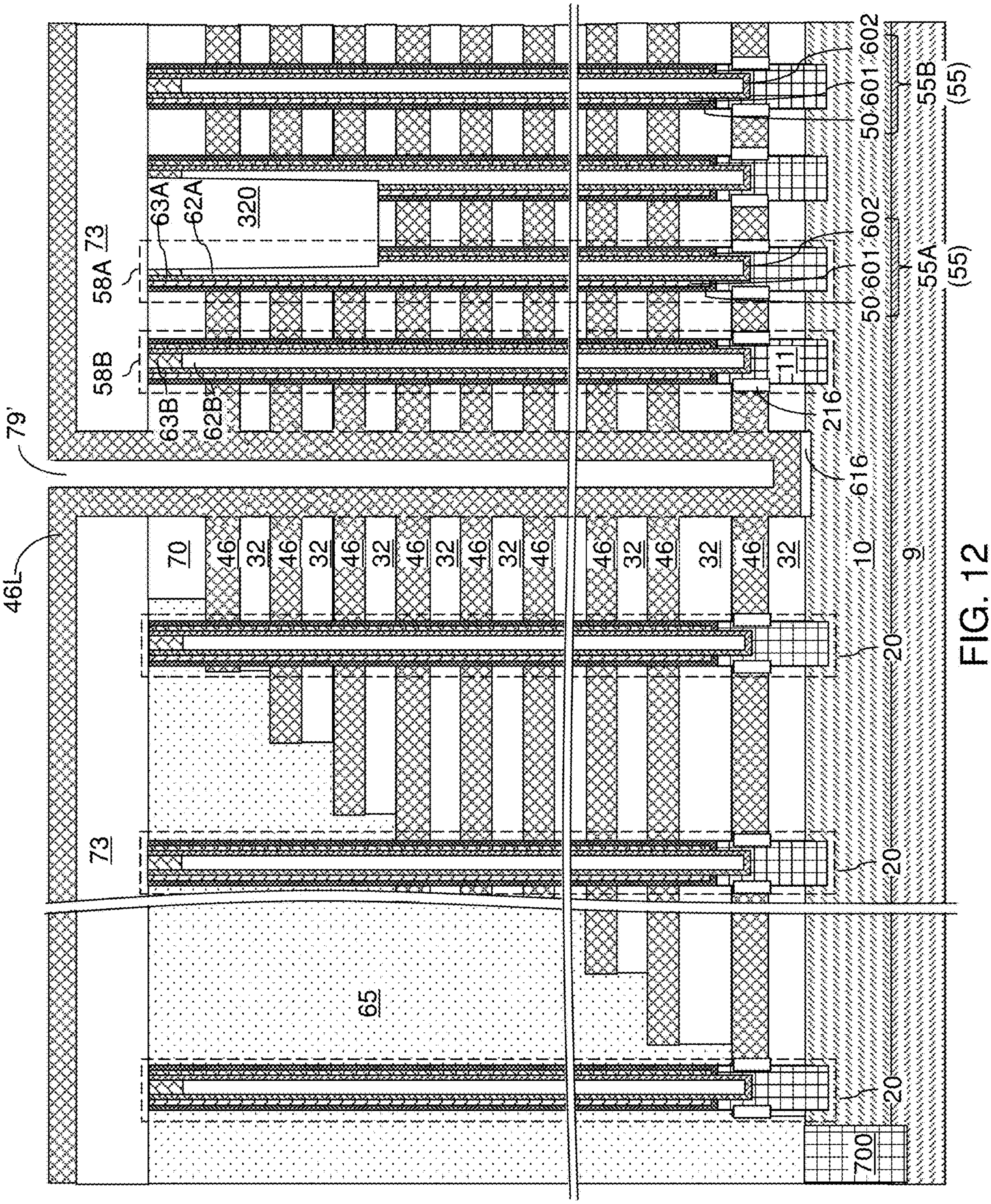
FIG. 12 is a schematic vertical cross-sectional view of the first exemplary structure at the processing step of FIG. 11D.

Referring to FIGS. 11D and 12, a metal fill material may be deposited in the plurality of backside recesses 43, on the sidewalls of the at least one the backside trench 79, and over the top surface of the contact level dielectric layer 73 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited using a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 may be formed in the plurality of backside recesses 43, and a continuous electrically conductive material layer 46L may be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 may be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 216 laterally surrounds a pedestal channel portion 11. A bottommost electrically conductive layer 46 laterally surrounds each tubular dielectric spacer 216 upon formation of the electrically conductive layers 46.

Figure 13:
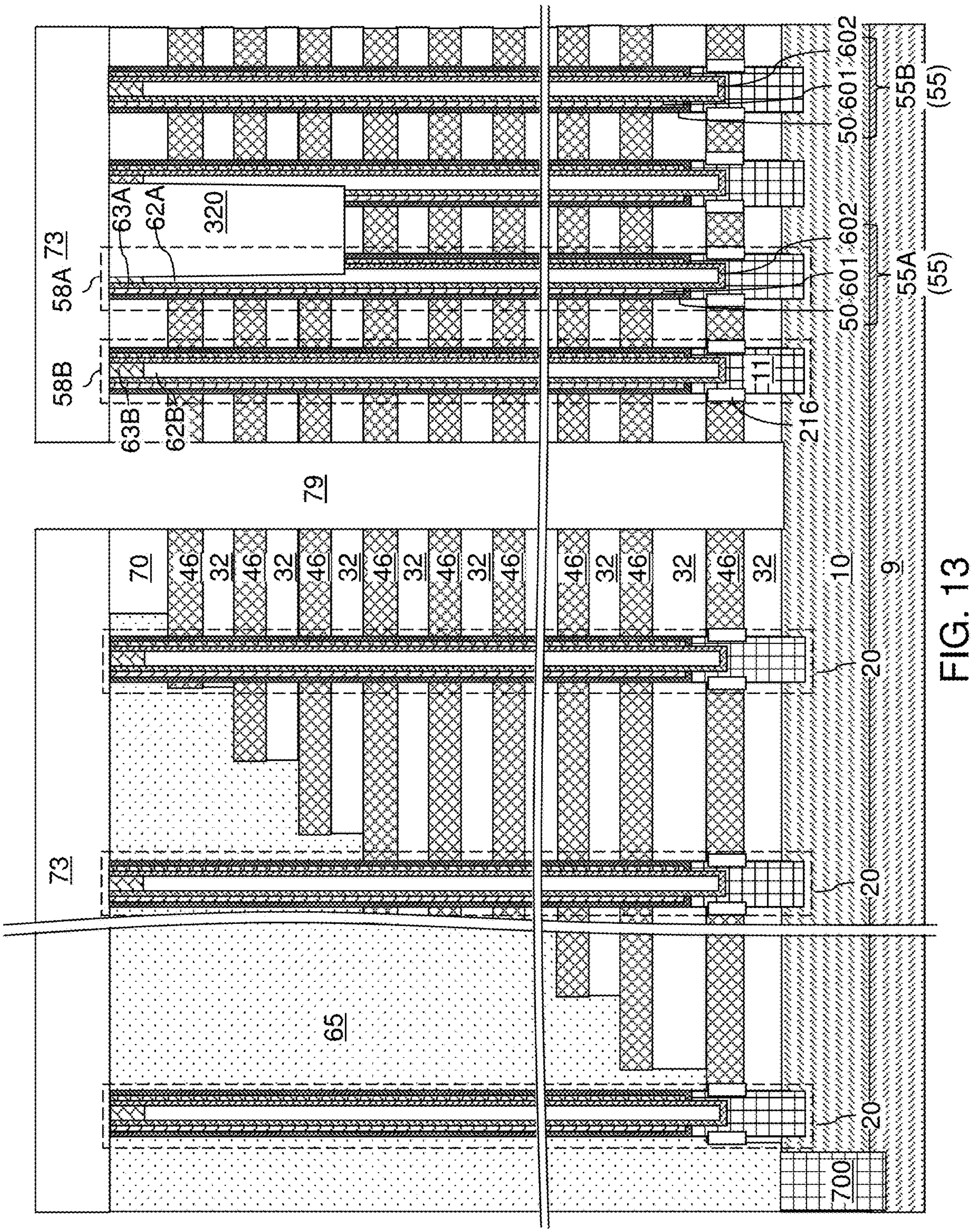
FIG. 13 is a schematic vertical cross-sectional view of the first exemplary structure after removal of a deposited conductive material from within the backside trench according to the first embodiment of the present disclosure.

Referring to FIG. 13, the deposited metallic material of the continuous electrically conductive material layer 46L may be etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 may be replaced with the electrically conductive layers 46.

Each electrically conductive layer 46 may function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

In one embodiment, the removal of the continuous electrically conductive material layer 46L may be selective to the material of the backside blocking dielectric layer 44. In this case, a horizontal portion of the backside blocking dielectric layer 44 may be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 may be removed during removal of the continuous electrically conductive material layer 46L. A backside cavity 79' may be present within each backside trench 79.

Figure 14A:
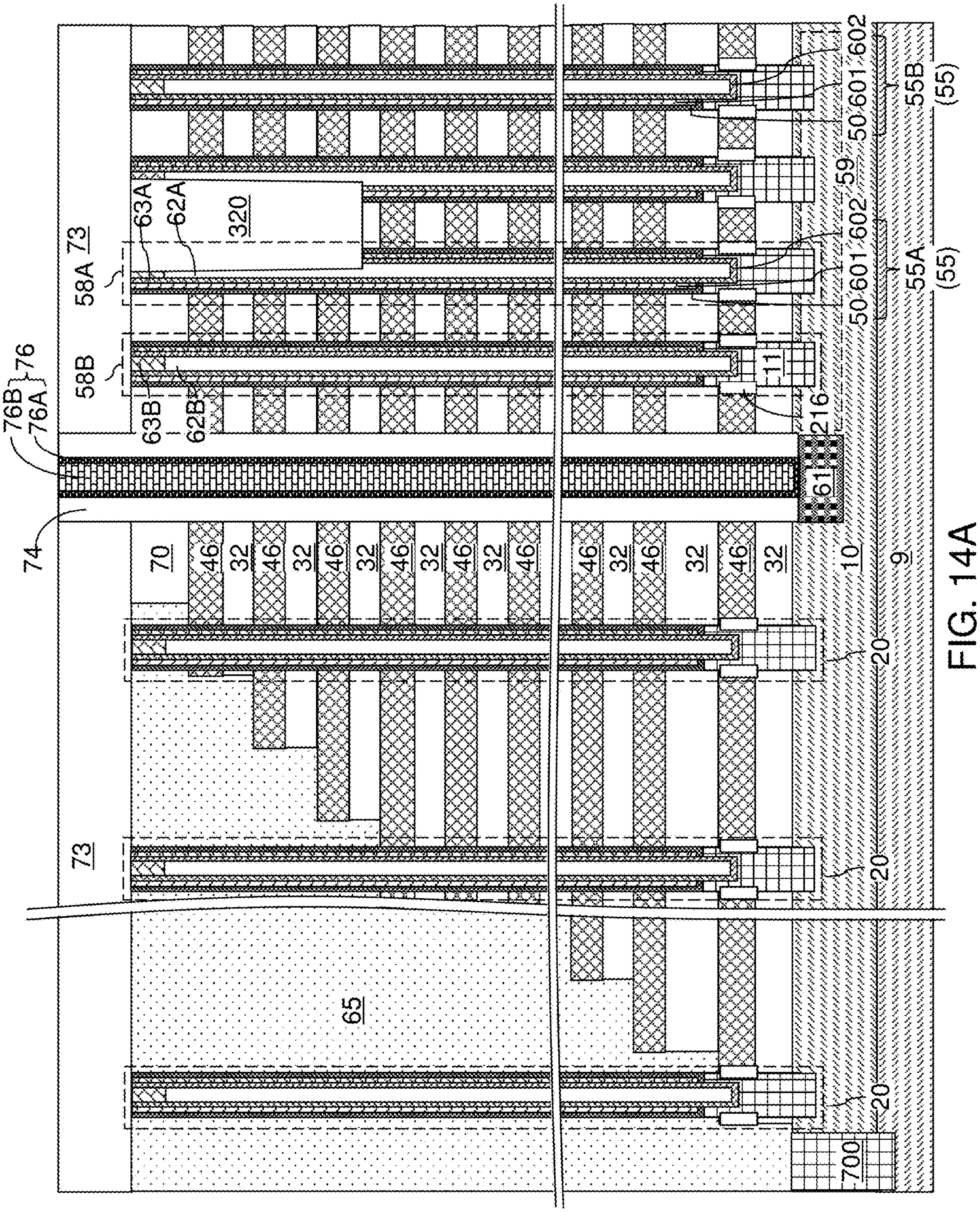
FIG. 14A is a schematic vertical cross-sectional view of the first exemplary structure after formation of insulating spacers and backside contact via structures according to the first embodiment of the present disclosure.
Figure 14B:
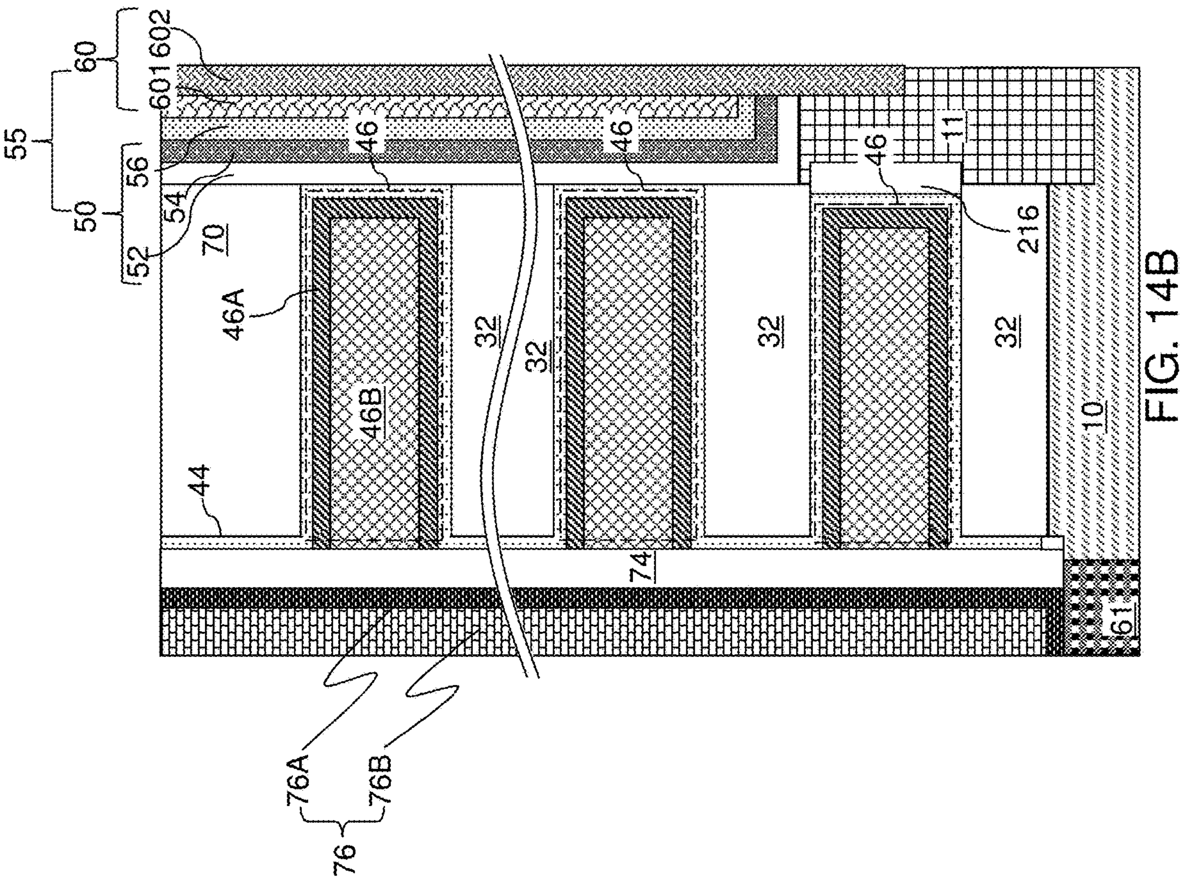
FIG. 14B is a magnified view of a region of the first exemplary structure of FIG. 14A.

Referring to FIGS. 14A and 14B, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

If a backside blocking dielectric layer 44 is present, the insulating material layer may be formed directly on surfaces of the backside blocking dielectric layer 44 and directly on the sidewalls of the electrically conductive layers 46. If a backside blocking dielectric layer 44 is not used, the insulating material layer may be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' may be present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 may be formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

In one embodiment, the substrate (9, 10) may include the semiconductor material layer 10, and the semiconductor material layer 10 and the first vertical semiconductor channels 60 of the first memory stack structures 55A have a doping of a first conductivity type. Pedestal channel portions 11 may be disposed between bottom ends of the first vertical semiconductor channels 60 and the substrate semiconductor layer 9, and a source region 61 having a doping of a second conductivity type may be formed within the semiconductor material layer 10 and may be laterally spaced from the first memory stack structures 55A and the pedestal channel portions 11.

An upper portion of the semiconductor material layer 10 that extends between the source region 61 and the plurality of pedestal channel portions 11 may constitute a horizontal semiconductor channel 59 for a plurality of field effect transistors. The horizontal semiconductor channel 59 may be connected to multiple vertical semiconductor channels 60 through respective pedestal channel portions 11. The horizontal semiconductor channel 59 may contact the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 may be formed within each backside cavity 79'. Each contact via structure 76 may fill a respective backside cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized using the contact level dielectric layer 73 overlying the alternating stack (32, 46) as a stopping layer. If chemical mechanical planarization (CMP) process is used, the contact level dielectric layer 73 may be used as a CMP stopping layer. Each remaining continuous portion of the at least one conductive material in the backside trenches 79 constitutes a backside contact via structure 76.

The backside contact via structure 76 may extend through the alternating stack (32, 46), and contacts a top surface of the source region 61. In embodiments in which a backside blocking dielectric layer 44 is used, the backside contact via structure 76 may contact a sidewall of the backside blocking dielectric layer 44.

Figure 15A:
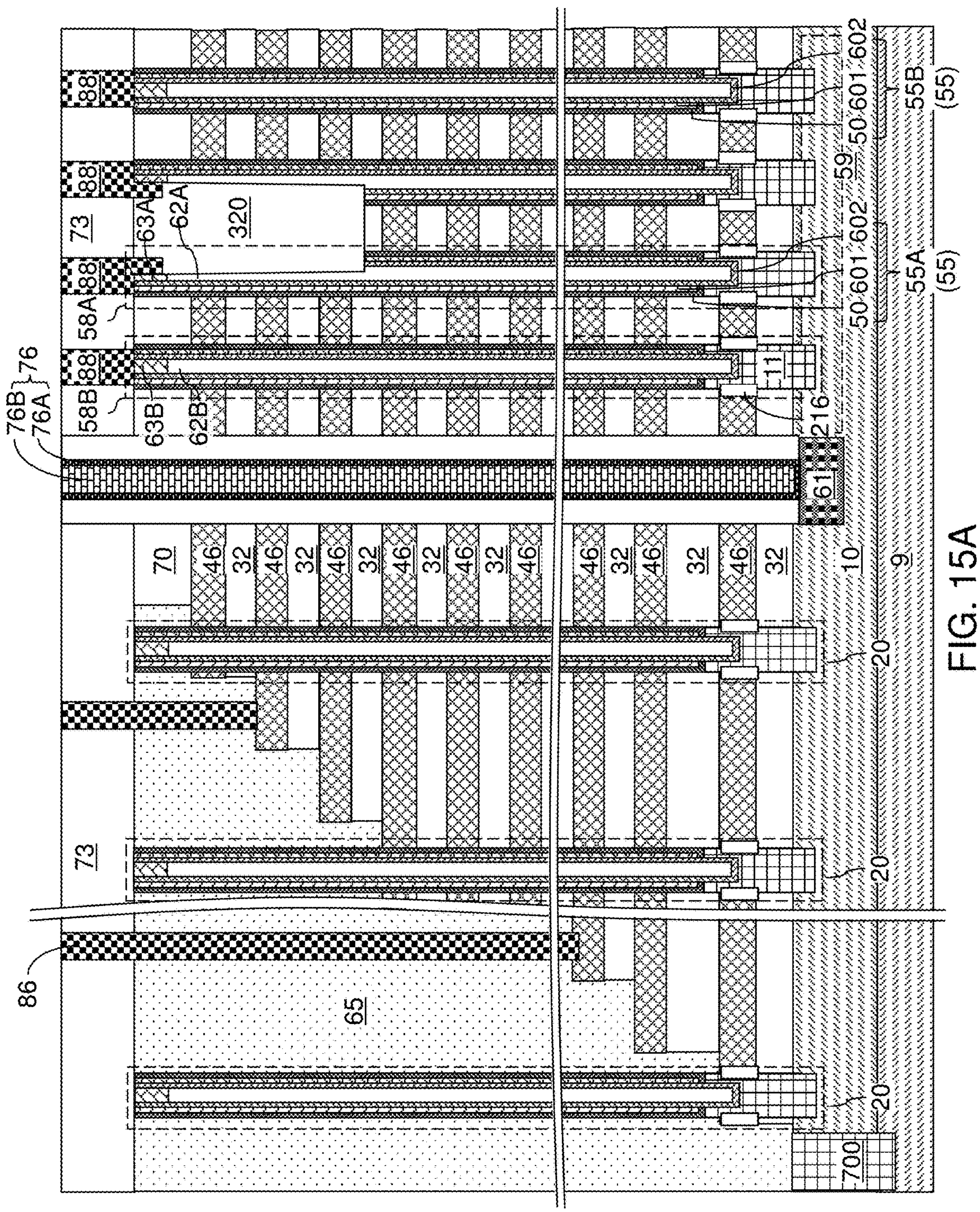
FIG. 15A is a schematic vertical cross-sectional view of the first exemplary structure after formation of additional contact via structures according to the first embodiment of the present disclosure.
Figure 15B:
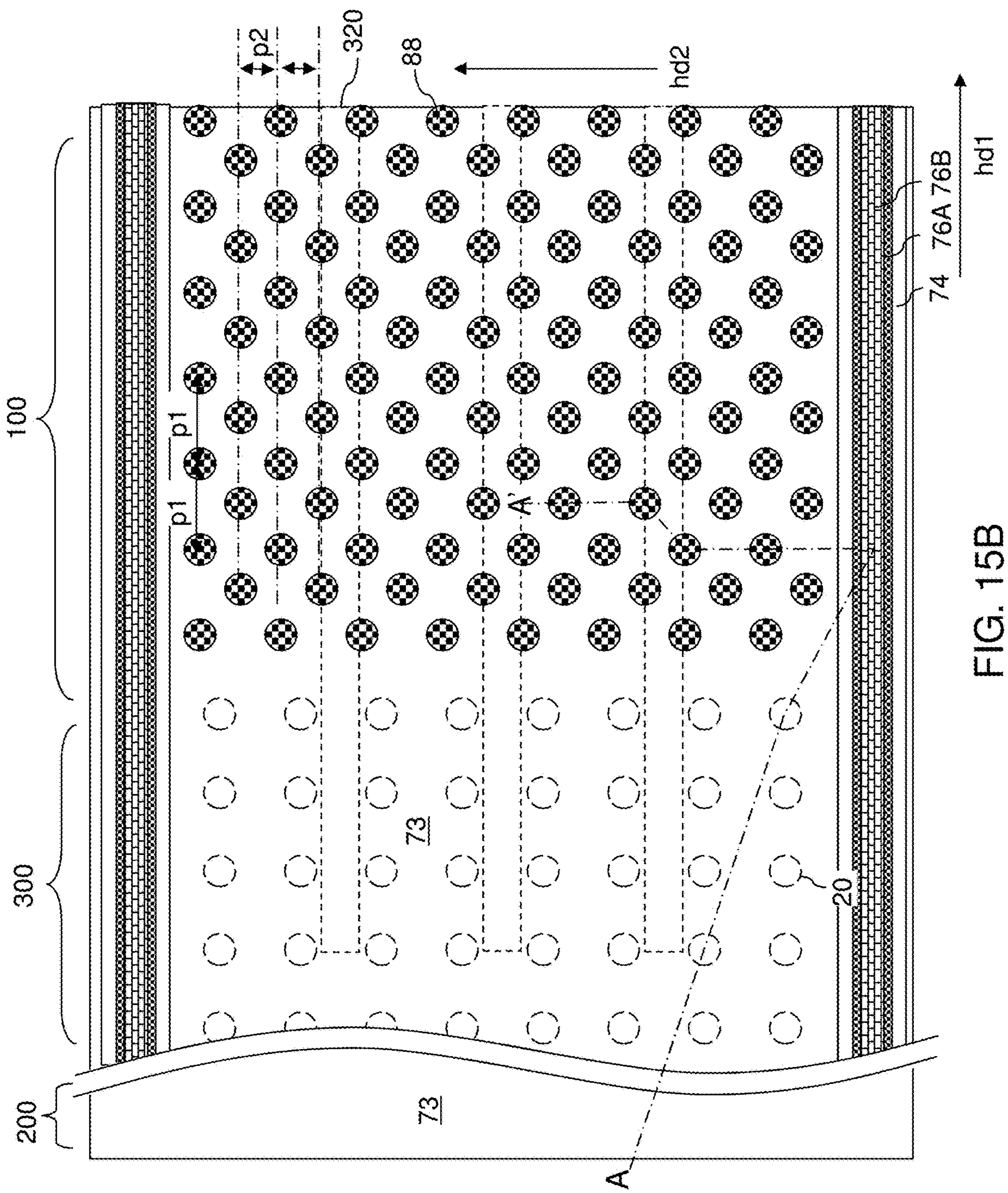
FIG. 15B is a top-down view of the first exemplary structure of FIG. 15A. The zig-zag vertical plane A-A' is the plane of the schematic vertical cross-sectional view of FIG. 15A.

Referring to FIGS. 15A and 15B, additional contact via structures (88, 86) may be formed through the contact level dielectric layer 73, and optionally through the retro-stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73, and through the retro-stepped dielectric material portion 65. Peripheral device contact via structures (not shown) may be formed through the retro-stepped dielectric material portion 65 directly on respective nodes of the peripheral devices.

Each drain contact via structure 88 may contact a top surface of an underlying one of the drain regions 63. Drain contact via structures 88 that contact first drain regions 63A may contact a sidewall of a respective one of the first drain regions 63A. Drain contact via structure that contact second drain regions 63B may contact only a top surface of a respective one of the second drain regions 63B.

Figure 16:
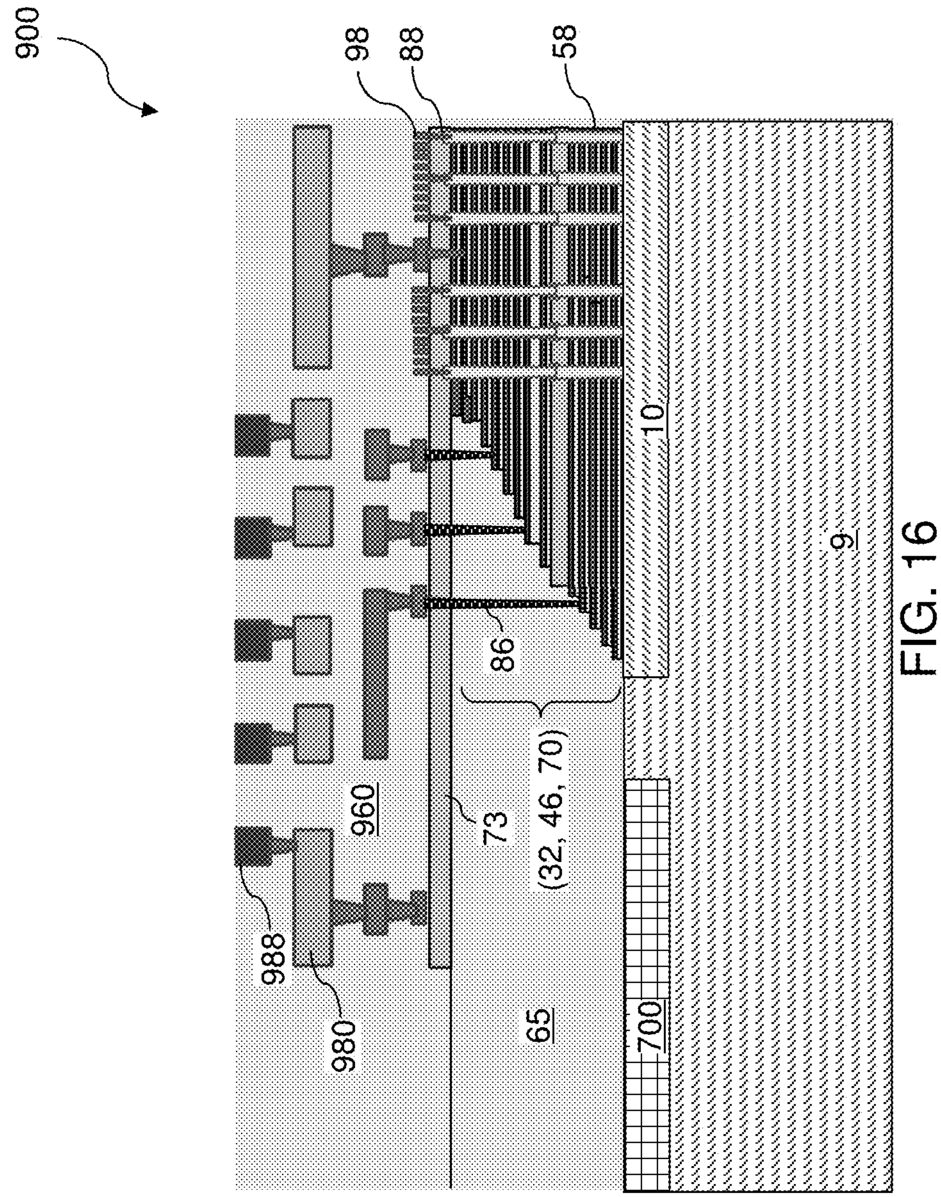
FIG. 16 is a vertical cross-sectional view of the first exemplary structure after formation of interconnect-level dielectric material layers, additional metal interconnect structures, and bonding pads according to the first embodiment of the present disclosure.

Referring to FIG. 16, memory-side dielectric material layers 960 may be deposited over the contact level dielectric layer 73. Various memory-side metal interconnect structures 980 may be formed within the memory-side dielectric material layers 960. The memory-side metal interconnect structures 980 may include bit lines 98 that overlie the memory stack structures 55 and are electrically connected to a respective subset of the drain regions 63. Further, the memory-side metal interconnect structures 980 may include additional metal via structures and additional metal line structures that provide electrical wiring to and from the various underlying elements such as the backside contact via structures 76, the word line contact via structures 86, the bit lines 98, and other nodes of the three-dimensional memory device that may be formed as needed. The thickness of the memory-side dielectric material layers 960 may be in a range from 300 nm to 3,000 nm, although lesser and greater thicknesses may also be used.

Pad cavities may be formed in the upper portion of the memory-side metal interconnect structures 980 such that a respective one of the memory-side metal interconnect structures 980 is exposed at the bottom of each pad cavity. In one embodiment, the pad cavities may be arranged as a one-dimensional array or as a two-dimensional array, and may have a respective polygonal, circular, elliptical, or generally-curvilinear shape. A conductive material may be deposited in the pad cavities to form various memory-side bonding pads 988. The memory-side bonding pads 988 may be formed in memory-side dielectric material layers 960, which is formed over the alternating stack (32, 46). The memory-side bonding pads 988 may be electrically connected to nodes of the memory stack structures 55. In one embodiment, each bit line 98 may be electrically connected to a respective one of the memory-side bonding pads 988. The first exemplary structure comprises a memory die 900.

In embodiments in which the at least one semiconductor device 700 in the peripheral device region 200 includes a peripheral circuitry for controlling operation of memory stack structures 55 in the three-dimensional array of memory elements, the memory stack structure 55, the electrically conductive layers 46 that function as word lines, and the bit lines 98 of the three-dimensional memory device may be controlled by the peripheral circuitry of the memory die 900. Alternatively, or additionally, a support die (not shown) may be used to control various nodes of the three-dimensional memory device. In this case, the support die may include a peripheral circuitry for controlling operation of memory stack structures 55 in the three-dimensional array of memory elements, the memory stack structure 55, the electrically conductive layers 46 that function as word lines, and the bit lines 98 of the three-dimensional memory device. The support die may be bonded to the memory die 900 using the memory-side bonding pads 988.

Figure 17:
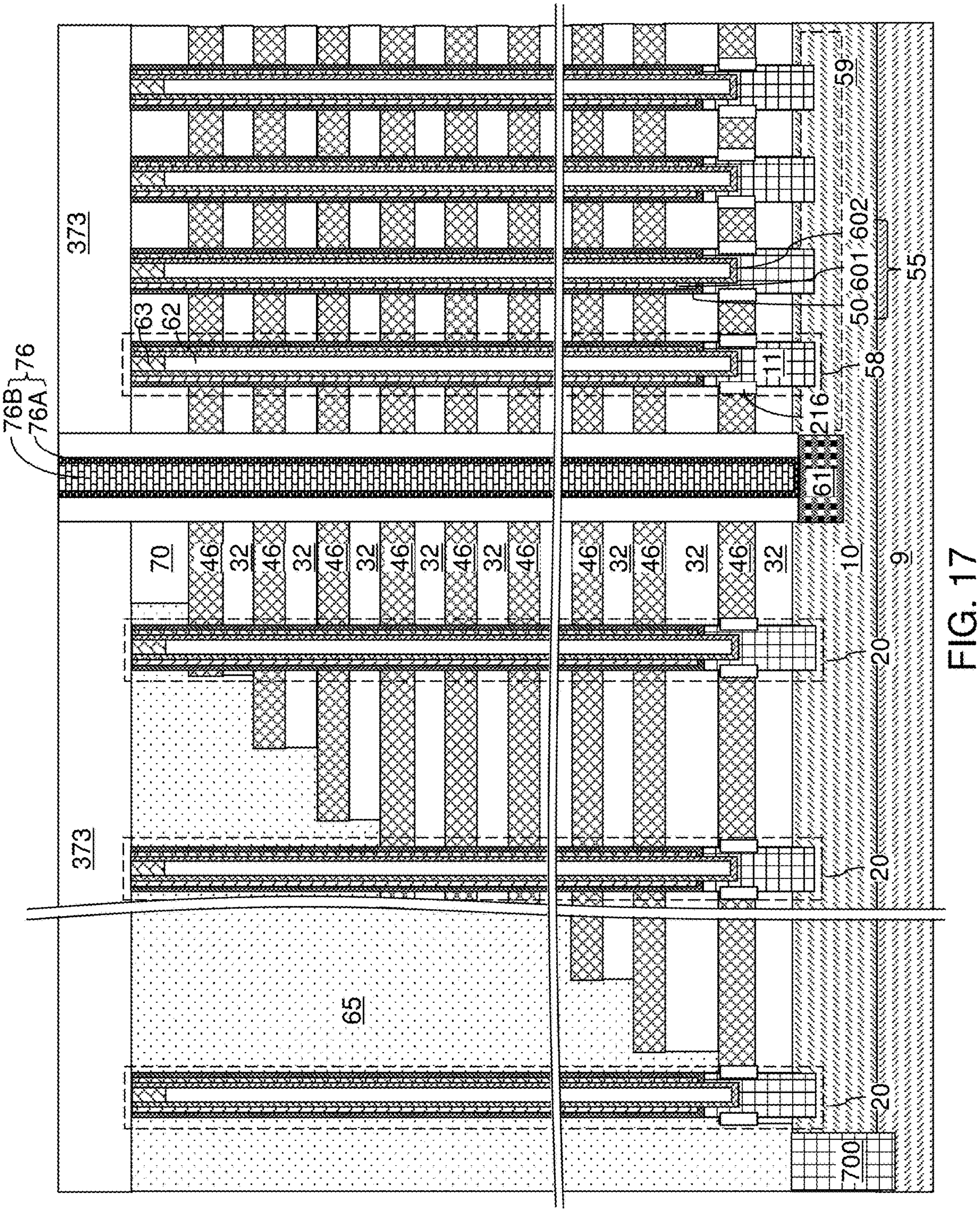
FIG. 17 is a vertical cross-sectional view of a second exemplary structure after formation of insulating spacers and backside contact via structures according to a second embodiment of the present disclosure.

Referring to FIG. 17, a second exemplary structure according to a second embodiment of the present disclosure is illustrated, which may be derived from the first exemplary structure of FIG. 6. A sacrificial planarization stopper layer 373 may be formed over the insulating cap layer 70 after the processing steps of FIG. 6. The sacrificial planarization stopper layer 373 includes a material that may be used as a planarization stopper structure and is different from the material of the sacrificial material layers 42. In one embodiment, the sacrificial planarization stopper layer 373 may include the same material as the contact level dielectric layer 73. Subsequently, backside trenches 79 are formed through the sacrificial planarization stopper layer 373 and the alternating stack (32, 42) by performing the processing steps of FIGS. 9A and 9B. Subsequently, the processing steps of FIGS. 10, 11A-11D, 12, 13, and 14A and 14B may be performed to provide the second exemplary structure illustrated in FIG. 17.

Figure 18:
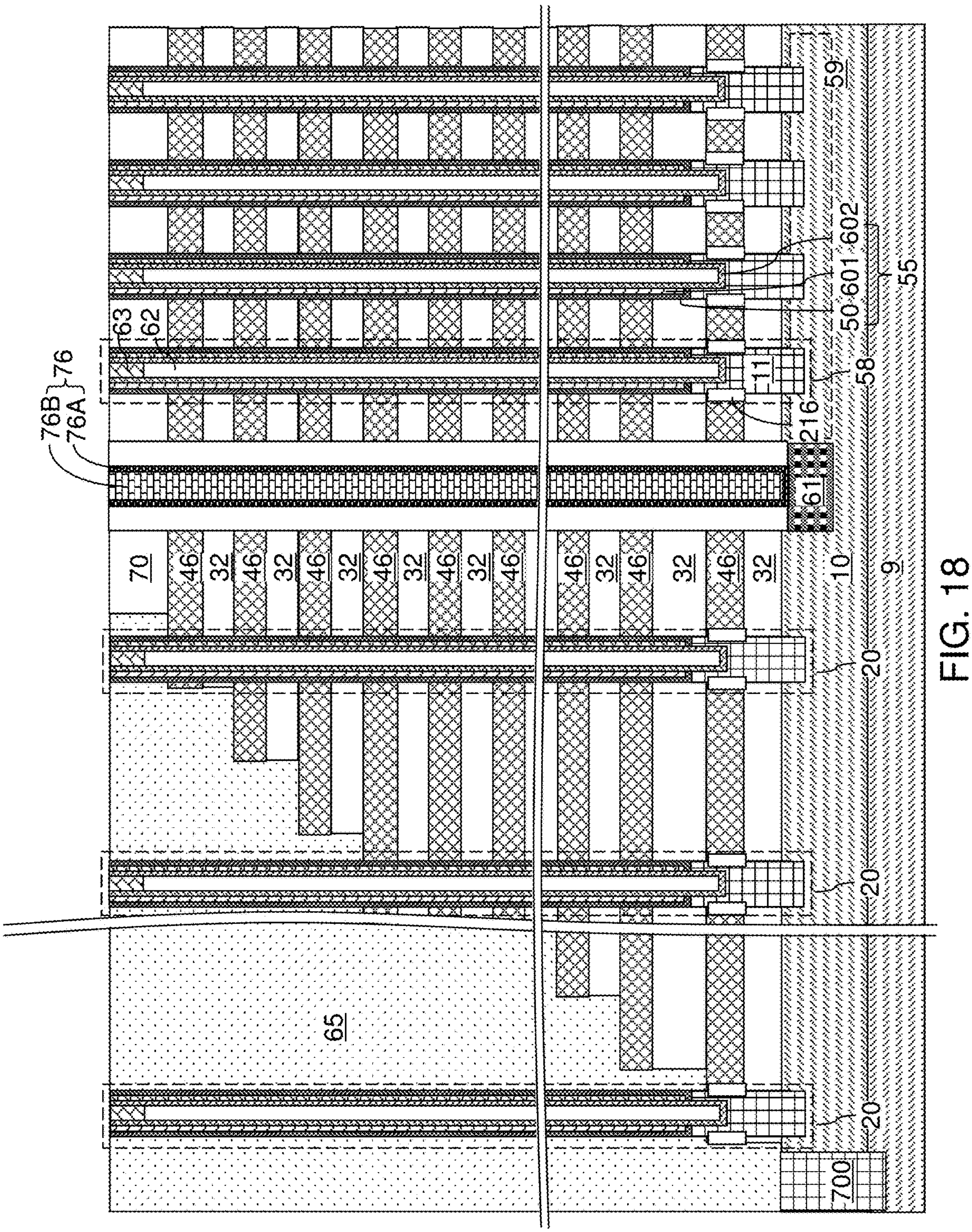
FIG. 18 is a vertical cross-sectional view of the second exemplary structure after removal of a sacrificial planarization stopper layer according to the second embodiment of the present disclosure.

Referring to FIG. 18, portions of the second exemplary structure located above the horizontal plane including the top surface of the insulating cap layer 70 may be removed by performing at least one planarization process. The sacrificial planarization stopper layer 373 and portions of the insulating spacers 74 and the backside contact via structures 76 that protrude above the horizontal plane including the top surface of the insulating cap layer 70 by chemical mechanical planarization and/or at least one recess etch process.

Figure 19A:
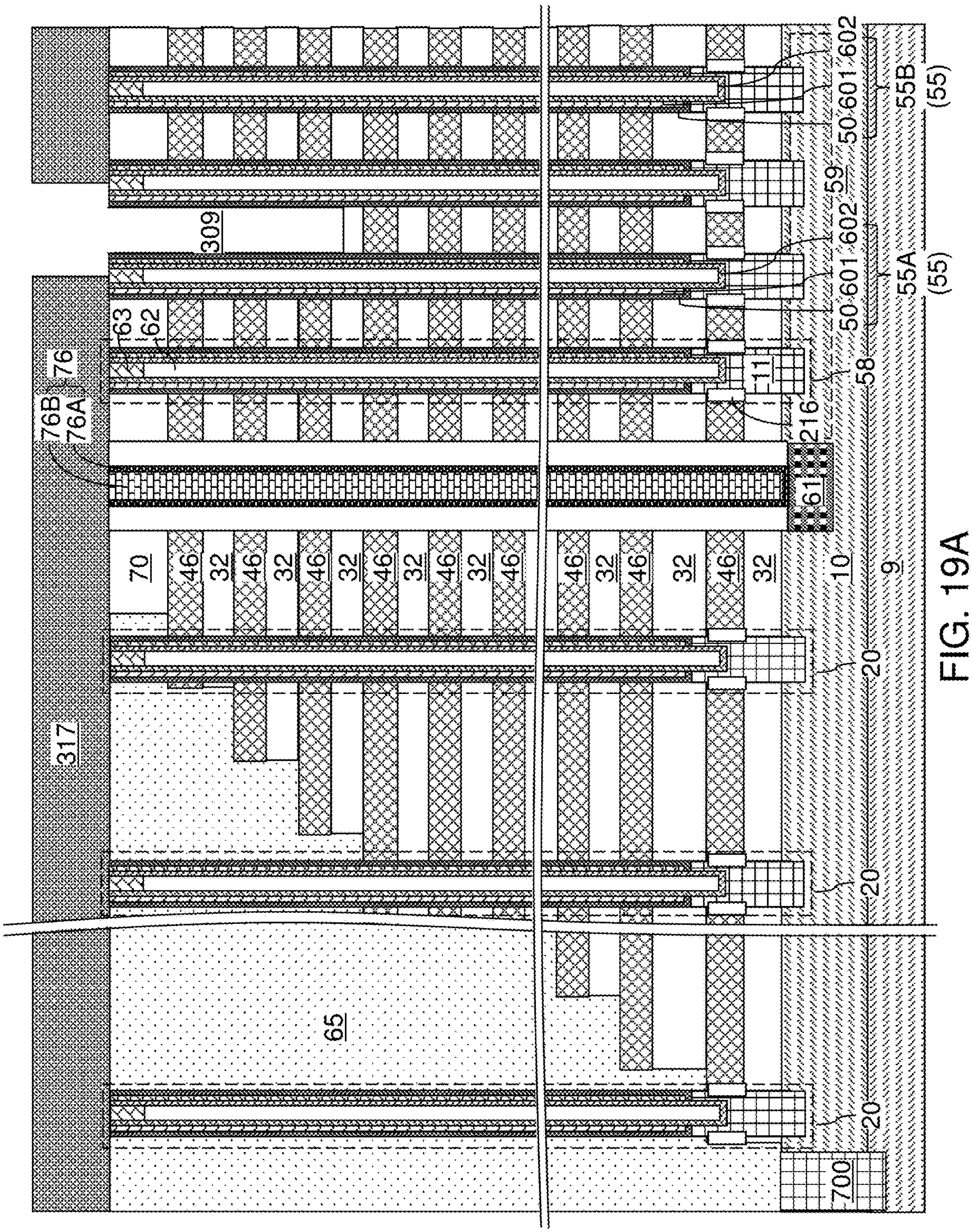
FIG. 19A is a vertical cross-section view of the second exemplary structure during formation of drain-select-level trenches according to the second embodiment of the present disclosure.
Figure 19B:
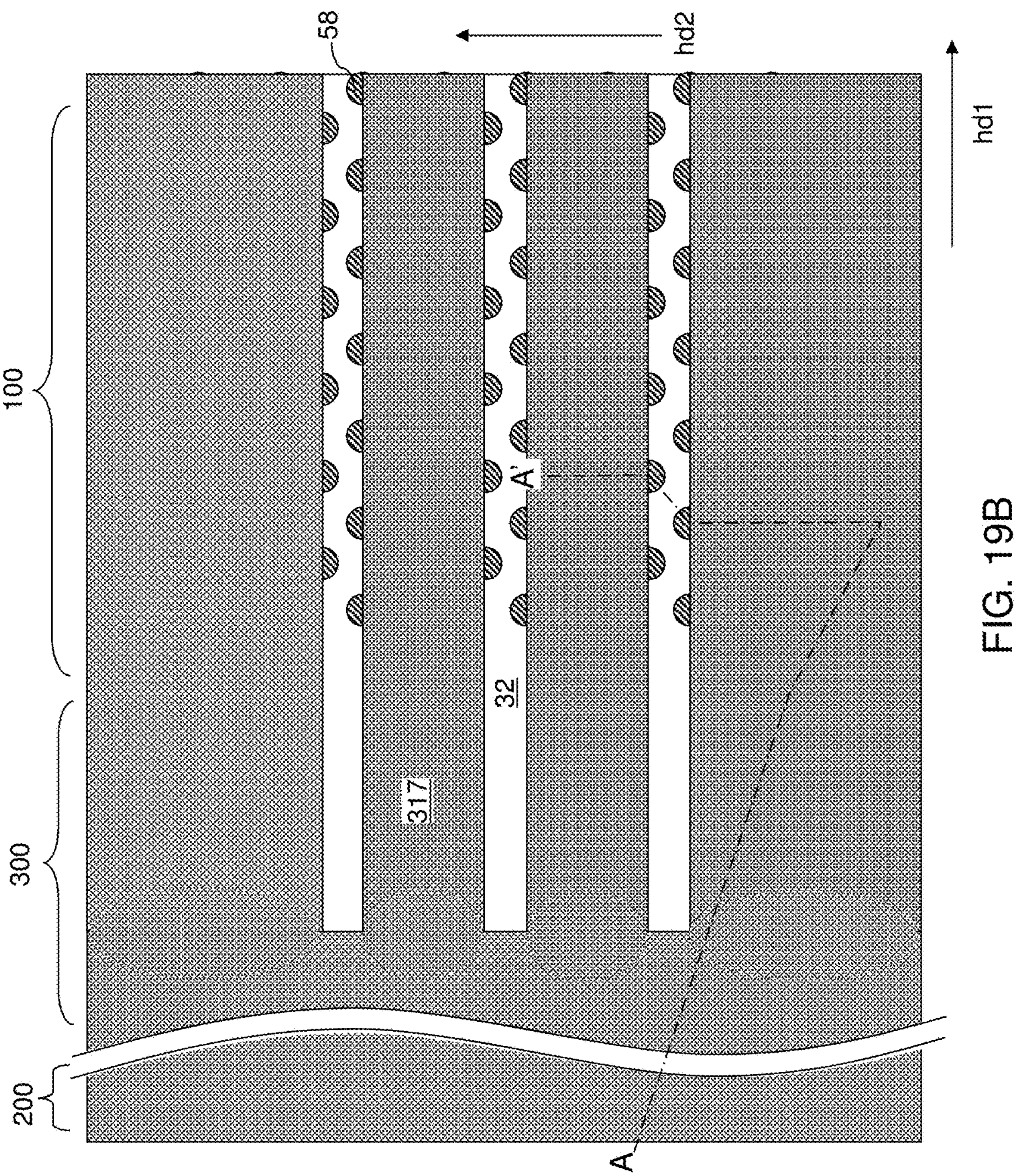
FIG. 19B is a top-down view of the second exemplary structure of FIG. 19A. The zig-zag vertical plane A-A' is the plane of the schematic vertical cross-sectional view of FIG. 19A.

Referring to FIGS. 19A and 19B, a patterned etch mask layer 317 including elongated openings may be formed over the alternating stack (32, 46) and the memory stack structures 55. In one embodiment, the patterned etch mask layer 317 may be a patterned photoresist layer formed by application and lithographic patterning of a photoresist material over the alternating stack (32, 46) and the memory stack structures 55. Each opening in the patterned etch mask layer 317 may overlie a segment of each memory stack structure 55 within a neighboring pair of rows of memory stack structures 55. Each memory stack structure 55 of which a segment is located within an area of one of the openings in the patterned etch mask layer 317 is herein referred to as a first memory stack structure 55A. Memory stack structures 55 that are entirely covered with the patterned etch mask layer 317, for example, by being located between neighboring pairs of first memory stack structures 55A, are herein referred to as a second memory stack structure 55B. Second memory stack structures 55B may, or may not, be present in the first exemplary structure depending on the layout of the elongated openings in the patterned etch mask layer 317. Each first memory stack structure 55A may only partly covered with the patterned etch mask layer 317. As such, a first area of each of the first memory stack structures 55A may be located within an area of an elongated opening in the patterned etch mask layer 317, and a second area of each of the first memory stack structures 55B is covered by the patterned etch mask layer 317. The first area may be in a range from 15% to 70%, such as from 25% to 50%, of the entire area of each first memory stack structure 55A.

Drain regions 63 at an upper end of the first memory stack structures 55A are herein referred to as first drain regions 63A, and drain regions 63 at an upper end of the second memory stack structures 55B are herein referred to as second drain regions 63B. Dielectric cores 62 formed within the first memory stack structures 55A are herein referred to as first dielectric cores 62A, and dielectric cores 62 formed within the second memory stack structures 55B are herein referred to as second dielectric cores 62B.

Figure 20:
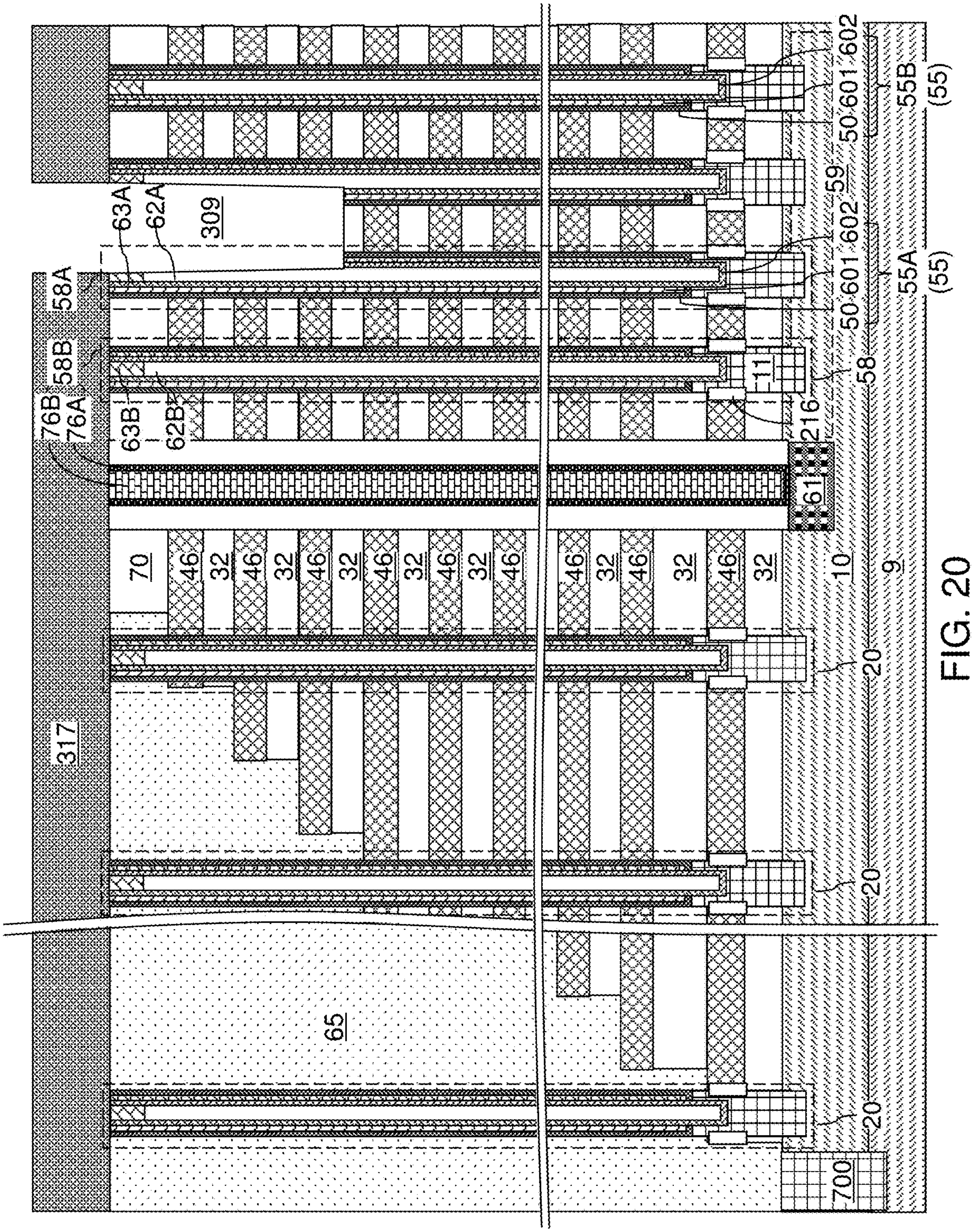
FIG. 20 is a vertical cross-section view of the second exemplary structure after formation of drain-select-level trenches according to the second embodiment of the present disclosure.

Referring to FIG. 20, an anisotropic etch process may be performed to etch an upper portion of the alternating stack (32, 46) and unmasked segments of the first memory stack structures 55A. The unmasked segments of the first memory stack structures 55A may include portions of vertical semiconductor channels 60 and the memory films 50 of the first memory stack structures 55A that are not masked by the patterned etch mask layer 317. A drain-select-level trench 309 is formed underneath each elongated opening within the patterned etch mask layer 317 by etching through an upper portion of the alternating stack (32, 46) and a first area of each of the first memory stack structures 55A. Each drain-select-level trench 309 may include a pair of straight lengthwise sidewalls that extend along the first horizontal direction hd1. The depth of the drain-select-level trenches 309 may be selected such that the drain-select-level trenches 309 vertically extend through each sacrificial material layer located at drain select levels, i.e., levels in which drain-select-level electrically conductive layers that function as drain select gate electrodes are to be subsequently formed.

The anisotropic etch process may etch portions of memory films 50 and vertical semiconductor channels 60 of the first memory stack structure 55A that underlie the elongated opening in the patterned etch mask layer 317. A portion of each first drain region 63A may be removed during formation of the drain-select-level trenches 309. The pair of straight lengthwise sidewalls of each drain-select-level trench 309 may comprise straight sidewall segments of remaining portions of the first drain regions 63A. The memory stack structures 55 may comprise second memory stack structures 55B that are masked with a patterned etch mask layer 317 during formation of the drain-select-level trenches 309. Sidewalls of the second memory stack structures 55B are not etched during formation of the drain-select-level trenches 309. Thus, each vertical semiconductor channel 60 of the second memory stack structures 55B has a tubular configuration. The patterned etch mask layer 317 may be removed, for example, by ashing after formation of the drain-select-level trenches 309.

Figure 21:
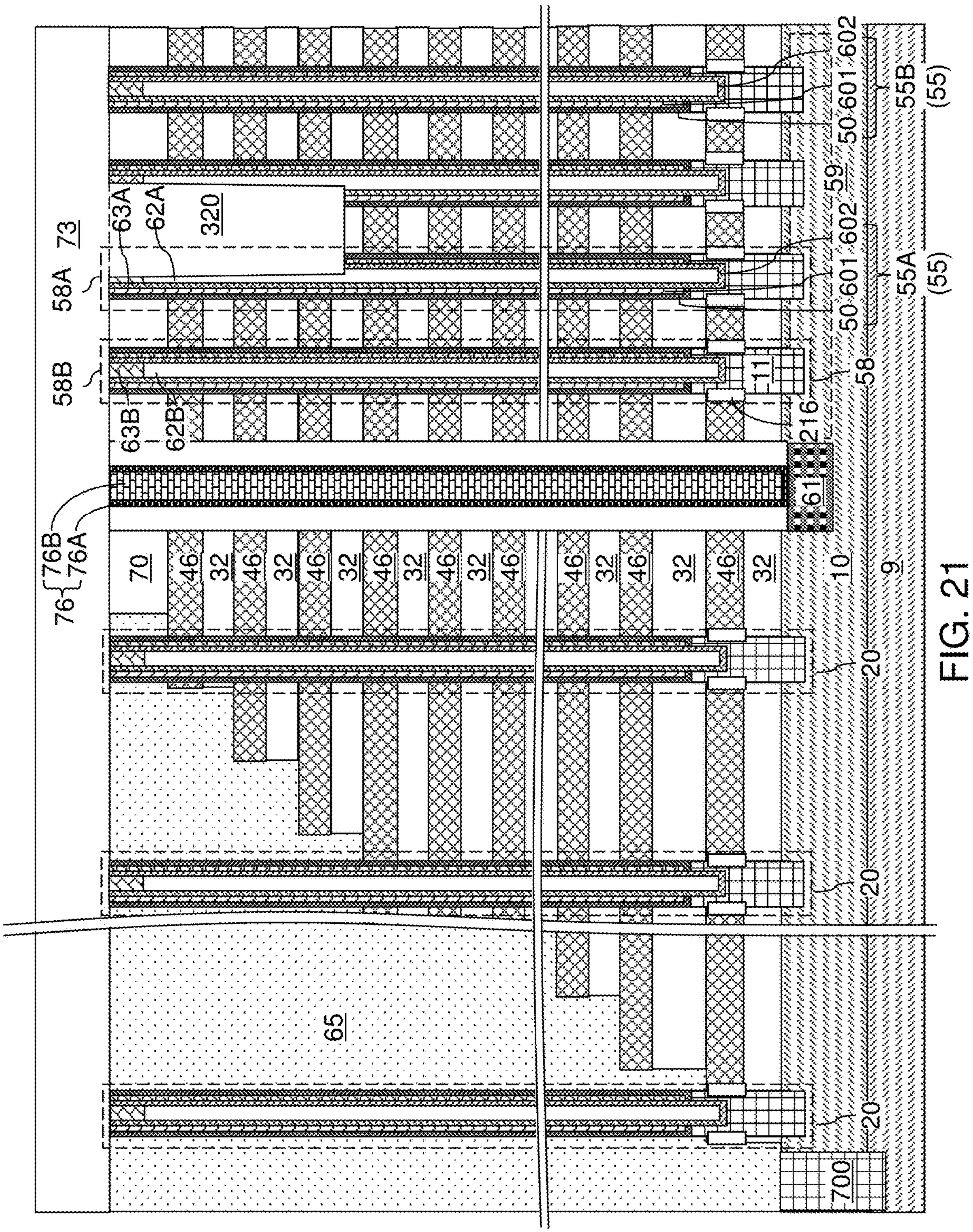
FIG. 21 is a vertical cross-section view of the second exemplary structure after formation of drain-select-level isolation structures and a contact level dielectric layer according to the second embodiment of the present disclosure.

Referring to FIG. 21, a drain-select-level isolation structure 320 may be formed in each drain-select-level trench 309, for example, by depositing a dielectric material such as silicon oxide in the drain-select-level trenches 309. Excess portions of the dielectric material may be removed from above the horizontal plane including the top surface of the insulating cap layer 70 by a planarization process, which may use a recess etch and/or chemical mechanical planarization. Each drain-select-level isolation structure 320 may include a pair of straight sidewalls that laterally extend along the first horizontal direction hd1. Each drain-select-level isolation structure 320 may vertically extend through a plurality of electrically conductive layers 46 including a topmost one of the electrically conductive layers within the alternating stack (32, 46). Each vertical semiconductor channel 60 within the first memory stack structures 55A comprises a tubular section that underlie a horizontal plane including a bottom surface of a drain-select-level isolation structure 320 and a semi-tubular section overlying the tubular section and contacting the drain-select-level isolation structure 320.

Continuing to refer to FIG. 21, a contact level dielectric layer 73 may be formed over the alternating stack (32, 46) of insulating layer 32 and electrically conductive layers 46, and over the memory stack structures 55 and the support pillar structures 20. The contact level dielectric layer 73 may include a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be used.

Figure 22A:
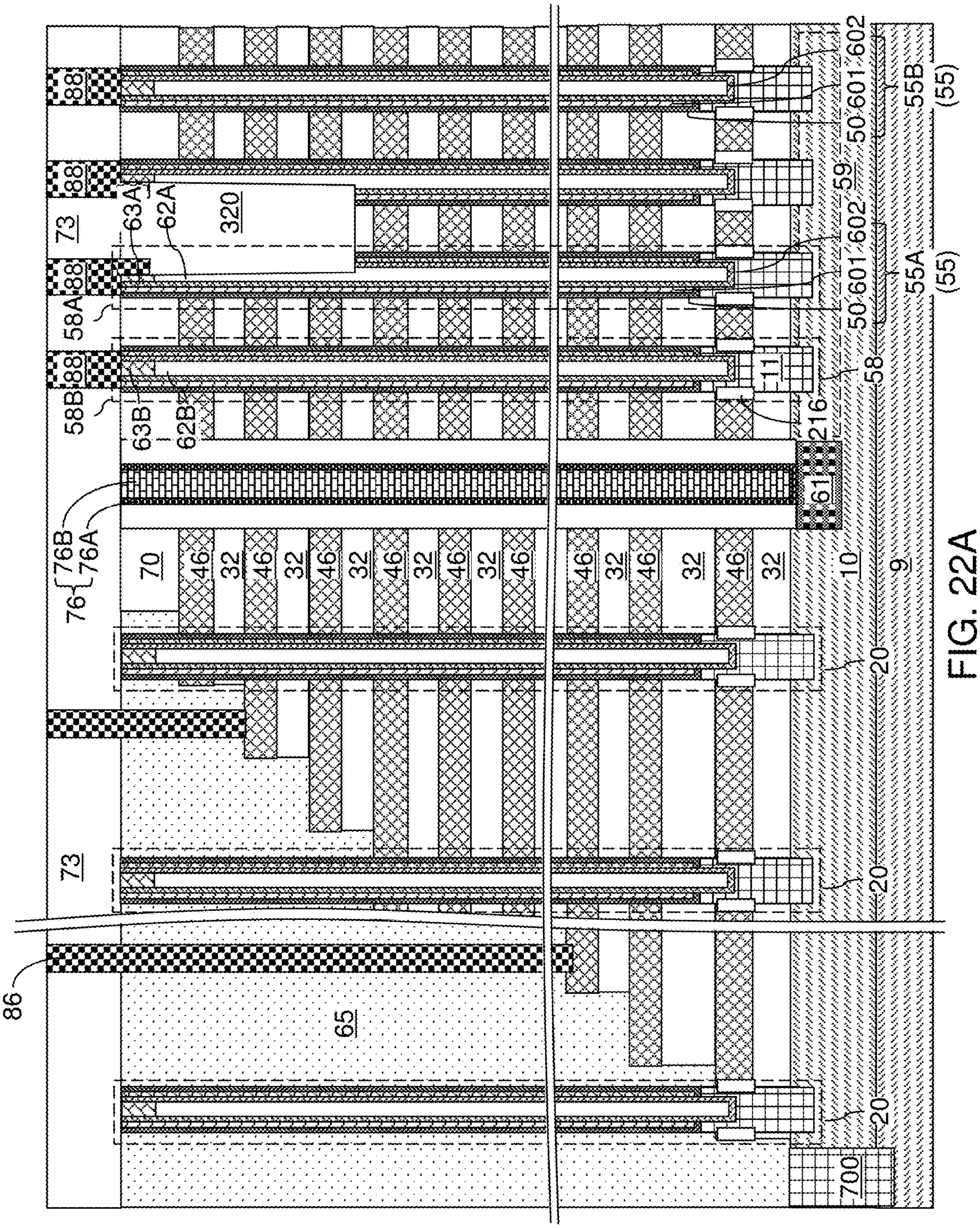
FIG. 22A is a schematic vertical cross-sectional view of the second exemplary structure after formation of additional contact via structures according to the second embodiment of the present disclosure.
Figure 22B:
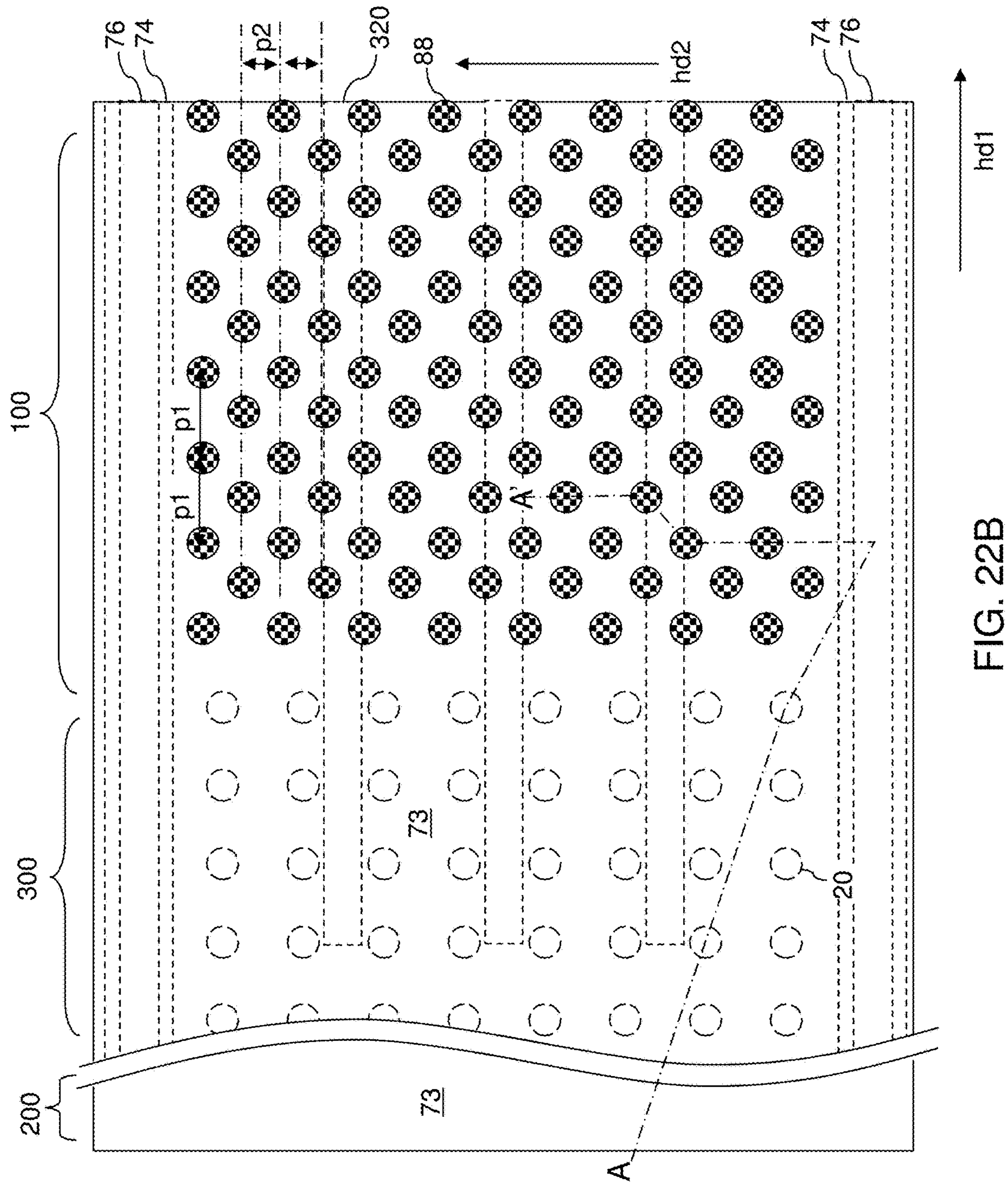
FIG. 22B is a top-down view of the second exemplary structure of FIG. 22A. The zig-zag vertical plane A-A' is the plane of the schematic vertical cross-sectional view of FIG. 22A.

Referring to FIGS. 22A and 22B, the processing steps of FIGS. 15A and 15B may be performed to form additional contact via structures (88, 86) through the contact level dielectric layer 73, and optionally through the retro-stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73, and through the retro-stepped dielectric material portion 65. Peripheral device contact via structures (not shown) may be formed through the retro-stepped dielectric material portion 65 directly on respective nodes of the peripheral devices.

Each drain contact via structure 88 may contact a top surface of an underlying one of the drain regions 63. Drain contact via structures 88 that contact first drain regions 63A may contact a sidewall of a respective one of the first drain regions 63A. Drain contact via structure that contact second drain regions 63B may contact only a top surface of a respective one of the second drain regions 63B.

Figure 23:
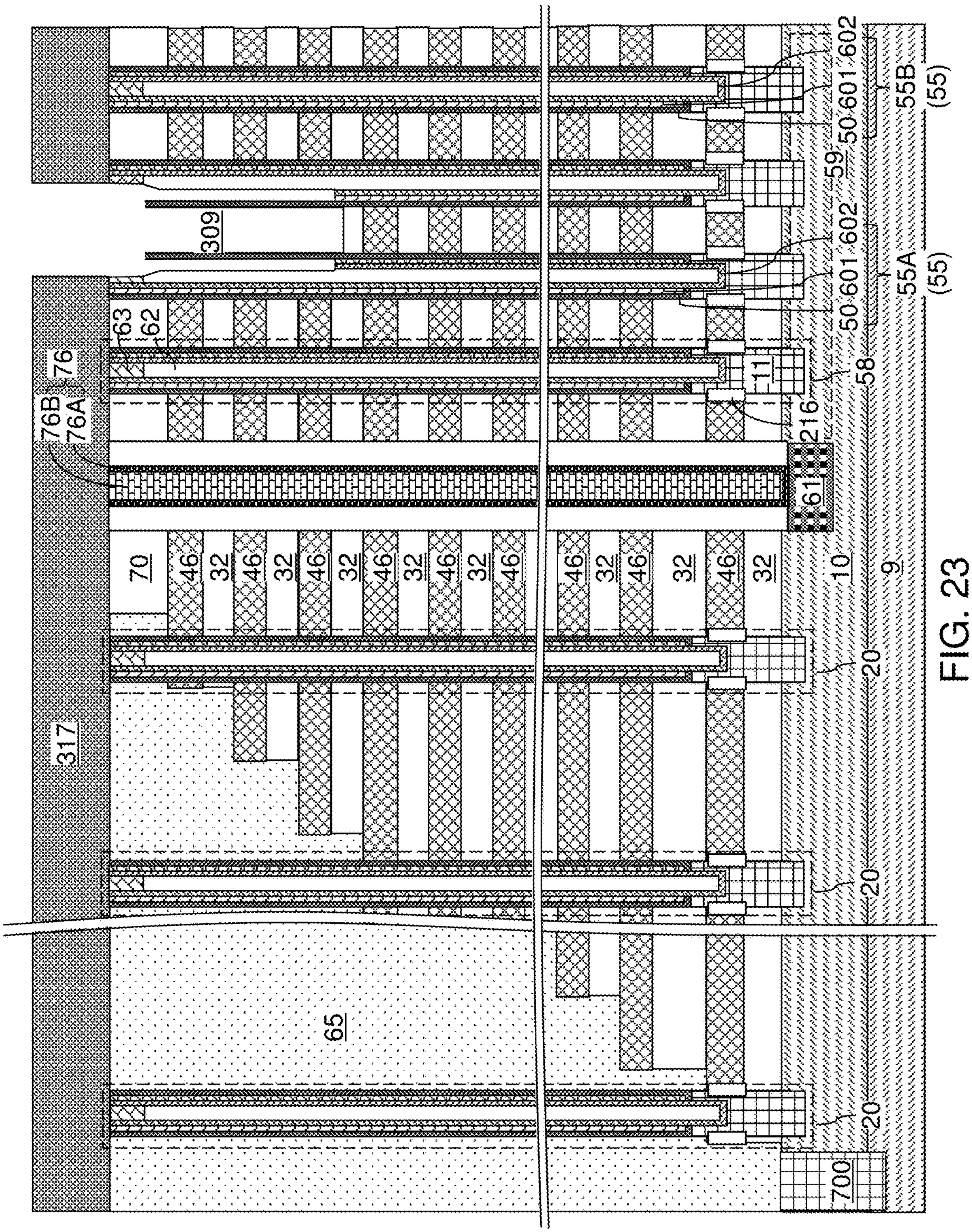
FIG. 23 is a vertical cross-section view of an alternative embodiment of the second exemplary structure during formation of drain-select-level trenches according to the second embodiment of the present disclosure.

Referring to FIG. 23, an alternative embodiment of the second exemplary structure according to the second embodiment of the present disclosure is illustrated, which may be derived from the second exemplary structure of FIG. 18 by forming a patterned etch mask layer 317 having the same pattern as the patterned etch mask layer of FIGS. 19A and 19B, and by performing an anisotropic etch process with a different etch chemistry than the anisotropic etch process of FIGS. 19A and 19B. Specifically, the etch chemistry of the anisotropic etch process may be selected such that the anisotropic etch process etches unmasked portions of the insulating cap layer 70, the insulating layers 32, the electrically conductive layers 46, the drain regions 63, and the dielectric cores 62 selective to at least one material of the memory films 50. For example, the charge storage layers 54 may include silicon nitride, and the anisotropic etch process may have an etch chemistry that is selective to silicon nitride. In this case, unetched portions of the memory films 50 may protrude inside each drain-select-level trench 309.

Figure 24:
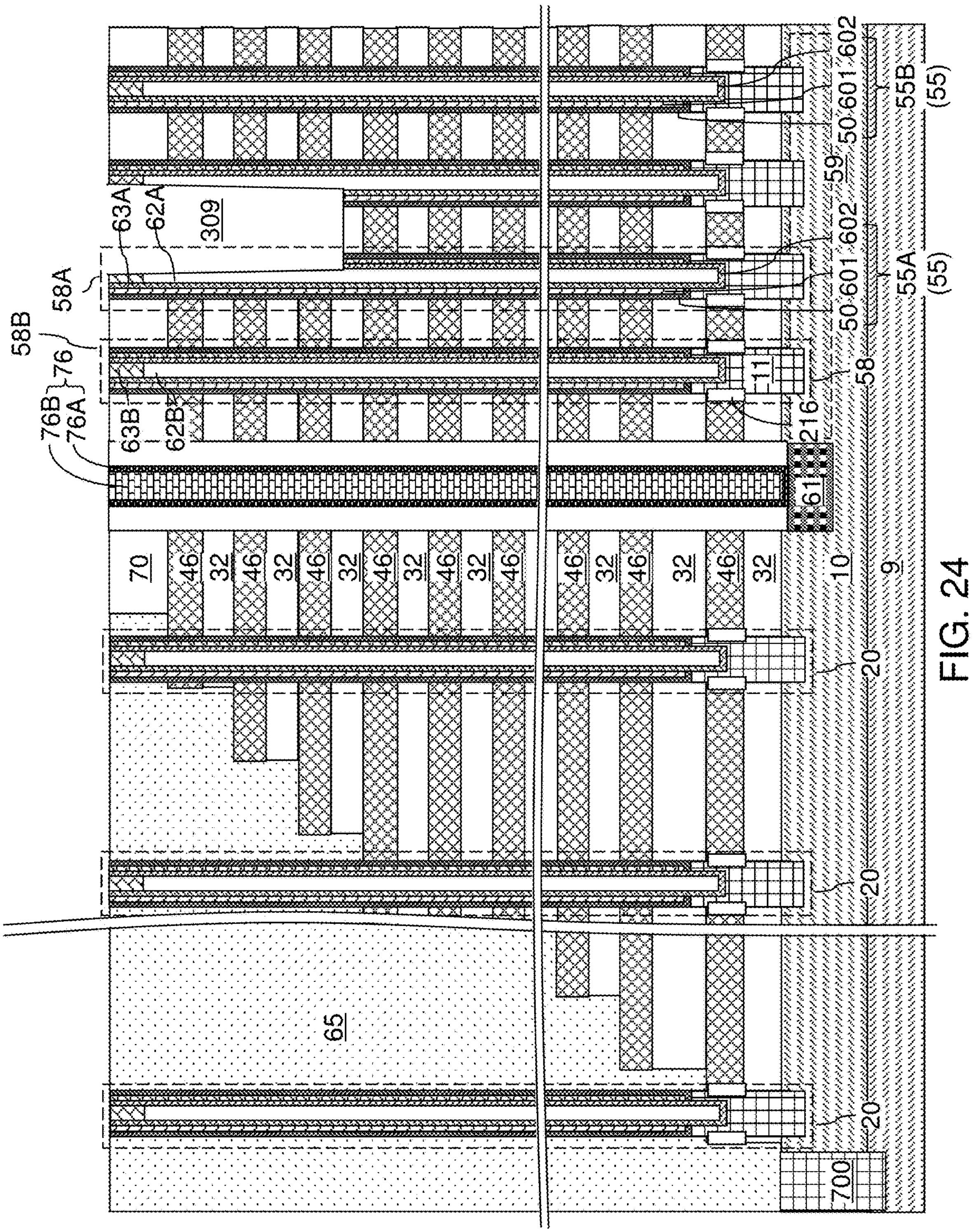
FIG. 24 is a vertical cross-section view of the alternative embodiment of the second exemplary structure after formation of drain-select-level trenches according to the second embodiment of the present disclosure.

Referring to FIG. 24, portions of memory films 50 of the first memory stack structures 55A that underlie the elongated opening in the patterned etch mask layer 317 may be removed by performing an isotropic etch process after performing the anisotropic etch process at the processing steps of FIG. 23. Protruding portions of the memory films 50 inside the drain-select-level trenches 309 may be removed during isotropic etch process. The etch chemistry of the isotropic etch process may be selected to etch the material(s) of the protruding portions of the memory films 50. For example, a wet etch process using a combination of hydrofluoric acid and ethylene glycol may be used to isotropically etch the protruding portions of the memory films 50. The patterned etch mask layer 317 may be subsequently removed, for example, by ashing. The resulting structure may be substantially the same as the second exemplary structure of FIG. 20 after removal of the patterned etch mask layer 317. The processing steps of FIGS. 21, 22A, and 22B may be subsequently performed to provide the second exemplary structure illustrated in FIGS. 22A and 22B.

Figure 25A:
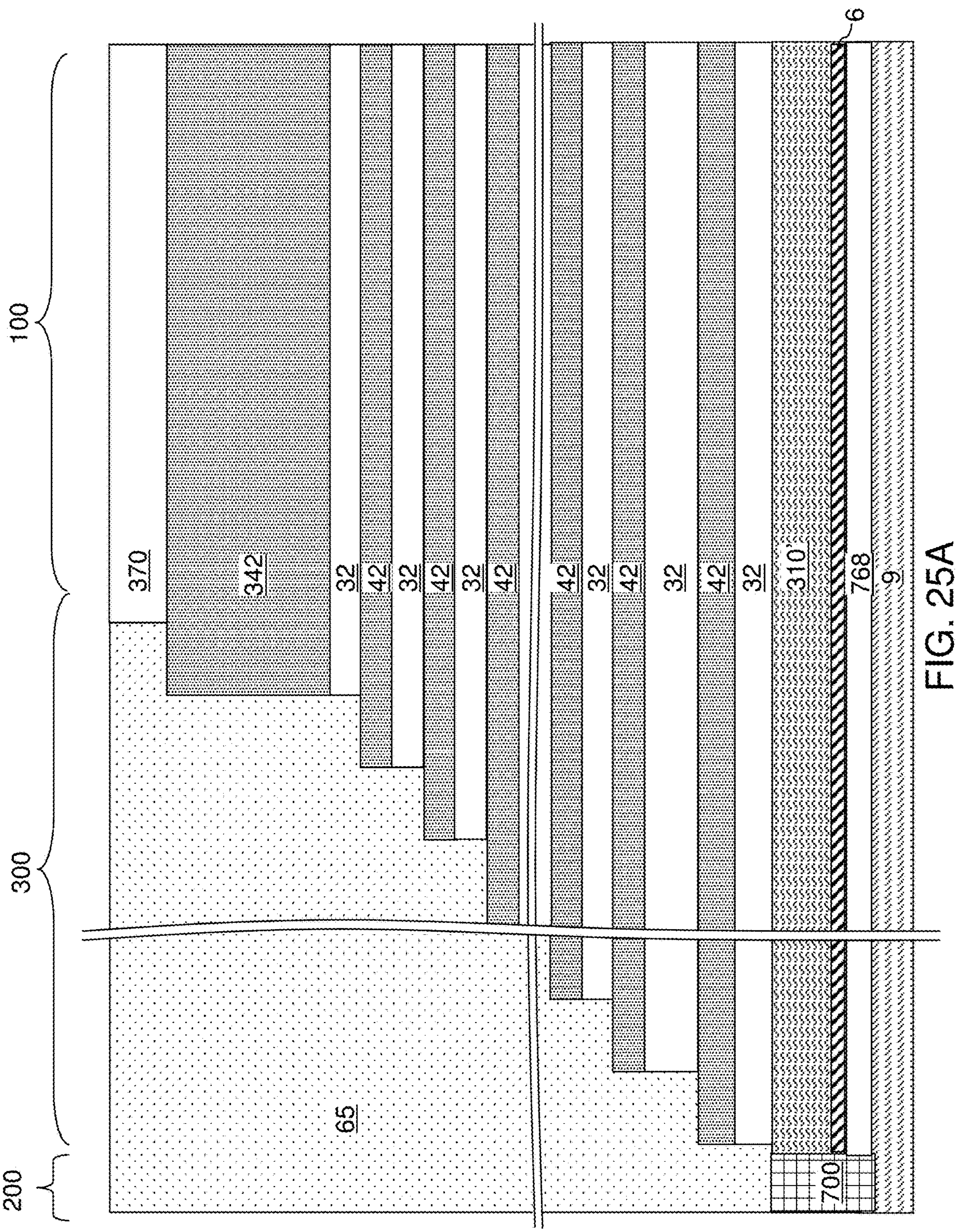
FIG. 25A is a vertical cross-sectional view of a third exemplary structure after formation of an alternating stack and a retro-stepped dielectric material portion according to a third embodiment of the present disclosure.
Figure 25B:
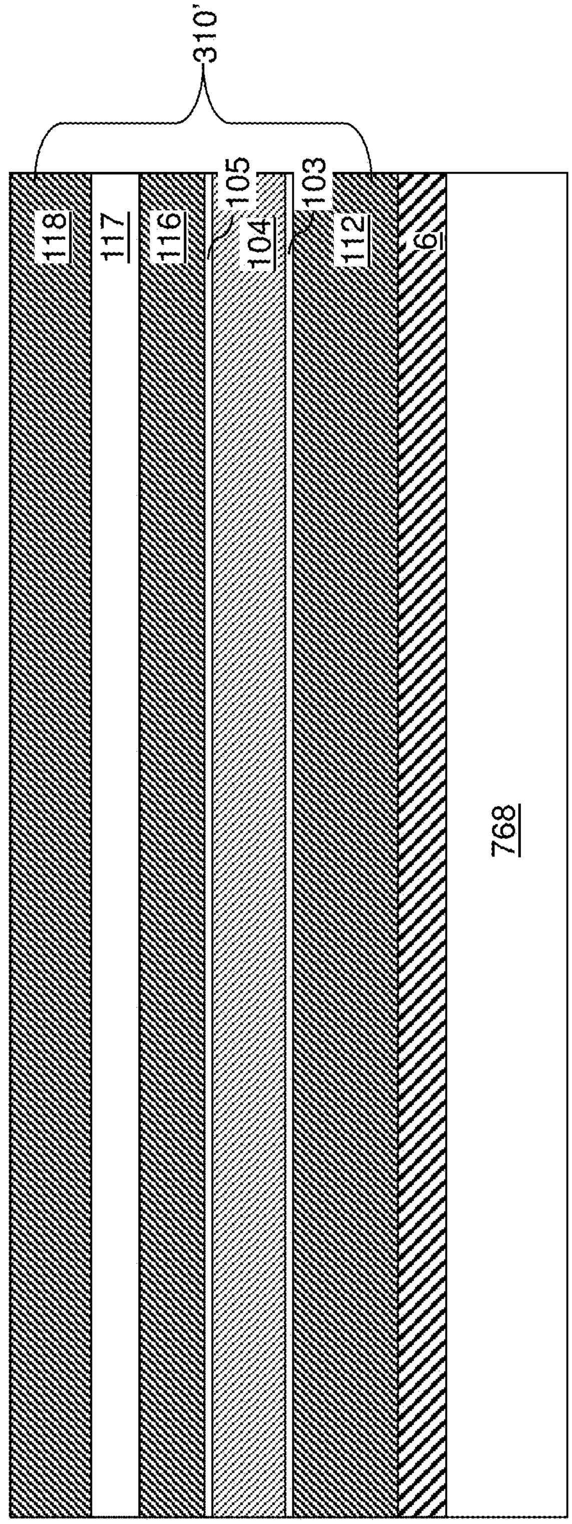
FIG. 25B is a vertical cross-sectional view of an in-process source level material layers according to the third embodiment of the present disclosure.

Referring to FIGS. 25A and 25B, a third exemplary structure according to a third embodiment of the present disclosure may be derived from the first exemplary structure of FIG. 1 by forming a layer stack including a dielectric isolation layer 768, an optional conductive plate layer 6, and in-process source-level material layers 310' in lieu of the semiconductor material layer 10. The dielectric isolation layer 768 electrically isolates the in-process source-level material layers 310' from the substrate semiconductor layer 9. The optional conductive plate layer 6, if present, provides a high conductivity conduction path for electrical current that flows into, or out of, the in-process source-level material layers 310'.

The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 310' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 310' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 310' may be formed directly above a subset of the semiconductor devices on the substrate (such as the substrate semiconductor layer 9). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate.

The optional conductive plate layer 6 and the in-process source-level material layers 310' may be patterned to provide openings in areas in which through-memory-level contact via structures and through-dielectric contact via structures are to be subsequently formed. Patterned portions of the stack of the conductive plate layer 6 and the in-process source-level material layers 310' are present in each memory array region 100 in which three-dimensional memory stack structures are to be subsequently formed.

Subsequently, the processing steps described with reference to FIG. 2 may be performed with a modification such that the topmost sacrificial material layer 42 may be replaced with a drain-select-level sacrificial material layer 342, and the insulating cap layer 70 may be replaced with a sacrificial insulating cap layer 370 that is subsequently removed. In one embodiment, the drain-select-level sacrificial material layer 342 may have a thickness in a range from 1.0 times the average thickness of the sacrificial material layers 42 to 10 time the average thickness of the sacrificial material layers 42, such as from 2 times the average thickness of the sacrificial material layers 42 to 6 time the average thickness of the sacrificial material layers 42, although lesser and greater thicknesses may also be used. In one embodiment, the drain-select-level sacrificial material layer 342 may include the same material as the sacrificial material layers 42. The sacrificial insulating cap layer 370 may include the same material as the insulating cap layer 70 of the first embodiment.

Subsequently, the processing steps described above with reference to FIG. 3 may be performed to form stepped surfaces in the staircase region 300. A retro-stepped dielectric material portion 65 may be formed over the stepped surfaces of the staircase region 300 by deposition and planarization of a dielectric material.

Figure 26A:
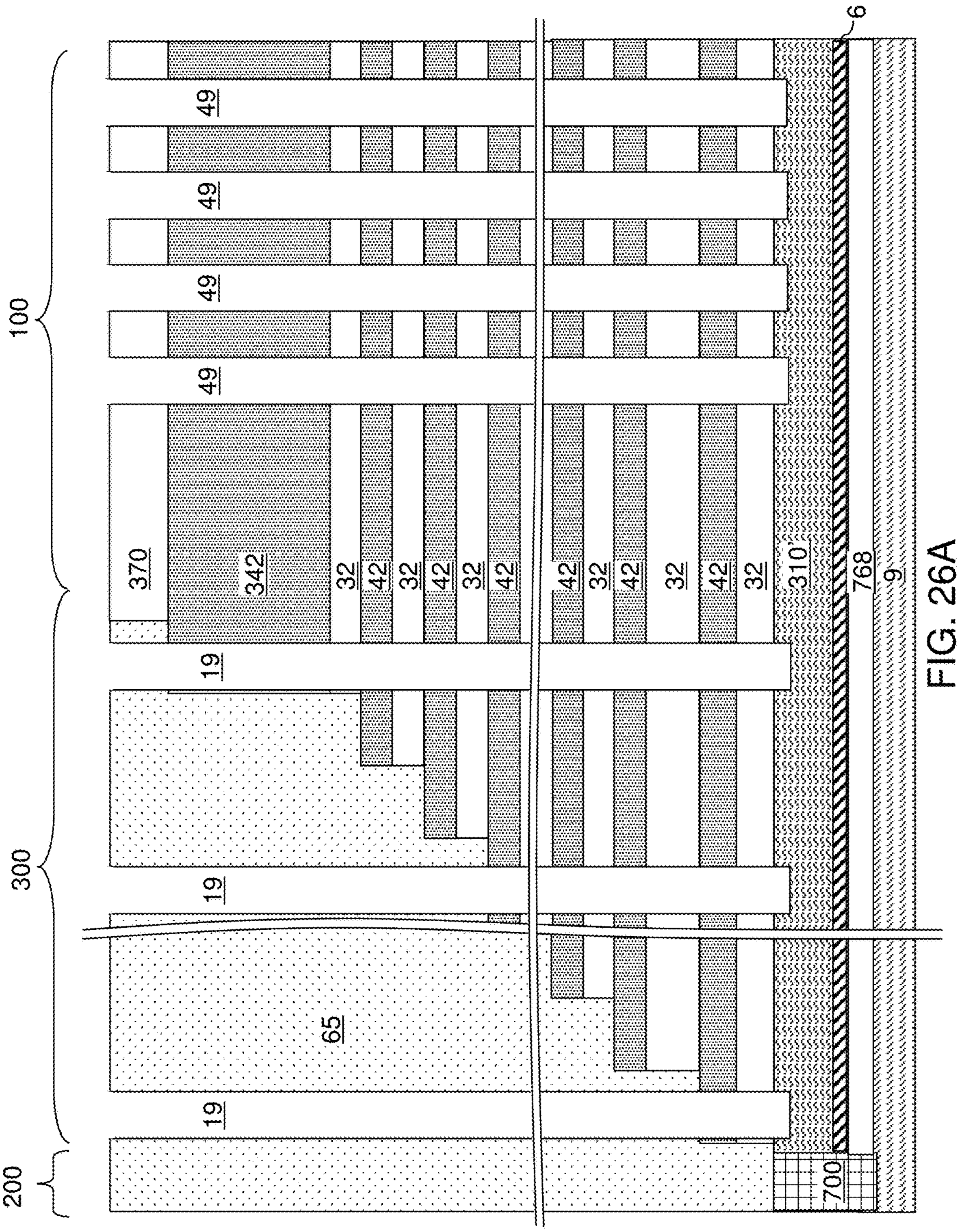
FIG. 26A is a vertical cross-sectional view of the third exemplary structure after formation of memory openings and support openings according to the third embodiment of the present disclosure.
Figure 26B:
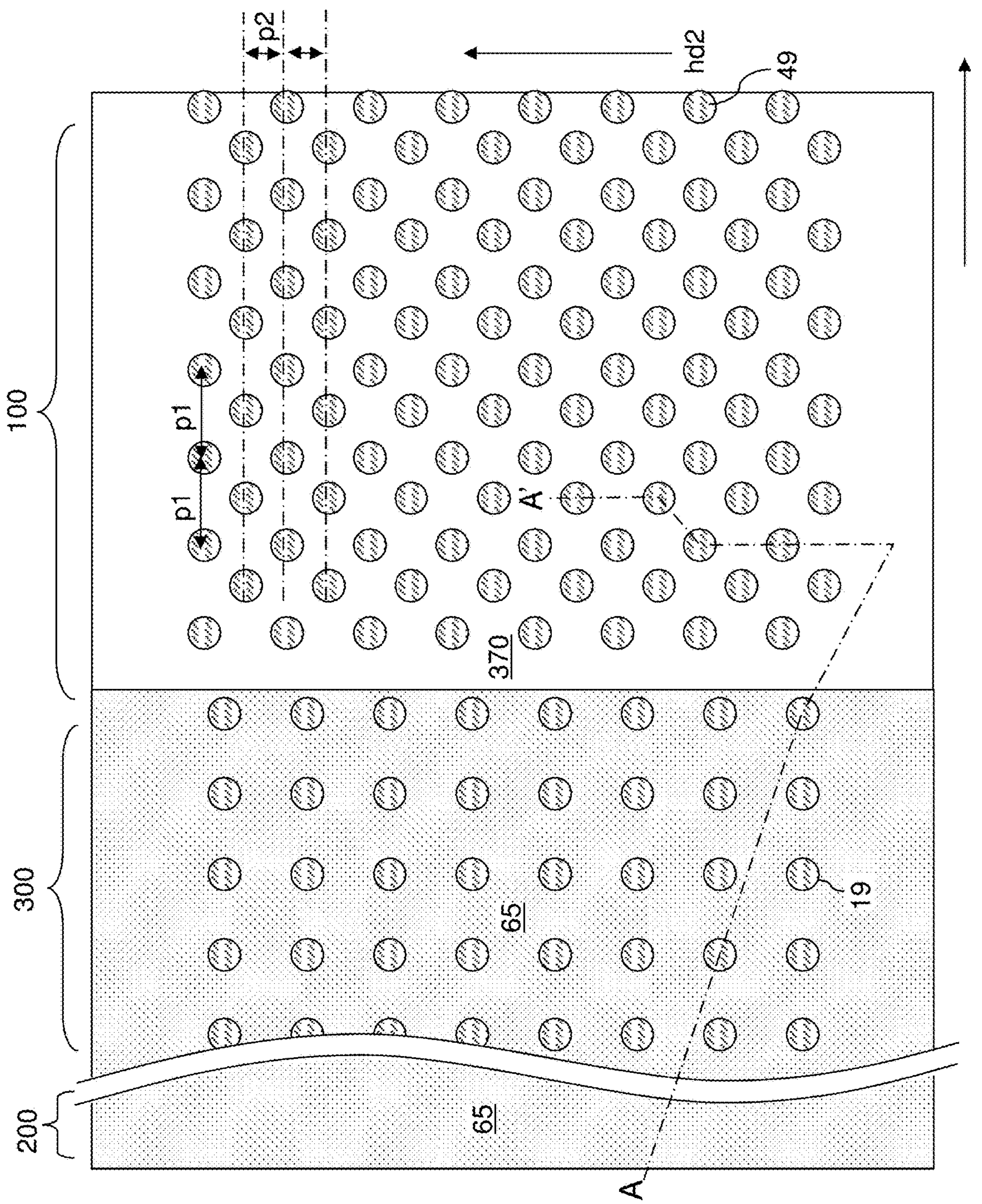
FIG. 26B is a top-down view of the third exemplary structure of FIG. 26A. The zig-zag vertical plane A-A' is the plane of the schematic vertical cross-sectional view of FIG. 26A.

Referring to FIGS. 26A and 26B, the processing steps described above with reference to FIGS. 4A and 4B may be performed to form memory openings 49 and support openings 19. The layout of the memory openings 49 and the support openings may be the same as in the first embodiment. The chemistry of the anisotropic etch process may be selected such that each memory opening 49 extends through the optional source-select-level conductive layer 118, the source-level insulating layer 117, the upper source-level semiconductor layer 116, the source-level sacrificial layer 104, and the lower sacrificial liner 103, and into an upper portion of the lower source-level semiconductor layer 112.

Figure 27:
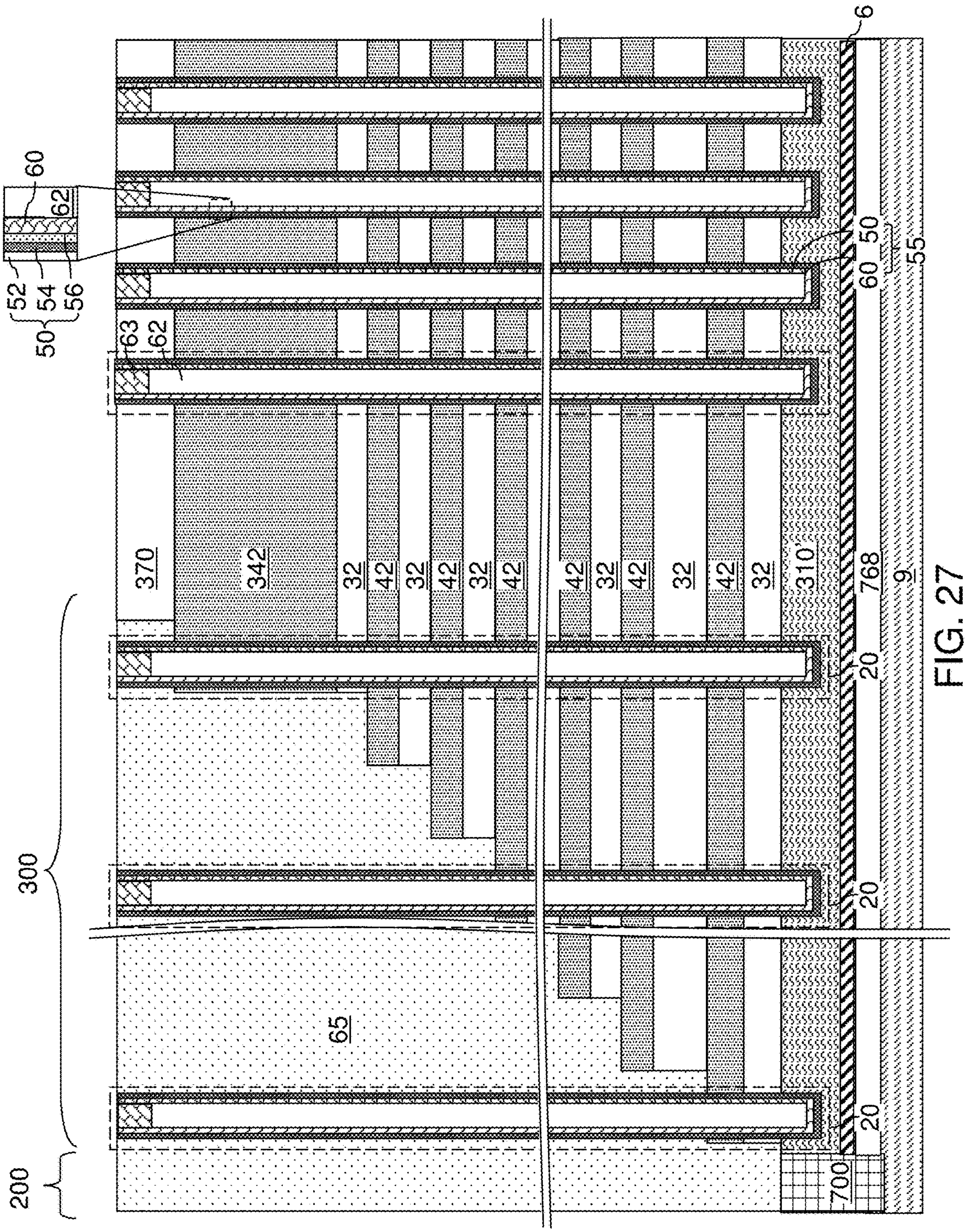
FIG. 27 is a vertical cross-sectional view of the third exemplary structure after formation of memory stack structures according to the third embodiment of the present disclosure.

Referring to FIG. 27, a stack of layers including a blocking dielectric layer 52, a charge storage layer 54, a tunneling dielectric layer 56, and a semiconductor channel material layer may be sequentially deposited in each of the memory openings 49 and the support openings 19. Each of the blocking dielectric layer 52, the charge storage layer 54, and the tunneling dielectric layer 56 may have the same composition and the same thickness as in the first embodiment. The semiconductor channel material layer may have the same thickness and the same composition as the vertical semiconductor channel 60 of the first embodiment. A dielectric material is deposited in unfilled cavities in the memory openings 49 and in the support openings 19, and is vertically recessed to form dielectric cores 62. Excess portions of the blocking dielectric layer 52, the charge storage layer 54, and the tunneling dielectric layer 56, the semiconductor channel material layer are removed from outside the memory openings 49 and the support openings 19. Each remaining portion of the semiconductor channel material layer in a memory opening 49 or in a support opening 19 constitutes a vertical semiconductor channel 60. A semiconductor material having a doping of a second conductivity type may be deposited in recesses above the dielectric cores 62 to form drain regions 63.

Figure 28A:
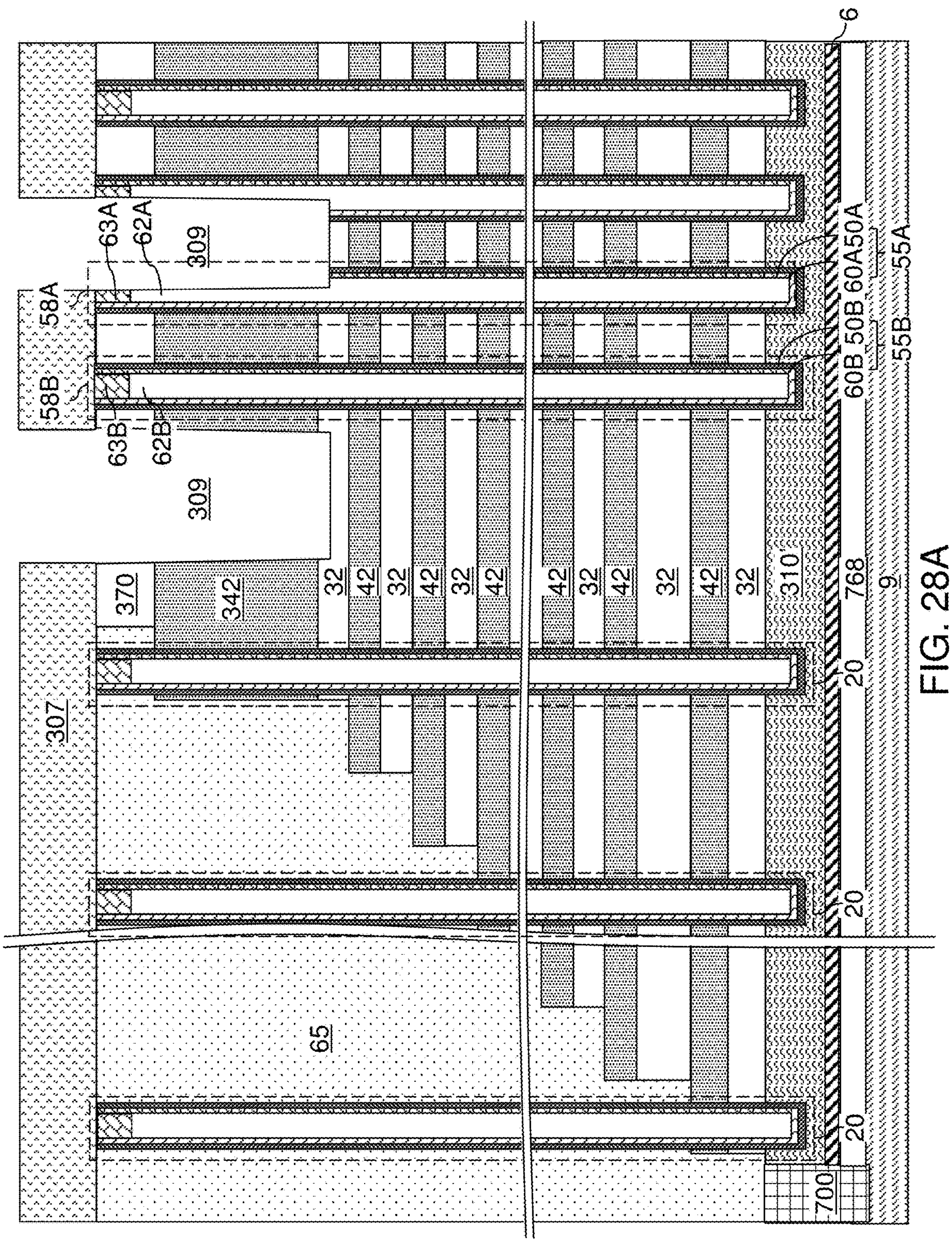
FIG. 28A is a vertical cross-sectional view of the third exemplary structure after formation of drain-select-level trenches according to the third embodiment of the present disclosure.
Figure 28B:
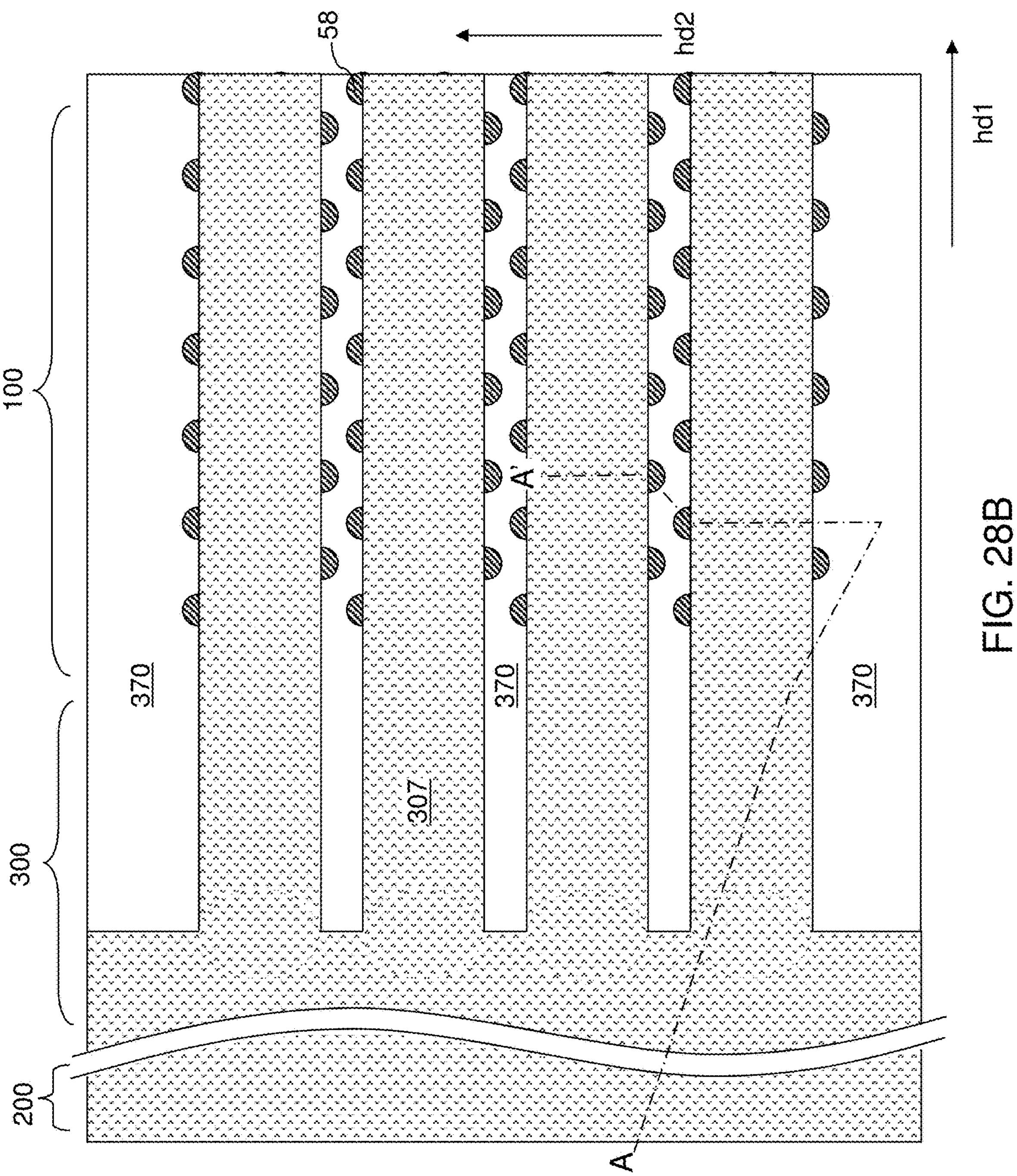
FIG. 28B is a top-down view of the third exemplary structure of FIG. 28A. The zig-zag vertical plane A-A' is the plane of the schematic vertical cross-sectional view of FIG. 28A.

Referring to FIGS. 28A and 28B, a patterned etch mask layer 307 including elongated openings may be formed over the alternating stack (32, 42) and the memory stack structures 55. In one embodiment, the patterned etch mask layer 307 may be a patterned photoresist layer formed by application and lithographic patterning of a photoresist material over the alternating stack (32, 42) and the memory stack structures 55. Each opening in the patterned etch mask layer 307 may overlie a segment of each memory stack structure 55 within a neighboring pair of rows of memory stack structures 55. An opening in the patterned etch mask layer 307 is provided in each area in which backside trenches are to be subsequently formed. Each row of memory stack structures 55 that are most proximal to an area in which a backside trench is to be subsequently formed is partly exposed underneath one of the openings in the patterned etch mask layer 307.

Each memory stack structure 55 of which a segment is located within an area of one of the openings in the patterned etch mask layer 307 is herein referred to as a first memory stack structure 55A. Memory stack structures 55 that are entirely covered with the patterned etch mask layer 307, for example, by being located between neighboring pairs of first memory stack structures 55A, are herein referred to as a second memory stack structure 55B. Second memory stack structures 55B may, or may not, be present in the first exemplary structure depending on the layout of the elongated openings in the patterned etch mask layer 307. Each first memory stack structure 55A is only partly covered with the patterned etch mask layer 307. As such, a first area of each of the first memory stack structures 55A is located within an area of an elongated opening in the patterned etch mask layer 307, and a second area of each of the first memory stack structures 55B is covered by the patterned etch mask layer 307. The first area may be in a range from 15% to 70%, such as from 25% to 50%, of the entire area of each first memory stack structure 55A. Each row of memory stack structures 55 that neighbors an area in which a backside trench is to be subsequently formed is a row of first memory stack structures 55A.

Drain regions 63 at an upper end of the first memory stack structures 55A are herein referred to as first drain regions 63A, and drain regions 63 at an upper end of the second memory stack structures 55B are herein referred to as second drain regions 63B. Dielectric cores 62 formed within the first memory stack structures 55A are herein referred to as first dielectric cores 62A, and dielectric cores 62 formed within the second memory stack structures 55B are herein referred to as second dielectric cores 62B. Each vertical semiconductor channel 60A of the first memory stack structures 55A is herein referred to as a first vertical semiconductor channel 60, and each vertical semiconductor channel 60 of the second memory stack structures 55B is herein referred to as a second vertical semiconductor channel 60B. Each memory film 50 of the first memory stack structures 55A is herein referred to as a first memory film 50A, and each memory film 50 of the second memory stack structures 55B is herein referred to as a second memory film 50B.

An anisotropic etch process may be performed to etch unmasked portions of the sacrificial insulating cap layer 370 and the drain-select-level sacrificial material layer 342 and unmasked segments of the first memory stack structures 55A. The unmasked segments of the first memory stack structures 55A include portions of vertical semiconductor channels (60A, 60B) and the memory films (50A, 50B) of the first memory stack structures 55A that are not masked by the patterned etch mask layer 307. A drain-select-level trench 309 may be formed underneath each elongated opening within the patterned etch mask layer 307 by etching through unmasked portions of the sacrificial insulating cap layer 370 and the drain-select-level sacrificial material layer 342 and a first area of each of the first memory stack structures 55A (i.e., unmasked portions of the first memory stack structures 55A). Each drain-select-level trench 309 may include a pair of straight lengthwise sidewalls that extend along the first horizontal direction hd1. The depth of the drain-select-level trenches 309 may be selected such that the drain-select-level trenches 309 vertically extend through the sacrificial insulating cap layer 370 and the drain-select-level sacrificial material layer 342, and does not extend into sacrificial material layers 42.

The anisotropic etch process etches portions of memory films (50A, 50B) of the first memory stack structure 55A that underlie the elongated opening in the patterned etch mask layer 307. A portion of each first drain region 63A may be removed during formation of the drain-select-level trenches 309. The pair of straight lengthwise sidewalls of each drain-select-level trench 309 may comprise straight sidewall segments of remaining portions of the first drain regions 63A and straight sidewall segments of the dielectric cores (62A, 62B). The memory stack structures (55A, 55B) may comprise second memory stack structures 55B that are masked with a patterned etch mask layer 307 during formation of the drain-select-level trenches 309. Sidewalls of the second memory stack structures 55B are not etched during formation of the drain-select-level trenches 309. Thus, each vertical semiconductor channel (60A, 60B) of the second memory stack structures 55B has a tubular configuration. The patterned etch mask layer 307 may be removed, for example, by ashing after formation of the drain-select-level trenches 309.

Figure 29A:
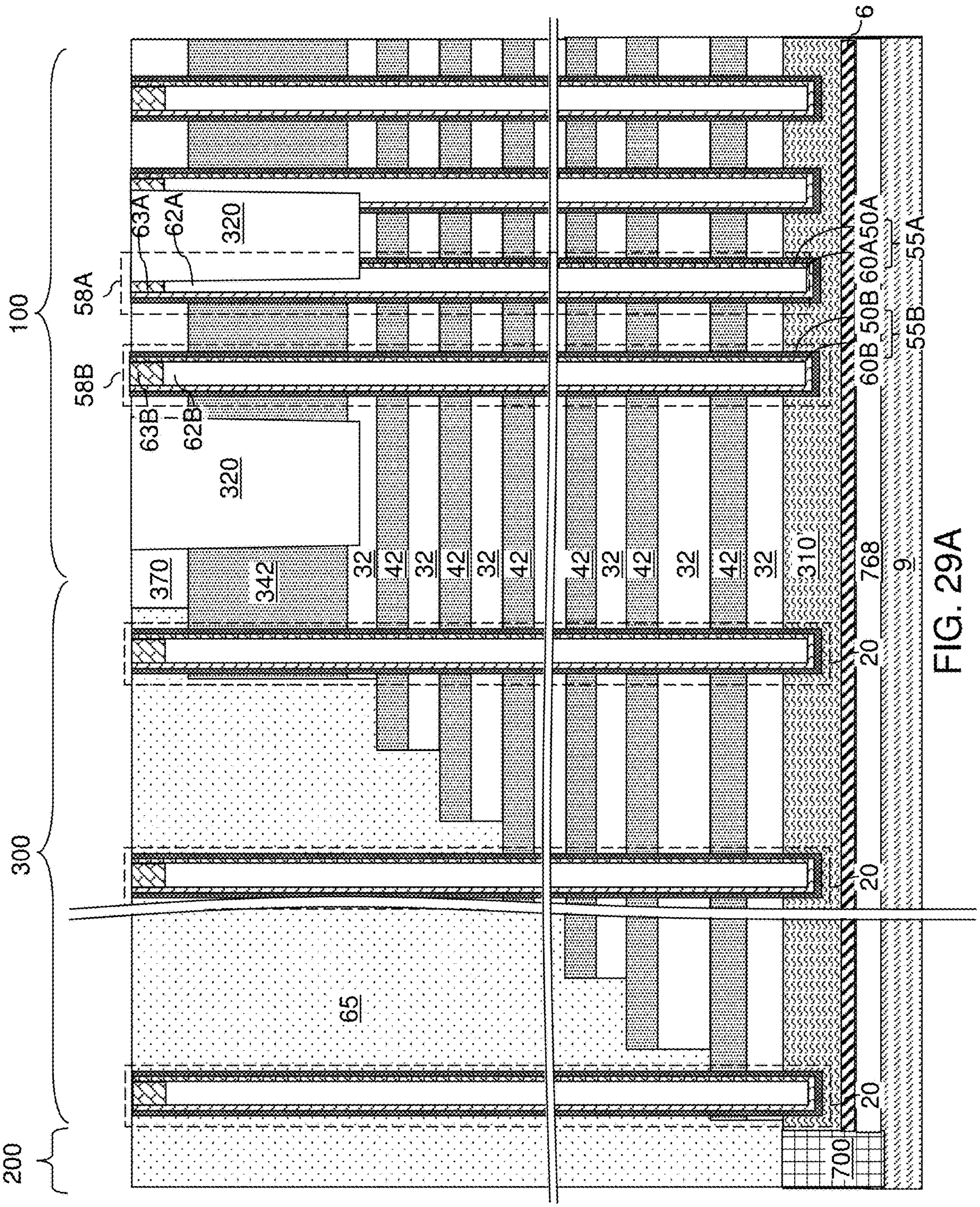
FIG. 29A is a vertical cross-sectional view of the third exemplary structure after formation of drain-select-level isolation structures according to the third embodiment of the present disclosure.
Figure 29B:
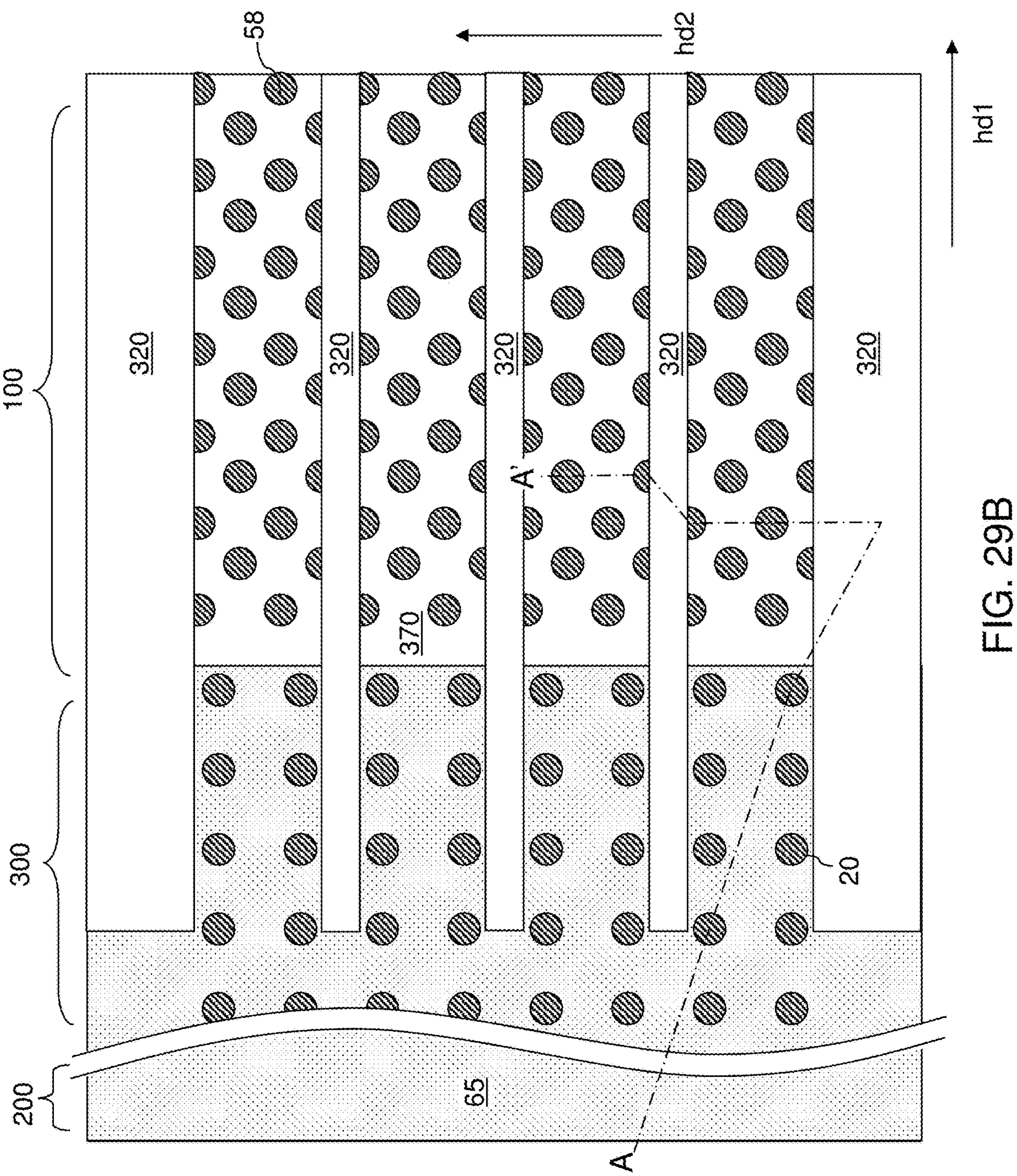
FIG. 29B is a top-down view of the third exemplary structure of FIG. 29A. The zig-zag vertical plane A-A' is the plane of the schematic vertical cross-sectional view of FIG. 29A.

Referring to FIGS. 29A and 29B, a drain-select-level isolation structure 320 may be formed in each drain-select-level trench 309, for example, by depositing a dielectric material such as silicon oxide in the drain-select-level trenches 309. Excess portions of the dielectric material may be removed from above the horizontal plane including the top surface of the sacrificial insulating cap layer 370 by a planarization process, which may use a recess etch and/or chemical mechanical planarization. Each drain-select-level isolation structure 320 may include a pair of straight sidewalls that laterally extend along the first horizontal direction hd1. Each drain-select-level isolation structure 320 may vertically extend through the drain-select-level sacrificial material layer 342 and the sacrificial insulating cap layer 370. Each vertical semiconductor channel (60A, 60B) within the first memory stack structures 55A comprises a tubular section that underlie a horizontal plane including a bottom surface of a drain-select-level isolation structure 320 and a semi-tubular section overlying the tubular section and contacting the drain-select-level isolation structure 320.

Figure 30A:
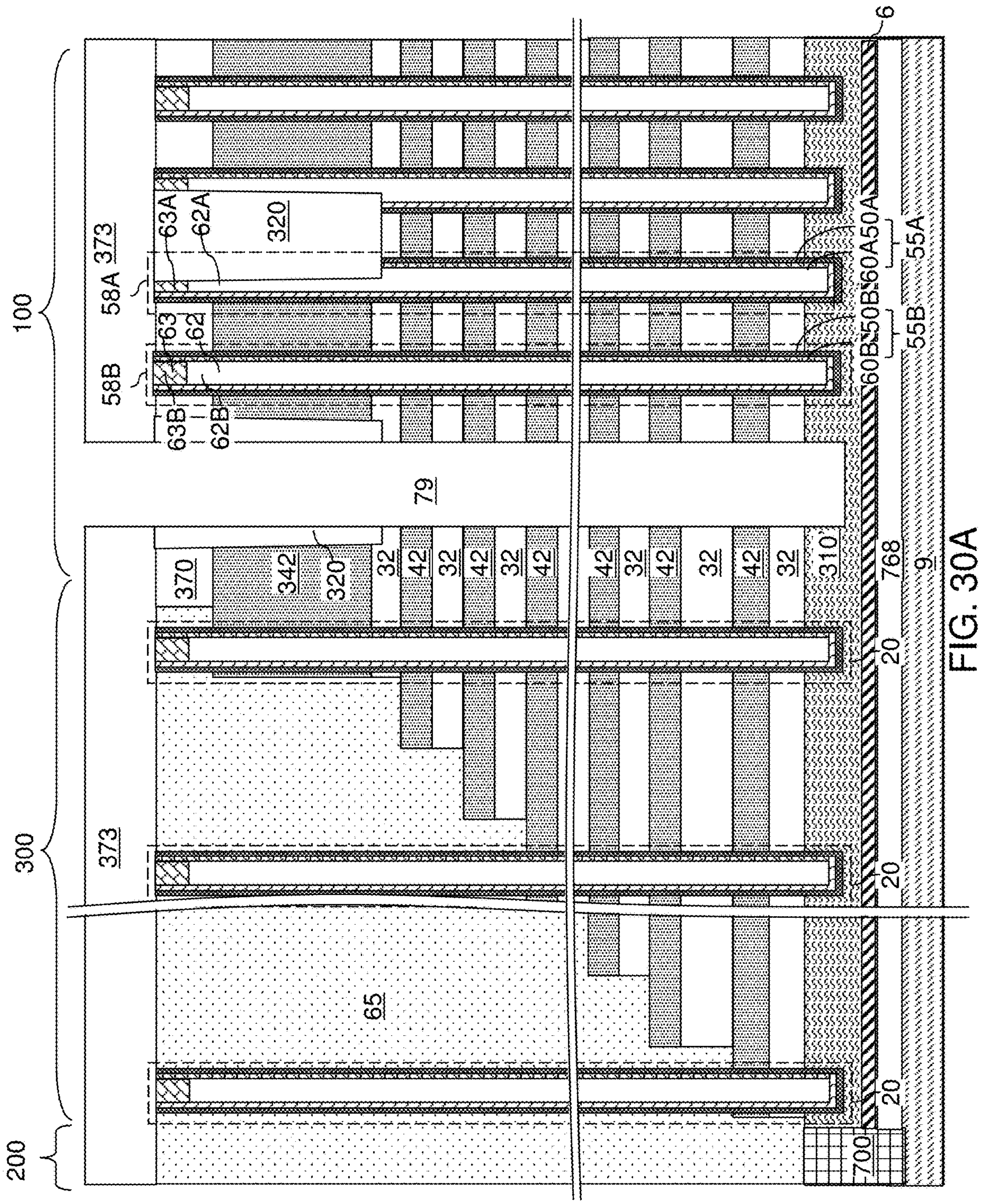
FIG. 30A is a vertical cross-sectional view of the third exemplary structure after formation of backside trenches according to the third embodiment of the present disclosure.
Figure 30B:
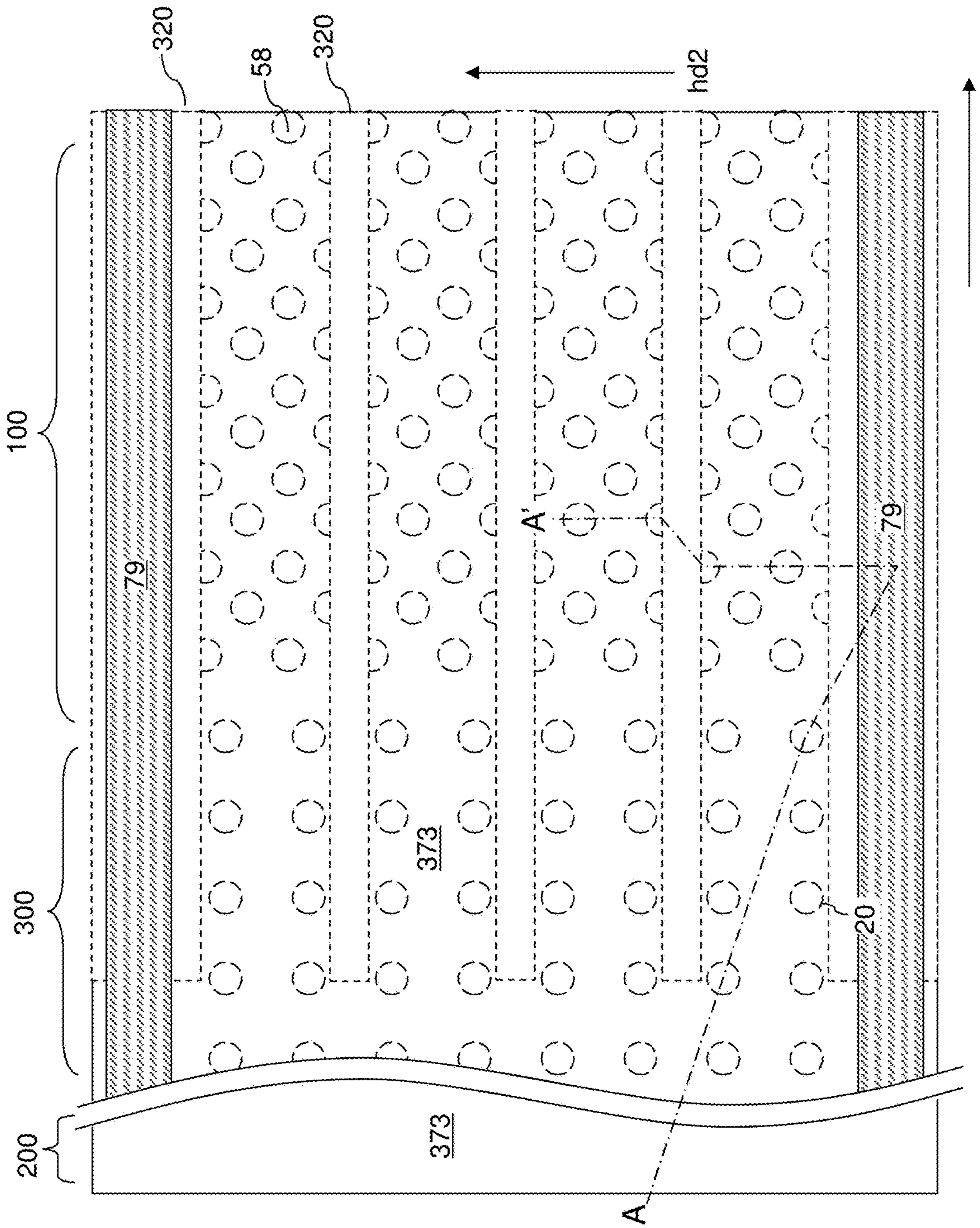
FIG. 30B is a top-down view of the third exemplary structure of FIG. 30A. The zig-zag vertical plane A-A' is the plane of the schematic vertical cross-sectional view of FIG. 30A.

Referring to FIGS. 30A and 30B, a sacrificial planarization stopper layer 373 may be formed over the sacrificial insulating cap layer 370. The sacrificial planarization stopper layer 373 may include a material that may be used as a planarization stopper structure and is different from the material of the sacrificial material layers 42. In one embodiment, the sacrificial planarization stopper layer 373 may include silicon oxide, and may have a thickness in a range from 50 nm to 500 nm.

A photoresist layer (not shown) may be applied over the sacrificial planarization stopper layer 373, and lithographically patterned to form openings in areas between clusters of memory stack structures (55A, 55B). The pattern in the photoresist layer may be transferred through the sacrificial planarization stopper layer 373, the sacrificial insulating cap layer 370, the drain-select-level sacrificial material layer 342, the alternating stack (32, 42), and/or the retro-stepped dielectric material portion 65 using an anisotropic etch to form backside trenches 79. The backside trenches 79 may extend into the in-process source-level material layers 310'. For example, bottom surfaces of the backside trenches 79 may be recessed surfaces of the source-level sacrificial layer 104.

Figure 31A:
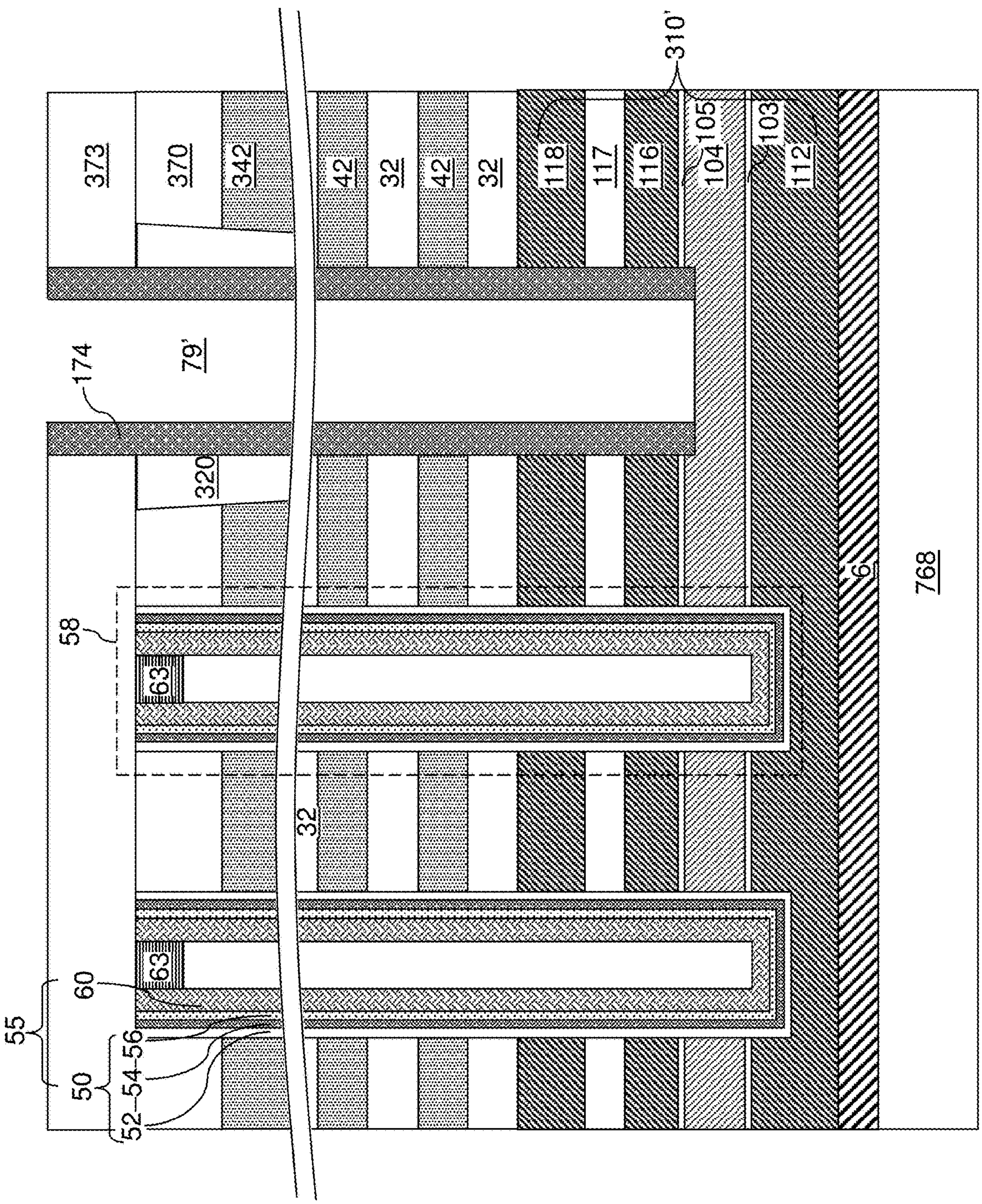
FIGS. 31A-31E are sequential vertical cross-sectional views of a backside trench and two memory opening fill structures during replacement of the in-process source level material layers with source level material layers according to the third embodiment of the present disclosure.

Referring to FIG. 31A, a backside trench spacer 174 may be formed on sidewalls of each backside trench 79. For example, a conformal spacer material layer may be deposited in the backside trenches 79 and over the sacrificial planarization stopper layer 373, and may be anisotropically etched to form the backside trench spacers 174. The backside trench spacers 174 may include a material that is different from the material of the source-level sacrificial layer 104. For example, the backside trench spacers 174 may include silicon nitride. A backside cavity 79' may be present within each backside trench 79.

Figure 31B:
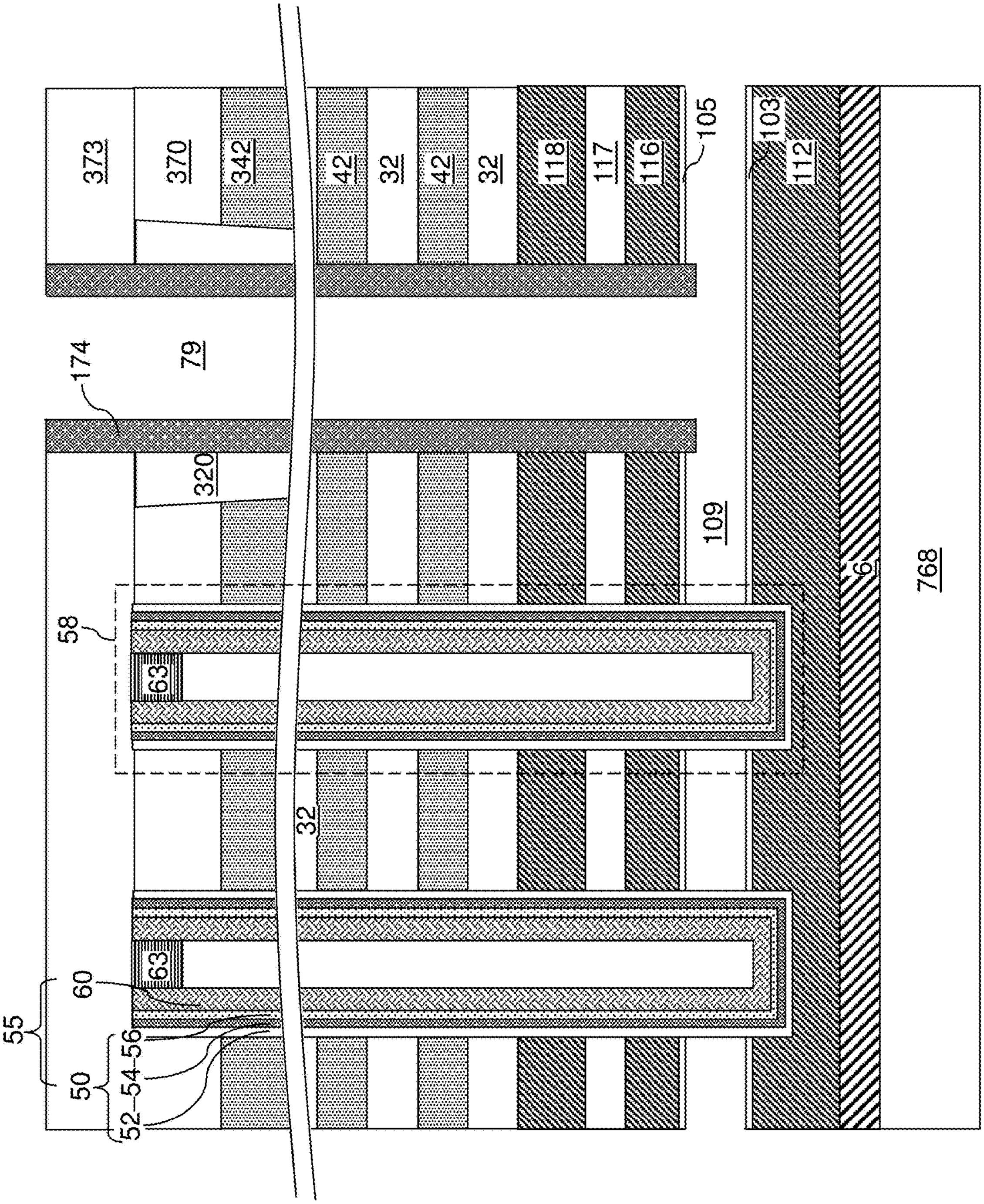

Referring to FIG. 31B, an etchant that etches the material of the source-level sacrificial layer 104 selective to the materials of the backside trench spacers 174, the sacrificial planarization stopper layer 373, the upper sacrificial liner 105, and the lower sacrificial liner 103 may be introduced into the backside cavities 79' in an isotropic etch process. For example, if the source-level sacrificial layer 104 includes undoped amorphous silicon or an undoped amorphous silicon-germanium alloy, the backside trench spacers 174 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 174 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 174, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and a bottom surface that are physically exposed to the source cavity 109.

Figure 31C:
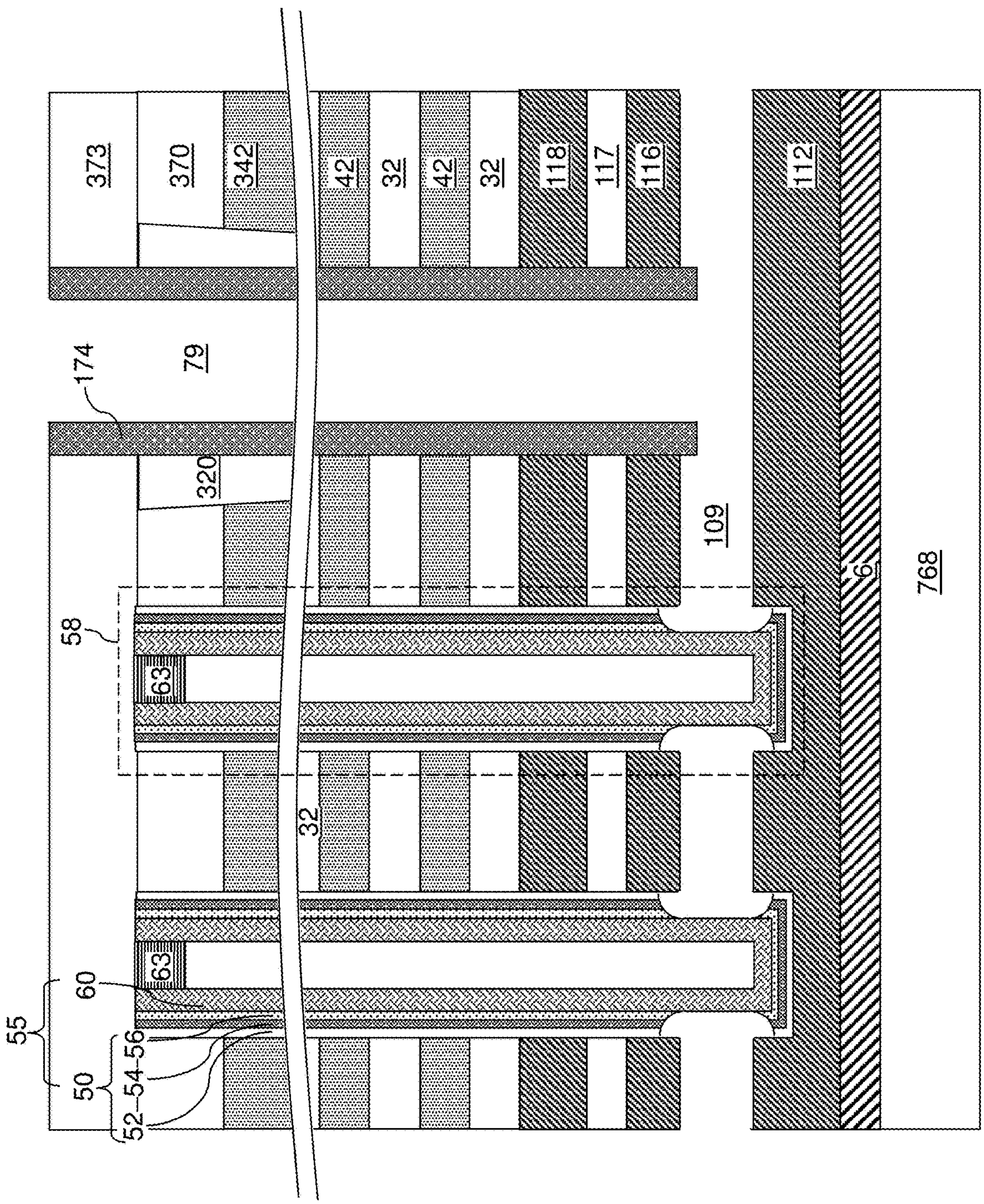

Referring to FIG. 31C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 may be formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 31D:
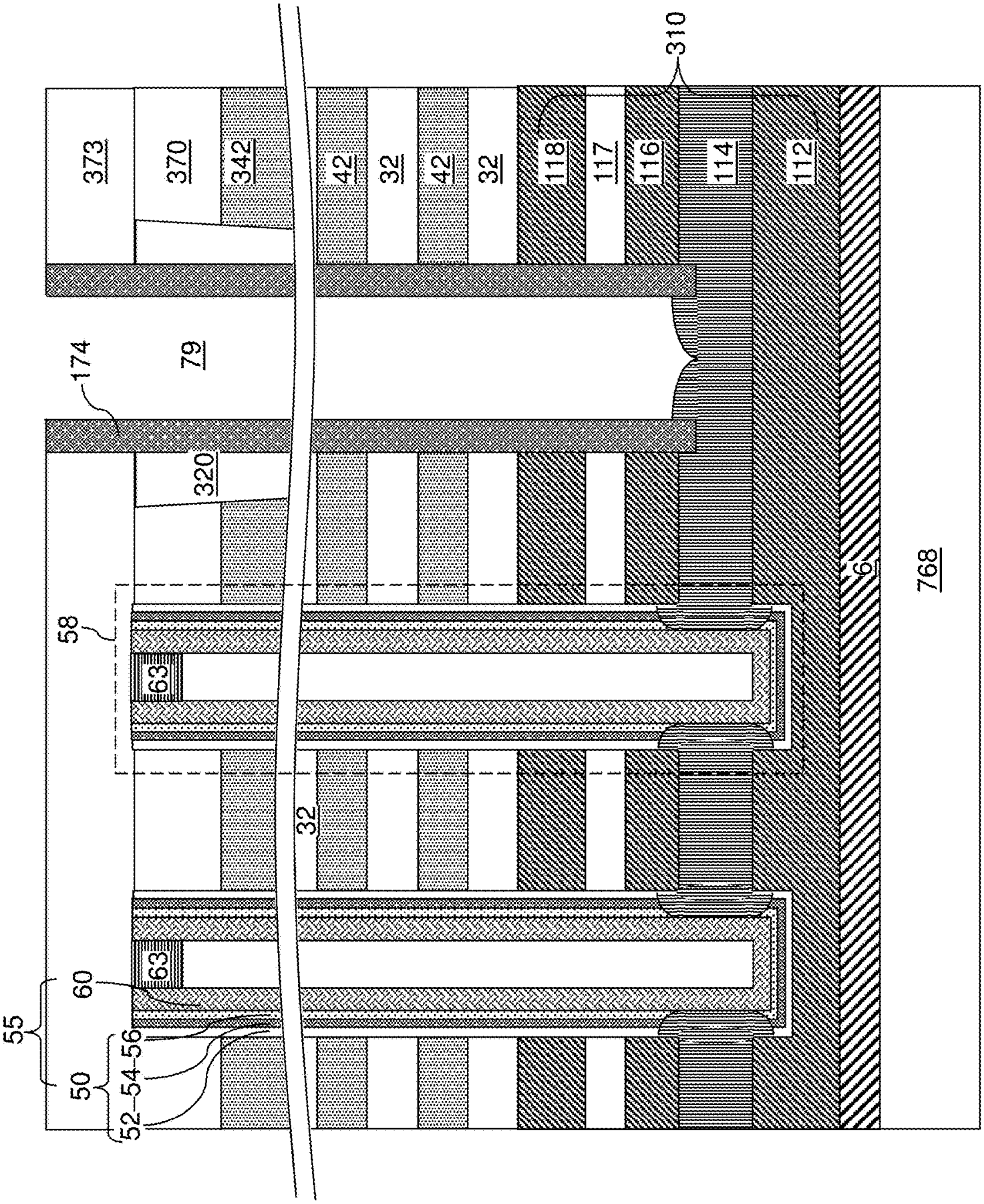

Referring to FIG. 31D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a doped horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material having a doping of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant such as phosphine, arsine, stibine, or diborane. In this case, the selective semiconductor deposition process grows a doped semiconductor material from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 174. In one embodiment, the source contact layer 114 may be formed by selectively depositing a doped semiconductor material from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 may constitute a buried source layer (112, 114, 116). The set of layers including the buried source layer (112, 114, 116), the source-level insulating layer 117, and the source-select-level conductive layer 118 may constitute source-level material layers 310, which replaces the in-process source-level material layers 310'.

Figure 31E:
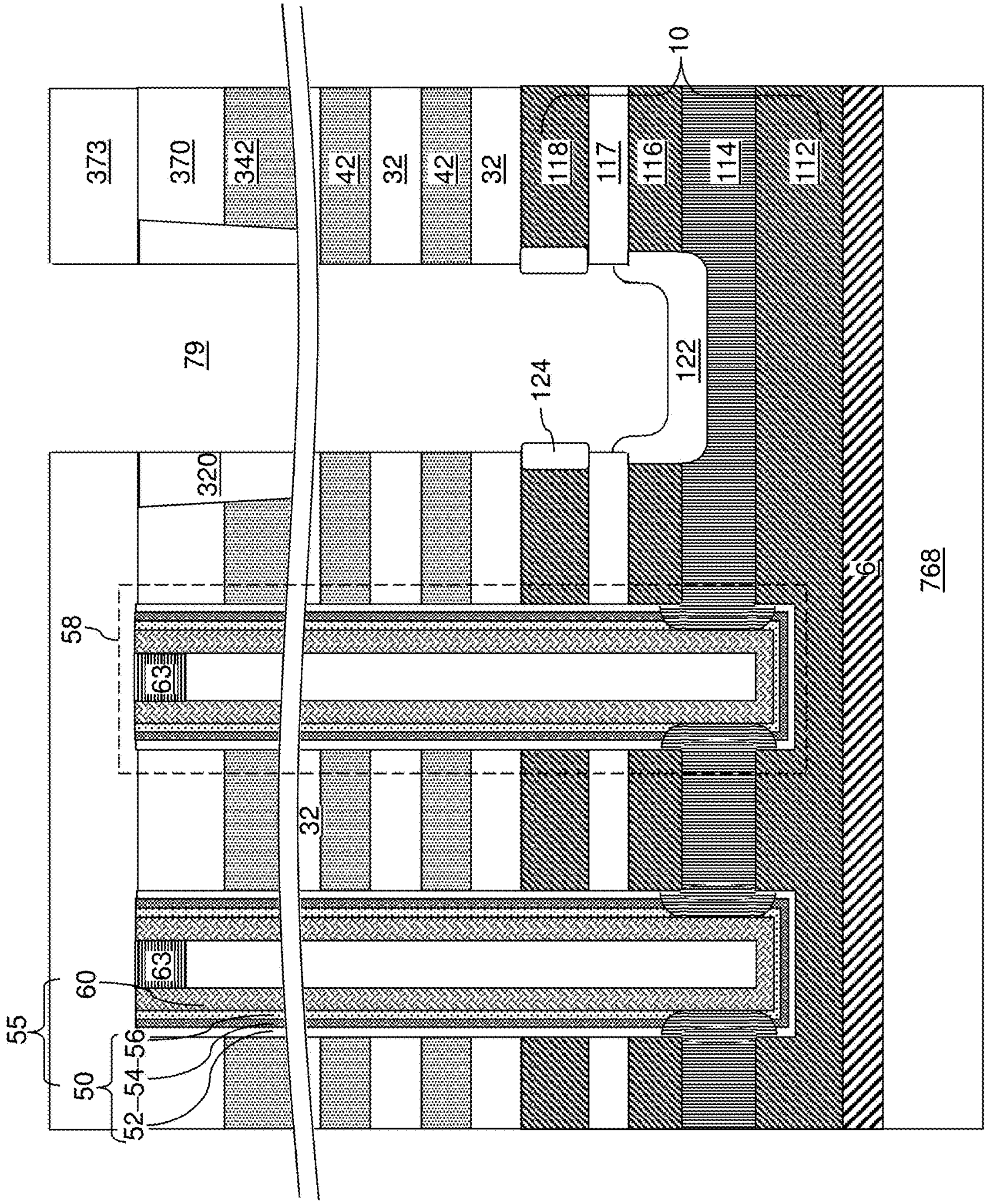

Referring to FIG. 31E, the backside trench spacers 174 may be removed selective to the insulating layers 32, the sacrificial planarization stopper layer 373, the drain-select-level isolation structures 320, and the source contact layer 114 using an isotropic etch process. For example, if the backside trench spacers 174 include silicon nitride, a wet etch process using hot phosphoric acid may be performed to remove the backside trench spacers 174. In one embodiment, the isotropic etch process that removes the backside trench spacers 174 may be combined with a subsequent isotropic etch process that etches the sacrificial material layers 42 selective to the insulating layers 32, drain-select-level isolation structures 320, the sacrificial planarization stopper layer 373, and the source contact layer 114.

The vertical semiconductor channels 60 may have a doping of the first conductivity type, and the source contact layer 114 having a doping of the second conductivity type that is an opposite of the first conductivity type is located over the substrate that includes the substrate semiconductor layer 9. The source contact layer 114 may contact bottom ends of each of the vertical semiconductor channels 60.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide liners 122, and surface portions of the source-select-level conductive layer 118 may be converted into annular dielectric semiconductor oxide spacers 124.

Figure 32:
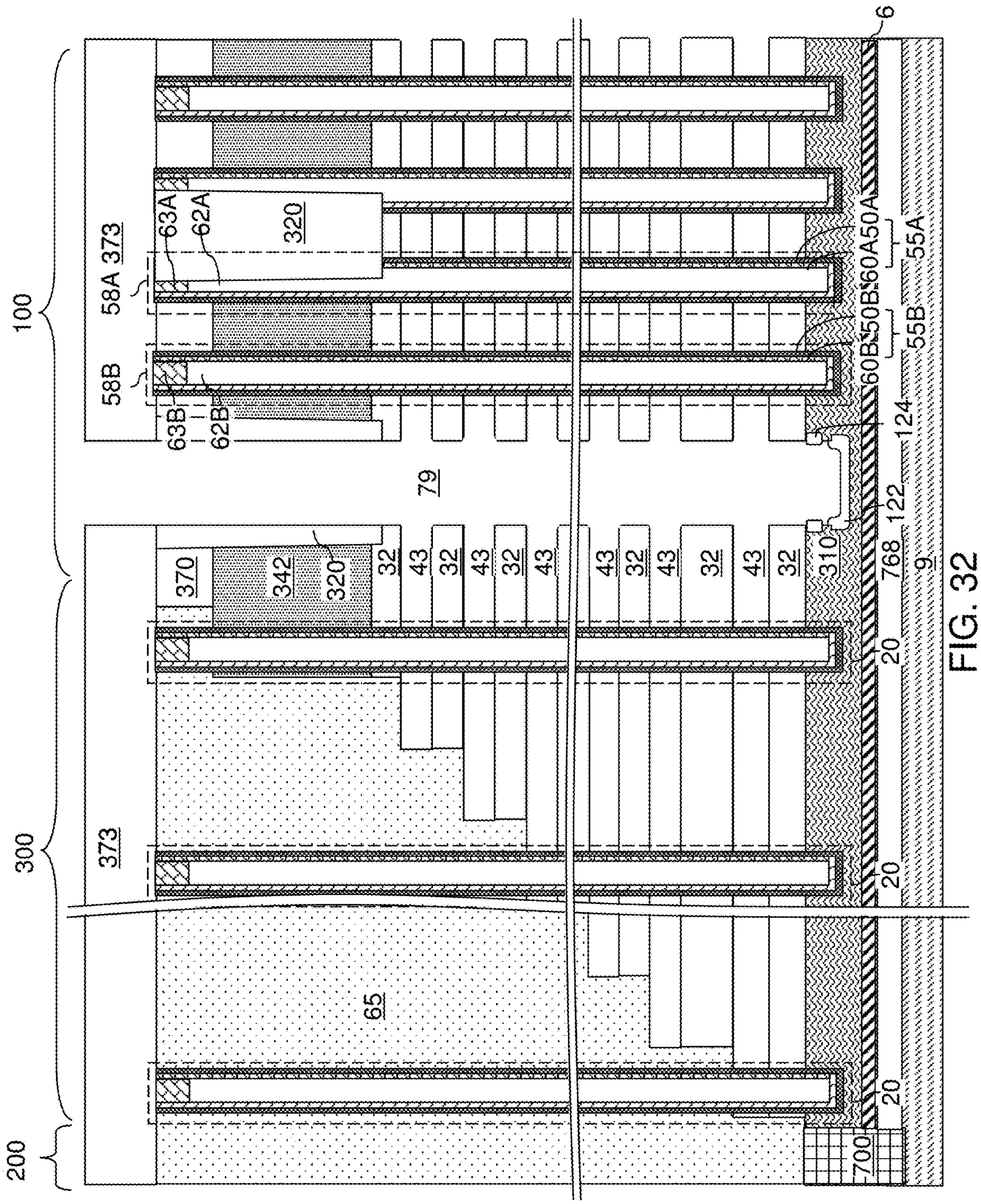
FIG. 32 is a schematic vertical cross-sectional view of the third exemplary structure after formation of backside recesses according to the third embodiment of the present disclosure.

Referring to FIG. 32, the sacrificial material layers 42 may be removed selective to the insulating layers 32, the drain-select-level isolation structures 320, the sacrificial planarization stopper layer 373, and the source contact layer 114, the dielectric semiconductor oxide liners 122, and the annular dielectric semiconductor oxide spacers 124. For example, an etchant that selectively etches the materials of the sacrificial material layers 42 with respect to the materials of the insulating layers 32, the drain-select-level isolation structures 320, the retro-stepped dielectric material portion 65, and the material of the outermost layer of the memory films (50A, 50B) may be introduced into the backside trenches 79, for example, using an isotropic etch process. For example, the sacrificial material layers 42 may include silicon nitride, the materials of the insulating layers 32, the drain-select-level isolation structures 320, the retro-stepped dielectric material portion 65, and the outermost layer of the memory films (50A, 50B) may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses 43 may be formed in volumes from which the sacrificial material layers 42 are removed. Each of the backside recesses 43 may be a laterally extending cavity having a lateral dimension that is greater than the vertical extent of the cavity. In other words, the lateral dimension of each of the backside recesses 43 may be greater than the height of the respective backside recess 43. A plurality of backside recesses 43 may be formed in the volumes from which the material of the sacrificial material layers 42 is removed. Each of the backside recesses 43 may extend substantially parallel to the top surface of the substrate semiconductor layer 9. A backside recess 43 may be vertically bounded by a top surface of an underlying insulating layer 32 and a bottom surface of an overlying insulating layer 32. In one embodiment, each of the backside recesses 43 may have a uniform height throughout. The drain-select-level sacrificial material layer 342 may be protected from the etchant by a combination of the sacrificial planarization stopper layer 373, the drain-select-level isolation structures 320, and a topmost insulating layer 32, i.e., the topmost one of the insulating layers 32.

Figure 33:
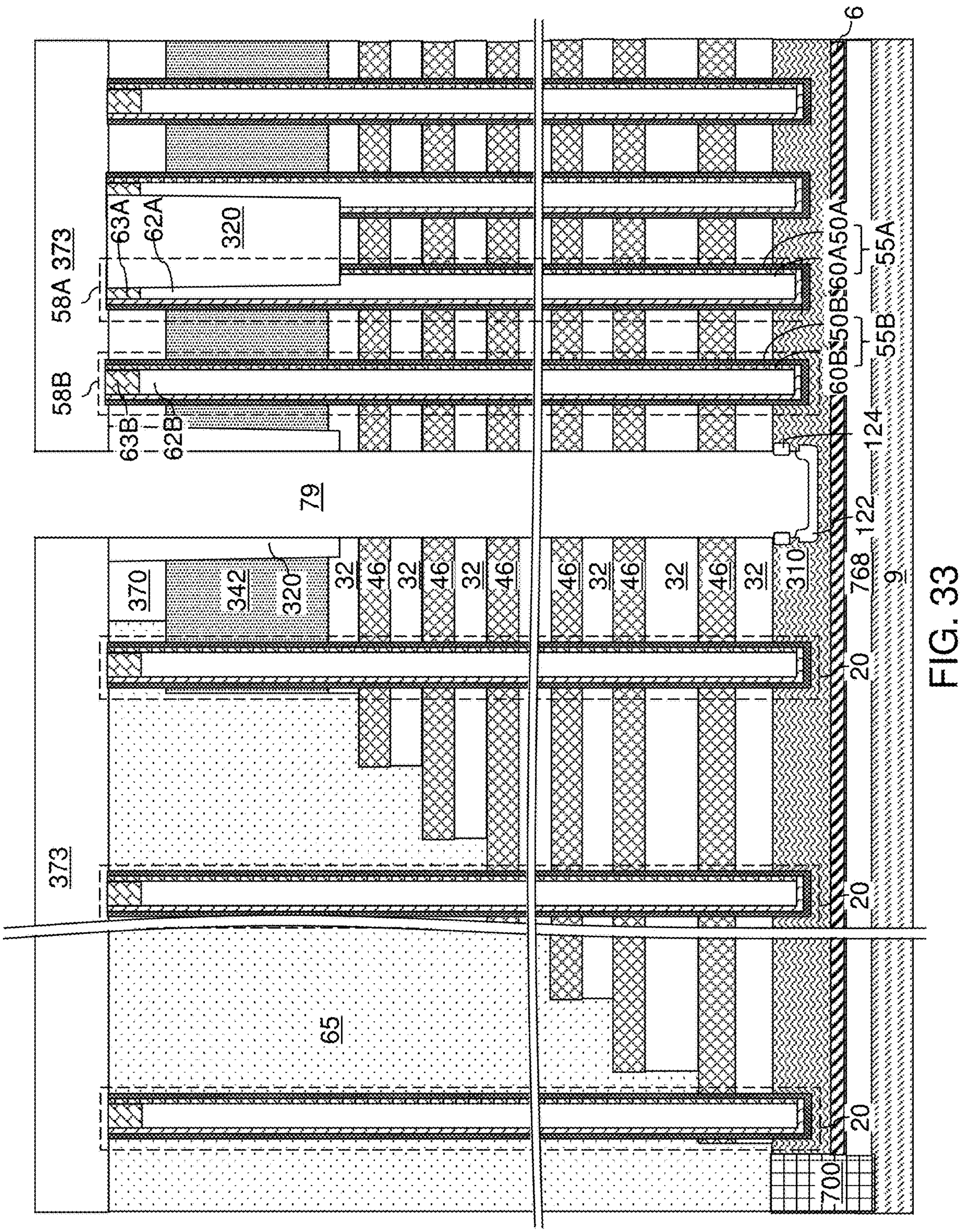
FIG. 33 is a schematic vertical cross-sectional view of the third exemplary structure after formation of electrically conductive layers according to the third embodiment of the present disclosure.

Referring to FIG. 33, a backside blocking dielectric layer (not shown) may be optionally deposited in the backside recesses 43 and the backside trenches 79 and over the sacrificial planarization stopper layer 373. The backside blocking dielectric layer may include a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses 43, on the sidewalls of the backside trenches 79, and over the sacrificial planarization stopper layer 373. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses 43 include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses 43 may be a combination of titanium nitride layer and a tungsten fill material.

Electrically conductive layers 46 may be formed in the backside recesses 43 by deposition of the at least one conductive material. A continuous metallic material layer (not shown) may be formed on the sidewalls of each backside trench 79 and over the sacrificial planarization stopper layer 373. Each of the electrically conductive layers 46 may include a respective conductive metallic nitride liner and a respective conductive fill material. Thus, the first and second sacrificial material layers 42 may be replaced with the electrically conductive layers 46, respectively. Specifically, each sacrificial material layer 42 may be replaced with an optional portion of the backside blocking dielectric layer and an electrically conductive layer 46. A backside cavity may be present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the sacrificial planarization stopper layer 373, for example, by an anisotropic or isotropic etch. Each remaining portion of the deposited metallic material in the backside recesses 43 constitutes an electrically conductive layer 46. Sidewalls of the electrically conductive layers 46 may be physically exposed to a respective backside trench 79. The backside trenches may have a pair of curved sidewalls having a non-periodic width variation along the first horizontal direction hd1 and a non-linear width variation along the vertical direction.

Each electrically conductive layer 46 may be a conductive sheet including openings therein. A first subset of the openings through each electrically conductive layer 46 may be filled with memory opening fill structures 58. A second subset of the openings through each electrically conductive layer 46 may be filled with the support pillar structures 20. Each electrically conductive layer 46 may have a lesser area than any underlying electrically conductive layer 46 because of the first and second stepped surfaces. Each electrically conductive layer 46 may have a greater area than any overlying electrically conductive layer 46 because of the first and second stepped surfaces.

The electrically conductive layer 46 may function as combinations of a control gate and a word line located at the same level. The control gate electrodes within each electrically conductive layer 46 are the control gate electrodes for a vertical memory device including the memory stack structure (55A, 55B). Each of the memory stack structures (55A, 55B) comprises a vertical stack of memory elements located at each level of the electrically conductive layers 46. A subset of the electrically conductive layers 46 may comprise word lines for the memory elements. The semiconductor devices in the peripheral device region 200 may comprise word line switch devices configured to control a bias voltage to respective word lines. The memory-level assembly is located over the substrate semiconductor layer 9. The memory-level assembly includes at least one alternating stack (32, 46) and memory stack structures (55A, 55B) vertically extending through the at least one alternating stack (32, 46).

Figure 34:
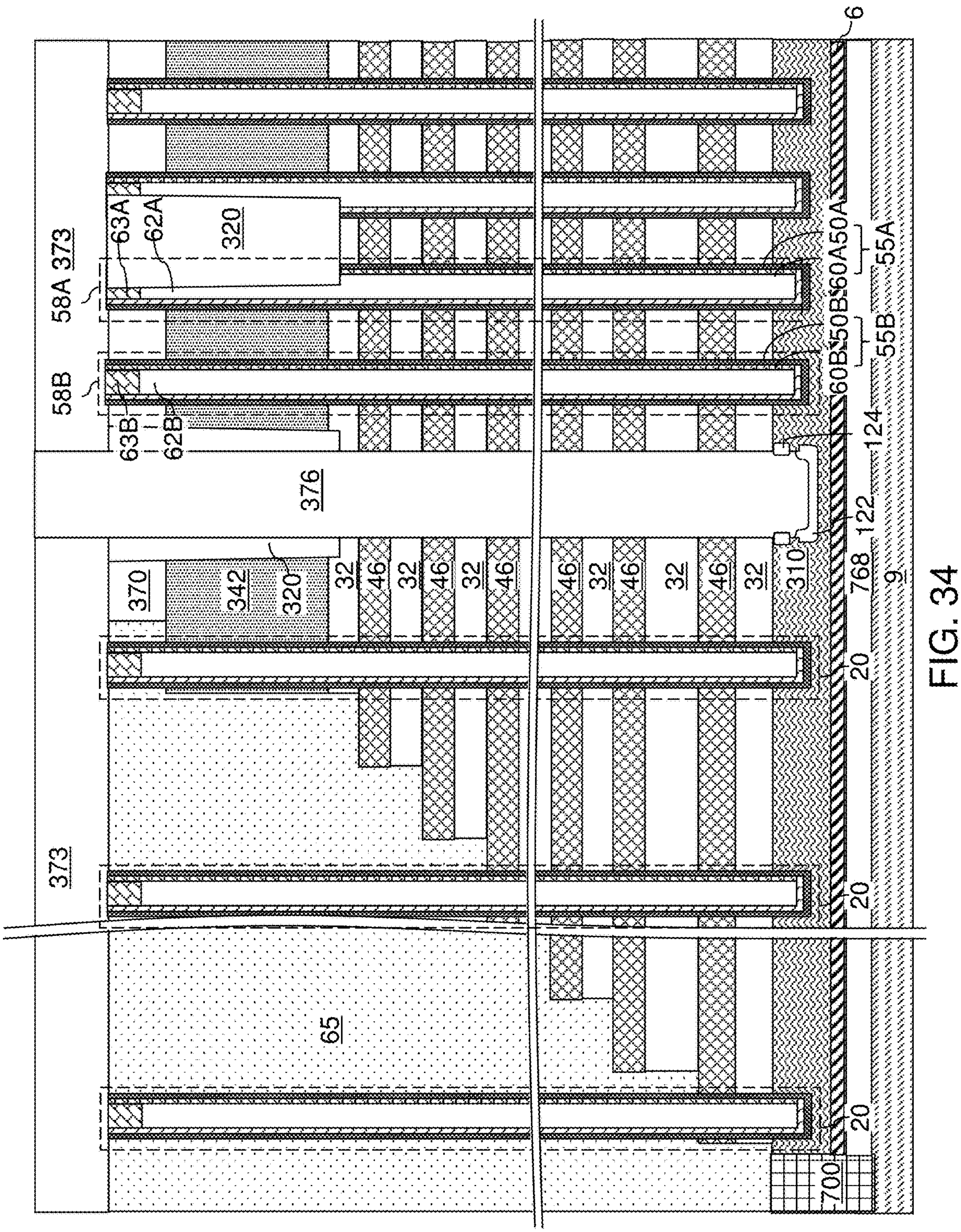
FIG. 34 is a schematic vertical cross-sectional view of the third exemplary structure after formation of dielectric wall structures according to the third embodiment of the present disclosure.

Referring to FIG. 34, a dielectric material may be conformally deposited in the backside trenches 79 and over the sacrificial planarization stopper layer 373 by a conformal deposition process. The dielectric material layer may include, for example, silicon oxide. Each portion of the dielectric material deposited in a backside trench 79 constitutes a dielectric wall structure 376. The horizontally-extending portion of the deposited dielectric material above the sacrificial planarization stopper layer 373 may be removed, for example, by a recess etch, which may use, for example, a wet etch or a dry etch. Alternatively, an insulating spacer (not shown) may be formed at a periphery of each backside trench 79, and a backside contact via structure (not shown) contacting the source contact layer 114 may be formed through each dielectric semiconductor oxide liner 122 within a respective one of the insulating spacers.

Figure 35A:
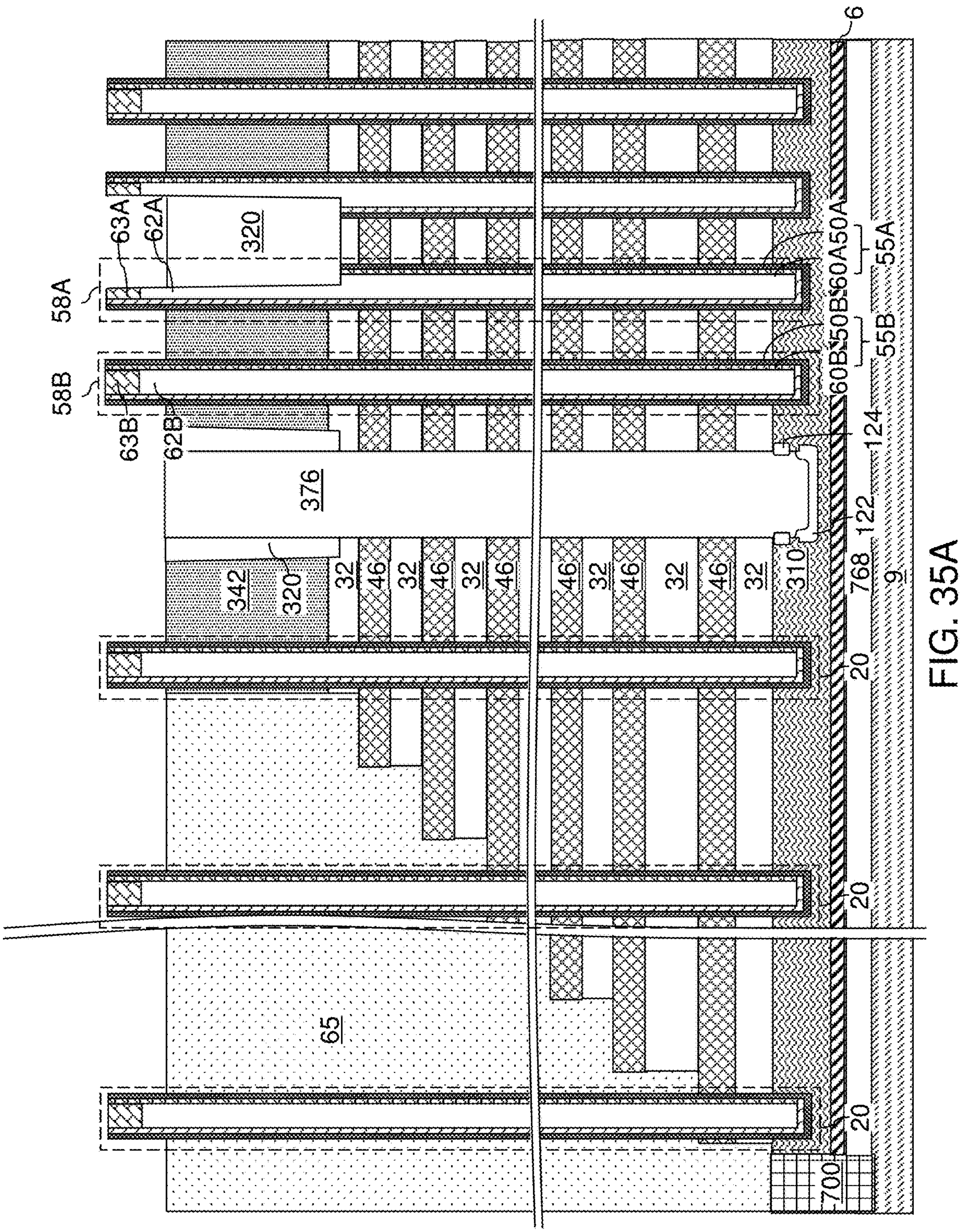
FIG. 35A is a schematic vertical cross-sectional view of the third exemplary structure after removal of a sacrificial planarization stopper layer according to the third embodiment of the present disclosure.
Figure 35B:
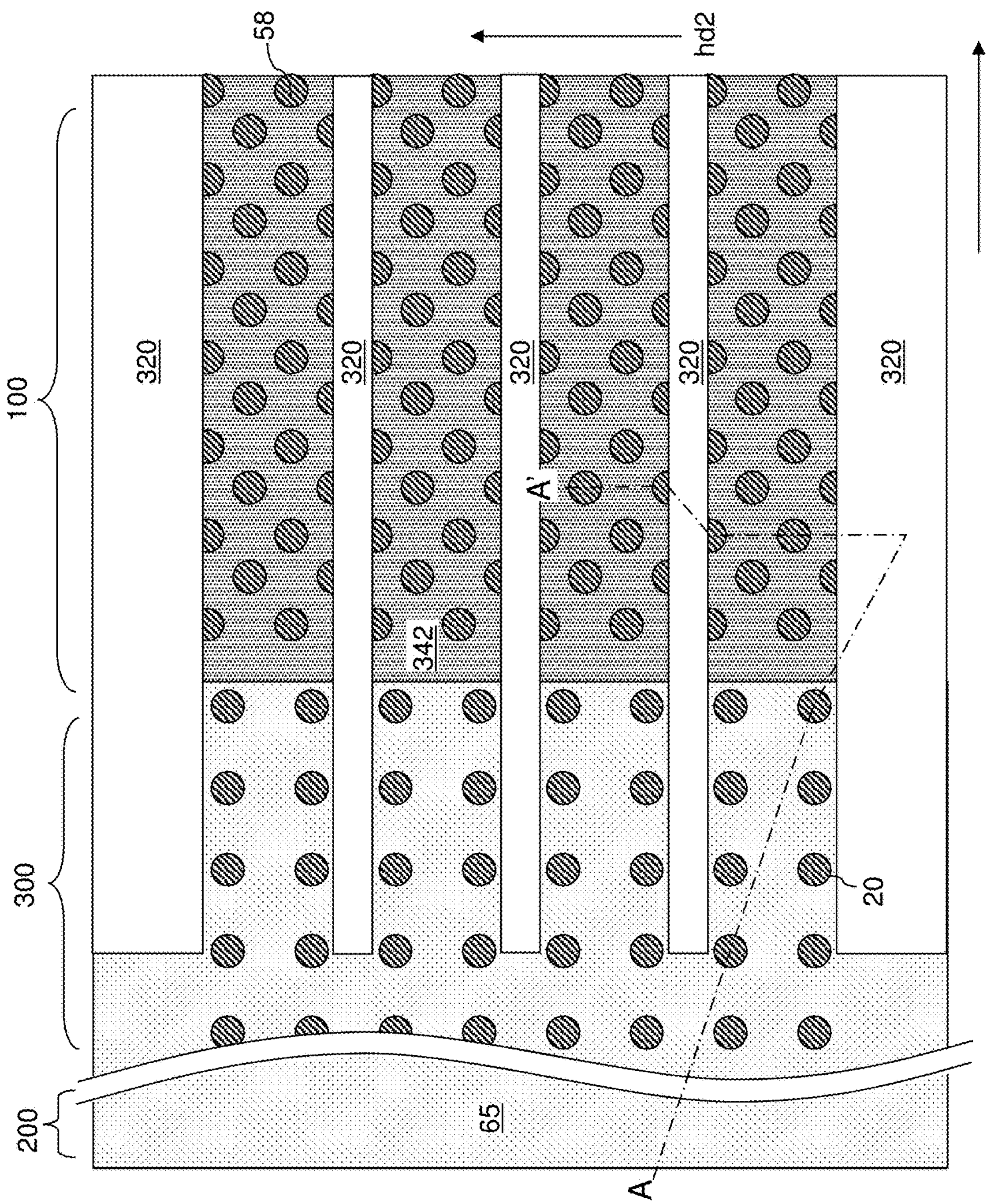
FIG. 35B is a top-down view of the third exemplary structure of FIG. 35A. The zig-zag vertical plane A-A' is the plane of the schematic vertical cross-sectional view of FIG. 35A.

Referring to FIGS. 35A and 35B, the sacrificial planarization stopper layer 373 and an upper portion of each dielectric wall structures 376 may be removed by a recess etch, which may use an isotropic etch process such as a wet etch process using hydrofluoric acid. The sacrificial insulating cap layer 370, an upper portion of each drain-select-level isolation structure 320, an upper portion of the retro-stepped dielectric material portion 65, and an additional portion of each dielectric wall structure 376 may be subsequently removed, for example, by extending the recess etch process. In one embodiment, sacrificial planarization stopper layer 373, the sacrificial insulating cap layer 370, the drain-select-level isolation structures 320, the retro-stepped dielectric material portion 65, and the dielectric wall structures 376 may include a same dielectric material, which may be, for example, undoped silicate glass or doped silicate glass. In this case, the recess etch process may provide recessed surfaces of the drain-select-level isolation structures 320, the retro-stepped dielectric material portion 65, and the dielectric wall structures 376 within a same horizontal plane. A top surface of each strip of the drain-select-level sacrificial material layer 342 may be physically exposed after recessing the sacrificial planarization stopper layer 373, the sacrificial insulating cap layer 370, the drain-select-level isolation structures 320, the retro-stepped dielectric material portion 65, and the dielectric wall structures 376.

The recess etch process used to recess the sacrificial planarization stopper layer 373, the sacrificial insulating cap layer 370, the drain-select-level isolation structures 320, the retro-stepped dielectric material portion 65, and the dielectric wall structures 376 may be selective to the materials of the drain-select-level sacrificial material layer 342, the drain regions (63A, 63B), the vertical semiconductor channels (60A, 60B), and a material layer within the memory films (50A, 50B) such as a charge storage layer 54. For example, the recess etch process may include a wet etch process using dilute hydrofluoric acid.

Figure 36:
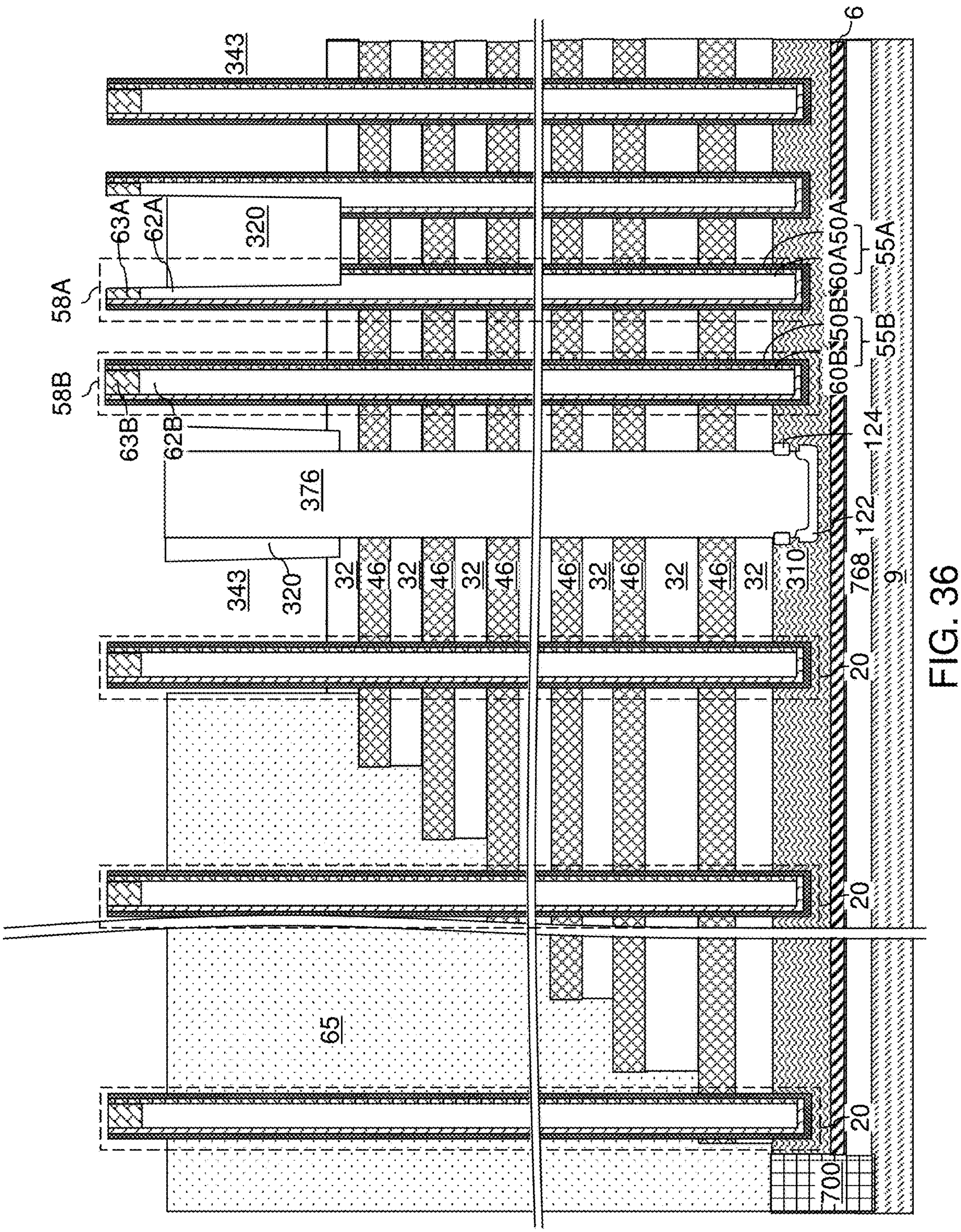
FIG. 36 is a schematic vertical cross-sectional view of the third exemplary structure after formation of drain-select-level recesses according to the third embodiment of the present disclosure.

Referring to FIG. 36, drain-select-level recesses 343 may be formed by removing the drain-select-level sacrificial material layer 342 selective to the materials of the drain-select-level isolation structures 320, the retro-stepped dielectric material portion 65, and the dielectric wall structures 376, selective to the semiconductor materials of the drain regions (63A, 63B) and the vertical semiconductor channels (60A, 60B), and selective to the dielectric material of the outermost layer of the memory films (50A, 50B) (which may be, for example, silicon oxide of the blocking dielectric layers 52). For example, a wet etch process using hot phosphoric acid may be used to remove the drain-select-level sacrificial material layer 342. The volumes from which the drain-select-level sacrificial material layer 342 is removed constitutes the drain-select-level recesses 343.

Figure 37A:
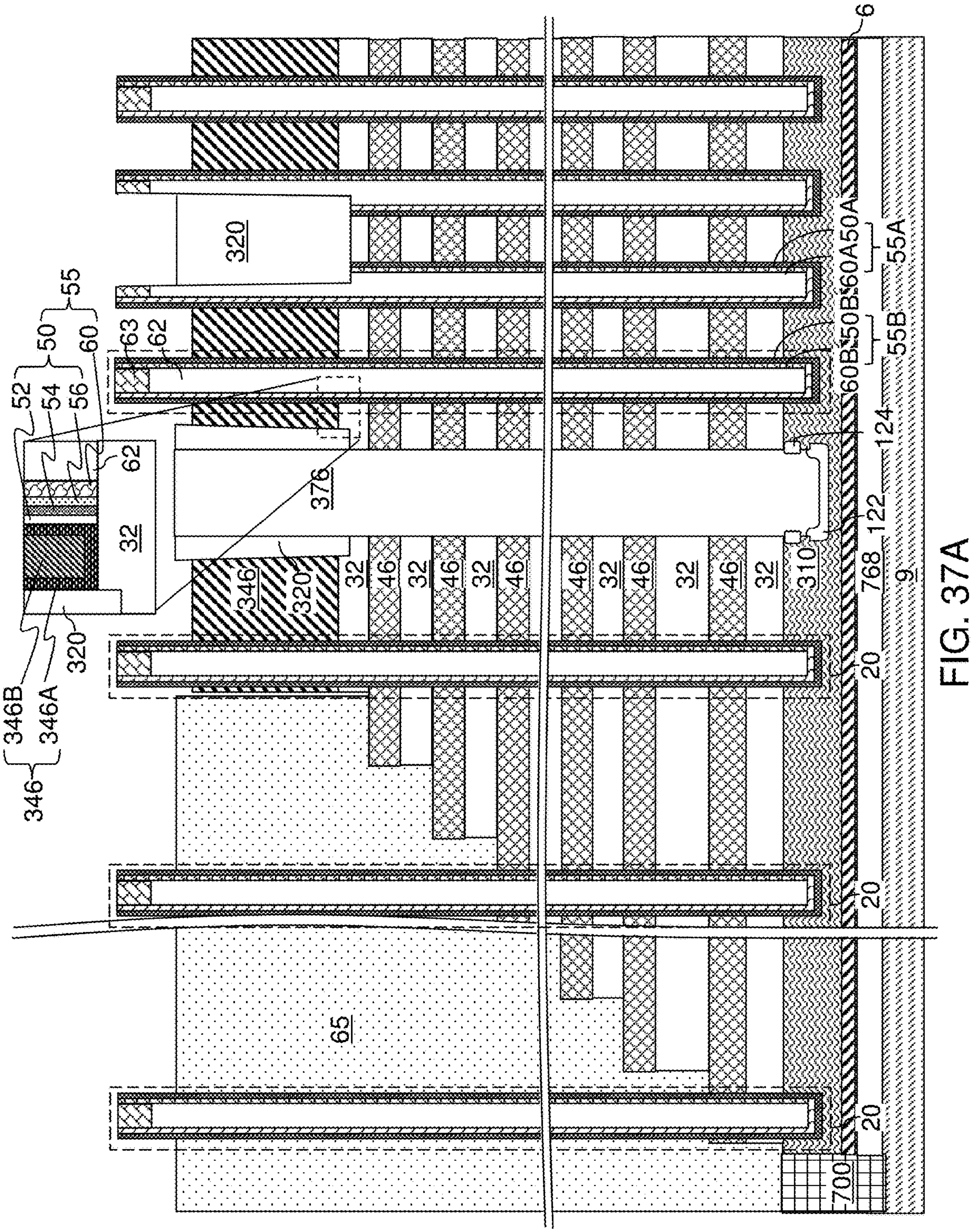
FIG. 37A is a schematic vertical cross-sectional view of the third exemplary structure after formation of a drain-select-level electrically conductive layer according to the third embodiment of the present disclosure.
Figure 37B:
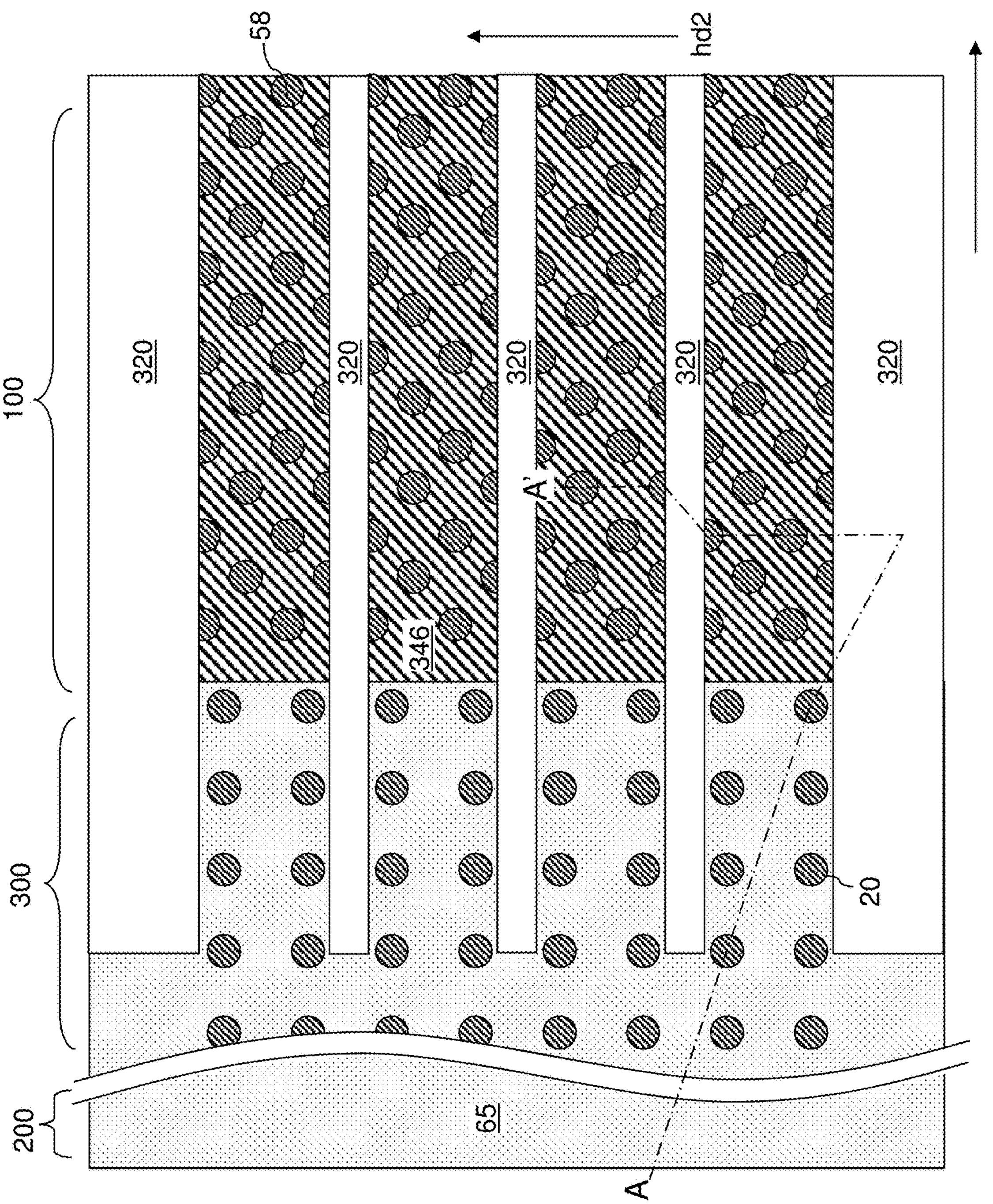
FIG. 37B is a top-down view of the third exemplary structure of FIG. 37A. The zig-zag vertical plane A-A' is the plane of the schematic vertical cross-sectional view of FIG. 37A.

Referring to FIGS. 37A and 37B, at least one conductive material may be deposited in the drain-select-level recesses 343 and over the drain-select-level isolation structures 320, the retro-stepped dielectric material portion 65, and the dielectric wall structures 376. Portions of the at least one deposited conductive material that overlie the drain-select-level isolation structures 320, the retro-stepped dielectric material portion 65, and the dielectric wall structures 376 are etched back, for example, by a recess etch. Portions of the at least one conductive material that fill the drain-select-level recesses 343 constitute a drain-select-level electrically conductive layer 346. The drain-select-level electrically conductive layer 346 may be an electrically conductive layer that is formed at the drain select level, i.e., a level at which drain select level electrodes. The drain-select-level electrically conductive layer 346 are formed as multiple physically-disjoined fingers that are laterally electrically isolated one from another by the drain-select-level isolation structures 320.

Each strip of the drain-select-level electrically conductive layer 346 laterally extends along the first horizontal direction hd1. Each strip of the drain-select-level electrically conductive layer 346 may have two pairs of laterally undulating sidewalls that extend along the first horizontal direction hd1. Each laterally undulating sidewall of a strip of the drain-select-level electrically conductive layer 346 may have a laterally alternating sequence of planar sidewall segments and concave sidewall segments. Each strip of the drain-select-level electrically conductive layer 346 contacts two rows of first memory stack structures 55A. In case second memory stack structures 55B are present, a strip of the drain-select-level electrically conductive layer 346 may contact one or more rows of second memory stack structures 55B.

In one embodiment, each strip of the drain-select-level electrically conductive layer 346 may include a combination of a drain-select-level metallic liner 346A and a drain-select-level metal fill portion 346B. The drain-select-level metallic liner 346A includes an electrically conductive metallic material that may function as a diffusion barrier layer and/or adhesion promotion layer for a metallic fill material to be subsequently deposited. The drain-select-level metallic liner 346A may include a conductive metallic nitride material such as TiN, TaN, WN, or a stack thereof, or may include a conductive metallic carbide material such as TiC, TaC, WC, or a stack thereof. The drain-select-level metallic liner 346A may be deposited by a conformal deposition process such as chemical vapor deposition (CVD) or atomic layer deposition (ALD), or by a non-conformal deposition process such as physical vapor deposition (PVD). The thickness of the drain-select-level metallic liner 346A may be in a range from 2 nm to 8 nm, such as from 3 nm to 6 nm, although lesser and greater thicknesses may also be used. In one embodiment, the drain-select-level metallic liner 346A may consist essentially of a conductive metal nitride such as TiN.

The drain-select-level metal fill portion 346B may be deposited by a conformal or non-conformal deposition method, which may be, for example, chemical vapor deposition (CVD), atomic layer deposition (ALD), physical vapor deposition (PVD), electroless plating, electroplating, or a combination thereof. In one embodiment, the drain-select-level metal fill portion 346B may consist essentially of at least one elemental metal. The at least one elemental metal of the drain-select-level metal fill portion 346B may be selected, for example, from tungsten, cobalt, ruthenium, titanium, and tantalum. In one embodiment, the drain-select-level metal fill portion 346B may consist essentially of a single elemental metal.

The drain-select-level electrically conductive layer 346 may be formed on a topmost one of the insulating layers 32, and may be added to the alternating stack (32, 46) as a topmost electrically conductive layer. Each drain-select-level isolation structure 320 that does not contact a backside trench 79 may vertically extend through the drain-select-level electrically conductive layer 346, which is a topmost electrically conductive layer within an expanded alternating stack (32, 46, 346). Each strip of the drain-select-level electrically conductive layer 346 includes a drain-select-level metallic liner 346A and a drain-select-level metal fill portion 346B formed within the drain-select-level metallic liner 346A.

Figure 38A:
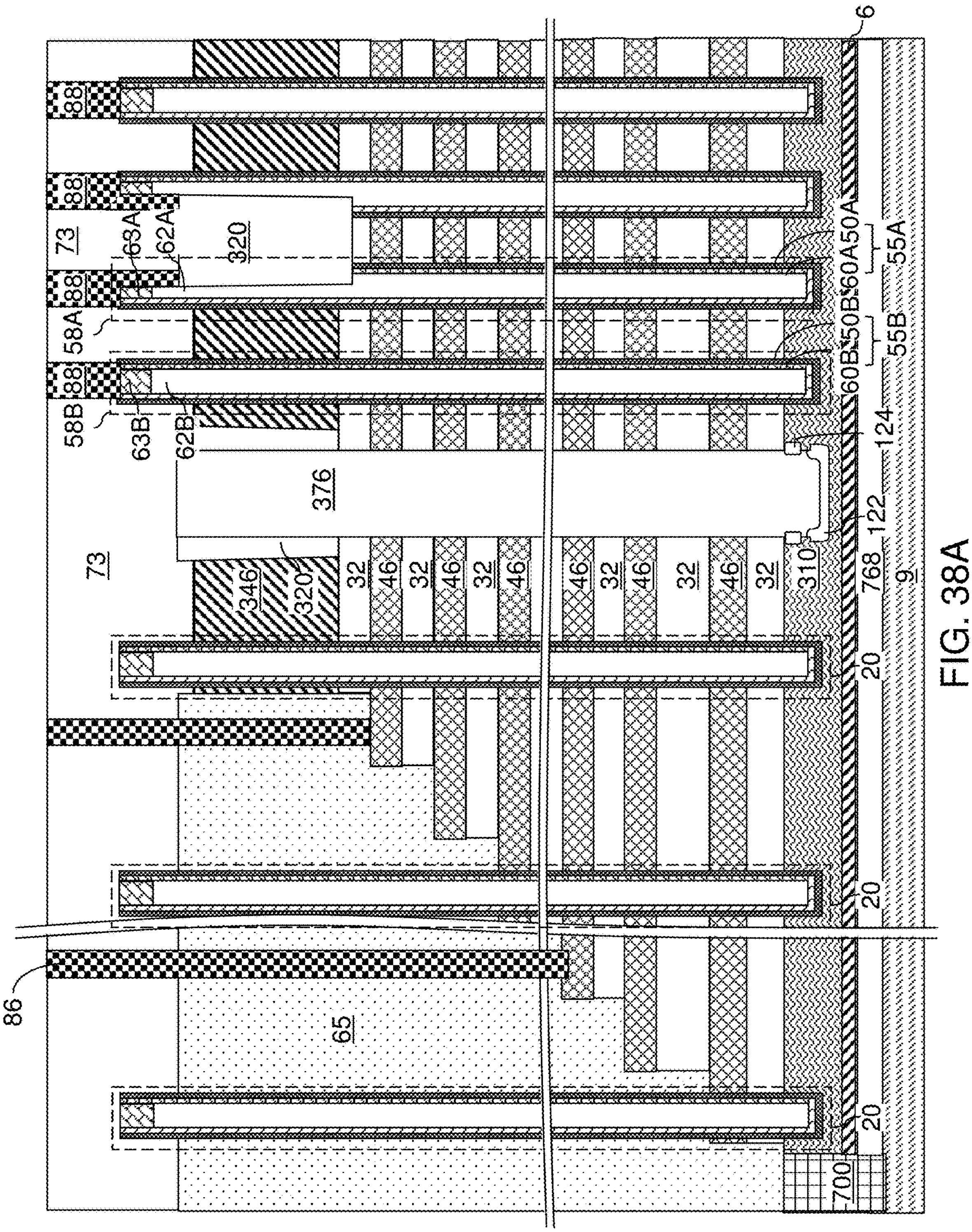
FIG. 38A is a schematic vertical cross-sectional view of the third exemplary structure after formation of additional contact via structures according to the third embodiment of the present disclosure.
Figure 38B:
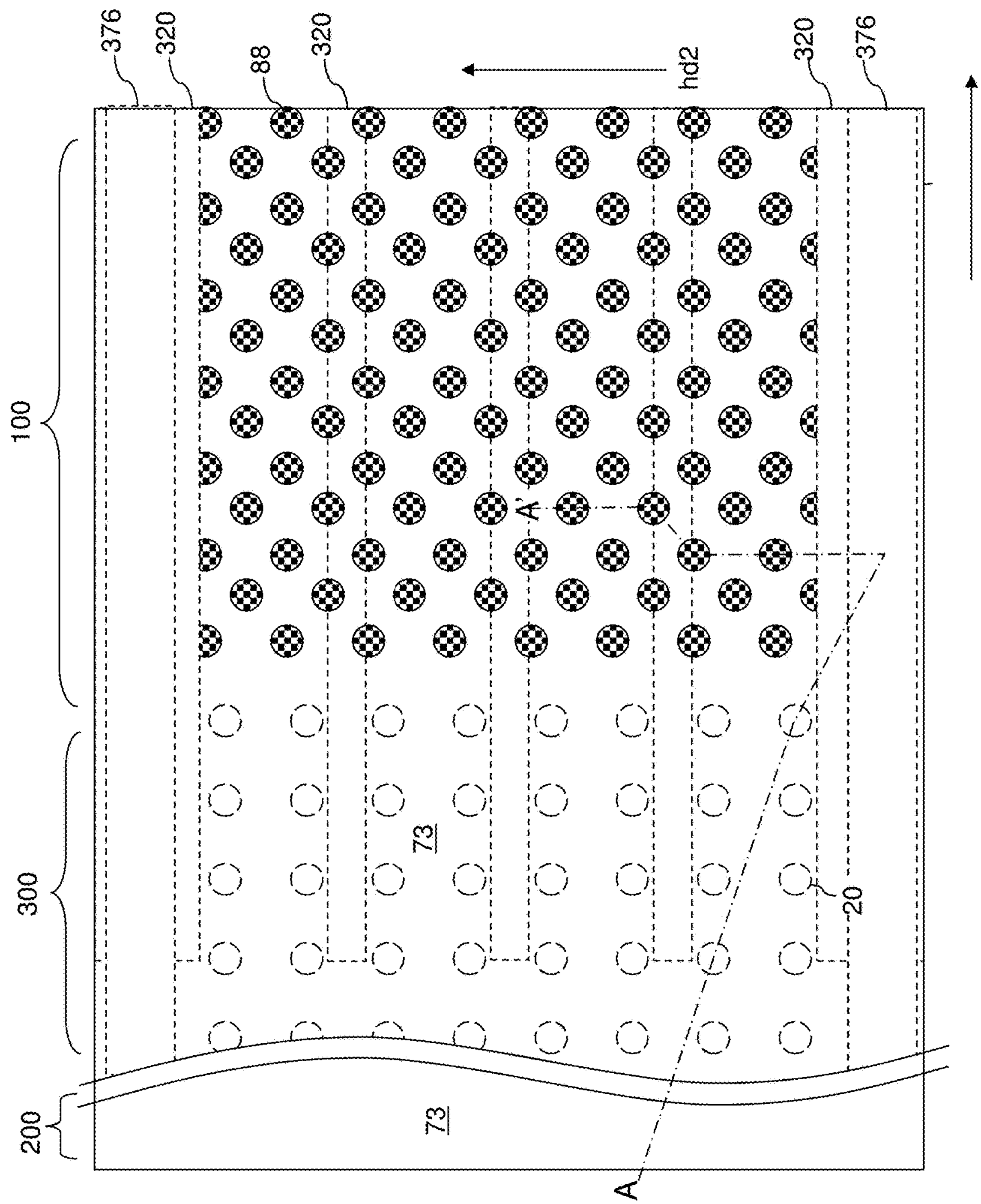
FIG. 38B is a top-down view of the third exemplary structure of FIG. 38A. The zig-zag vertical plane A-A' is the plane of the schematic vertical cross-sectional view of FIG. 38A.

Referring to FIGS. 38A and 38B, a contact level dielectric layer 73 may be formed over the drain-select-level electrically conductive layer 346 by deposition and planarization of a dielectric material such as silicon oxide. The contact level dielectric layer 73 contacts top surfaces of the drain-select-level metallic liner 346A and the drain-select-level metal fill portion 346B of each strip of the drain-select-level electrically conductive layer 346, i.e., the topmost electrically conductive layer of the expanded alternating stack (32, 46, 346).

Additional contact via structures (88, 86) may be formed through the contact level dielectric layer 73, and optionally through the retro-stepped dielectric material portion 65. For example, drain contact via structures 88 may be formed through the contact level dielectric layer 73 on each drain region (63A, 63B). Word line contact via structures 86 may be formed on the electrically conductive layers 46 through the contact level dielectric layer 73, and through the retro-stepped dielectric material portion 65. Peripheral device contact via structures (not shown) may be formed through the retro-stepped dielectric material portion 65 directly on respective nodes of the peripheral devices.

Referring to all drawings of the first, second, and third exemplary structures and according to various embodiments of the present disclosure, a three-dimensional memory device is provided, which comprises: an alternating stack of insulating layers 32 and electrically conductive layers (46 and 346 if present) located over a substrate (9 and 10 if present); first memory stack structures 55A extending through the alternating stack (32, 46, 346), wherein each of the first memory stack structures 55A includes a respective first memory film (50, 50A) and a respective first vertical semiconductor channel (60, 60A); and a drain-select-level isolation structure 320 having a pair of straight lengthwise sidewalls that extend along a first horizontal direction hd1 and contact straight sidewalls of the first memory stack structures 55A, wherein each first vertical semiconductor channel (60, 60A) comprises a tubular section that underlie a horizontal plane including a bottom surface of the drain-select-level isolation structure 320 and a semi-tubular section overlying the tubular section and contacting the drain-select-level isolation structure 320.

In one embodiment, each of the first vertical semiconductor channels (60, 60A) comprises: a tubular vertical semiconductor channel segment that extends through a first plurality of electrically conductive layers 46 of the alternating stack (32, 46, 346) that are located under the horizontal plane; and a semi-tubular vertical semiconductor channel segment that overlies the tubular vertical semiconductor channel segment and contacts a respective one of the pair of straight lengthwise sidewalls of the drain-select-level isolation structure 320.

In one embodiment, the three-dimensional memory device comprises first dielectric cores 62A located within a respective one of the first memory stack structures 55A, wherein each of the first dielectric cores 62A comprises: a cylindrical core portion that extends through the first plurality of electrically conductive layers 46 of the alternating stack (32, 46, 346) that are located under the horizontal plane; and a semi-cylindrical portion that overlies the tubular vertical semiconductor channel segment and contacts a respective one of the pair of straight lengthwise sidewalls of the drain-select-level isolation structure 320.

In one embodiment, the first vertical semiconductor channels (60, 60A) may have a doping of a first conductivity type; and first drain regions 63A having a doping of a second conductivity type are located at an upper end of each of the first vertical semiconductor channels (60, 60A).

In one embodiment, each of the first drain regions 63A may have a straight sidewall that contacts a respective one of the pair of straight lengthwise sidewalls of the drain-select-level isolation structure 320.

In one embodiment, the drain-select-level isolation structure 320 may vertically extend through a plurality of electrically conductive layers (46 or 346) including a topmost one of the electrically conductive layers within the alternating stack (32, 46, 346).

In one embodiment, the drain-select-level isolation structure 320 may vertically extend through a topmost one of the electrically conductive layers 346 within the alternating stack (32, 46, 346); the topmost one of the electrically conductive layers 346 comprises a drain-select-level metallic liner 346A and a drain-select-level metal fill portion 346B formed within the drain-select-level metallic liner 346A; and a dielectric layer (such as a contact level dielectric layer 73) contacts top surfaces of the drain-select-level metallic liner 346A and the drain-select-level metal fill portion 346B.

In one embodiment, the substrate (9, 10) comprises a semiconductor material layer 10; the semiconductor material layer 10 and the first vertical semiconductor channels 60 have a doping of a first conductivity type; pedestal channel portions 11 are disposed between bottom ends of the first vertical semiconductor channels 60 and the semiconductor material layer 10; and a source region 61 having a doping of a second conductivity type is formed within the semiconductor material layer 10 and is laterally spaced from the first memory stack structures 55A and the pedestal channel portions 11.

In one embodiment, the first vertical semiconductor channels 60A may have a doping of a first conductivity type; a source contact layer 114 having a doping of a second conductivity type that is an opposite of the first conductivity type is located over the substrate 9; and the source contact layer 114 contacts bottom ends of each of the first vertical semiconductor channels 60A.

In one embodiment, the three-dimensional memory device comprises second memory stack structures 55B extending through the alternating stack (32, 46, 346). Each of the second memory stack structures 55B includes a respective second memory film (50, 50B) and a respective second vertical semiconductor channel (60, 60B); and each second vertical semiconductor channel (60, 60B) has a tubular configuration and extends through each electrically conductive layer (46, 346) in the alternating stack (32, 46, 346).

In one embodiment, the first memory stack structures 55A are arranged in first rows that extend along a first horizontal direction hd1 and have a uniform intra-row pitch p1 within each first row. The second memory stack structures 55B are arranged in second rows that extend along the first horizontal direction hd1 and have the uniform intra-row pitch p1 within each second row. The first memory stack structures 55A and the second memory stack structures 55B are arranged as a two-dimensional periodic array in which each neighboring pair of rows selected from the first rows and second rows has a uniform inter-row pitch p2.

In one embodiment, the three-dimensional memory device further comprises a pair of backside trenches 79 vertically extending through the alternating stack (32, 46, 346) and laterally extending along the first horizontal direction hd1, wherein the two-dimensional periodic array and the drain-select-level isolation structure 320 are located between the pair of backside trenches 79.

In one embodiment, the three-dimensional memory device comprises: first drain regions 63A contacting an upper end of a respective one of the first vertical semiconductor channels (60, 60A) and having a semi-cylindrical shape; second drain regions 63B contacting an upper end of a respective one of the second vertical semiconductor channels (60, 60B) and having a cylindrical shape; first drain contact via structures 88 having bottommost surfaces that contact topmost surfaces of the first drain regions 63A; and second drain contact via structures 88 contacting a top surface and a sidewall of a respective one of the second drain regions 63B.

Figure 39A:
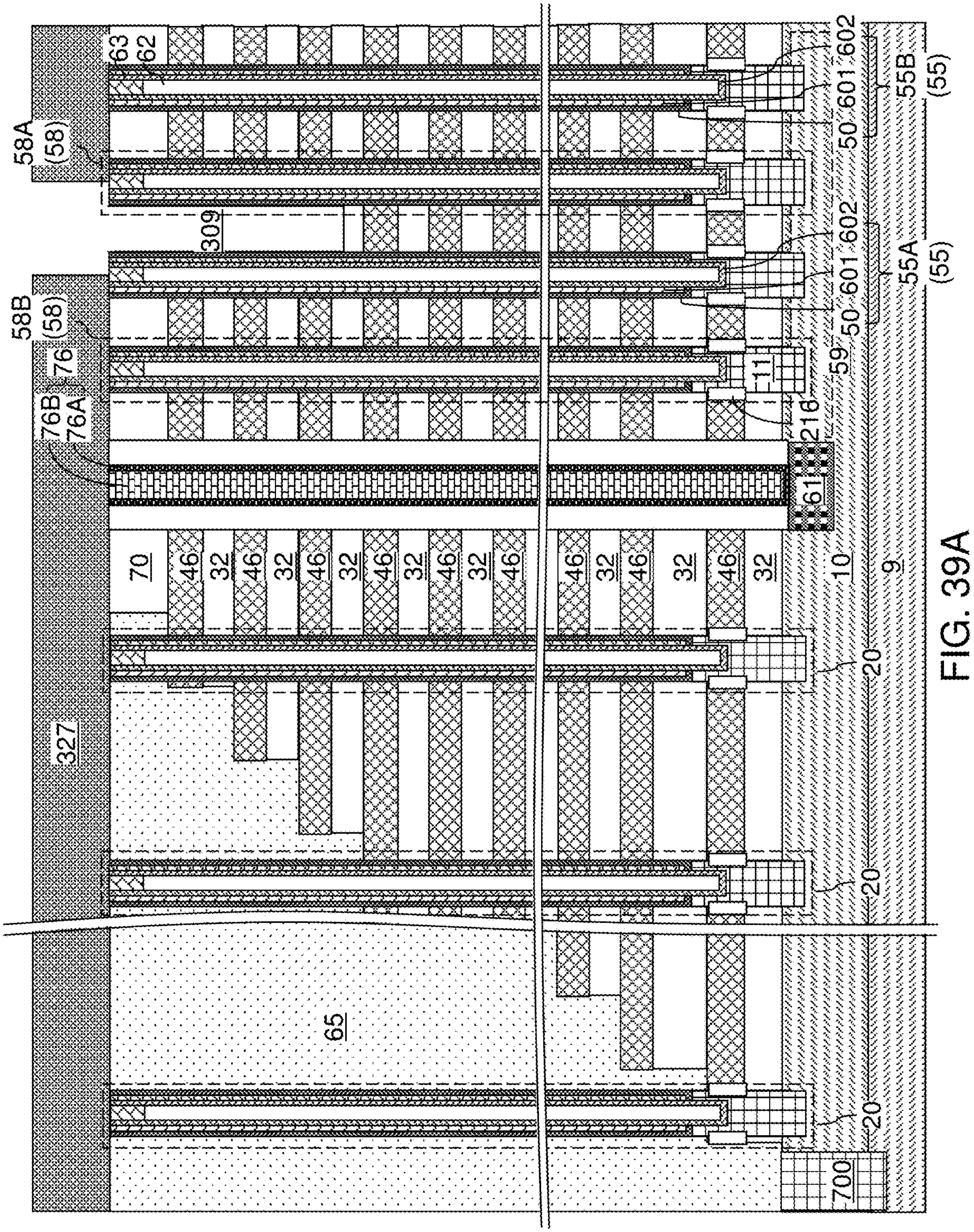
FIG. 39A is a vertical cross-sectional view of a fourth exemplary structure after formation of drain-select-level trenches according to a fourth embodiment of the present disclosure.
Figure 39B:
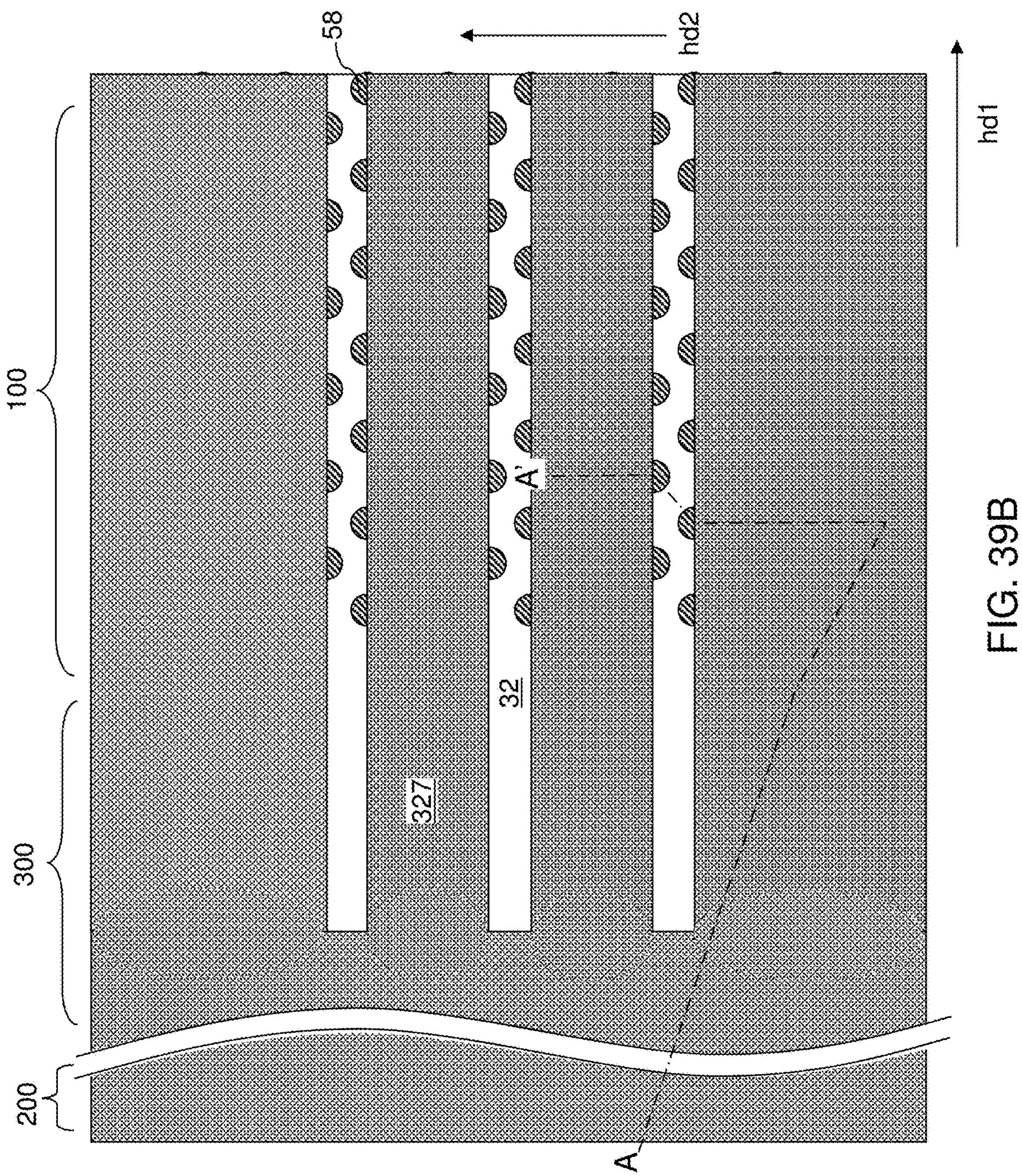
FIG. 39B is a top-down view of the fourth exemplary structure of FIG. 39A. The zig-zag vertical plane A-A' is the plane of the schematic vertical cross-sectional view of FIG. 39A.

Referring to FIGS. 39A and 39B, a fourth exemplary structure according to a fourth embodiment of the present disclosure may be derived from the second exemplary structure of FIG. 18. Generally, the fourth exemplary structure may be provided by forming an alternating stack of insulating layers 32 and spacer material layers over a substrate (9 and optionally 10). The spacer material layers are formed as electrically conductive layers 46, or are formed as sacrificial material layers 42 and are subsequently replaced with the electrically conductive layers 46. Memory stack structures 55 extending through the alternating stack (32, 46) are formed. Each of the memory stack structures 55 includes a respective memory film 50 and a respective vertical semiconductor channel 60 including dopants of a first conductivity type at a first atomic concentration. Drain regions 63 having a doping of a second conductivity type that is an opposite of the first conductivity type is formed on an upper end of each of the vertical semiconductor channels 60. The memory stack structures 55 may be arranged in two rows that extend along a first horizontal direction hd1. The memory stack structures 55 are arranged as a two-dimensional periodic array in which each neighboring pair of rows of memory stack structures 55 has a uniform inter-row pitch p2. Each two-dimensional periodic array of memory stack structures 55 may be formed between the pair of backside trenches 79.

A patterned etch mask layer 327 including elongated openings may be formed over the alternating stack (32, 46) and the memory stack structures 55. In one embodiment, the patterned etch mask layer 327 may be a patterned photoresist layer formed by application and lithographic patterning of a photoresist material over the alternating stack (32, 46) and the memory stack structures 55. Each opening in the patterned etch mask layer 327 may overlie a segment of each memory stack structure 55 within a neighboring pair of rows of memory stack structures 55. Each memory stack structure 55 of which a segment is located within an area of one of the openings in the patterned etch mask layer 327 is herein referred to as a first memory stack structure 55A. Each memory opening fill structure 58 including a first memory stack structure 55A is herein referred to as a first memory opening fill structure 58A. Memory stack structures 55 that are entirely covered with the patterned etch mask layer 327, for example, by being located between neighboring pairs of first memory stack structures 55A, are herein referred to as a second memory stack structure 55B. Second memory stack structures 55B may, or may not, be present in the first exemplary structure depending on the layout of the elongated openings in the patterned etch mask layer 327. Each memory opening fill structure 58 including a second memory stack structure 55B is herein referred to as a second memory opening fill structure 58B.

Each first memory stack structure 55A may be only partly covered with the patterned etch mask layer 327. As such, a first area of each of the first memory stack structures 55A is located within an area of an elongated opening in the patterned etch mask layer 327, and a second area of each of the first memory stack structures 55A is covered by the patterned etch mask layer 327. The first area may be in a range from 15% to 70%, such as from 25% to 50%, of the entire area of each first memory stack structure 55A.

An anisotropic etch process may be performed to etch unmasked portions of the insulating cap layer 70 and upper layers of the alternating stack (32, 46) located at the drain select levels without etching the memory stack structures 55. A drain-select-level trench 309 may be formed underneath each elongated opening within the patterned etch mask layer 327 by etching through an upper portion of the alternating stack (32, 46) selective to the physically exposed material portions of the memory opening fill structures 58. Each drain-select-level trench 309 may include a pair of laterally undulating lengthwise sidewalls that extend generally along the first horizontal direction hd1. Each laterally undulating lengthwise sidewall may include a laterally alternating sequence of straight sidewall segments (that are sidewalls of the insulating cap layer 70 and upper layers of the alternating stack (32, 46)) and concave sidewall segments (that are sidewalls of the memory opening fill structures 58). The depth of the drain-select-level trenches 309 may be selected such that the drain-select-level trenches 309 vertically extend through each electrically conductive layer 46 located at drain select levels, i.e., levels in which the electrically conductive layers function as drain select level gate electrodes. Each vertical semiconductor channel 60 of the memory stack structures 55 has a tubular configuration.

The anisotropic etch process partially physically exposes upper portions of sidewalls of two rows of the first memory stack structures 55A around each drain-select-level trench 309. Each drain-select-level trench 309 extends through an upper portion of the alternating stack (32, 46) and laterally extends between two rows of first memory stack structures 55A. The memory stack structures 55 includes first memory stack structures 55A that are partially exposed to a respective one of the drain-select-level trenches 309, and optionally includes second memory stack structures 55B that are masked with the patterned etch mask layer 317 during formation of the drain-select-level trenches 309. Thus, sidewalls of the second memory stack structures 55B are not physically exposed after formation of the drain-select-level trenches 309.

Figure 40A:
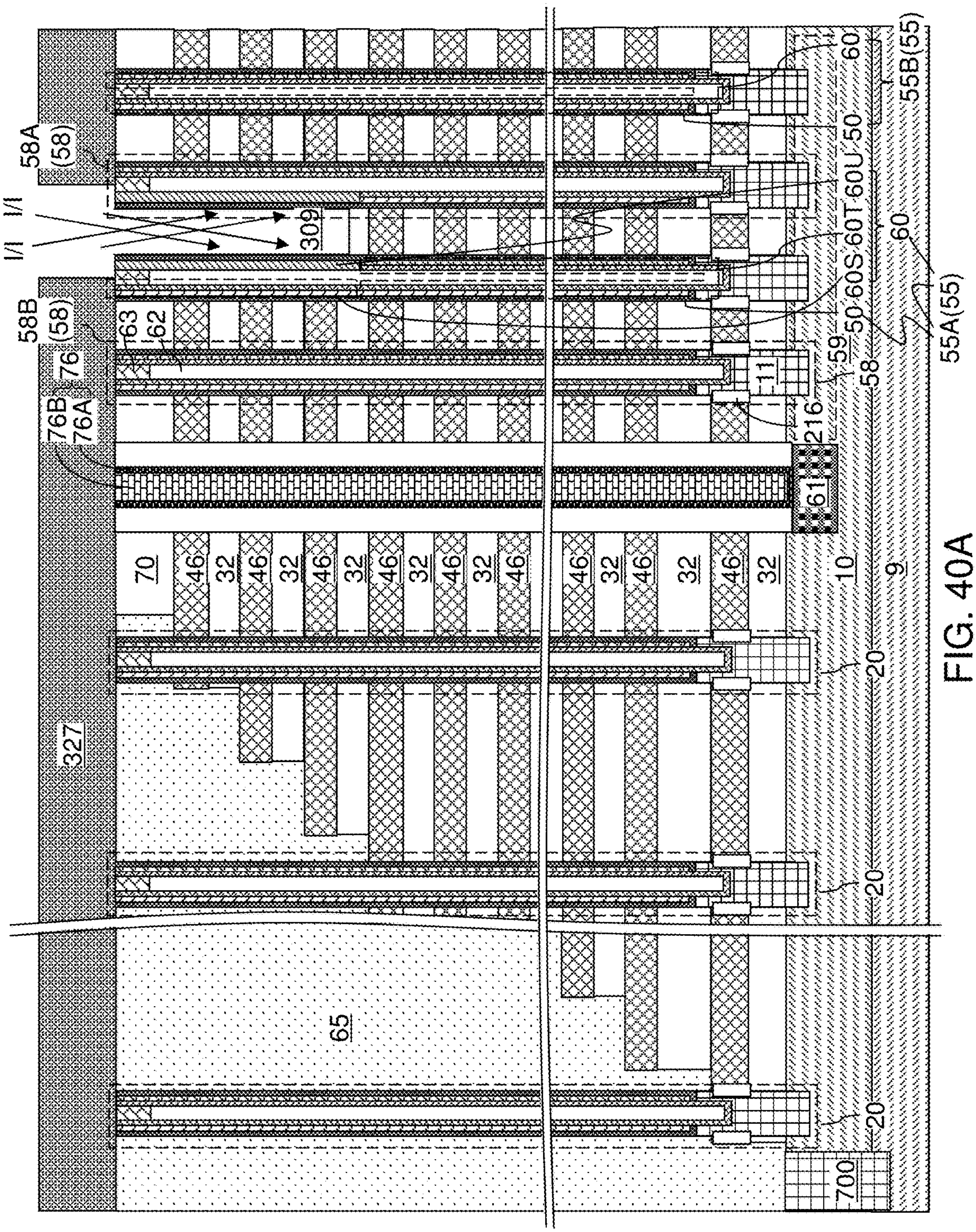
FIG. 40A is a vertical cross-sectional view of the fourth exemplary structure after ion implantation of dopants of a first conductivity type into portions of vertical semiconductor channels according to the fourth embodiment of the present disclosure.
Figure 40B:
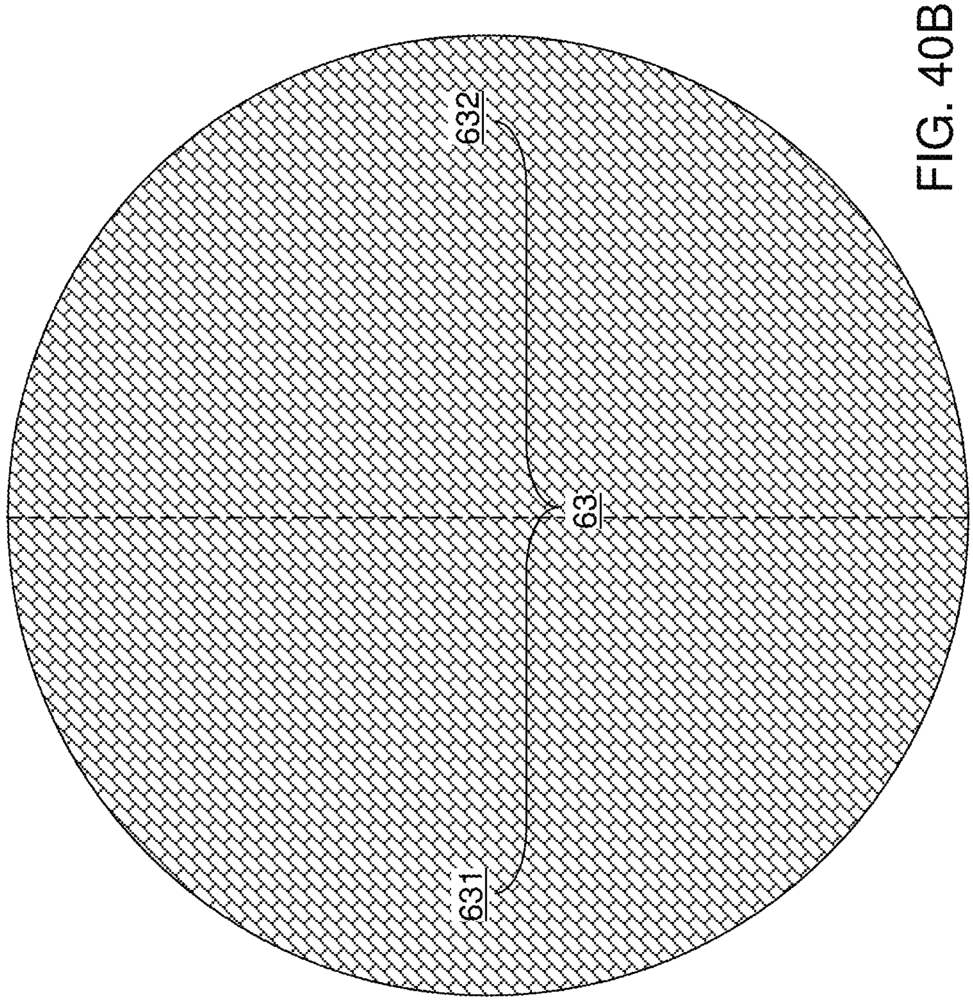
FIG. 40B is horizontal cross-sectional view of a drain region at the processing steps of FIG. 40A.

Referring to FIGS. 40A and 40B, dopants of the first conductivity type are implanted into segments of vertical semiconductor channels 60 within the first memory stack structures 55A that are proximal to a respective one of the drain-select-level trenches 309. Angled ion implantation may be performed using the patterned etch mask layer 307 as an implantation mask. The tilt angle of the angled ion implantation process may be selected such that the dopants of the first conductivity type are implanted into portions of the vertical semiconductor channels 60 that are located above the horizontal plane including the top surface of a topmost electrically conductive layer 46 that underlies the drain-select-level trenches 309. For example, the tilt angle of the ion implantation process may be in a range from 2 degree to 30 degrees, such as from 4 degrees to 15 degrees, although lesser and greater tilt angles may also be used. In case the first conductivity type is p-type, the dopants of the first conductivity type may include boron atoms. In case the first conductivity type is n-type, the dopants of the first conductivity type may include phosphor atoms, arsenic atoms, and/or antimony atoms. In one embodiment, diffusion suppressor atoms such as carbon atoms may be implanted in addition to the dopant atoms of the first conductivity type to reduce diffusion of the implanted dopants of the first conductivity type.

Each vertical semiconductor channel 60 within the first memory stack structures 55A (located within the first memory opening fill structures 58A) comprises a tubular section 60T including dopants of the first conductivity type at the first atomic concentration (which is the atomic concentration of dopants of the first conductivity type as provided during formation of the first and second semiconductor channel layers (601, 602)), a first semi-tubular section 60S overlying the tubular section 60T and including dopants of the first conductivity type at the first atomic concentration, and a second semi-tubular section 60U overlying the tubular section 60T and laterally adjoined to the first semi-tubular section 60S and including dopants of the first conductivity type at a second atomic concentration that is greater than the first atomic concentration.

In one embodiment, the second atomic concentration may be in a range from 5 times the first atomic concentration to $1.0\times10^{5}$ times the first atomic concentration. In a non-limiting illustrative example, the first atomic concentration may be in a range from $1.0\times10^{14}/cm^3$ to $1.0\times10^{18}/cm^3$, and the second atomic concentration may be in a range from $1.0\times10^{17}/cm^3$ to $1.0\times10^{19}/cm^3$, although lesser and greater concentrations may be used for each of the first atomic concentration and the second atomic concentration. In one embodiment, the tubular section 60T of each first memory stack structure 55A (within a respective one of the first memory opening fill structures 58A) may be located underneath a horizontal plane including bottom surfaces of the drain-select-level trenches 309. Each tubular section 60T, each first semi-tubular section 60S, and each second semi-tubular section 60U may include a respective portion derived from a first semiconductor channel layer 601 and a respective portion derived from a second semiconductor channel layer 602. The second semi-tubular section 60U may additionally include carbon atoms, for example, at an atomic concentration in a range from $1.0\times10^{15}/cm^3$ to $5.0\times10^{17}/cm^3$, and the first semi-tubular section 60S and the tubular section 60T may be free of carbon atoms, e.g., at a trace level below $1.0\times10^{14}/cm^3$. Thus, the atomic concentration of carbon atoms in the second semi-tubular section 60U may be at least 10 times the atomic concentration of carbon atoms in the first semi-tubular region 60S, and at least 10 times the atomic concentration of carbon atoms in the tubular region 60T.

The memory stack structures 55 may include second memory stack structures 55B extending through the alternating stack (32, 46). Each of the second memory stack structures 55B includes a respective second memory film 50 and a respective second vertical semiconductor channel 60, and each second vertical semiconductor channel 60 may include a portion having a tubular configuration, extend through each electrically conductive layer 46 in the alternating stack (32, 46), and include dopants of the first conductivity type at the first atomic concentration throughout an entire volume thereof. The portion having the tubular configuration may extend to the horizontal plane including the top surfaces of the drain regions 63.

In one embodiment, each of the first semi-tubular sections 60S has a horizontal cross-sectional shape of a first block arc that is invariant with translation along a vertical direction hd1, and each of the second semi-tubular sections 60U has a horizontal cross-sectional shape of a second block arc that is invariant with translation along the vertical direction. As used herein, a "block arc" is a shape that is obtained by limiting the azimuthal extent of a planar annular shape to less than 360 degrees around the geometrical center of the planar annular shape (i.e., the shape of an anulus within a Euclidean plane).

Dopants of the first conductivity type may be collaterally implanted into a segment of each of the first drain regions 63 during implantation of the dopants of the first conductivity type into the implanted segments of vertical semiconductor channels 60 (i.e., into the second semi-tubular sections 60U). The first drain regions 63 may contact an upper end of a respective one of the first semi-tubular sections 60S, contact an upper end of a respective one of the second semi-tubular sections 60U, and have a doping of the second conductivity type that is the opposite of the first conductivity type. In one embodiment, each of the first drain regions 63 may include a first drain segment 631 consisting essentially of a semiconductor material and dopants of the second conductivity type and contacting the upper end of the respective one of the first semi-tubular sections 60S, and a second drain segment 632 consisting essentially of the semiconductor material, dopants of the second conductivity type, and dopants of the first conductivity type, and contacting the upper end of the respective one of the second semi-tubular sections 60U. The atomic concentration of dopants of the first conductivity type in a second drain segment 632 is less than the atomic concentration of dopants of the second conductivity type in the second drain segment 632, and may be the less than the atomic concentration of dopants of the first conductivity type in the second semi-tubular sections 60U. The patterned etch mask layer 327 may be removed, for example, by ashing after formation of the drain-select-level trenches 309.

Figure 41A:
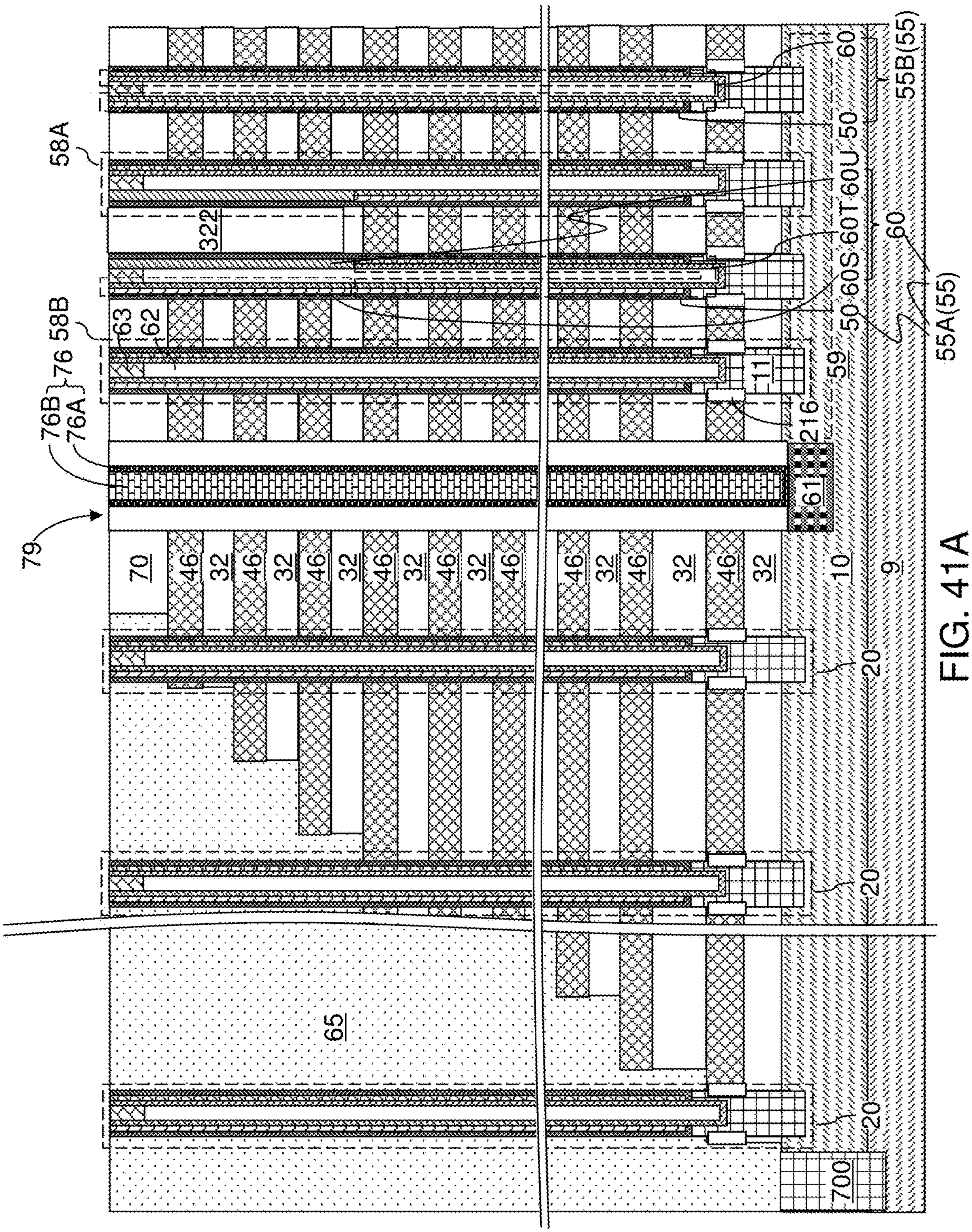
FIG. 41A is a vertical cross-sectional view of the fourth exemplary structure after formation of drain-select-level isolation structures according to the fourth embodiment of the present disclosure.
Figure 41B:
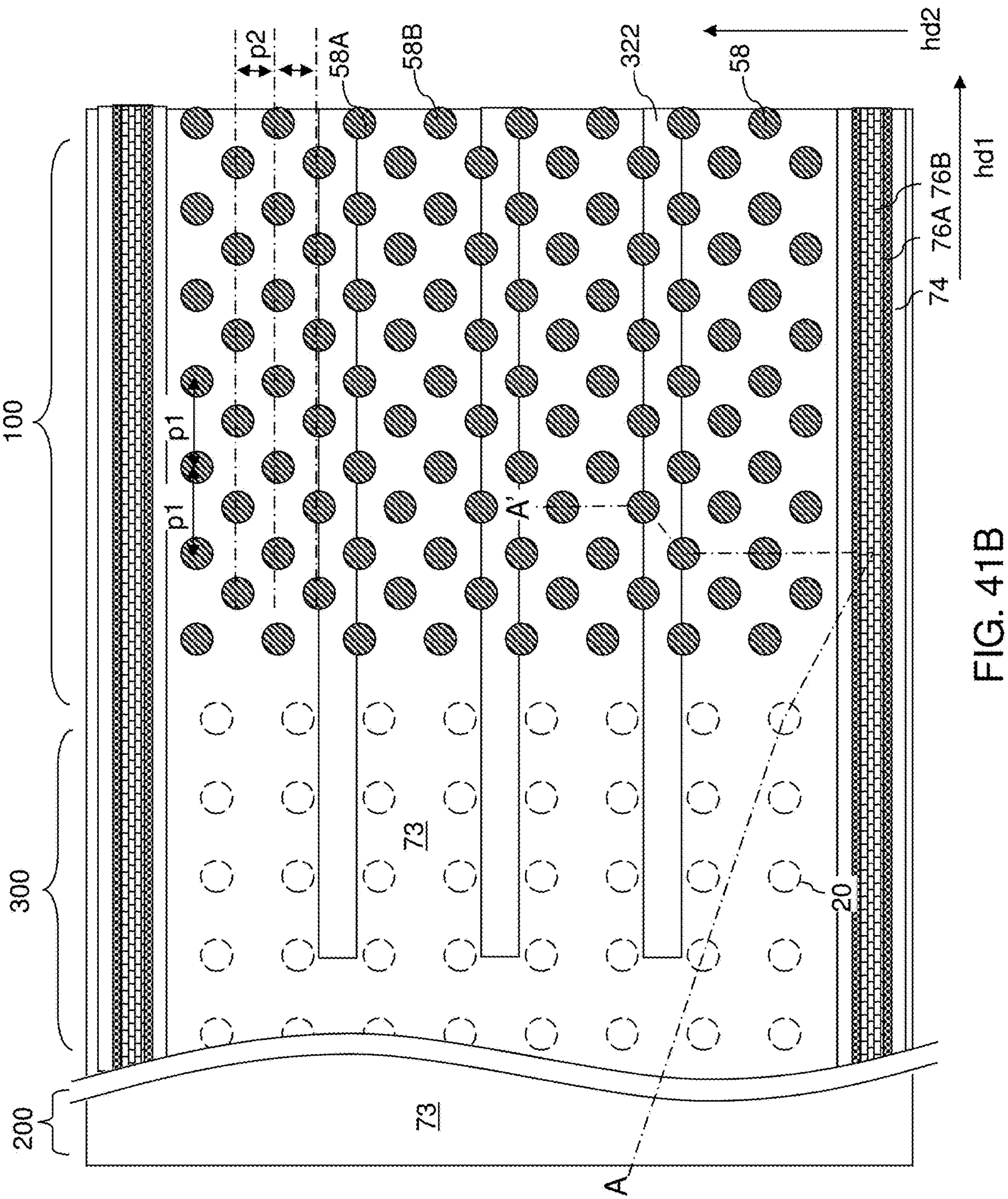
FIG. 41B is a top-down view of the third exemplary structure of FIG. 41A. The zig-zag vertical plane A-A' is the plane of the schematic vertical cross-sectional view of FIG. 41A.

Referring to FIGS. 41A and 41B, drain-select-level isolation structure 322 may be formed in each drain-select-level trench 309, for example, by depositing a dielectric material such as silicon oxide in the drain-select-level trenches 309. Excess portions of the dielectric material may be removed from above the horizontal plane including the top surface of the insulating cap layer 70 by a planarization process, which may use a recess etch and/or chemical mechanical planarization. Each drain-select-level isolation structure 322 may be formed in a drain-select-level trench 309 on sidewalls of memory films 50 of the first memory stack structures 55A. Each drain-select-level isolation structure 320 may include a pair of laterally-undulating sidewalls that laterally extend along the first horizontal direction hd1 and including a laterally alternating sequence of straight sidewall segments and concave sidewall segments. Each drain-select-level isolation structure 322 may vertically extend through each electrically conductive layer 46 within the alternating stack (32, 46) that is located at a drain select level.

In one embodiment, the first memory stack structures 55A may be arranged in first rows that extend along the first horizontal direction hd1 and has a uniform intra-row pitch p1 within each first row. The second memory stack structures 55B are arranged in second rows that extend along the first horizontal direction hd1 and have the uniform intra-row pitch p1 within each second row. The first memory stack structures 55A and the second memory stack structures 55B are arranged as a two-dimensional periodic array in which each neighboring pair of rows selected from the first rows and second rows has a uniform inter-row pitch p2.

In one embodiment, a pair of backside trenches 79 may vertically extend through the alternating stack (32, 46) and laterally extends along the first horizontal direction hd1. The two-dimensional periodic array of memory stack structures 55 and at least one drain-select-level isolation structure 322 are located between the pair of backside trenches 79.

Figure 42:
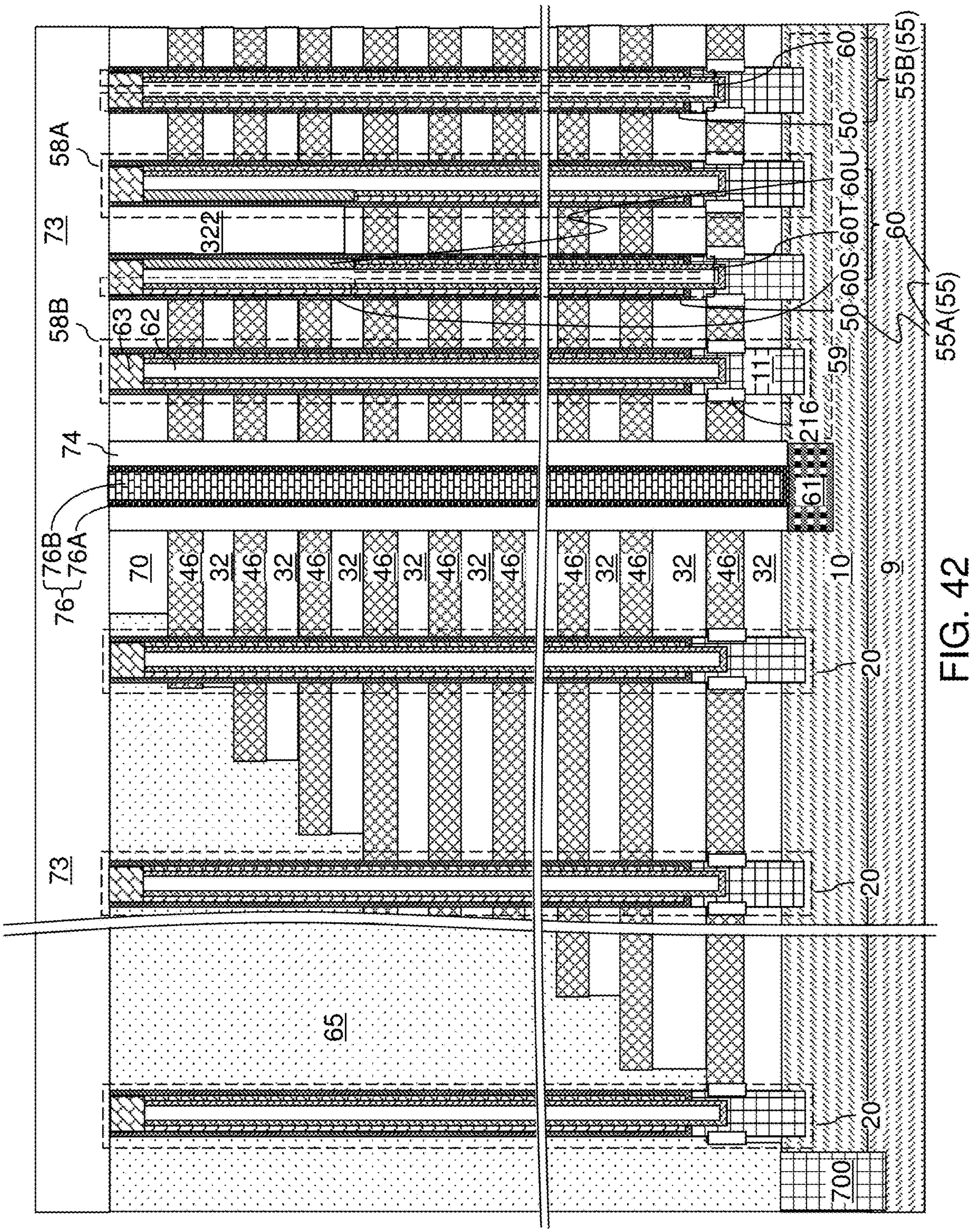
FIG. 42 is a vertical cross-sectional view of the fourth exemplary structure after formation of a contact level dielectric layer according to the fourth embodiment of the present disclosure.

Referring to FIG. 42, a contact level dielectric layer 73 may be formed over the insulating cap layer 70, the drain-select-level isolation structures 322, and over the memory stack structures 55 and the support pillar structures 20. The contact level dielectric layer 73 includes a dielectric material such as silicon oxide. The contact level dielectric layer 73 may have a thickness in a range from 50 nm to 500 nm, although lesser and greater thicknesses may also be used.

Figure 43A:
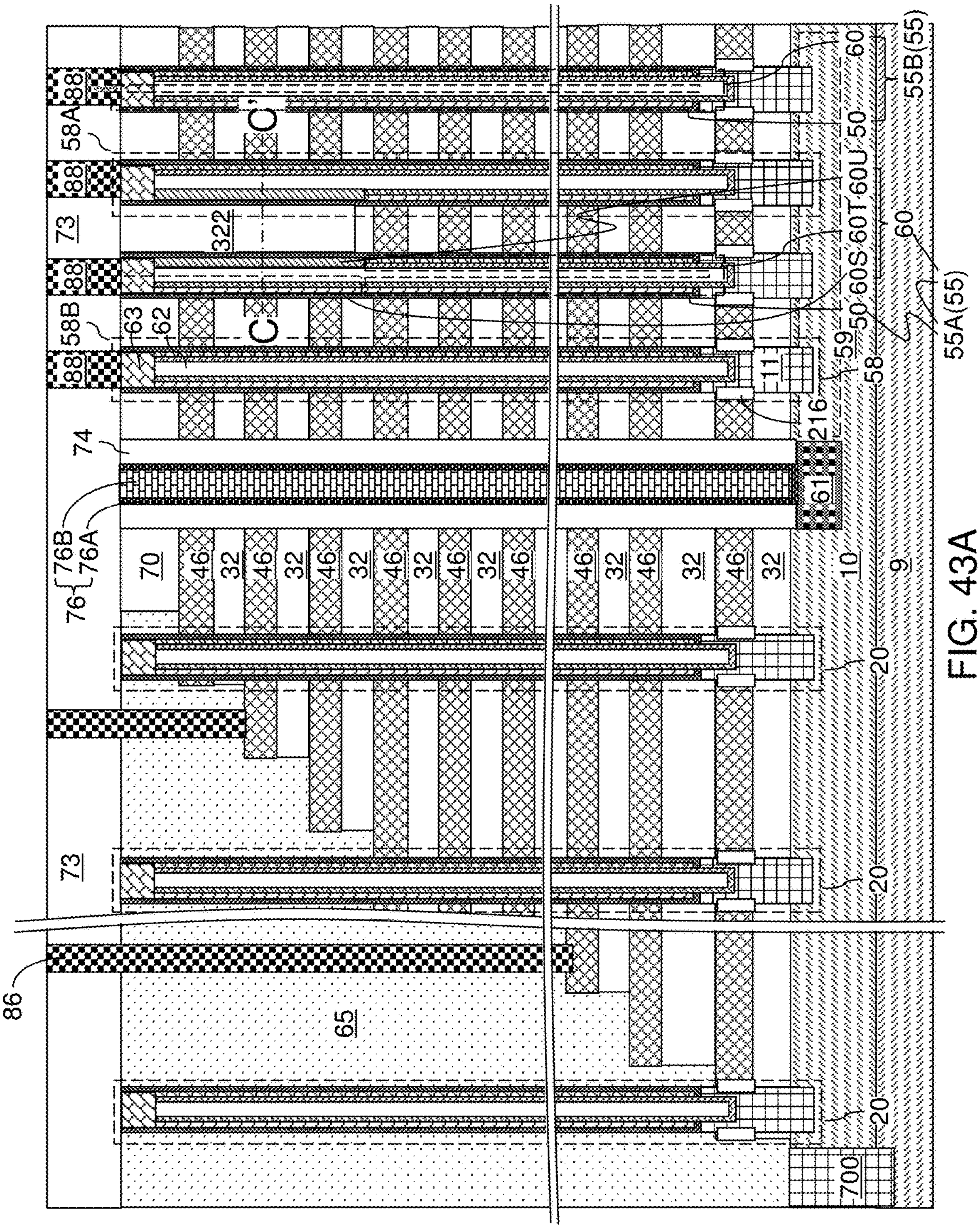
FIG. 43A is a schematic vertical cross-sectional view of the fourth exemplary structure after formation of additional contact via structures according to the fourth embodiment of the present disclosure.
Figure 43B:
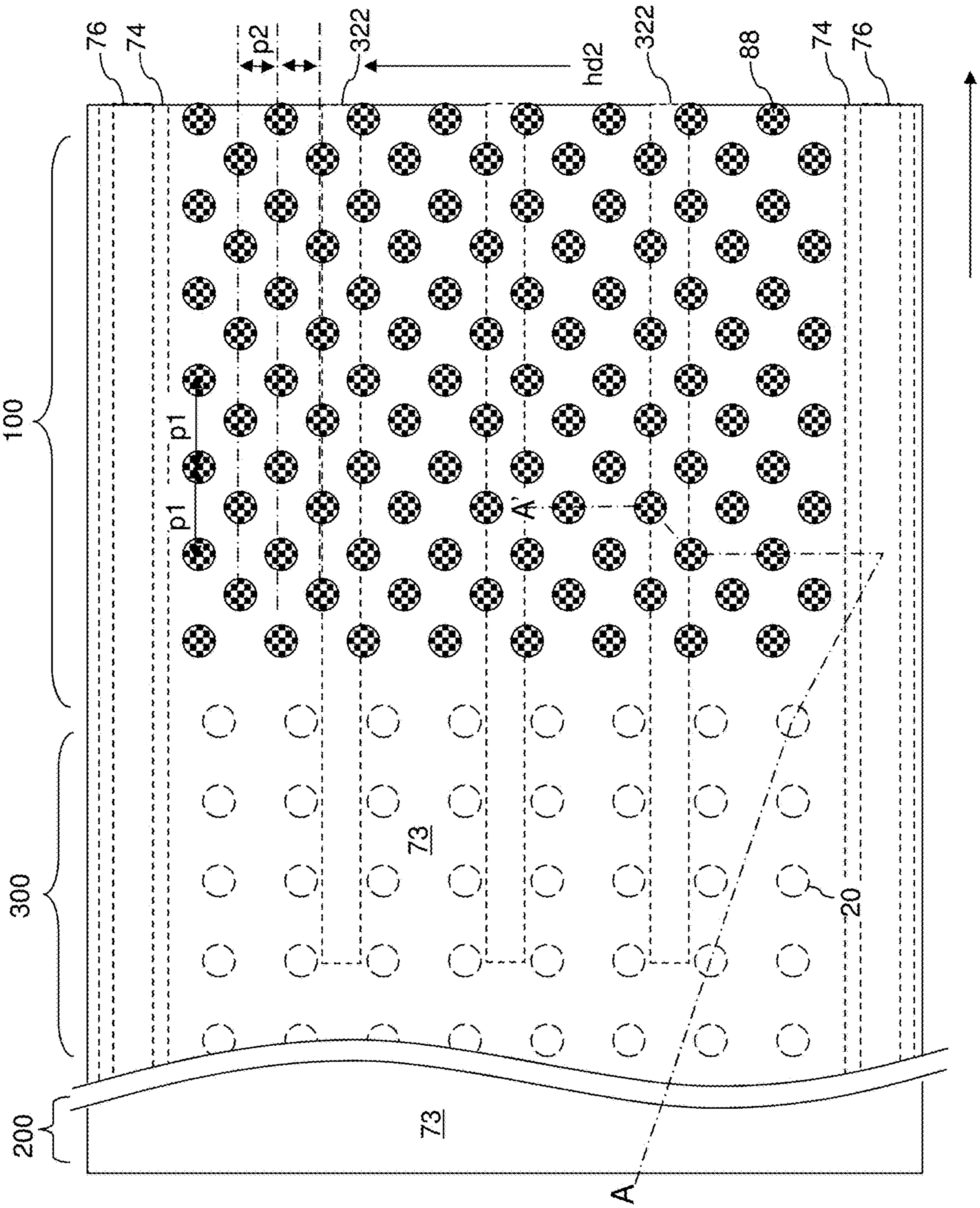
FIG. 43B is a top-down view of the fourth exemplary structure of FIG. 43A. The zig-zag vertical plane A-A' is the plane of the schematic vertical cross-sectional view of FIG. 43A.
Figure 43C:
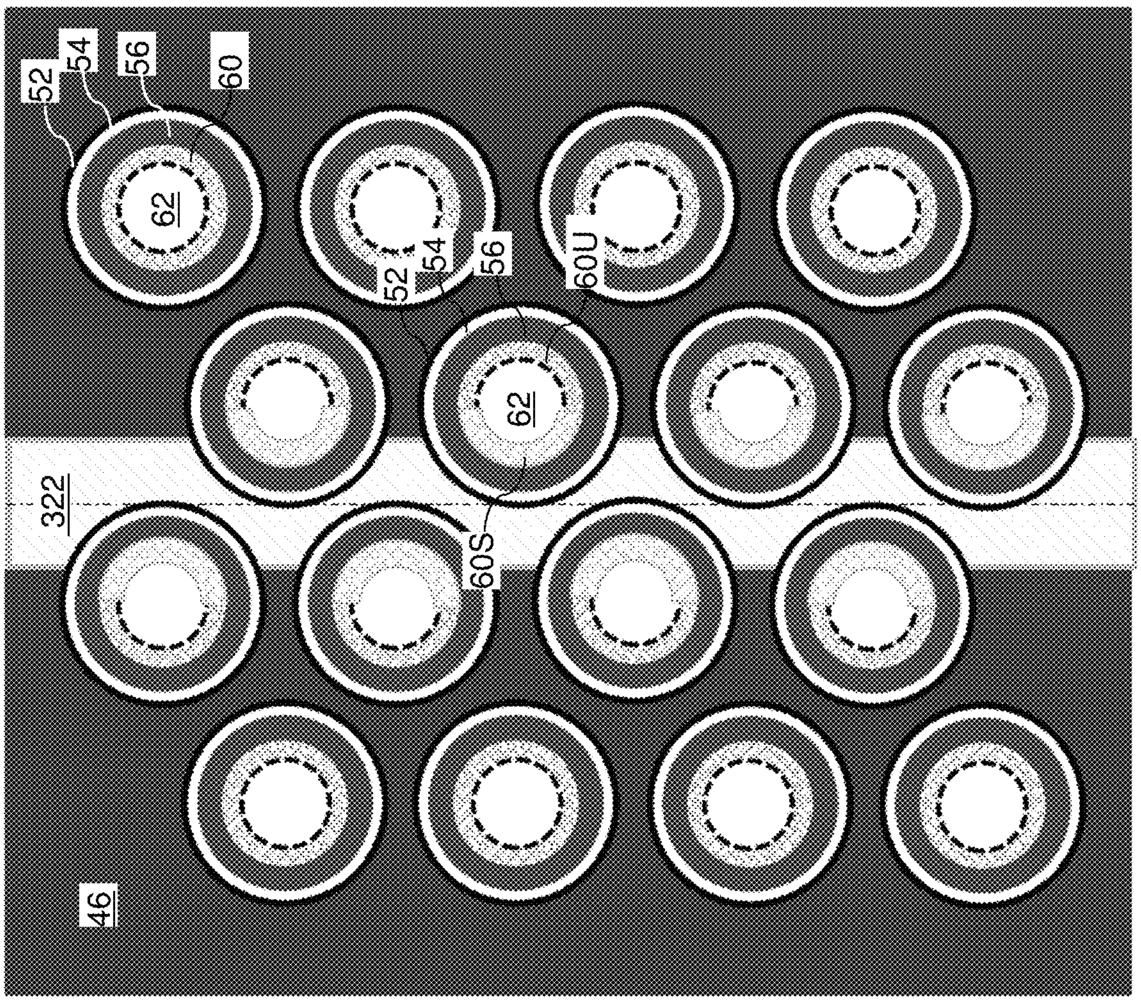
FIG. 43C is a horizontal cross-sectional view of the fourth exemplary structure along the horizontal plane C-C' of FIG. 43A.

Referring to FIGS. 43A-43C, additional contact via structures (88, 86) may be formed through the contact level dielectric layer 73, and optionally through the retro-stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73, and through the retro-stepped dielectric material portion 65. Peripheral device contact via structures (not shown) may be formed through the retro-stepped dielectric material portion 65 directly on respective nodes of the peripheral devices.

The drain-select-level gate electrodes, comprising a subset of the electrically conductive layers 46, may be self-aligned to the memory opening fill structures. Separation of the drain-select-level gate electrodes may be performed after replacement of the sacrificial material layers 42 with the electrically conductive layers 46. Separate processing steps for replacement of sacrificial material layers 42 at the drain select levels is not necessary, and thus, total processing cost may be reduced. The drain-select-level gate electrodes are laterally spaced from one another by drain-select-level isolation structure 320 and second semi-tubular sections 60U that are inactive portions of a vertical semiconductor channel.

In one embodiment, the insulating layers 32 may include silicon oxide and the electrically conductive layers 46 may include tungsten. In this case, formation of the drain-select-level trenches 309 may be performed by using an anisotropic etch process that etches silicon oxide and tungsten selective to the materials of the memory opening fill structures 58. Thus, the drain-select-level trenches 309 may be self-aligned to the memory opening fill structures 58. A bottom surface of each drain-select-level trenches 309 may be formed on an insulating layer 32 located between a topmost word line and a bottommost drain-select-level gate electrode. The implantation of the dopants of the first conductivity type (such as boron in case the first conductivity type is p-type) into the second semi-tubular sections 60U of the vertical semiconductor channels 60 raises the threshold voltage of the second semi-tubular sections 60U, effectively disabling the second semi-tubular sections 60U and preventing flow of electrical current therethrough. In other words, high bias voltages applied to adjacent drain-select-level gate electrodes do not turn on the second semi-tubular sections 60U of the vertical semiconductor channels 60, and a leakage current through the second semi-tubular sections 60U is prevented by the high dose of the dopants of the first conductivity type during the angled implantation process.

Formation of the drain-select-level trenches 309 provides for the implantation of the first conductivity dopants into the second semi-tubular sections 60U. The angled implantation may be a low energy implantation process, which reduces straggle of implanted dopants and reduces electrical impact on the first semi-tubular sections 60S of the vertical semiconductor channels 60, i.e., does not affect the threshold voltage of the first semi-tubular sections 60S. High temperature thermal anneal processes may be performed prior to implantation of the dopants of the first conductivity type into the second semi-tubular sections 60U. Thus, outdiffusion of the first conductivity type dopants from the second semi-tubular sections 60U after the angled ion implantation process may be limited due to reduced thermal cycling. Thus, the impact of formation of the second semi-tubular sections 60U on the threshold voltage of the first semi-tubular sections 60S may be minimal.

High threshold voltage for the second semi-tubular sections 60U may be effectively provided by a multi-twist ion implantation process to minimize shadowing of the implanted dopants due to geometry. The dose, the tilt angle, and the energy of the ion implantation process that implants the dopants of the first conductivity type into the second semi-tubular sections 60U may be optimized based on the diffusivity of the dopants of the first conductivity type and the subsequent thermal budget. In some embodiments, portions of the memory films 50 may be at least partially removed prior to the ion implantation process, in which case the parameters of the ion implantation process may be adjusted accordingly.

Figure 44A:
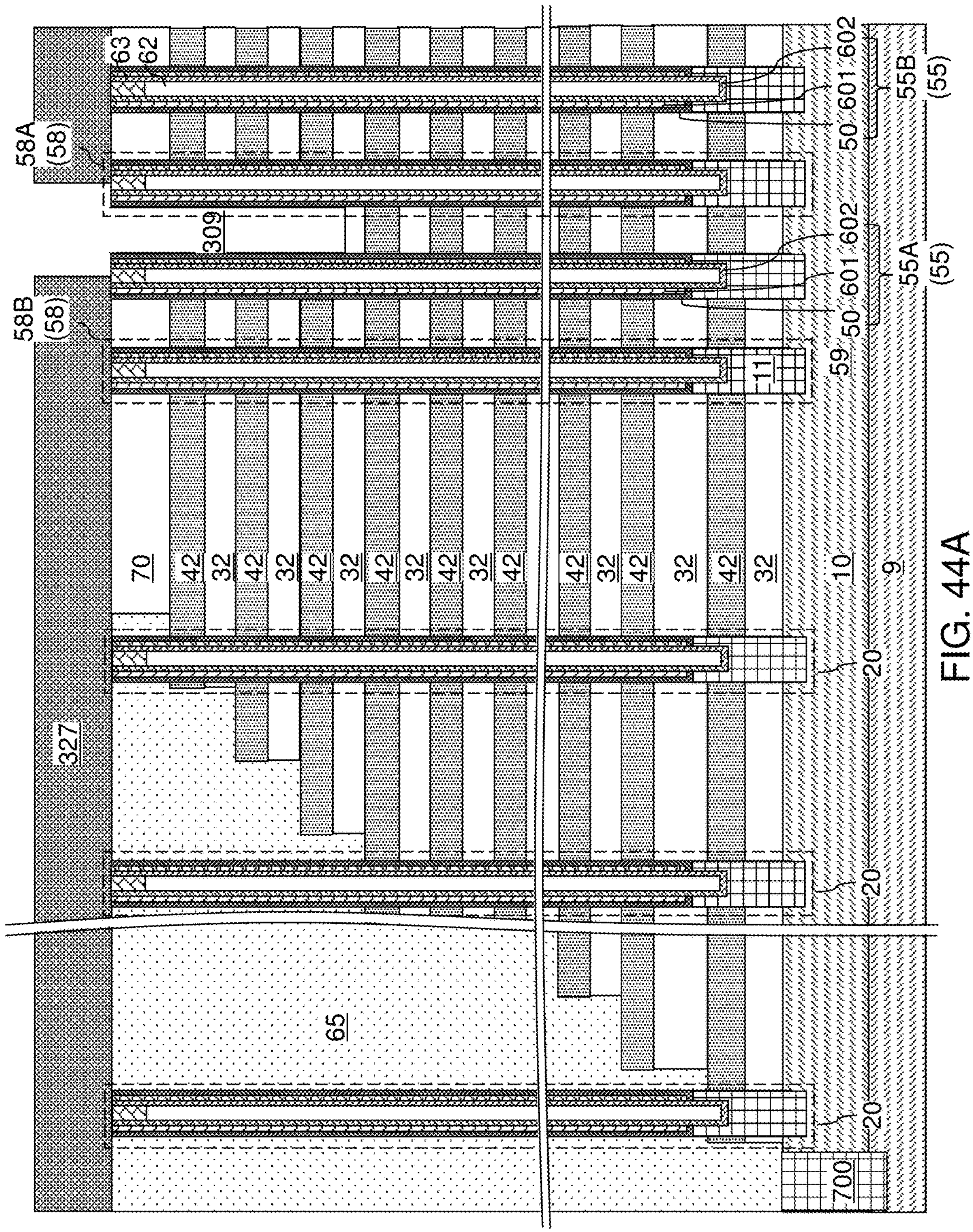
FIG. 44A is a vertical cross-sectional view of a fifth exemplary structure after formation of drain-select-level trenches according to a fifth embodiment of the present disclosure.
Figure 44B:
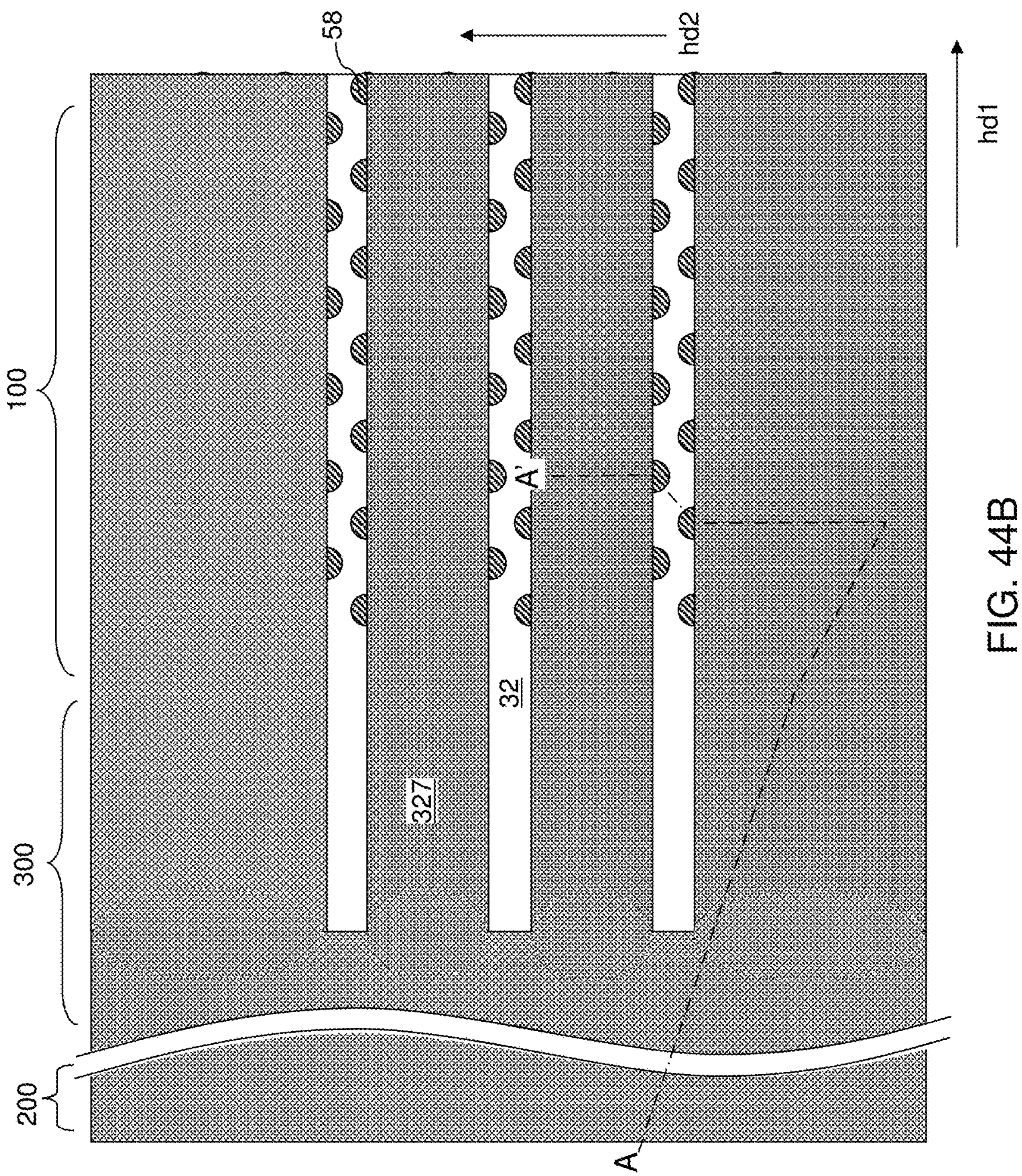
FIG. 44B is a top-down view of the fifth exemplary structure of FIG. 44A. The zig-zag vertical plane A-A' is the plane of the schematic vertical cross-sectional view of FIG. 44A.

Referring to FIGS. 44A and 44B, a fifth exemplary structure according to a fifth embodiment of the present disclosure may be derived from the first exemplary structure of FIG. 6. Generally, the fifth exemplary structure may be provided by forming an alternating stack of insulating layers 32 and spacer material layers over a substrate (9 and optionally 10). The spacer material layers are formed as sacrificial material layers 42, and may be subsequently replaced with the electrically conductive layers. Memory stack structures 55 extending through the alternating stack (32, 42) are formed. Each of the memory stack structures 55 includes a respective memory film 50 and a respective vertical semiconductor channel 60 including dopants of a first conductivity type at a first atomic concentration. Drain regions 63 having a doping of a second conductivity type that is an opposite of the first conductivity type is formed on an upper end of each of the vertical semiconductor channels 60. The memory stack structures 55 may be arranged in two rows that extend along a first horizontal direction hd1. The memory stack structures 55 are arranged as a two-dimensional periodic array in which each neighboring pair of rows of memory stack structures 55 has a uniform inter-row pitch p2. Each two-dimensional periodic array of memory stack structures 55 may be formed between the pair of backside trenches 79.

A patterned etch mask layer 327 including elongated openings may be formed over the alternating stack (32, 42) and the memory stack structures 55. In one embodiment, the patterned etch mask layer 327 may be a patterned photoresist layer formed by application and lithographic patterning of a photoresist material over the alternating stack (32, 42) and the memory stack structures 55. Each opening in the patterned etch mask layer 327 may overlie a segment of each memory stack structure 55 within a neighboring pair of rows of memory stack structures 55. Each memory stack structure 55 of which a segment is located within an area of one of the openings in the patterned etch mask layer 327 is herein referred to as a first memory stack structure 55A. Each memory opening fill structure 58 including a first memory stack structure 55A is herein referred to as a first memory opening fill structure 58A. Memory stack structures 55 that are entirely covered with the patterned etch mask layer 327, for example, by being located between neighboring pairs of first memory stack structures 55A, are herein referred to as a second memory stack structure 55B. Second memory stack structures 55B may, or may not, be present in the first exemplary structure depending on the layout of the elongated openings in the patterned etch mask layer 327. Each memory opening fill structure 58 including a second memory stack structure 55B is herein referred to as a second memory opening fill structure 58B.

Each first memory stack structure 55A is only partly covered with the patterned etch mask layer 327. As such, a first area of each of the first memory stack structures 55A is located within an area of an elongated opening in the patterned etch mask layer 327, and a second area of each of the first memory stack structures 55A is covered by the patterned etch mask layer 327. The first area may be in a range from 15% to 70%, such as from 25% to 50%, of the entire area of each first memory stack structure 55A.

An anisotropic etch process is performed to etch unmasked portions of the insulating cap layer 70 and upper layers of the alternating stack (32, 42) located at the drain select levels without etching the memory stack structures 55. A drain-select-level trench 309 is formed underneath each elongated opening within the patterned etch mask layer 327 by etching through an upper portion of the alternating stack (32, 42) selective to the physically exposed material portions of the memory opening fill structures 58. Each drain-select-level trench 309 may include a pair of laterally undulating lengthwise sidewalls that extend generally along the first horizontal direction hd1. Each laterally undulating lengthwise sidewall may include a laterally alternating sequence of straight sidewall segments (that are sidewalls of the insulating cap layer 70 and upper layers of the alternating stack (32, 42)) and concave sidewall segments (that are sidewalls of the memory opening fill structures 58). The depth of the drain-select-level trenches 309 may be selected such that the drain-select-level trenches 309 vertically extend through each sacrificial material layer 42 located at drain select levels, i.e., levels in which the sacrificial material layers 42 are subsequently replaced with electrically conductive layers that function as drain select level gate electrodes. Each vertical semiconductor channel 60 of the memory stack structures 55 has a tubular configuration.

The chemistry of the anisotropic etch process may be selective to the materials of the drain regions 63, the vertical semiconductor channels 60, and the outer layer of the memory films 50. In one embodiment, the blocking dielectric layers 52 may include an aluminum oxide layer as an outermost layer, and the anisotropic etch process may be selective to aluminum oxide. The anisotropic etch process partially physically exposes upper portions of sidewalls of two rows of the first memory stack structures 55A around each drain-select-level trench 309. Each drain-select-level trench 309 extends through an upper portion of the alternating stack (32, 42) and laterally extends between two rows of first memory stack structures 55A. The memory stack structures 55 includes first memory stack structures 55A that are partially exposed to a respective one of the drain-select-level trenches 309, and optionally includes second memory stack structures 55B that are masked with the patterned etch mask layer 317 during formation of the drain-select-level trenches 309. Thus, sidewalls of the second memory stack structures 55B are not physically exposed after formation of the drain-select-level trenches 309.

Figure 45:
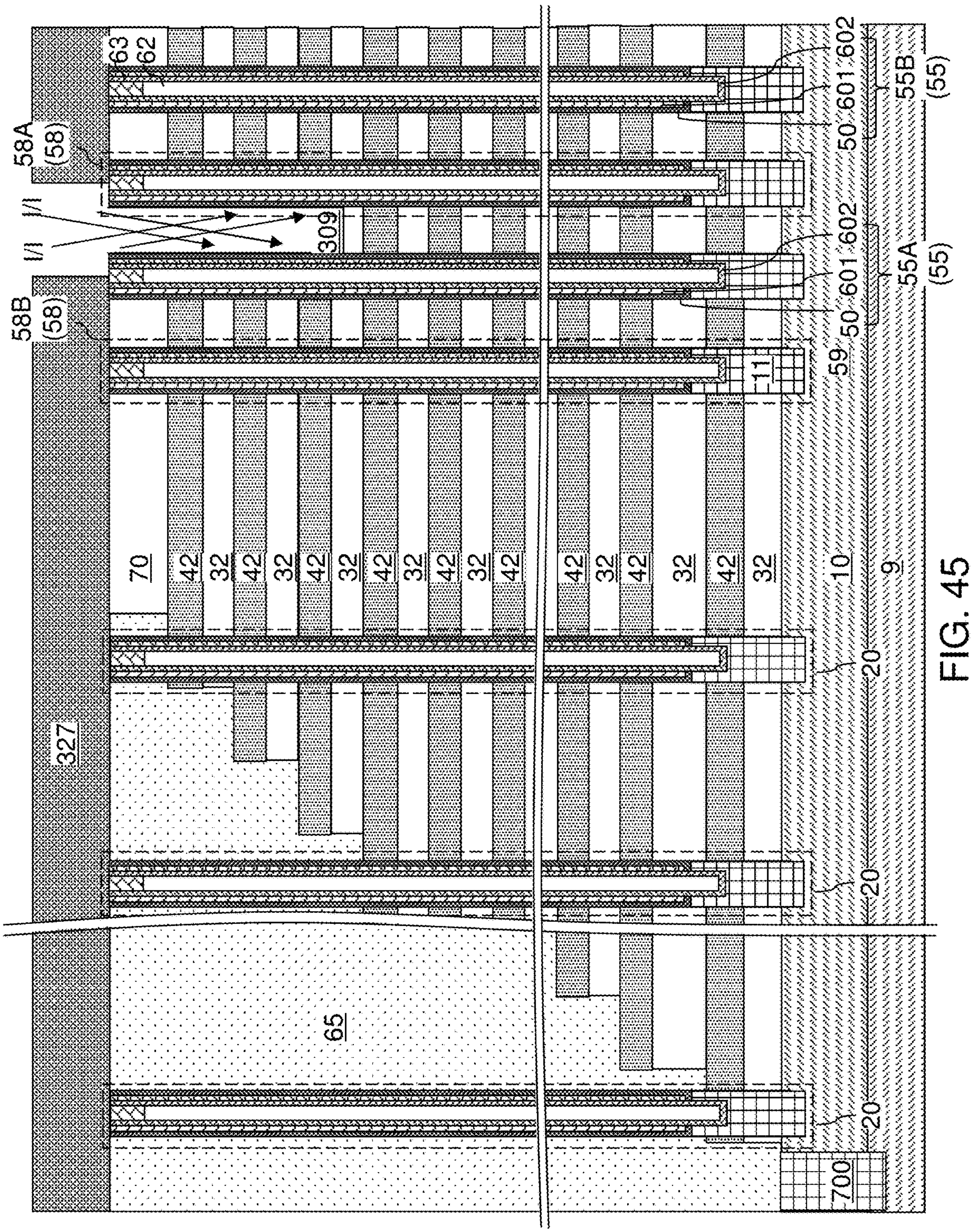
FIG. 45 is a vertical cross-sectional view of the fourth exemplary structure after ion implantation of dopants of a first conductivity type into portions of vertical semiconductor channels according to the fifth embodiment of the present disclosure.

Referring to FIG. 45, the processing steps of FIGS. 40A and 40B may be performed to implant dopants of the first conductivity type into segments of vertical semiconductor channels 60 within the first memory stack structures 55A that are proximal to a respective one of the drain-select-level trenches 309. Each vertical semiconductor channel 60 within the first memory stack structures 55A (located within the first memory opening fill structures 58A) comprises a tubular section 60T including dopants of the first conductivity type at the first atomic concentration (which is the atomic concentration of dopants of the first conductivity type as provided during formation of the first and second semiconductor channel layers (601, 602)), a first semi-tubular section 60S overlying the tubular section 60T and including dopants of the first conductivity type at the first atomic concentration, and a second semi-tubular section 60U overlying the tubular section 60T and laterally adjoined to the first semi-tubular section 60S and including dopants of the first conductivity type at a second atomic concentration that is greater than the first atomic concentration.

In one embodiment, the second atomic concentration may be in a range from 5 times the first atomic concentration to $1.0\times10^5$ times the first atomic concentration. In a non-limiting illustrative example, the first atomic concentration may be in a range from $1.0\times10^{14}/cm^3$ to $1.0\times10^{18}/cm^3$, and the second atomic concentration may be in a range from $1.0\times10^{17}/cm^3$ to $1.0\times10^{19}/cm^3$, although lesser and greater concentrations may be used for each of the first atomic concentration and the second atomic concentration. In one embodiment, the tubular section 60T of each first memory stack structure 55A (within a respective one of the first memory opening fill structures 58A) may be located underneath a horizontal plane including bottom surfaces of the drain-select-level trenches 309. Each tubular section 60T, each first semi-tubular section 60S, and each second semi-tubular section 60U may include a respective portion derived from a first semiconductor channel layer 601 and a respective portion derived from a second semiconductor channel layer 602. The second semi-tubular section 60U may additionally include carbon atoms, for example, at an atomic concentration in a range from $1.0\times10^{15}/cm^3$ to $5.0\times10^{17}/cm^3$, and the first semi-tubular section 60S and the tubular section 60T may be free of carbon atoms, e.g., at a trace level below $1.0\times10^{14}/cm^3$. Thus, the atomic concentration of carbon atoms in the second semi-tubular section 60U may be at least 10 times the atomic concentration of carbon atoms in the first semi-tubular region 60S, and at least 10 times the atomic concentration of carbon atoms in the tubular region 60T.

The memory stack structures 55 may include second memory stack structures 55B extending through the alternating stack (32, 46). Each of the second memory stack structures 55B includes a respective second memory film 50 and a respective second vertical semiconductor channel 60, and each second vertical semiconductor channel 60 may include a portion having a tubular configuration, extend through each electrically conductive layer 46 in the alternating stack (32, 46), and include dopants of the first conductivity type at the first atomic concentration throughout an entire volume thereof. The portion having the tubular configuration may extend to the horizontal plane including the top surfaces of the drain regions 63.

In one embodiment, each of the first semi-tubular sections 60S has a horizontal cross-sectional shape of a first block arc that is invariant with translation along a vertical direction hd1, and each of the second semi-tubular sections 60U has a horizontal cross-sectional shape of a second block arc that is invariant with translation along the vertical direction. As used herein, a "block arc" is a shape that is obtained by limiting the azimuthal extent of a planar annular shape to less than 360 degrees around the geometrical center of the planar annular shape (i.e., the shape of an anulus within a Euclidean plane).

Dopants of the first conductivity type are collaterally implanted into a segment of each of the first drain regions 63 during implantation of the dopants of the first conductivity type into the implanted segments of vertical semiconductor channels 60 (i.e., into the second semi-tubular sections 60U). The first drain regions 63 may contact an upper end of a respective one of the first semi-tubular sections 60S, contact an upper end of a respective one of the second semi-tubular sections 60U, and have a doping of the second conductivity type that is the opposite of the first conductivity type. In one embodiment, each of the first drain regions 63 may include a first drain segment 631 consisting essentially of a semiconductor material and dopants of the second conductivity type and contacting the upper end of the respective one of the first semi-tubular sections 60S, and a second drain segment 632 consisting essentially of the semiconductor material, dopants of the second conductivity type, and dopants of the first conductivity type, and contacting the upper end of the respective one of the second semi-tubular sections 60U. The atomic concentration of dopants of the first conductivity type in a second drain segment 632 is less than the atomic concentration of dopants of the second conductivity type in the second drain segment 632, and may be the less than the atomic concentration of dopants of the first conductivity type in the second semi-tubular sections 60U. The patterned etch mask layer 327 may be removed, for example, by ashing after formation of the drain-select-level trenches 309.

Figure 46:
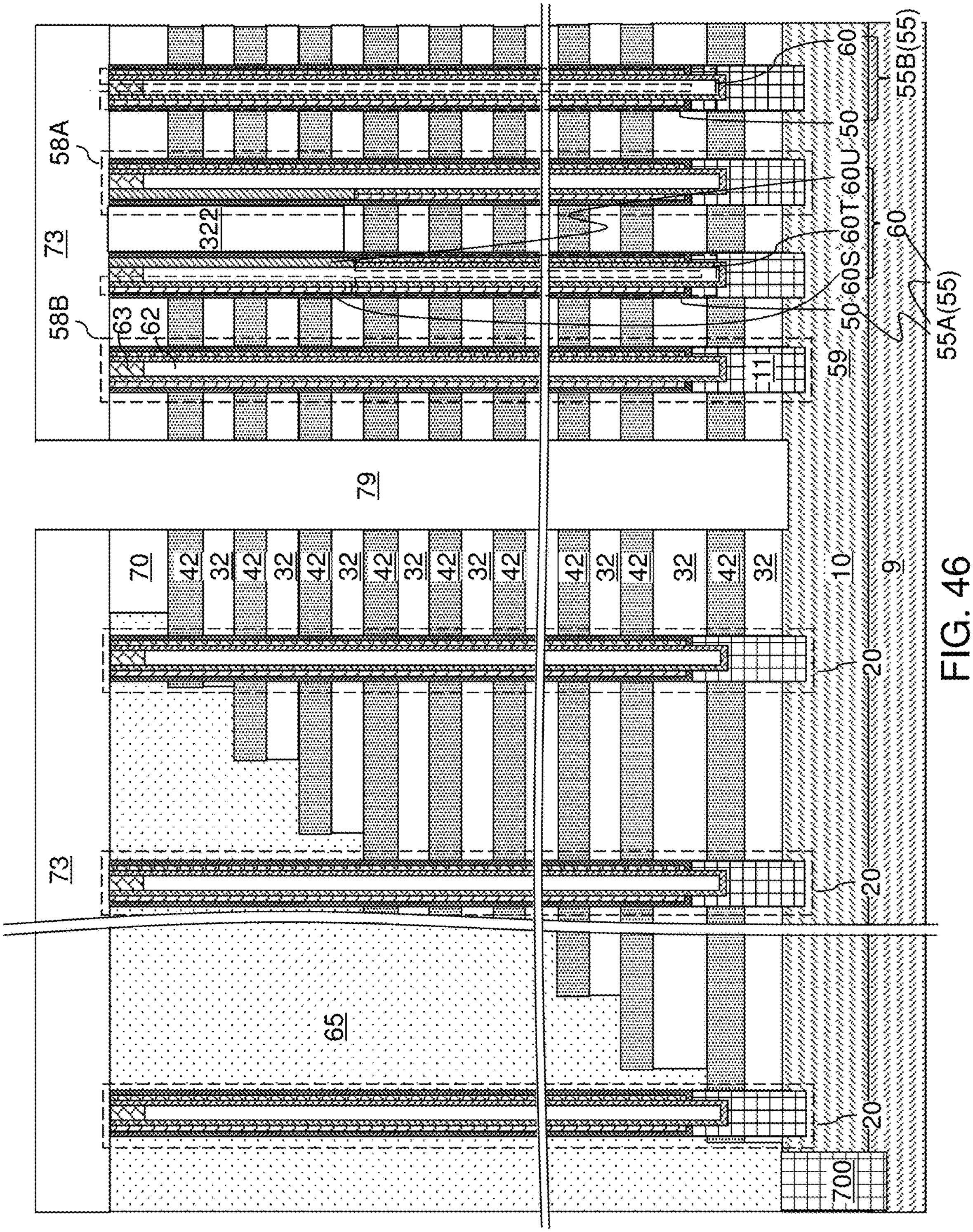
FIG. 46 is a vertical cross-sectional view of the fourth exemplary structure formation of backside trenches according to the fifth embodiment of the present disclosure.

Referring to FIG. 46, drain-select-level isolation structure 322 may be formed in each drain-select-level trench 309, for example, by depositing a dielectric material such as silicon oxide in the drain-select-level trenches 309. Excess portions of the dielectric material may be removed from above the horizontal plane including the top surface of the insulating cap layer 70 by a planarization process, which may use a recess etch and/or chemical mechanical planarization. Each drain-select-level isolation structure 322 may be formed in a drain-select-level trench 309 on sidewalls of memory films 50 of the first memory stack structures 55A. Each drain-select-level isolation structure 320 may include a pair of laterally-undulating sidewalls that laterally extend along the first horizontal direction hd1 and including a laterally alternating sequence of straight sidewall segments and concave sidewall segments. Each drain-select-level isolation structure 322 may vertically extend through each electrically conductive layer 46 within the alternating stack (32, 46) that is located at a drain select level.

In one embodiment, the first memory stack structures 55A are arranged in first rows that extend along the first horizontal direction hd1 and has a uniform intra-row pitch p1 within each first row. The second memory stack structures 55B are arranged in second rows that extend along the first horizontal direction hd1 and have the uniform intra-row pitch p1 within each second row. The first memory stack structures 55A and the second memory stack structures 55B are arranged as a two-dimensional periodic array in which each neighboring pair of rows selected from the first rows and second rows has a uniform inter-row pitch p2.

Subsequently, the processing steps described above with reference to FIGS. 9A and 9B may be performed to form a contact level dielectric layer 73 and backside trenches 79.

Figure 47:
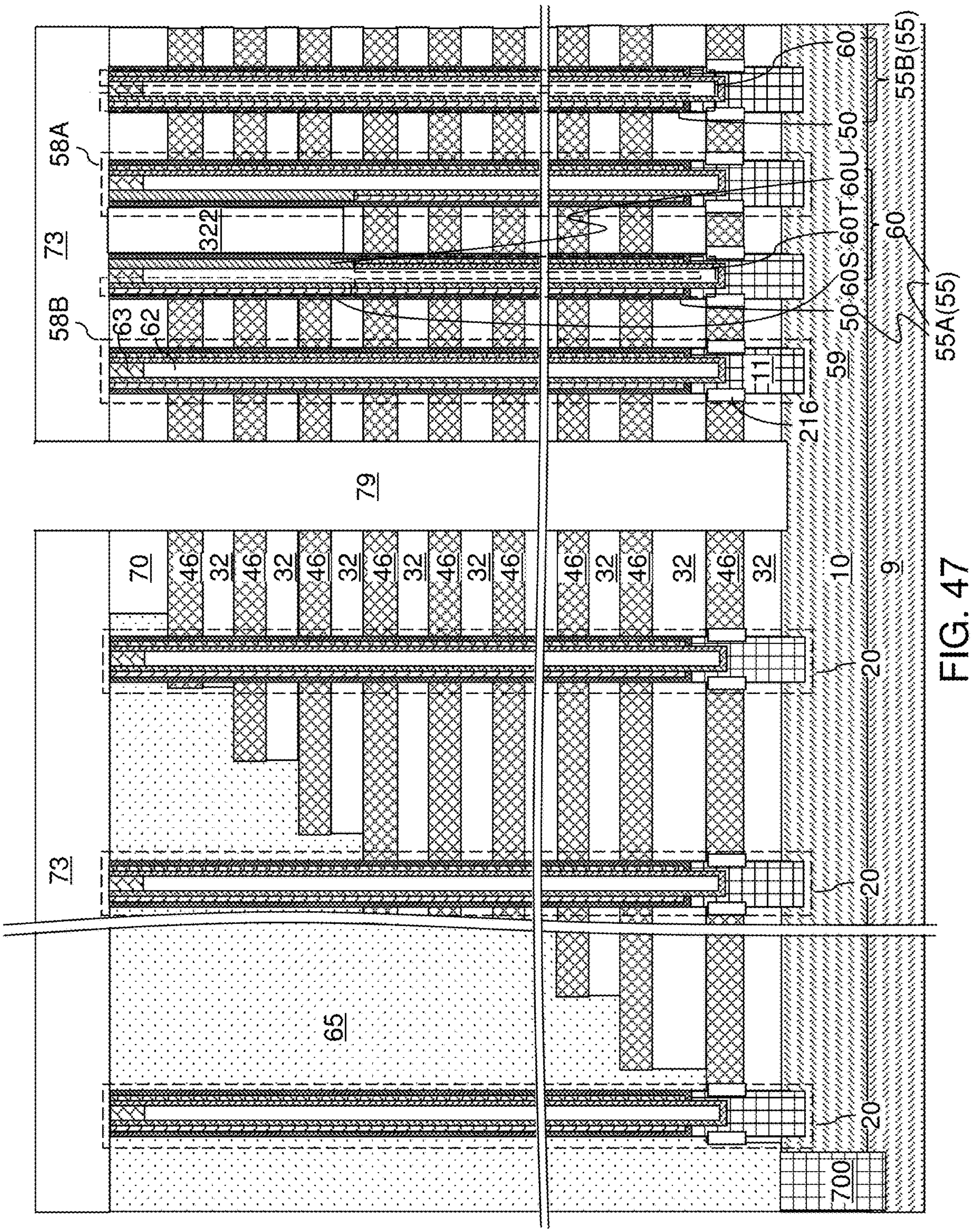
FIG. 47 is a vertical cross-sectional view of the fourth exemplary structure after replacement of the sacrificial material layers with electrically conductive layers according to the fifth embodiment of the present disclosure.

Referring to FIG. 47, the processing steps of FIGS. 10, 11A-11D, 12, 13A and 13B may be performed to replace the sacrificial material layers 42 with electrically conductive layers 46. The processing steps of FIGS. 14A, 14B, 15A, and 15B may be subsequently performed to provide a structure that is substantially identical to the structure of FIGS. 43A-43C.

Referring to all drawings of the fourth and fifth exemplary structures and according to various embodiments of the present disclosure, a three-dimensional memory device is provided, which comprises: an alternating stack of insulating layers 32 and electrically conductive layers 46 located over a substrate (9, 10); and first memory stack structures 55A extending through the alternating stack (32, 46), wherein each of the first memory stack structures 55A includes a respective first memory film 50 and a respective first vertical semiconductor channel 60, wherein each first vertical semiconductor channel 60 comprises a tubular section 60T including dopants of a first conductivity type at a first atomic concentration, a first semi-tubular section 60S overlying the tubular section and including dopants of the first conductivity type at the first atomic concentration, and a second semi-tubular section 60U overlying the tubular section and laterally adjoined to the first semi-tubular section 60S and including dopants of the first conductivity type at a second atomic concentration that is greater than the first atomic concentration.

In one embodiment, the three-dimensional memory device comprises drain-select-level isolation structures 322 vertically extending through an upper region of the alternating stack (32, 46) and laterally extending along a first horizontal direction hd1, wherein each of the first memory stack structures 55A contacts a respective one of the drain-select-level isolation structures 322.

In one embodiment, the tubular section 60T of each first vertical semiconductor channel 60 is located underneath a horizontal plane including bottom surfaces of the drain-select-level isolation structures 322.

In one embodiment, each of the drain-select-level isolation structures 322 comprises a pair of laterally-undulating sidewalls; and each of the laterally-undulating sidewalls comprises an alternating sequence of straight sidewall segments and concave sidewall segments that are adjoined to one another. In one embodiment, each of the concave sidewall segments contacts an outer surface of a respective one of the first memory films 50. In one embodiment, each of the second semi-tubular sections 60U is laterally spaced from a most proximal one of the drain-select-level isolation structures 322 by a uniform lateral spacing that is the same as a lateral thickness of one of the first memory films 50.

The various embodiments of the present disclosure may be used to provide drain-select-level isolation structures (320, 322) without disturbing the periodicity of a two-dimensional array of memory stack structures (55A, 55B). First memory stack structures 55A contacting a respective one of the drain-select-level isolation structures (320, 322) and optional second memory stack structures 55B that do not contact any of the drain-select-level isolation structures (320, 322) may be within a same periodic two-dimensional periodic array, thereby enabling reduction of footprint for a three-dimensional array of memory devices.

Figure 48:
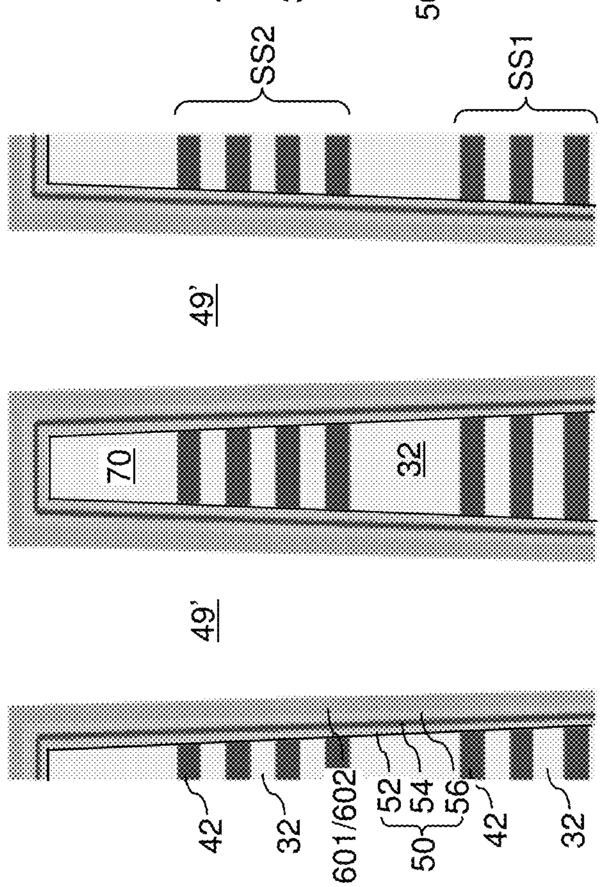
FIG. 48 is a vertical cross-sectional view of a region of a fifth exemplary structure after formation of memory openings, a memory film, and a first semiconductor channel layer according to a sixth embodiment of the present disclosure.

Referring to FIG. 48, a region of a fifth exemplary structure is illustrated, which may be derived from the first exemplary structure described above with reference to FIGS. 4A and 4B by performing the processing steps described above with reference to FIGS. 5B and 5C. A memory film 50 and a first semiconductor channel layer 601 may be formed within each memory opening 49 and within each support opening 19. The alternating stack of insulating layers 32 and sacrificial material layers 42 may include a first subset SS1 of the insulating layers 32 and the sacrificial material layers 42 that may be formed at the levels of word lines to be subsequently formed, and a second subset SS2 of the insulating layers 32 and the sacrificial material layers 42 that may be formed at the levels of drain select gate electrodes to be subsequently formed, i.e., at the drain select levels. A memory cavity 49' may be present within each void inside the memory openings 49 that are not filled with the memory film 50 and the first semiconductor channel layer 601.

Figure 49:
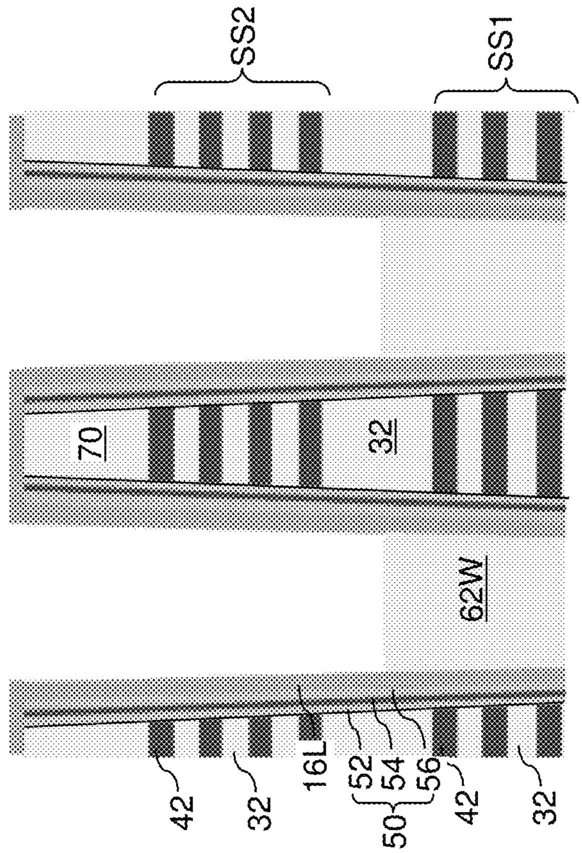
FIG. 49 is a vertical cross-sectional view of a region of the fifth exemplary structure after formation of word-line-level dielectric cores according to the sixth embodiment of the present disclosure.

Referring to FIG. 49, the processing steps described above with reference to FIGS. 5D-5F may be performed. The combination of the first semiconductor channel layer 601 and a second semiconductor channel layer 602 (illustrated in FIG. 5E) is herein referred to as a word-line-level semiconductor channel material layer 16L. A dielectric material 62W may be deposited in the memory cavities 49' and unfilled volumes of the support openings 19, and may be vertically recessed selective to the material of the word-line-level semiconductor channel material layer 16L to a height between the first subset SS1 of the insulating layers 32 and the sacrificial material layers 42 and the second subset SS2 of the insulating layers 32 and the sacrificial material layers 42. In one embodiment, the insulating layer 32 between the first subset SS1 of the insulating layers 32 and the sacrificial material layers 42 and the second subset SS2 of the insulating layers 32 and the sacrificial material layers 42 may have a greater thickness than the insulating layers 32 in the first subset SS1 and in the second subset 32 to increase the process margin for the recess etch process that etches the dielectric material. Each remaining portion of the dielectric material after the recess etch process constitutes a word-line-level dielectric core 62W.

Figure 50:
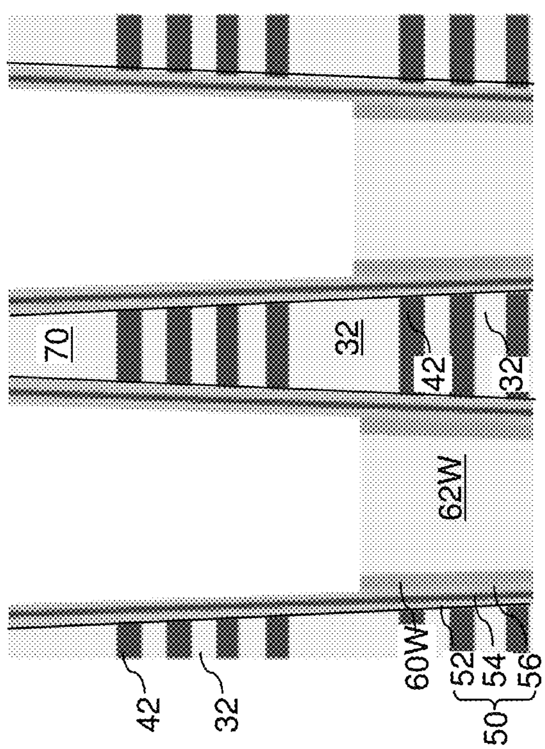
FIG. 50 is a vertical cross-sectional view of a region of the fifth exemplary structure after patterning a word-line-level semiconductor channel material layer according to the sixth embodiment of the present disclosure.

Referring to FIG. 50, the word-line-level semiconductor channel material layer 16L may be patterned by removing physically exposed portions of the word-line-level semiconductor channel material layer 16L selective to underlying dielectric material layers. For example, a wet etch process using hot trimethyl-2 hydroxyethyl ammonium hydroxide ("hot TMY") or tetramethyl ammonium hydroxide (TMAH) may be used to remove physically exposed portions of the word-line-level semiconductor channel material layer 16L. Alternatively, a dry etch process using gas phase hydrochloric acid may be used to etch physically exposed portions of the word-line-level semiconductor channel material layer 16L selective to underlying dielectric material layers. Each remaining discrete portion of the word-line-level semiconductor channel material layer 16L in a memory opening 49 constitutes a word-line-level semiconductor channel portion 60W.

Figure 51:
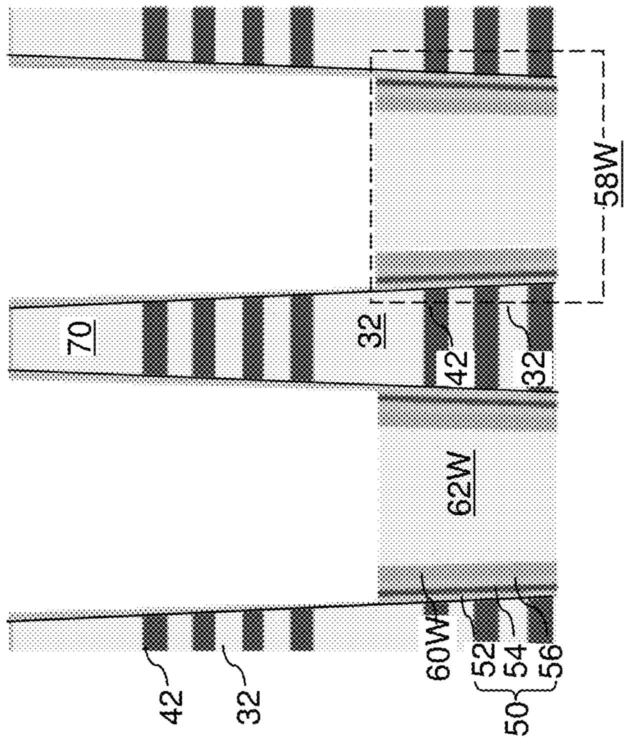
FIG. 51 is a vertical cross-sectional view of a region of the fifth exemplary structure after patterning a memory film according to the sixth embodiment of the present disclosure.

Referring to FIG. 51, the tunneling dielectric layer 56 and the charge storage layer 54 of the memory film 50 may be removed by isotropic etch processes, which may include wet etch processes. In one embodiment, the charge storage layer 54 may be removed selective to the material of the blocking dielectric layer 52. In one embodiment, the tunneling dielectric layer 56 may include silicon oxide, the charge storage layer 54 may include silicon nitride, and the blocking dielectric layer 52 may include silicon oxide. In this case, the tunneling dielectric layers 56 may be etched selective to the charge storage layers 54 by a wet etch process using dilute hydrofluoric acid, and the charge storage layers 54 may be etched selective to the blocking dielectric layers 52 by a wet etch process using a mixture of hydrofluoric acid and glycerol. The blocking dielectric layers 52 may be physically exposed around each cavity located above the word-line-level dielectric cores 62W. A word-line-level opening fill structure 58W is formed within a lower portion of each of the memory openings 49. Each word-line-level opening fill structure 58W includes a memory film 50, a word-line-level semiconductor channel portion 60W, and a word-line-level dielectric core 62W.

Figure 52:
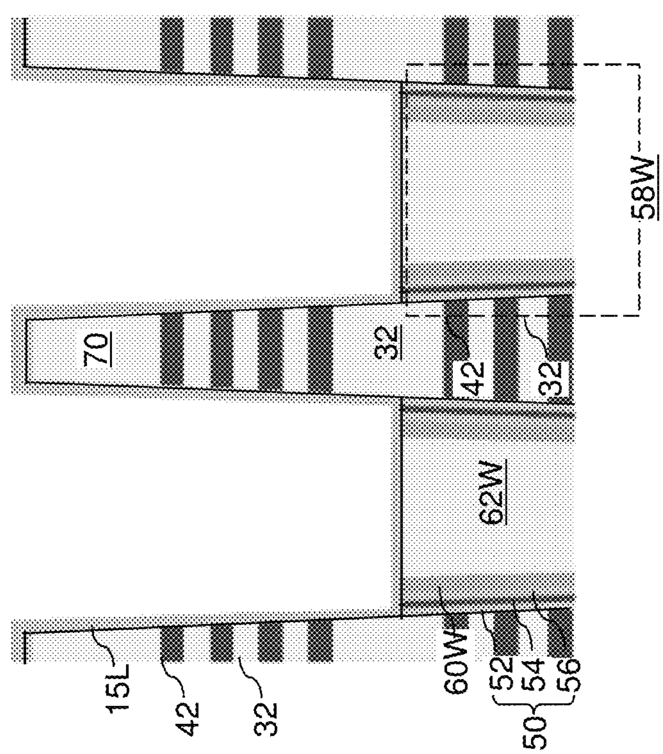
FIG. 52 is a vertical cross-sectional view of a region of the fifth exemplary structure after formation of a gate dielectric layer according to the sixth embodiment of the present disclosure.

Referring to FIG. 52, portions of the blocking dielectric layers 52 that protrude above the top surfaces of the word-line-level dielectric cores 62W may, or may not, be removed. A gate dielectric material may be conformally deposited directly on the sidewalls of the insulating layers 32 and the sacrificial material layers 42 and on the top surfaces of the word-line-level dielectric cores 62W, or directly on the physically exposed vertical portions of the blocking dielectric layers 52. The deposited gate dielectric material and any underlying portion of the blocking dielectric layers 52, if any, may constitute a gate dielectric layer 15L. The gate dielectric layer 15L may include silicon oxide and/or a dielectric metal oxide (such as aluminum oxide or hafnium oxide). The thickness of the gate dielectric layer 15L may be in a range from 1 nm to 6 nm, although lesser and greater thicknesses may also be used.

Figure 53:
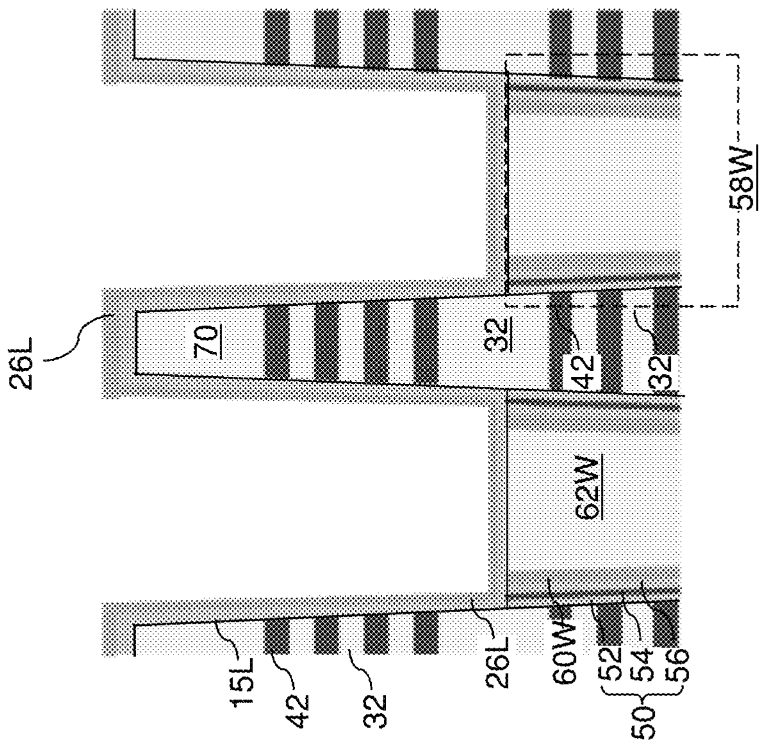
FIG. 53 is a vertical cross-sectional view of a region of the fifth exemplary structure after formation of a drain-select-level cover semiconductor layer according to the sixth embodiment of the present disclosure.

Referring to FIG. 53, a drain-select-level cover semiconductor layer 26L may be deposited over the gate dielectric layer 15L by a conformal deposition method. The drain-select-level cover semiconductor layer 26L may include the same material as the first semiconductor channel layer 601. The thickness of the drain-select-level cover semiconductor layer 26L may be in a range from 2 nm to 10 nm, although lesser and greater thicknesses may also be used.

Figure 54:
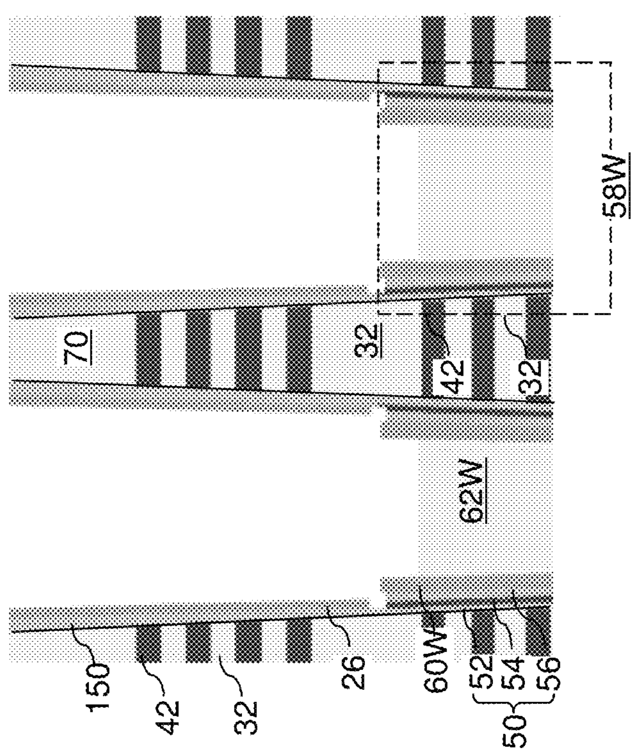
FIG. 54 is a vertical cross-sectional view of a region of the fifth exemplary structure after removal of horizontal portions of the drain-select-level cover semiconductor layer and the gate dielectric layer and formation of a drain-select-level cover semiconductor portions by an anisotropic etch process according to the sixth embodiment of the present disclosure.

Referring to FIG. 54, an anisotropic etch process may be performed to remove horizontal portions of the drain-select-level cover semiconductor layer 26L and the gate dielectric layer 15L. Each remaining cylindrical portion of the drain-select-level cover semiconductor layer 26L constitutes a drain-select-level cover semiconductor portion 26 that has a generally cylindrical configuration. Each remaining vertical portion of the gate dielectric layer 15L constitutes a gate dielectric 150 that has a generally cylindrical configuration. Each gate dielectric 150 laterally surrounds a drain-select-level cover semiconductor portion 26. The top surface of each word-line-level dielectric core 62W may be vertically recessed by the anisotropic etch process so that an upper portion of an inner sidewall of each word-line-level semiconductor channel portion 60W may be exposed.

Figure 55:
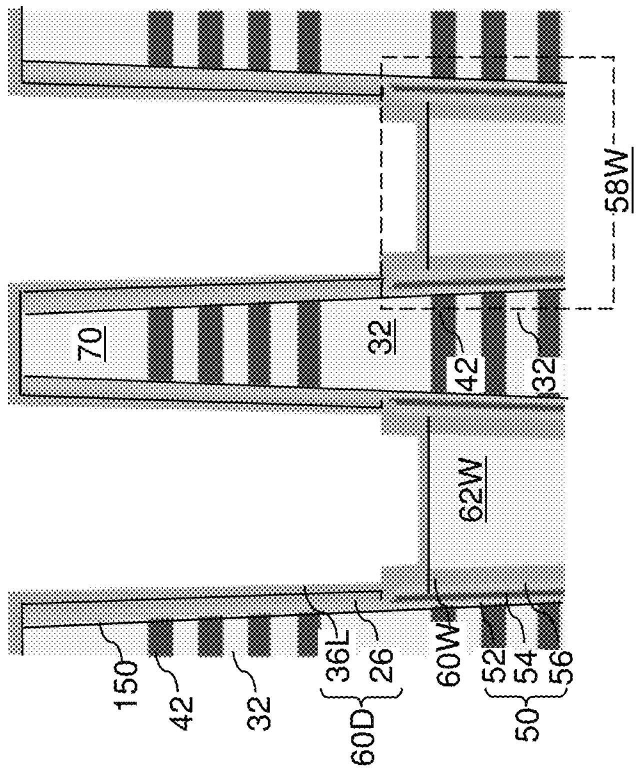
FIG. 55 is a vertical cross-sectional view of a region of the fifth exemplary structure after formation of a drain-select-level body semiconductor layer according to the sixth embodiment of the present disclosure.

Referring to FIG. 55, a drain-select-level body semiconductor layer 36L may be deposited on the drain-select-level cover semiconductor portions 26, on the physically exposed surfaces of the word-line-level semiconductor channel portions 60W, and on the top surfaces of the word-line-level dielectric cores 62W by a conformal deposition method. The drain-select-level body semiconductor layer 36L may include the same material as the second semiconductor channel layer 602. The thickness of the drain-select-level body semiconductor layer 36L may be in a range from 2 nm to 10 nm, although lesser and greater thicknesses may also be used.

Figure 56:
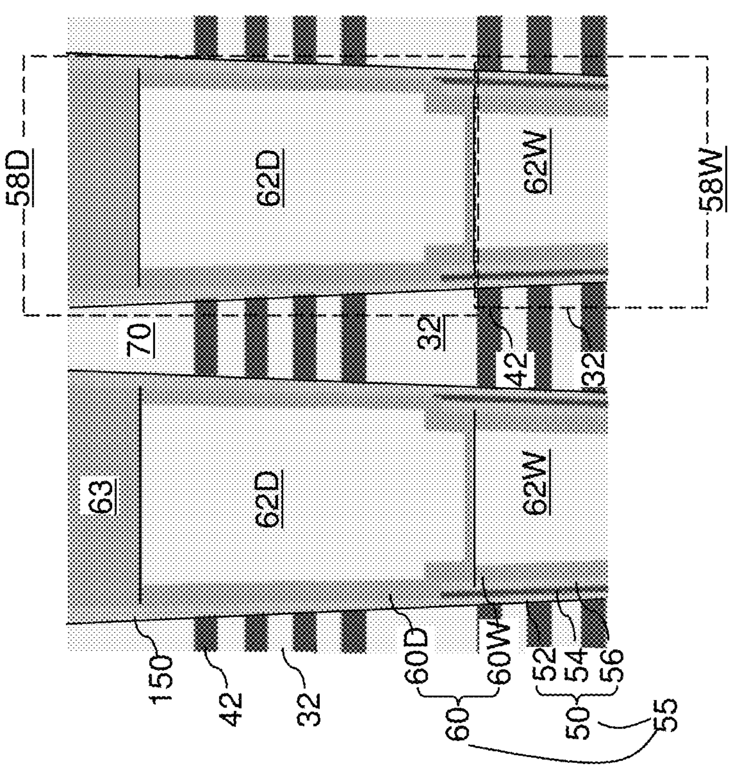
FIG. 56 is a vertical cross-sectional view of a region of the fifth exemplary structure after formation of drain-select-level dielectric cores, drain-select-level semiconductor channel portions, and drain regions according to the sixth embodiment of the present disclosure.

Referring to FIG. 56, a dielectric material may be deposited in the cavities located inside the memory openings 49. The dielectric material may include a silicon oxide material having a higher etch rate than the material of the insulating cap layer 70. For example, the insulating cap layer 70 may include undoped silicate glass, and the dielectric material deposited in the cavities within the memory openings 49 may include a doped silicate glass such as borosilicate glass or borophosphosilicate glass, or may include organosilicate glass. An etchback process (such as an anisotropic etch process) may be performed to remove portions of the deposited dielectric material from above the top surface of the insulating cap layer 70 and to vertically recess the deposited dielectric material below the horizontal plane including the top surface of the insulating cap layer 70. Each remaining portion of the deposited dielectric material in the memory openings 49 may constitute a drain-select-level dielectric core 62D. A doped semiconductor material having a doping of the second conductivity type may be deposited in recessed volumes that overlie the drain-select-level dielectric cores 62D. Excess portions of the doped semiconductor material may be removed from above the horizontal plane including the top surface of the insulating cap layer 70. Each remaining portion of the doped semiconductor material constitutes a drain region 63. Horizontal portions of the drain-select-level body semiconductor layer 36L overlying the top surface of the insulating cap layer 70 may be collaterally removed during the planarization process.

Each combination of a drain-select-level cover semiconductor portion 26 and a remaining portion of the drain-select-level body semiconductor layer 36L constitutes a drain-select-level semiconductor channel portion 60D. Each set of a gate dielectric 150, a drain-select-level semiconductor channel portion 60D, a drain-select-level dielectric core 62D, and a drain region constitutes a drain-select-level opening fill structure 58D. Each vertical stack of a word-line-level opening fill structure 58W and a drain-select-level opening fill structure 58D that fills a memory opening 49 constitutes a memory pillar structure (58W, 58D). Each combination of a word-line-level semiconductor channel portion 60W and a drain-select-level semiconductor channel portion 60D constitutes a vertical semiconductor channel 60.

Each of the drain-select-level semiconductor channel portions 60D comprises a bottom plate portion contacting an annular top surface of a respective one of the word-line-level semiconductor channel portions 60W and a top surface a respective one of the word-line-level dielectric cores 62W. One of the drain-select-level dielectric cores 62W is formed directly on a top surface of the bottom plate portion.

Generally, a drain-select-level opening fill structure 58D may include a gate dielectric 150, a drain-select-level semiconductor channel portion 60D, a drain-select-level dielectric core 62D, and a drain region 63, and is formed within an upper portion of each of the memory openings 49. Each vertical stack of a word-line-level opening fill structure 58W and a drain-select-level opening fill structure 58D constitutes a memory pillar structure (58W, 58D). The memory pillar structures (58W, 58D) extend through the alternating stack (32, 42). Each of the memory pillar structures (58W, 58D) may include a respective memory film 50 and a respective vertical semiconductor channel 60. The memory pillar structures (58W, 58D) comprise first memory pillar structures arranged in two neighboring rows that extend along a first horizontal direction hd1 because each memory pillar structure (58W, 58D) is formed within a respective one of the memory openings 49 and the support openings 19 illustrated in FIG. 4B.

Figure 57:
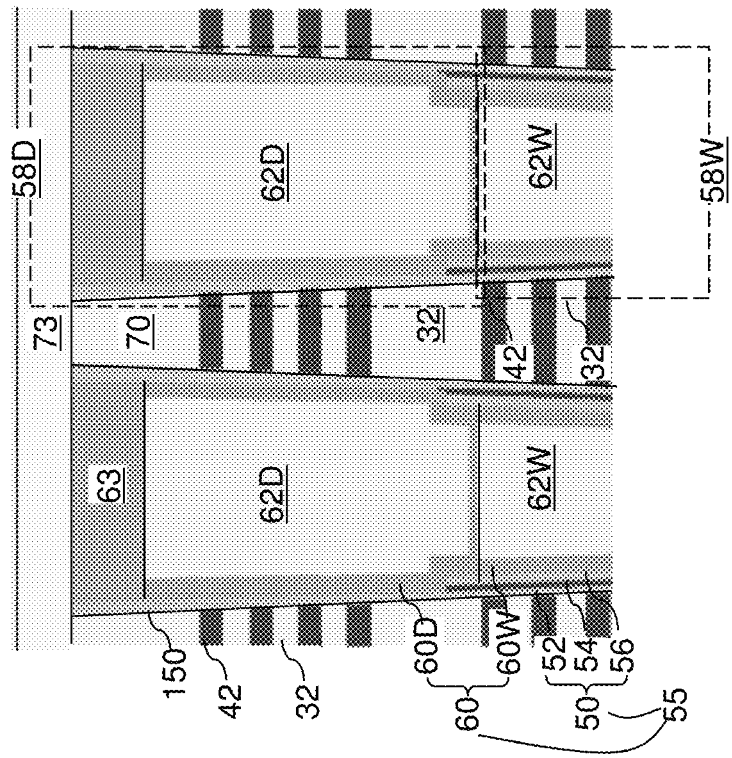
FIG. 57 is a vertical cross-sectional view of a region of the fifth exemplary structure after formation of a contact level dielectric layer according to the sixth embodiment of the present disclosure.

Referring to FIG. 57, a contact level dielectric layer 73 may be formed by performing the processing steps described above with reference to FIGS. 9A and 9B.

Figure 58:
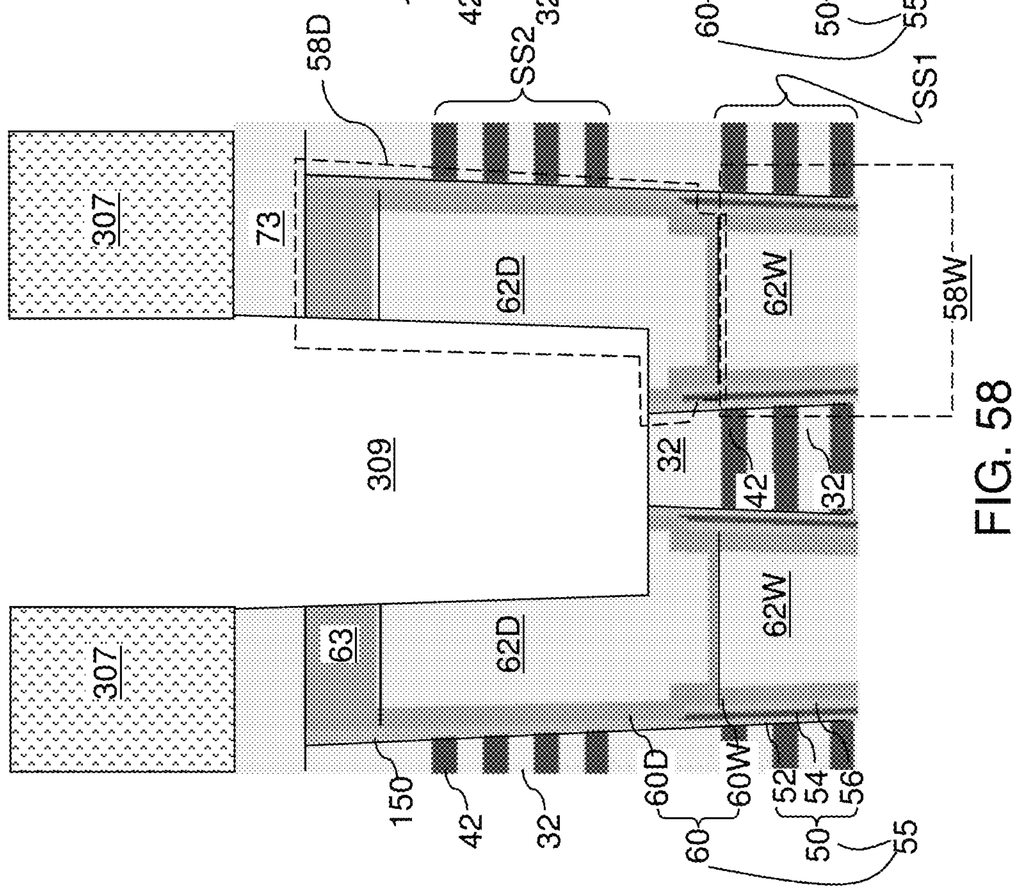
FIG. 58 is vertical cross-sectional view of a region of the fifth exemplary structure after formation of a drain-select-level trench according to the sixth embodiment of the present disclosure.

Referring to FIG. 58, the processing steps described above with reference to FIGS. 7A and 7B may be performed with a modification to the anisotropic etch to form drain-select-level trenches 309. The anisotropic etch process may be modified to etch through the contact level dielectric layer 73 and to terminate the anisotropic etch process when the drain-select-level trenches 309 reach a depth between a bottommost layer of the second subset SS2 of the layers of the alternating stack (32, 42) and a topmost layer of the first subset SS1 of the layers of the alternating stack (32, 42). For example, a patterned etch mask layer 307 including elongated openings may be formed over the alternating stack (32, 42) and the memory pillar structures (58W, 58D). In one embodiment, the patterned etch mask layer 307 may be a patterned photoresist layer formed by application and lithographic patterning of a photoresist material over the alternating stack (32, 42) and the memory pillar structures (58W, 58D). Each opening in the patterned etch mask layer 307 may overlie a segment of each memory pillar structure (58W, 58D) within a neighboring pair of rows of memory pillar structures (58W, 58D). Each memory pillar structure (58W, 58D) of which a segment may be located within an area of one of the openings in the patterned etch mask layer 307 is herein referred to as a first memory pillar structure (58W, 58D). Memory pillar structures (58W, 58D) that are entirely covered with the patterned etch mask layer 307, for example, by being located between neighboring pairs of first memory pillar structures (58W, 58D), are herein referred to as a second memory pillar structure (58W, 58D). Second memory pillar structures (58W, 58D) may, or may not, be present in the fifth exemplary structure depending on the layout of the elongated openings in the patterned etch mask layer 307. Each first memory pillar structure (58W, 58D) may only be partly covered with the patterned etch mask layer 307. As such, a first area of each of the first memory pillar structures (58W, 58D) may be located within an area of an elongated opening in the patterned etch mask layer 307, and a second area of each of the first memory pillar structure (58W, 58D) may be covered by the patterned etch mask layer 307. The first area may be in a range from 15% to 70%, such as from 25% to 50%, of the entire area of each first memory pillar structure (58W, 58D).

An anisotropic etch process may be performed to etch through unmasked portions of the contact level dielectric layer 73 and through unmasked portions of the second subset SS2 of layers within the alternating stack (32, 42) that are located at drain select levels. A segment of each drain-select-level semiconductor channel portion 60D and a segment of each drain-select-level dielectric core 62D may be etched for each memory pillar structure (58W, 58D) that partially underlie the openings in the etch mask layer 307. A drain-select-level trench 309 is formed underneath each elongated opening within the patterned etch mask layer 307 by etching through unmasked portions of the contact level dielectric layer 73, an upper portion of the alternating stack (32, 42), and a first area of each drain-select-level opening fill structure 58D selected from the first memory pillar structure (58W, 58D). Each drain-select-level trench 309 may include a pair of straight lengthwise sidewalls that extend along the first horizontal direction hd1. The depth of the drain-select-level trenches 309 may be selected such that the drain-select-level trenches 309 vertically extend through each sacrificial material layer located at drain select levels, i.e., levels in which drain-select-level electrically conductive layers that function as drain select gate electrodes are to be subsequently formed. The patterned etch mask layer 307 may be removed, for example, by ashing after formation of the drain-select-level trenches 309. Flat sidewalls of the drain regions 63 and the drain-select-level semiconductor channel portions 60D and semi-annular flat horizontal surfaces of the drain-select-level semiconductor channel portions 60D are physically exposed in each drain-select-level trench 309.

Figure 59:
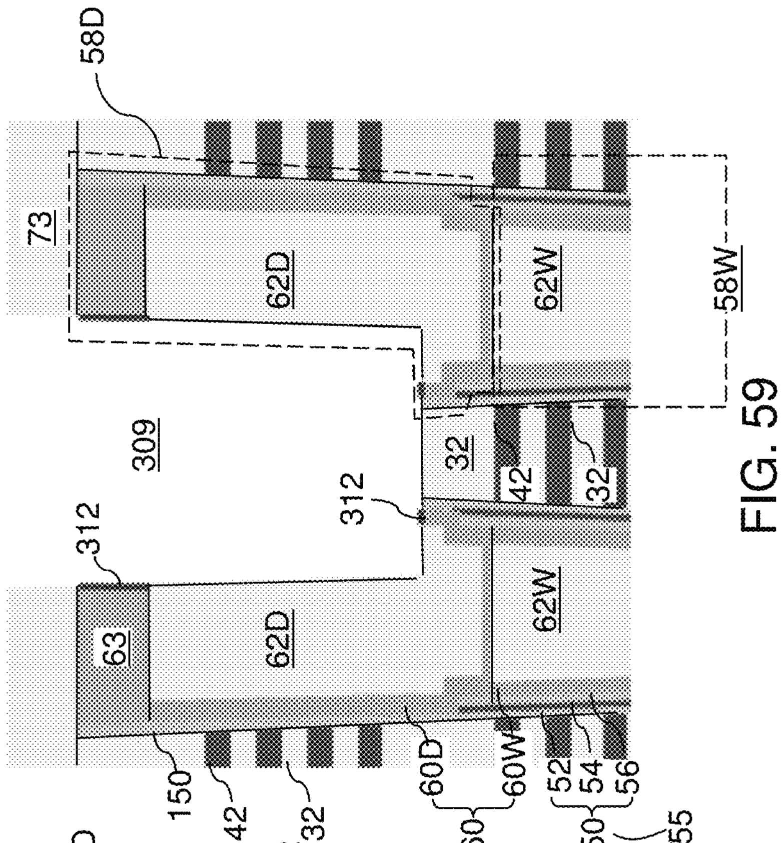
FIG. 59 is vertical cross-sectional view of a region of the fifth exemplary structure after formation of semiconductor oxide liners according to the sixth embodiment of the present disclosure.

Referring to FIG. 59, an oxidation process may be optionally performed to convert surface regions of physically exposed semiconductor material portions into semiconductor oxide liners 312. The physically exposed surface portions of the semiconductor materials of the drain-select-level semiconductor channel portions 60D and the drain regions 63 that underlie the flat sidewalls of the drain-select-level trenches 309 and the semi-annular flat horizontal surfaces of the drain-select-level semiconductor channel portions 60D located at the bottom of the drain-select-level trenches 309 may be oxidized into the semiconductor oxide liners 312. In one embodiment, the semiconductor oxide liners 312 may include silicon oxide, and may have a thickness in a range from 1 nm to 10 nm, although lesser and greater thicknesses may also be used. The semiconductor oxide liners 312 may be subsequently used to protect the drain regions 63 and the drain-select-level semiconductor channel portions 60D in a subsequent etch process.

Figure 60A:
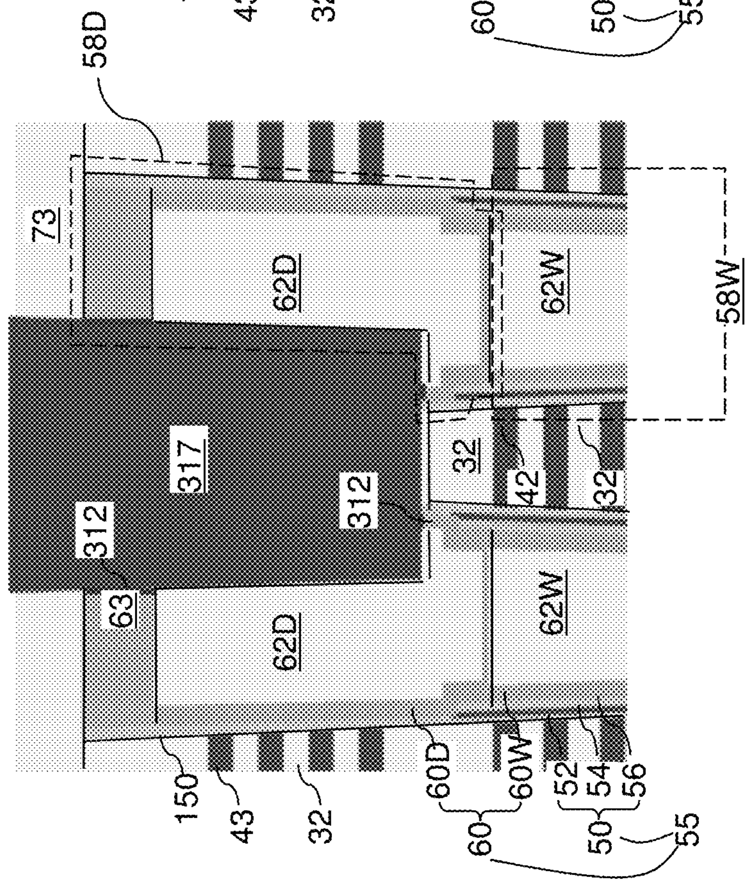
FIG. 60A is vertical cross-sectional view of a region of the fifth exemplary structure after formation of sacrificial drain-select-level trench fill structures and backside trenches according to the sixth embodiment of the present disclosure.
Figure 60B:
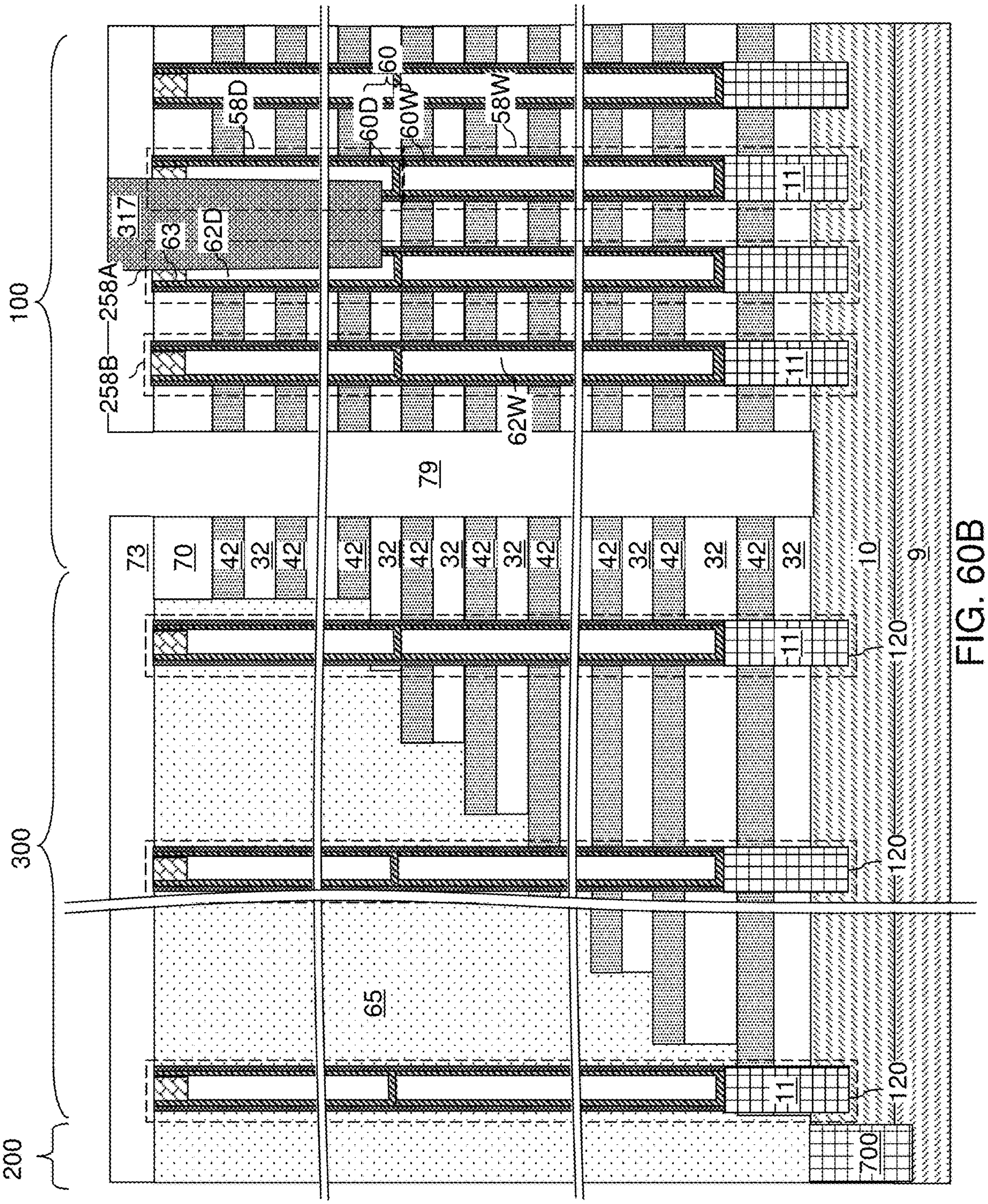
FIG. 60B is a vertical cross-sectional view of the fifth exemplary structure after the processing steps of FIG. 60A.

Referring to FIGS. 60A and 60B, a sacrificial drain-select-level trench fill structure 317 may be formed in each drain-select-level trench 309. A sacrificial material that is different from the materials of the contact level dielectric layer 73, the insulating layers 32, and the drain-select-level dielectric cores 62D may be deposited in the drain-select-level trenches 309, and excess portions of the sacrificial material may be removed from above the horizontal plane including the top surface of the contact level dielectric layer 73 by a planarization process. The planarization process may use a recess etch process and/or a chemical mechanical planarization (CMP) process. Each remaining portion of the sacrificial material that fills a drain-select-level trench 309 may constitute a sacrificial drain-select-level trench fill structure 317. In one embodiment, the sacrificial drainselect-level trench fill structures 317 may include a sacrificial dielectric material such as silicon nitride. In one embodiment, the sacrificial drain-select-level trench fill structures 317 may have the same material composition as the sacrificial material layers 42.

The processing steps as described above with reference to FIGS. 9A and 9B may be performed to form backside trenches 79. A photoresist layer (not shown) may be applied over the contact level dielectric layer 73, and may be lithographically patterned to form openings in areas between clusters of memory pillar structures (258A, 258B). The memory pillar structures (258A, 258B) include first memory pillar structures 258A that contact, and is partially cut by, a respective one of the sacrificial drain-select-level trench fill structures 317, and second memory pillar structures 258B that do not contact any of the sacrificial drain-select-level trench fill structures 317. Each of the memory pillar structures (258A, 258B) includes a vertical stack of a word-line-level opening fill structure 58W and a drain-select-level opening fill structure 58D.

The pattern in the photoresist layer may be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the substrate (9, 10) as illustrated in FIGS. 9A and 9B, and laterally extend through the memory array region 100 and the staircase region 300. The sixth exemplary structure at this processing step may have the same configuration as the first exemplary structure of FIGS. 9A and 9B with the modification that each of the memory opening fill structures 58 in FIGS. 9A and 9B is replaced with a memory pillar structure (258A, 258B), and each of the support pillar structures 20 in FIGS. 9A and 9B is replaced with a respective support pillar structure 120 having a same structure as a second memory pillar structure (58W, 58D), i.e., a memory pillar structure (258A, 258B) that does not contact a sacrificial drain-select-level trench fill structure 317. In one embodiment, the backside trenches 79 may laterally extend along a first horizontal direction hd1 and may be laterally spaced apart from one another along a second horizontal direction hd2 that is perpendicular to the first horizontal direction hd1. The memory pillar structures (258A, 258B) may be arranged in rows that extend along the first horizontal direction hd1.

Figure 61A:
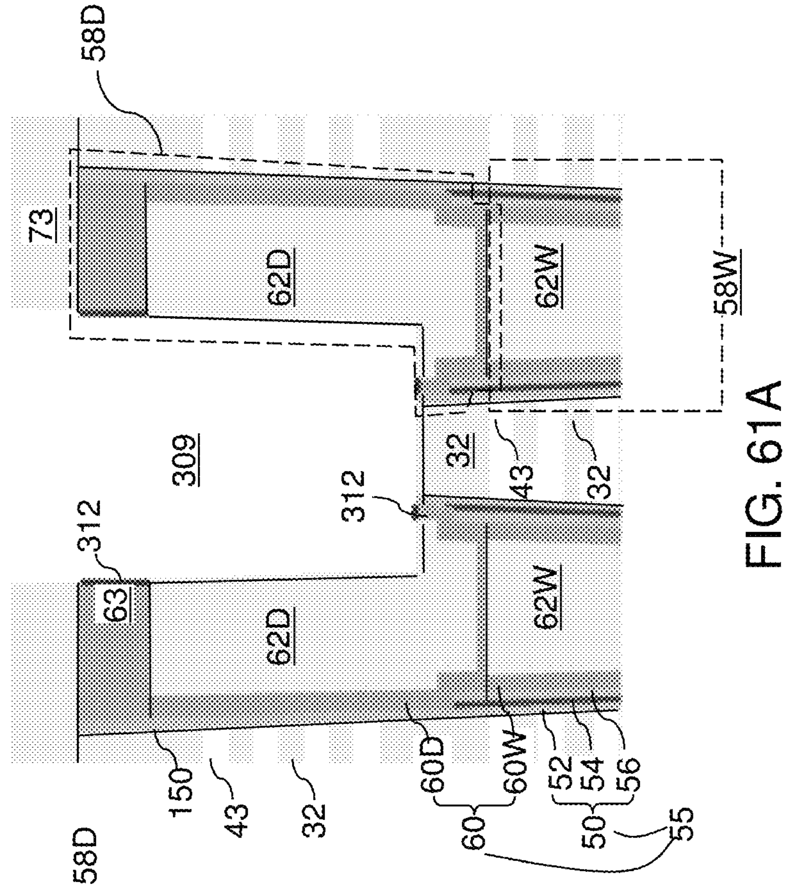
FIG. 61A is vertical cross-sectional view of a region of the fifth exemplary structure after formation of backside recesses according to the sixth embodiment of the present disclosure.
Figure 61B:
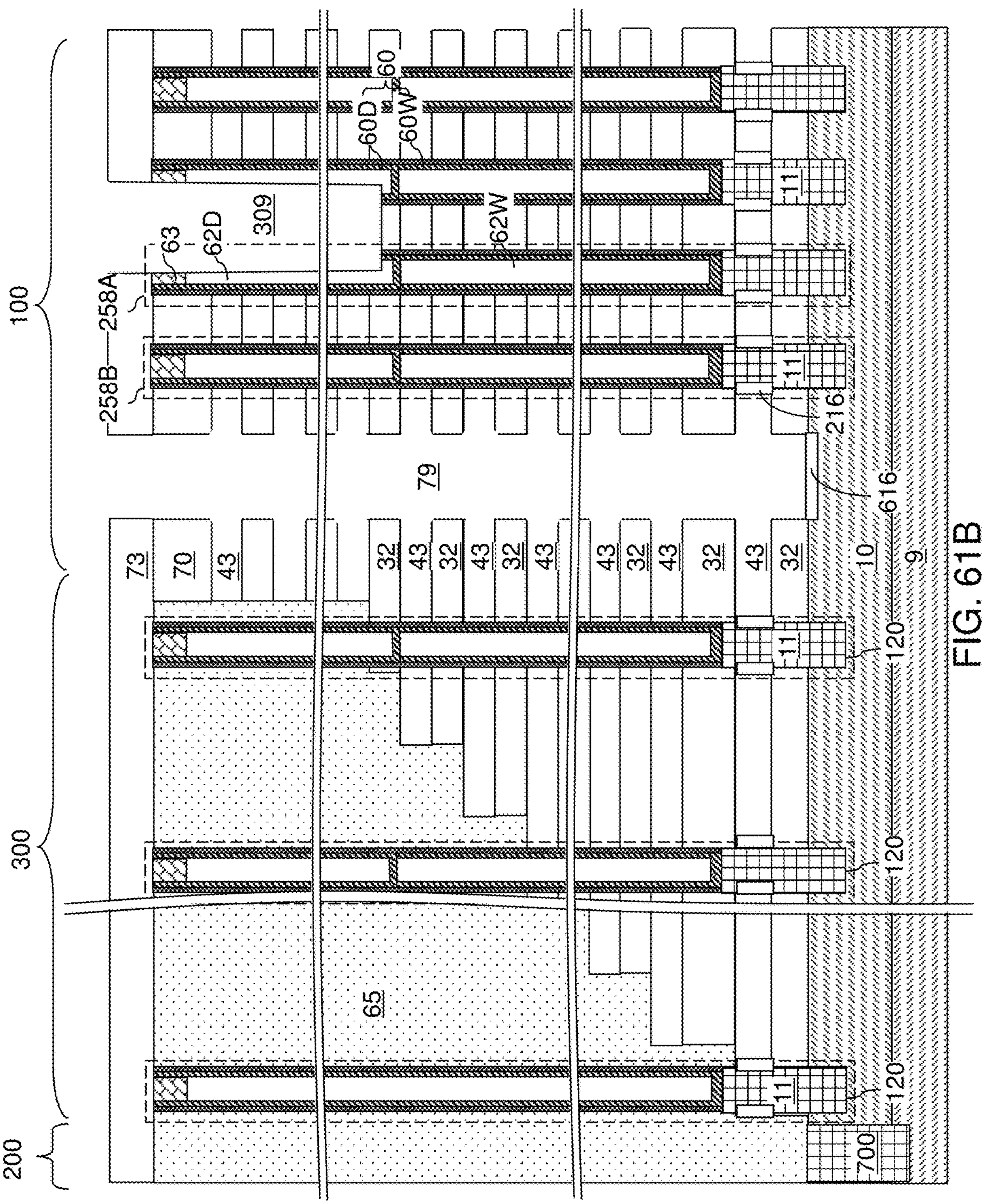
FIG. 61B is a vertical cross-sectional view of the fifth exemplary structure after the processing steps of FIG. 61A.

Referring to FIGS. 61A and 61B, an etchant that selectively etches the second material of the sacrificial material layers 42 with respect to the first material of the insulating layers 32 may be introduced into the backside trenches 79, for example, using an etch process. Backside recesses 43 may be formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, the material of the outermost layer of the memory films 50, and the material of the outer sidewall surfaces of the gate dielectrics 150. The sacrificial drain-select-level trench fill structures 317 may be removed concurrently with removal of the sacrificial material layers 42. In one embodiment, the sacrificial material layers 42 and the sacrificial drain-select-level trench fill structures 317 may include silicon nitride, and the materials of the insulating layers 32 and the retro-stepped dielectric material portion 65 may be selected from silicon oxide and dielectric metal oxides.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers 42 and the sacrificial drain-select-level trench fill structures 317 include silicon nitride, the etch process may be a wet etch process in which the fifth exemplary structure is immersed within a wet etch tank including phosphoric acid, which etches silicon nitride selective to silicon oxide, silicon, and various other materials used in the art. The support pillar structure 120, the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 216, and to convert each physically exposed surface portion of the semiconductor material layer 10 into a planar dielectric portion 616. In one embodiment, each tubular dielectric spacer 216 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 216 include a dielectric material that includes the same semiconductor element as the pedestal channel portions 11 and additionally includes at least one non-metallic element such as oxygen and/or nitrogen such that the material of the tubular dielectric spacers 216 is a dielectric material. In one embodiment, the tubular dielectric spacers 216 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Generally, materials of the sacrificial material layers 42 and the sacrificial drain-select-level trench fill structure 317 may be simultaneously removed. Backside recesses 43 are formed in volumes from which the sacrificial material layers 42 are formed. A void is formed in the volume of each drain-select-level trench 309.

Figure 62B:
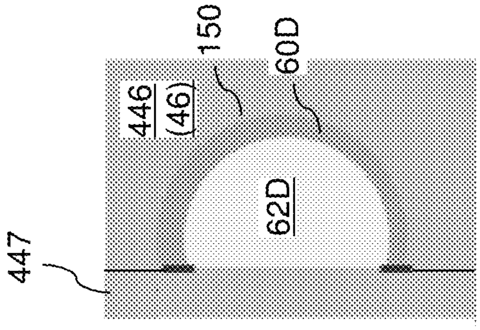
FIG. 62B is a horizontal cross-sectional view along the plane B-B' of FIG. 62A.
Figure 62A:
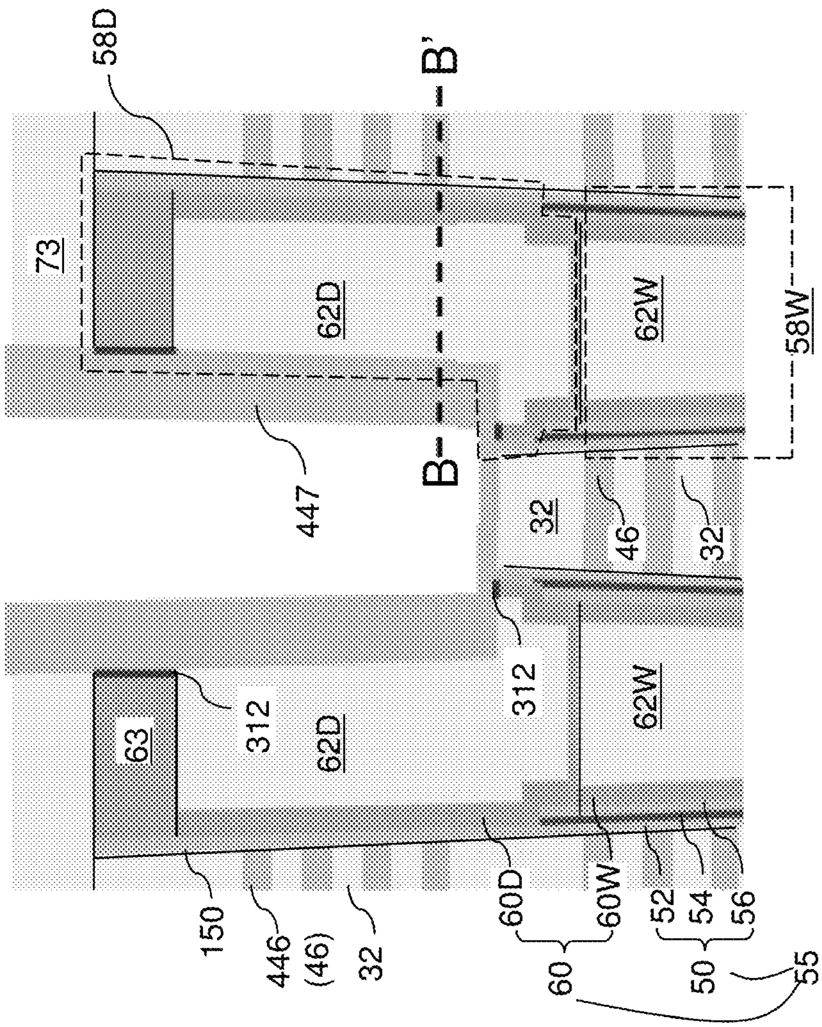
FIG. 62A is a vertical cross-sectional view of a region of the fifth exemplary structure after formation of electrically conductive layers according to the sixth embodiment of the present disclosure.

Referring to FIGS. 62A and 62B, the processing steps described above with reference to FIGS. 11B-11D may be performed to form an optional backside blocking dielectric layer (not expressly shown), and to conformally deposit at least one electrically conductive material in the backside recesses 43, peripheral portions of the backside trenches 79, over the contact level dielectric layer 73, and inside the voids of the drain-select-level trenches 309. Electrically conductive layers 46 are formed in the backside recesses 43, and a continuous electrically conductive material layer 46L may be formed at peripheral portions of the backside trenches 79 and above the contact level dielectric layer 73. A trench electrically conductive layer 447 may be formed inside each void of the drain-select-level trenches 309.

Figure 63B:
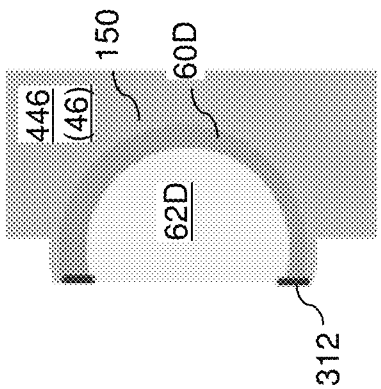
FIG. 63B is a horizontal cross-sectional view along the plane B-B' of FIG. 63A.
Figure 63A:
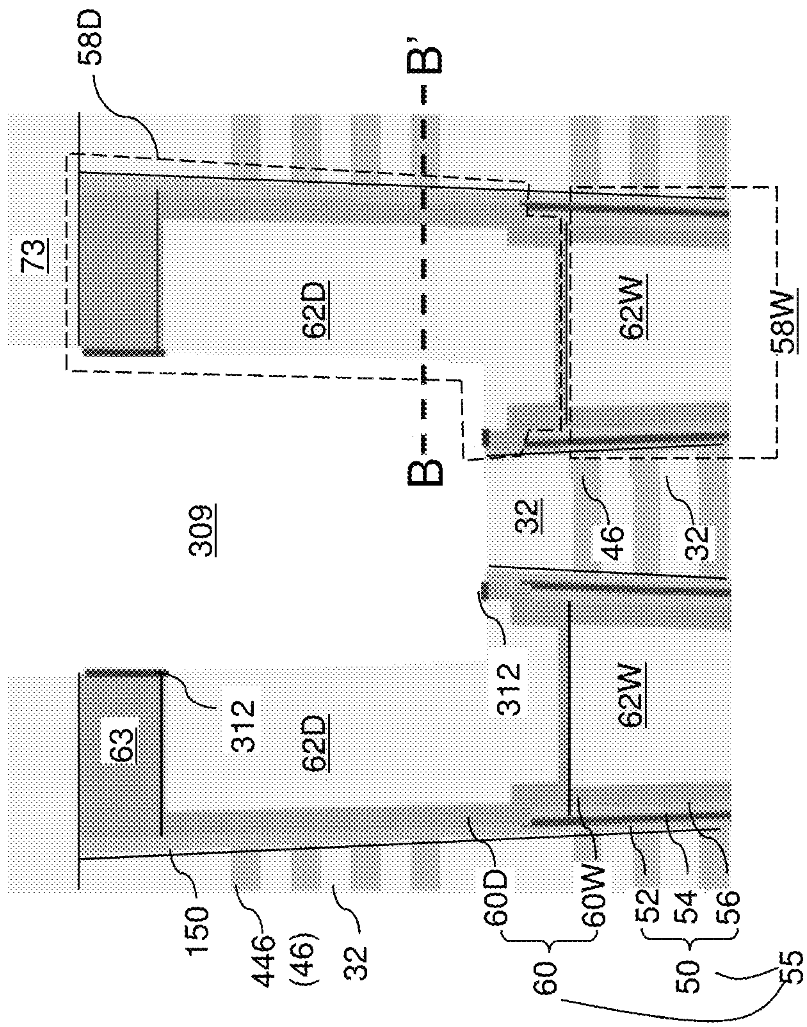
FIG. 63A is a vertical cross-sectional view of a region of the fifth exemplary structure after removal of trench-fill conductive material portions according to the sixth embodiment of the present disclosure.

Referring to FIGS. 63A and 63B, the processing steps of FIG. 13 may be performed to remove the continuous electrically conductive material layer 46L and the trench electrically conducive layers 447. In other words, portions of the electrically conductive material within the volumes of the drain-select-level trenches 309, at peripheral regions of the backside trenches 79, and above the contact level dielectric material layer 73 may be removed by a recess etch process, which may include an isotropic etch process and/or an anisotropic etch process. Remaining portions of the electrically conductive material in the backside recesses constitute the electrically conductive layers 46. A subset of the electrically conductive layers 46 that are formed at the drain select levels is herein referred to as drain-select-level electrically conductive layers 446 (46). The drain-select-level electrically conductive layers 446 (46) are physically exposed to the volumes of the drain-select-level trenches 309.

In one embodiment, an isotropic etch process may be performed after portions of the electrically conductive material(s) in the drain-select-level trenches 309 are removed. In this case, sidewalls of the drain-select-level electrically conductive layers 446 (46) may be laterally recessed from sidewalls of the insulating layers 32 that are physically exposed to the drain-select-level trenches 309.

Figure 64B:
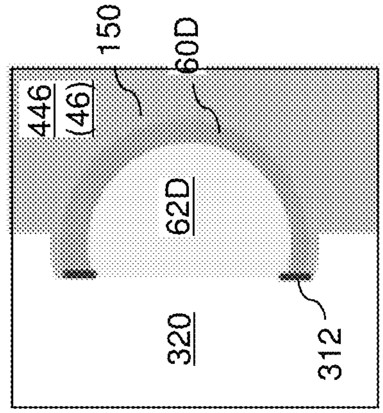
FIG. 64B is a horizontal cross-sectional view along the plane B-B' of FIG. 64A.
Figure 64A:
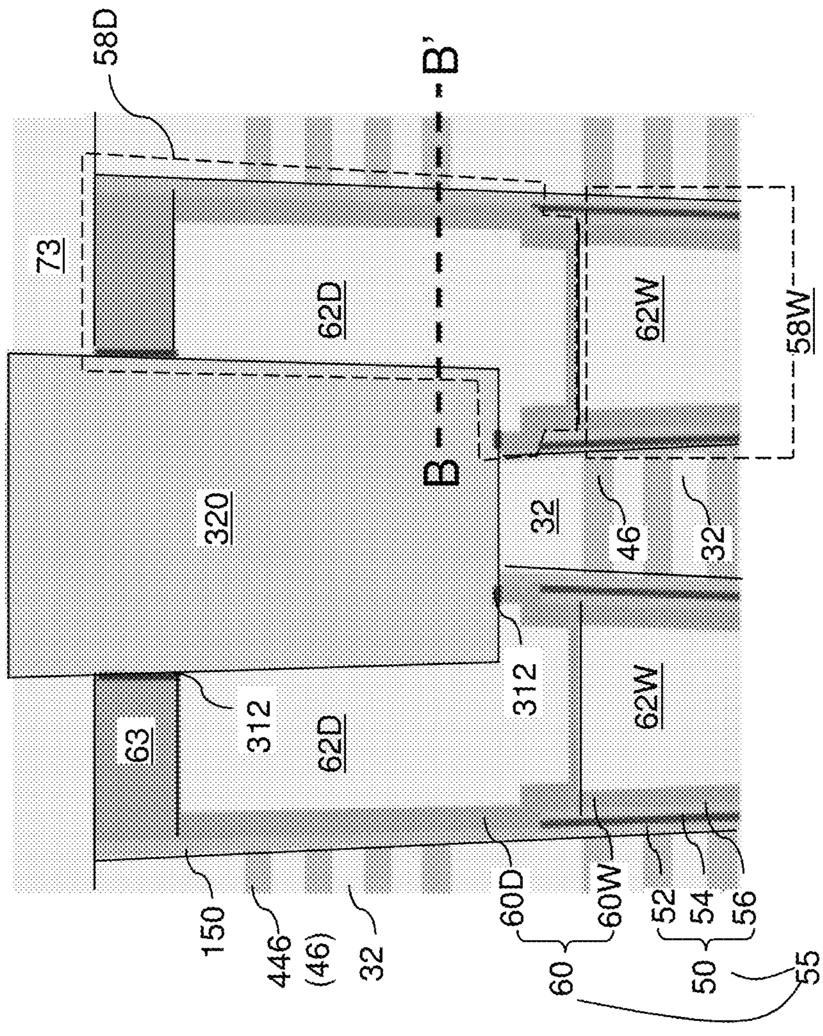
FIG. 64A is a vertical cross-sectional view of a region of the fifth exemplary structure after formation of a drain-select-level isolation structure according to the sixth embodiment of the present disclosure.

Referring to FIGS. 64A and 64B, the processing steps described above with reference to FIGS. 14A and 14B may be performed to conformally deposit and insulating material layer and to anisotropically etch the insulating material layer. The width of each drain-select-level trench 309 may be less than twice the thickness of the insulating material layer, and the width of each backside trench 79 may be greater than twice the thickness of the insulating material layer. Each drain-select-level trench 309 may be entirely filled with the material of the insulating material layer, and a cavity may be present within vertically-extending portions of the insulating material layer within each backside trench 79. An anisotropic etch process may be performed to remove horizontal portions of the insulating material layer. An insulating spacer 74 (illustrated in FIGS. 14A and 14B) may be formed within each backside trench 79, and a drain-select-level isolation structure 320 may be provided within each drain-select-level trench 309. Each drain-select-level isolation structure 320 may fill the volume of the void of a respective one of the drain-select-level trenches 309.

Subsequent processing steps of the first embodiment may be performed to form backside contact via structures 76 in remaining volumes of the backside trenches 79, and to form various contact via structures (88, 86) as illustrated in FIGS. 15A and 15B. The processing steps of FIG. 16 may be subsequently performed.

Figure 65B:
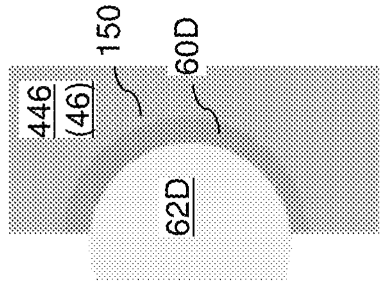
FIG. 65B is a horizontal cross-sectional view along the plane B-B' of FIG. 65A.
Figure 65A:
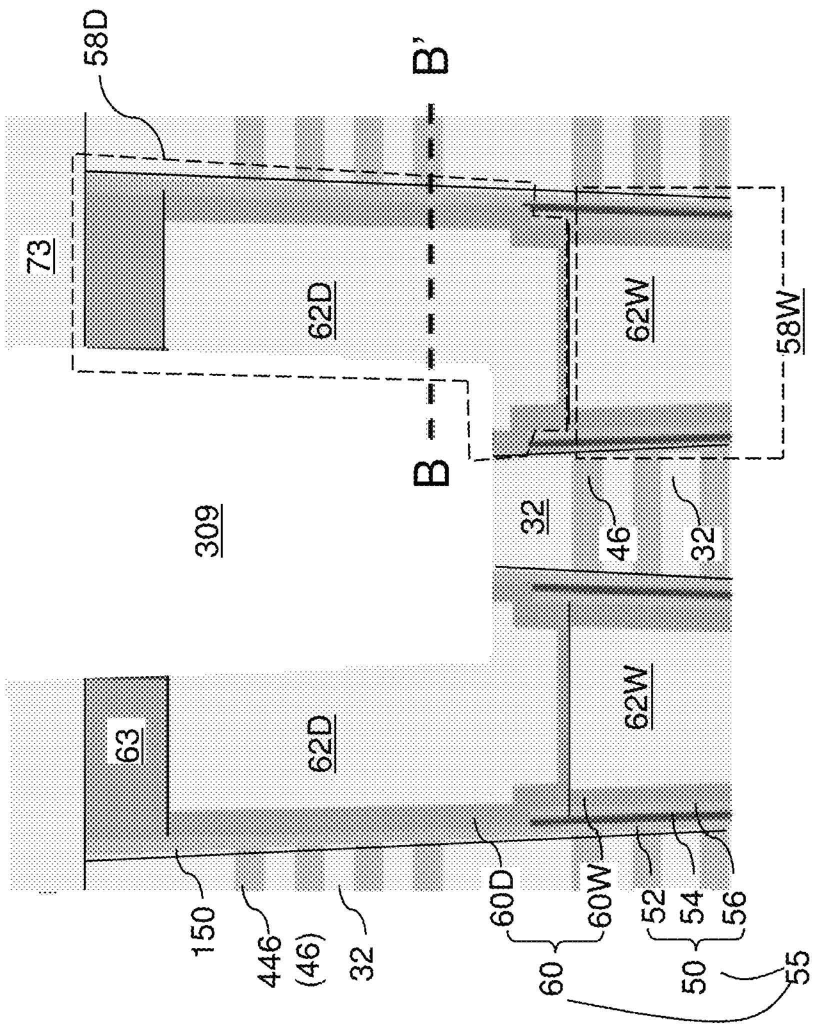
FIG. 65A is a vertical cross-sectional view of a region of an alternative embodiment of the fifth exemplary structure after removal of semiconductor oxide liners according to the sixth embodiment of the present disclosure.

Referring to FIGS. 65A and 65B, an alternative embodiment of the fifth exemplary structure may be derived from the fifth exemplary structure illustrated in FIGS. 63A and 63B by removing the semiconductor oxide liners 312 selective to the semiconductor materials of the drain-select-level semiconductor channel portions 60D and the drain regions 63. For example, a wet etch process using dilute hydrofluoric acid may be performed.

Figure 66B:
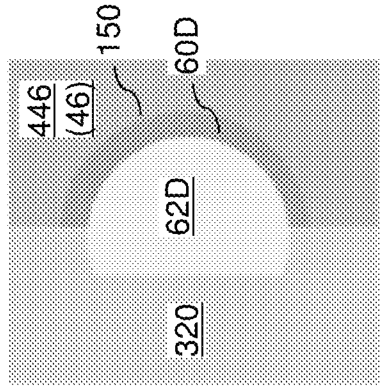
FIG. 66B is a horizontal cross-sectional view along the plane B-B' of FIG. 66A.
Figure 66A:
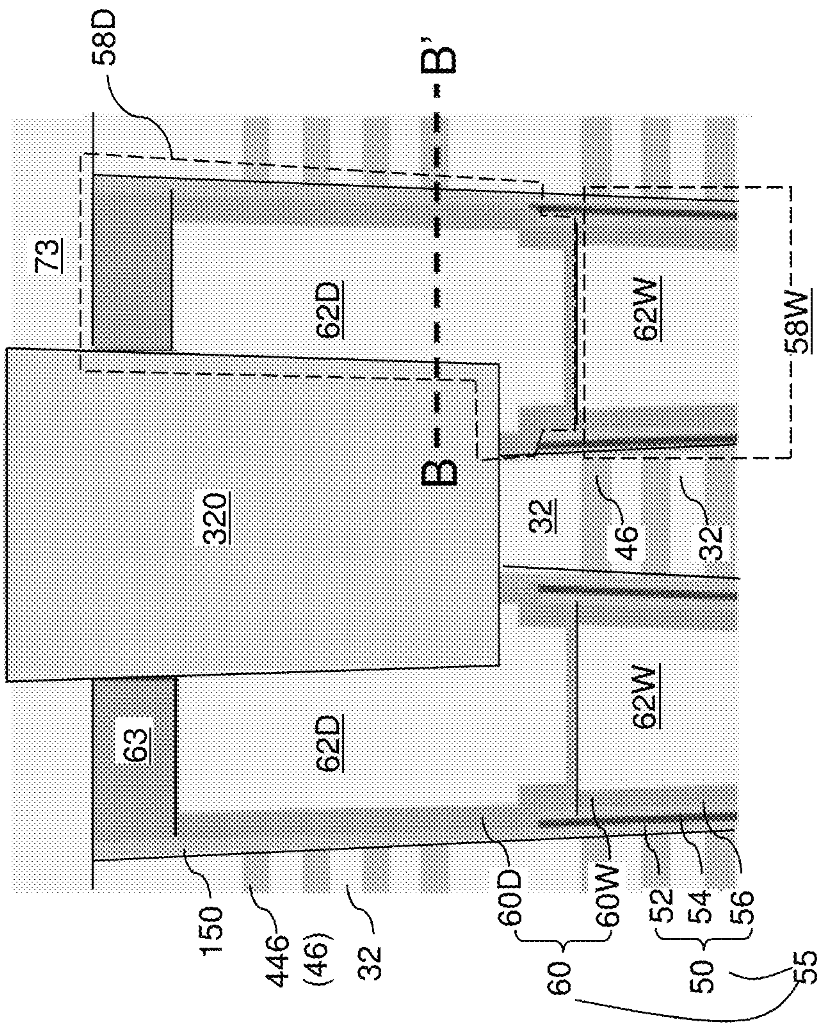
FIG. 66A is a vertical cross-sectional view of a region of the alternative embodiment of the fifth exemplary structure after formation of a drain-select-level isolation structure according to the sixth embodiment of the present disclosure.
Figure 66C:
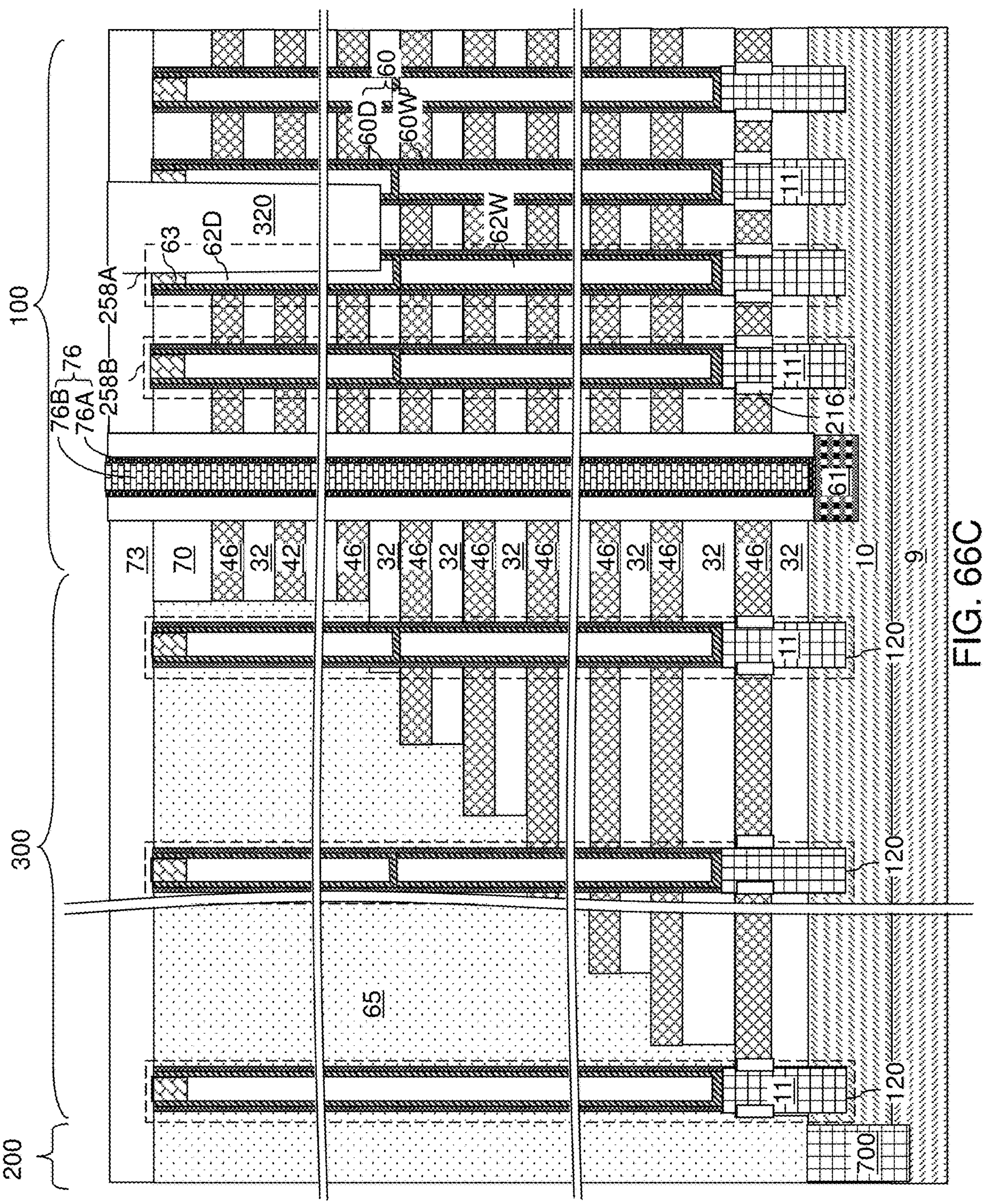
FIG. 66C is a vertical cross-sectional view of the alternative embodiment of the fifth exemplary structure of FIGS. 66A and 66B.

Referring to FIGS. 66A-66C, the processing steps described above with reference to FIGS. 14A and 14B and 15A and 15B may be performed to form drain-select-level isolation structures 320, insulating spacers 74, backside contact via structures 76, and additional contact via structures (88, 86).

Referring to all drawings and according to various embodiments of the present disclosure, a three-dimensional memory device is provided, which comprises: an alternating stack of insulating layers 32 and electrically conductive layers 46 located over a substrate (9, 10); first memory pillar structures 258A extending through the alternating stack (32, 46), wherein each of the first memory pillar structures 258A (or the first memory opening fill structures 58A) includes a respective first memory film 50 and a respective first vertical semiconductor channel 60; dielectric cores (such as dielectric cores 62 of the first through third embodiments or the drain-select-level dielectric cores 62D of the fifth exemplary structure) contacting an inner sidewall of a respective one of the first vertical semiconductor channels 60; and a drain-select-level isolation structure 320 that laterally extends along a first horizontal direction hd1 and contacts straight sidewalls of the dielectric cores (such as dielectric cores 62 of the first through third embodiments or the drain-select-level dielectric cores 62D of the fifth exemplary structure) at a respective two-dimensional flat interface.

In one embodiment, the drain-select-level isolation structure 320 contacts flat horizontal surfaces of the dielectric cores (such as dielectric cores 62 of the first through third embodiments or the drain-select-level dielectric cores 62D of the fifth exemplary structure) at two-dimensional horizontal interfaces, which may be within vertical planes or within substantially vertical planes having a taper angle less than 5 degrees with respect to the vertical direction.

In one embodiment, each of the two-dimensional flat interface may be adjoined to a respective one of the two-dimensional horizontal interfaces, at which a bottom surface of the drain-select-level isolation structure 320 contacts a horizontal surface of a dielectric core (such as dielectric cores 62 of the first through third embodiments or the drain-select-level dielectric cores 62D of the fifth exemplary structure).

In one embodiment, the drain-select-level isolation structure 320 may contact semi-annular flat horizontal surfaces of the first vertical semiconductor channels 60 within a horizontal plane including the two-dimensional horizontal interfaces.

In one embodiment, the three-dimensional memory device may comprise drain regions 63 contacting a planar top surface of a respective one of the dielectric cores (such as dielectric cores 62 of the first through third embodiments or the drain-select-level dielectric cores 62D of the fifth exemplary structure).

In one embodiment, the three-dimensional memory device may comprise semiconductor oxide liners 312 comprising an oxide of a material of the drain regions 63 and the vertical semiconductor channel 60, contacting a sidewall of a respective one of the drain regions 63 and a respective one of the vertical semiconductor channels 60, and contacting the drain-select-level isolation structure 320.

In one embodiment, the semiconductor oxide liners 312 may be absent, and sidewalls of the drain regions 63 contact the drain-select-level isolation structure 320 with a respective interface that laterally extends along the first horizontal direction hd1.

In one embodiment, each of the first vertical semiconductor channels 60 comprises: a word-line-level semiconductor channel portion 60W vertically extending through a first subset of the electrically conductive layers 46 that underlie a horizontal plane including a bottom surface of the drain-select-level isolation structure 320; and a drain-select-level semiconductor channel portion 60D vertically extending through a second subset of the electrically conductive layers 46 that overlie the horizontal plane including the bottom surface of the drain-select-level isolation structure 320.

In one embodiment, the drain-select-level semiconductor channel portion 60D comprises a bottom plate portion (i.e., a horizontally-extending portion that is laterally bounded by a bottom periphery of the outer sidewall of the drain-select-level semiconductor channel portion 60D) contacting a bottom surface of the a respective one of the dielectric cores (such as the drain-select-level dielectric cores 62D). In one embodiment, the bottom plate portion contacts an annular top surface of the word-line-level semiconductor channel portion 60W and a top surface of an additional dielectric core (i.e., the word-line-level dielectric core 62W) that is laterally surrounded by the word-line-level semiconductor channel portion 60W.

In one embodiment, each of the first memory films 50 comprises a layer stack including, from outside to inside, a charge storage layer 54 and a tunneling dielectric layer 56 that contacts a respective one of the first vertical semiconductor channels 60; and each of the first vertical semiconductor channels 60 contacts a semi-cylindrical gate dielectric layer 150 adjoined to an upper end of a respective one of the first memory films 50 and contacting the drain-select-level isolation structure 320 and a subset of the electrically conductive layers 46, i.e., the drain-select-level electrically conductive layers 446 (46).

In one embodiment, the three-dimensional memory device comprises second memory pillar structures 258B extending through the alternating stack (32, 46), wherein: each of the second memory pillar structures 258B includes a respective second memory film 50 and a respective second vertical semiconductor channel 60; and each second vertical semiconductor channel 60 includes a portion having a tubular configuration and extending through each electrically conductive layer 46 in the alternating stack (32, 46).

In one embodiment, the first memory pillar structures 258A of the fifth exemplary structure may be arranged in first rows that extend along a first horizontal direction hd1 and have a uniform intra-row pitch within each first row (for example, by being positioned at locations of the first memory opening fill structures 58A of the first exemplary structure); the second memory pillar structures 258B may be arranged in second rows that extend along the first horizontal direction hd1 and have the uniform intra-row pitch within each second row (for example, by being positioned at locations of the second memory opening fill structures 58B of the first exemplary structure); and the first memory pillar structures 258A and the second memory pillar structures 258B may be arranged as a two-dimensional periodic array in which each neighboring pair of rows selected from the first rows and second rows has a uniform inter-row pitch.

The memory pillar structures (258A, 258B) of the present disclosure may be formed on-pitch as a two-dimensional periodic array, and the drain-select-level isolation structures 320 may cut through upper portions of the first memory pillar structures 258A to minimize areas occupied by the drain-select-level isolation structures 320, while providing electrical isolation from the drain-select-level electrically conductive layers 446 (46).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:

an alternating stack of insulating layers and electrically conductive layers located over a substrate;

first memory pillar structures extending through the alternating stack, wherein each of the first memory pillar structures includes a respective first memory film and a respective first vertical semiconductor channel;

dielectric cores contacting an inner sidewall of a respective one of the first vertical semiconductor channels; and a drain-select-level isolation structure that laterally extends along a first horizontal direction and contacts straight sidewalls of the dielectric cores at a respective two-dimensional flat interface.

2. The three-dimensional memory device of claim 1, wherein the drain-select-level isolation structure contacts flat horizontal surfaces of the dielectric cores at two-dimensional horizontal interfaces.

3. The three-dimensional memory device of claim 2, wherein each of the two-dimensional flat interface is adjoined to a respective one of the two-dimensional horizontal interfaces.

4. The three-dimensional memory device of claim 2, wherein the drain-select-level isolation structure contacts semi-annular flat horizontal surfaces of the first vertical semiconductor channels within a horizontal plane including the two-dimensional horizontal interfaces.

5. The three-dimensional memory device of claim 2, further comprising drain regions contacting a planar top surface of a respective one of the dielectric cores.

6. The three-dimensional memory device of claim 5, further comprising semiconductor oxide liners comprising an oxide of a material of the drain regions, contacting a sidewall of a respective one of the drain regions, and contacting the drain-select-level isolation structure.

7. The three-dimensional memory device of claim 5, wherein sidewalls of the drain regions contact the drain-select-level isolation structure with a respective interface that laterally extends along the first horizontal direction.

8. The three-dimensional memory device of claim 2, wherein each of the first vertical semiconductor channels comprises:

a word-line-level semiconductor channel portion vertically extending through a first subset of the electrically conductive layers that underlie a horizontal plane including a bottom surface of the drain-select-level isolation structure; and a drain-select-level semiconductor channel portion vertically extending through a second subset of the electrically conductive layers that overlie the horizontal plane including the bottom surface of the drain-select-level isolation structure.

9. The three-dimensional memory device of claim 8, wherein the drain-select-level semiconductor channel portion comprises a bottom plate portion contacting a bottom surface of the a respective one of the dielectric cores.

10. The three-dimensional memory device of claim 9, wherein the bottom plate portion contacts an annular top surface of the word-line-level semiconductor channel portion and a top surface of an additional dielectric core that is laterally surrounded by the word-line-level semiconductor channel portion.

11. The three-dimensional memory device of claim 1, wherein:

each of the first memory films comprises a layer stack including, from outside to inside, a charge storage layer and a tunneling dielectric layer that contacts a respective one of the first vertical semiconductor channels; and each of the first vertical semiconductor channels contacts a semi-cylindrical gate dielectric layer adjoined to an upper end of a respective one of the first memory films and contacting the drain-select-level isolation structure and a subset of the electrically conductive layers.

12. The three-dimensional memory device of claim 1, further comprising second memory pillar structures extending through the alternating stack, wherein:

each of the second memory pillar structures includes a respective second memory film and a respective second vertical semiconductor channel; and each second vertical semiconductor channel includes a portion having a tubular configuration and extending through each electrically conductive layer in the alternating stack.

13. The three-dimensional memory device of claim 12, wherein:

the first memory pillar structures are arranged in first rows that extend along a first horizontal direction and have a uniform intra-row pitch within each first row;

the second memory pillar structures are arranged in second rows that extend along the first horizontal direction and have the uniform intra-row pitch within each second row; and the first memory pillar structures and the second memory pillar structures are arranged as a two-dimensional periodic array in which each neighboring pair of rows selected from the first rows and second rows has a uniform inter-row pitch.

* * * * *